US011985891B2

(12) United States Patent
Joo et al.

(10) Patent No.: US 11,985,891 B2
(45) Date of Patent: May 14, 2024

(54) POLYCYCLIC AROMATIC COMPOUNDS AND ORGANIC ELECTROLUMINESCENT DEVICES USING THE SAME

(71) Applicant: SFC CO., LTD., Cheongju-si (KR)

(72) Inventors: SungHoon Joo, Cheongju-si (KR); Ji-Hwan Kim, Cheongju-si (KR); Byung-sun Yang, Cheongju-si (KR); Hyeon Jun Jo, Cheongju-si (KR); Sungeun Choi, Cheongju-si (KR); Su-jin Kim, Cheongju-si (KR); Bong-Ki Shin, Cheongju-si (KR)

(73) Assignee: SFC Co., Ltd., Cheongju-si (KR)

(*) Notice: Subject to any disclaimer, the term of this patent is extended or adjusted under 35 U.S.C. 154(b) by 695 days.

(21) Appl. No.: 17/172,171

(22) Filed: Feb. 10, 2021

(65) Prior Publication Data

US 2021/0167293 A1 Jun. 3, 2021

Related U.S. Application Data

(63) Continuation-in-part of application No. 16/687,916, filed on Nov. 19, 2019, now Pat. No. 10,981,938.

(30) Foreign Application Priority Data

Nov. 30, 2018 (KR) ........................ 10-2018-0151781
Jun. 12, 2019 (KR) ........................ 10-2019-0069314

(51) Int. Cl.

| | |
|---|---|
| ***H01L 51/50*** | (2006.01) |
| ***C07F 5/02*** | (2006.01) |
| ***C09K 11/06*** | (2006.01) |
| ***H10K 85/60*** | (2023.01) |
| *H10K 50/11* | (2023.01) |
| *H10K 50/15* | (2023.01) |
| *H10K 50/16* | (2023.01) |
| *H10K 50/17* | (2023.01) |
| *H10K 50/18* | (2023.01) |

(52) U.S. Cl.

CPC ........... *H10K 85/636* (2023.02); *C07F 5/027* (2013.01); *C09K 11/06* (2013.01); *H10K 85/626* (2023.02); *H10K 85/633* (2023.02); *H10K 85/6572* (2023.02); *H10K 85/6574* (2023.02); *H10K 85/6576* (2023.02); *C09K 2211/1007* (2013.01); *C09K 2211/1018* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02)

(58) Field of Classification Search

None

See application file for complete search history.

(56) References Cited

U.S. PATENT DOCUMENTS

| | | | |
|---|---|---|---|
| 2003/0137239 A1 | 7/2003 | Matsuura et al. | |
| 2004/0217934 A1 | 11/2004 | Yang | |
| 2006/0043858 A1 | 3/2006 | Ikeda et al. | |
| 2009/0053557 A1 | 2/2009 | Spindler et al. | |
| 2014/0225100 A1 | 8/2014 | Yokoyama et al. | |
| 2015/0236274 A1* | 8/2015 | Hatakeyama ........ | H10K 85/322 548/405 |
| 2016/0056386 A1 | 2/2016 | Lee et al. | |
| 2017/0213969 A1 | 7/2017 | Shin et al. | |
| 2017/0346009 A1 | 11/2017 | Yokoyama et al. | |
| 2018/0006235 A1 | 1/2018 | Yokoyama et al. | |
| 2018/0301629 A1 | 10/2018 | Hatakeyama et al. | |
| 2019/0207112 A1 | 7/2019 | Hatakeyama et al. | |
| 2020/0098991 A1 | 3/2020 | Kim et al. | |
| 2020/0176679 A1 | 6/2020 | Jeong et al. | |
| 2021/0184121 A1 | 6/2021 | Suh et al. | |

FOREIGN PATENT DOCUMENTS

| | | |
|---|---|---|
| CN | 101490207 A | 7/2009 |
| CN | 103864789 A | 6/2014 |
| CN | 107342366 A | 11/2017 |
| CN | 107851724 A | 3/2018 |
| CN | 107925001 A | 4/2018 |
| EP | 3 246 963 A2 | 11/2017 |
| EP | 3 660 024 A1 | 6/2020 |
| JP | 2014-72120 A | 4/2014 |
| JP | 2016-86147 A | 5/2016 |
| JP | 2017-168796 A | 9/2017 |
| JP | 6755806 B2 | 9/2020 |
| JP | 2021-504373 A | 2/2021 |
| KR | 10-2017-0089094 A | 8/2017 |
| KR | 10-2017-0127593 A | 11/2017 |
| KR | 10-2017-0130434 A | 11/2017 |
| KR | 10-2017-0130435 A | 11/2017 |
| KR | 10-2018-0018404 A | 2/2018 |

(Continued)

OTHER PUBLICATIONS

Liang, Xiao, et al. "Peripheral amplification of multi-resonance induced thermally activated delayed fluorescence for highly efficient OLEDs", *Angewandte Chemie*, vol. 130, Issue 35, 2018 (pp. 11486-11490).

Korean Office Action dated Oct. 10, 2019 in corresponding Korean Patent Application No. 10-2019-0069314 (3 pages in English, 3 pages in Korean).

Korean Decision to Grant dated Dec. 24, 2019 in corresponding Korean Patent Application No. 10-2019-0069314 (2 pages in English, 2 pages in Korean).

Extended European Search Report dated Feb. 26, 2020 in corresponding European Patent Application No. 19212313.1 (7 pages in English).

Japanese Office Action dated Aug. 25, 2020 in counterpart Japanese Patent Application No. 2019-217554 (4 pages in Japanese).

(Continued)

*Primary Examiner* — Gregory D Clark

(74) *Attorney, Agent, or Firm* — NSIP Law

(57) ABSTRACT

Disclosed are polycyclic aromatic compounds that can be employed in various organic layers of organic electroluminescent devices. Also disclosed are organic electroluminescent devices including the polycyclic aromatic compounds. The organic electroluminescent devices are highly efficient and long lasting and have greatly improved luminous efficiency.

17 Claims, No Drawings

(56) References Cited

FOREIGN PATENT DOCUMENTS

| | | | |
|---|---|---|---|
| KR | 10-2018-0037695 | A | 4/2018 |
| KR | 10-1876763 | B1 | 7/2018 |
| KR | 10-2018-0122298 | A | 11/2018 |
| WO | WO 2015/001726 | A1 | 1/2015 |
| WO | WO 2016/104289 | A1 | 6/2016 |
| WO | WO 2017/027333 | A1 | 2/2017 |
| WO | WO 2017/183625 | A1 | 10/2017 |
| WO | WO 2018/095397 | A1 | 5/2018 |
| WO | WO 2018/203666 | A1 | 11/2018 |
| WO | WO 2020/054676 | A1 | 3/2020 |

OTHER PUBLICATIONS

Chinese Office Action dated Sep. 18, 2020 in counterpart Chinese Patent Application No. 201911199295.9 (12 pages in English and 7 pages in Chinese).

Chinese Office Action dated Apr. 22, 2023 in corresponding Chinese Patent Application No. 201980078604.9 (9 pages in English, 8 pages in Chinese).

Extended European Search Report dated Aug. 10, 2022 in counterpart European Patent Application No. 19890930.1 (8 pages in English).

International Search Report dated Mar. 20, 2020 in counterpart International Patent Application No. PCT/KR2019/016612 (3 pages in Korean).

United States Office Action dated Apr. 28, 2023, in U.S. Appl. No. 17/296,347 (34 pages in English).

Japanese Office Action dated Jun. 21, 2022 in corresponding Japanese Patent Application No. 2021-531137 (4 pages in Japanese).

* cited by examiner

POLYCYCLIC AROMATIC COMPOUNDS AND ORGANIC ELECTROLUMINESCENT DEVICES USING THE SAME

CROSS REFERENCE TO RELATED APPLICATIONS

The present invention is a continuation-in-part of U.S. patent application Ser. No. 16/687,916 filed on Nov. 19, 2019 and claims the benefit under 35 U.S.C. § 119(a) of Korean Patent Application No. 10-2019-0069314, filed on Jun. 12, 2019, and Korean Patent Application No. 10-2018-0151781, filed on Nov. 30, 2018, in the Korean Intellectual Property Office, the entire disclosures of which are each incorporated herein by reference for all purposes.

BACKGROUND OF THE INVENTION

1. Field of the Invention

The present invention relates to polycyclic aromatic compounds and highly efficient and long-lasting organic electroluminescent devices with greatly improved luminous efficiency using the same.

2. Description of the Related Art

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structurally optimized structures of organic layers for organic electroluminescent devices and stable and efficient materials for organic layers of organic electroluminescent devices.

Thus, there is a continued need to develop structures of organic electroluminescent devices optimized to improve their luminescent properties and new materials capable of supporting the optimized structures of organic electroluminescent devices.

SUMMARY OF THE INVENTION

Therefore, the present invention intends to provide organic electroluminescent compounds that are employed in organic layers of organic electroluminescent devices, achieving high efficiency and long lifetime of the devices. The present invention also intends to provide organic electroluminescent devices including the organic electroluminescent compounds.

One aspect of the present invention provides an organic electroluminescent compound represented by Formula A-5 or A-7:

(A-5)

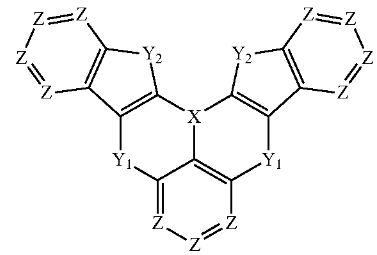

(A-7)

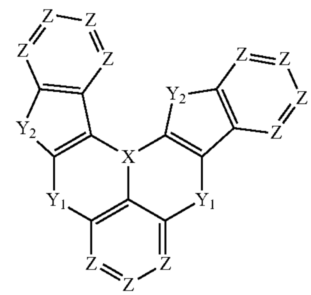

A description will be given concerning more detailed structures of the compounds of Formulae A-5 and A-7, the definitions of substituents $Y_1$, $Y_2$, X, and Z in the compounds of Formulae A-5 and A-7, and specific examples of polycyclic aromatic compounds that can be represented by Formulae A-5 and A-7.

A further aspect of the present invention provides an organic electroluminescent device including a first electrode, a second electrode opposite to the first electrode, and one or more organic layers interposed between the first and second electrodes wherein at least one of the organic layers includes the polycyclic aromatic compound represented by Formula A-5 or A-7.

The polycyclic aromatic compound of the present invention is employed in at least one of the organic layers of the organic electroluminescent device, achieving high efficiency and long lifetime of the device.

DETAILED DESCRIPTION OF THE INVENTION

The present invention will now be described in more detail.

The present invention is directed to a polycyclic aromatic compound represented by Formula A-5 or A-7:

(A-5)

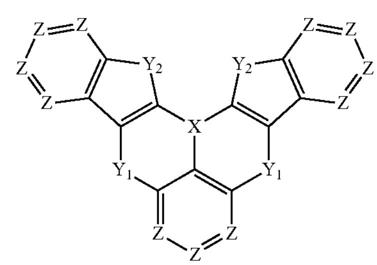

wherein X is selected from B, P, and P═O, the moieties $Y_1$ and $Y_2$ are identical to or different from each other and are each independently selected from $NR_1$, $CR_2R_3$, O, S, Se, and $SiR_4R_5$, with the proviso that the two $Y_1$ moieties are not simultaneously $NR_1$ (wherein $R_1$ to $R_5$ are identical to or different from each other and are each independently selected from hydrogen, deuterium, substituted or unsubstituted $C_1$-$C_{30}$ alkyl, substituted or -unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, substituted or unsubstituted $C_3$-$C_{20}$ mixed aliphatic-aromatic cyclic group, nitro, cyano, and halogen, with the proviso that $R_2$ and $R_3$ are optionally linked to each other to form an alicyclic or aromatic monocyclic or polycyclic ring and $R_4$ and $R_5$ are optionally linked to each other to form an alicyclic or aromatic monocyclic or polycyclic ring), and the moieties Z are identical to or different from each other and are each independently CR or N (wherein R is selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, substituted or unsubstituted $C_3$-$C_{20}$ mixed aliphatic-aromatic cyclic group, nitro, cyano, and halogen), with the proviso that $R_1$ is optionally linked to R of the adjacent Z moiety through O, S, $CR_6R_7$ or a single bond to form an alicyclic or aromatic monocyclic or polycyclic ring in which some or all of the carbon atoms are optionally substituted with heteroatoms selected from N, S, and O (wherein $R_6$ and $R_7$ are each independently selected from hydrogen, deuterium, substituted or unsubstituted $C_1$-$C_{30}$ alkyl, substituted or unsubstituted $C_6$-$C_{50}$ aryl, and substituted or unsubstituted $C_3$-$C_{30}$ cycloalkyl, and substituted or unsubstituted $C_2$-$C_{50}$ heteroaryl) and with the proviso that the plurality of R groups are optionally bonded to each other to form an alicyclic or aromatic monocyclic or polycyclic ring in which some or all of the carbon atoms are optionally substituted with heteroatoms selected from N, S, and O; or (A-7)

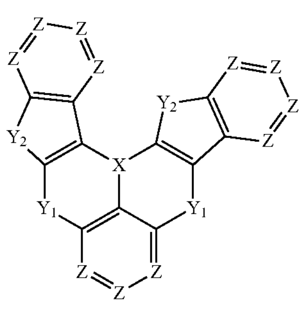

wherein X, $Y_1$, $Y_2$, and Z are as defined in Formula A-5, with the proviso that the two $Y_1$ moieties are optionally simultaneously $NR_1$.

According to a preferred embodiment of the present invention, X in Formula A-5 or A-7 is preferably B. The presence of boron (B) in the structure of the polycyclic aromatic compound ensures high efficiency and long lifetime of an organic electroluminescent device.

The polycyclic aromatic compound of Formula A-5 or A-7 can be employed in an organic electroluminescent device, achieving high efficiency and long lifetime of the device.

The use of the skeletal structure meets desired requirements of various organic layers of an organic electroluminescent device, achieving high efficiency and long lifetime of the device.

As used herein, the term "substituted" in the definition of R, and $R_1$ to $R_5$ indicates substitution with one or more substituents selected from the group consisting of deuterium, cyano, halogen, hydroxyl, nitro, $C_1$-$C_{24}$ alkyl, $C_3$-$C_{24}$ cycloalkyl, $C_1$-$C_{24}$ haloalkyl, $C_1$-$C_{24}$ alkenyl, $C_1$-$C_{24}$ alkynyl, $C_1$-$C_{24}$ heteroalkyl, $C_1$-$C_{24}$ heterocycloalkyl, $C_6$-$C_{24}$ aryl, $C_6$-$C_{24}$ arylalkyl, $C_2$-$C_{24}$ heteroaryl, $C_2$-$C_{24}$ heteroarylalkyl, $C_1$-$C_{24}$ alkoxy, $C_1$-$C_{24}$ alkylamino, $C_1$-$C_{24}$ arylamino, $C_1$-$C_{24}$ heteroarylamino, $C_1$-$C_{24}$ alkylsilyl, $C_1$-$C_{24}$ arylsilyl, and $C_1$-$C_{24}$ aryloxy, or a combination thereof. The term "unsubstituted" in the same definition indicates having no substituent.

In the "substituted or unsubstituted $C_1$-$C_{10}$ alkyl", "substituted or unsubstituted $C_6$-$C_{30}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent combines with an adjacent substituent to form a substituted or unsubstituted alicyclic or aromatic ring and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

In the present invention, the alkyl groups may be straight or branched. The number of carbon atoms in the alkyl groups is not particularly limited but is preferably from 1 to 20. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1- butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The cycloalkyl group is intended to include monocyclic and polycyclic ones and may be optionally substituted with one or more other substituents. As used herein, the term "polycyclic" means that the cycloalkyl group may be directly attached or fused to one or more other cyclic groups. The other cyclic groups may be cycloalkyl groups and other examples thereof include heterocycloalkyl, aryl, and heteroaryl groups. The cycloalkyl group may be specifically a cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl or cyclooctyl group but is not limited thereto.

The heterocycloalkyl group is intended to include monocyclic and polycyclic ones interrupted by a heteroatom such as O, S, Se, N or Si and may be optionally substituted with one or more other substituents. As used herein, the term "polycyclic" means that the heterocycloalkyl group may be directly attached or fused to one or more other cyclic groups. The other cyclic groups may be heterocycloalkyl groups and other examples thereof include cycloalkyl, aryl, and heteroaryl groups.

The aryl groups may be monocyclic or polycyclic ones. Examples of the monocyclic aryl groups include, but are not limited to, phenyl, biphenyl, terphenyl, and terphenyl groups. Examples of the polycyclic aryl groups include naphthyl, anthracenyl, phenanthrenyl, pyrenyl, perylenyl, tetracenyl, chrysenyl, fluorenyl, acenaphathcenyl, triphenylene, and fluoranthrene groups but the scope of the present invention is not limited thereto.

The heteroaryl groups refer to heterocyclic groups interrupted by one or more heteroatoms. Examples of the heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

As used herein, the term "mixed aliphatic-aromatic cyclic group" refers to a ring structure in which at least one aliphatic ring and at least one aromatic ring are linked and fused together and which is overall non-aromatic. The mixed aliphatic-aromatic polycyclic group may include one or more heteroatoms selected from N, O, P, and S other than carbon atoms.

The alkoxy group may be specifically a methoxy, ethoxy, propoxy, isobutyloxy, sec-butyloxy, pentyloxy, iso-amyloxy or hexyloxy group, but is not limited thereto.

The silyl group is intended to include alkyl-substituted silyl groups and aryl-substituted silyl groups. Specific examples of such silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine groups may be, for example, $—NH_2$, alkylamine groups, and arylamine groups. The arylamine groups are aryl-substituted amine groups and the alkylamine groups are alkyl-substituted amine groups. Examples of the arylamine groups include substituted or unsubstituted monoarylamine groups, substituted or unsubstituted diarylamine groups, and substituted or unsubstituted triarylamine groups. The aryl groups in the arylamine groups may be monocyclic or polycyclic ones. The arylamine groups may include two or more aryl groups. In this case, the aryl groups may be monocyclic aryl groups or polycyclic aryl groups. Alternatively, the aryl groups may consist of a monocyclic aryl group and a polycyclic aryl group. The aryl groups in the arylamine groups may be selected from those exemplified above.

The aryl groups in the aryloxy group and the arylthioxy group are the same as those described above. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, I-phenanthryloxy, 3-phenanthryloxy, and 9-phenanthryloxy groups. The arylthioxy group may be, for example, a phenylthioxy, 2-methylphenylthioxy or 4-tert-butylphenylthioxy group but is not limited thereto.

The halogen group may be, for example, fluorine, chlorine, bromine or iodine.

More specifically, the polycyclic aromatic compound represented by Formula A-7 may be selected from the following compounds:

5

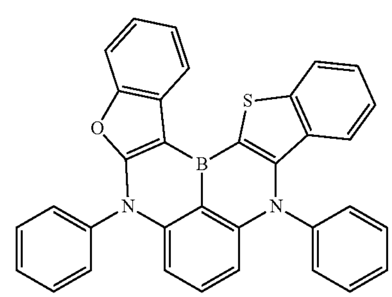

6

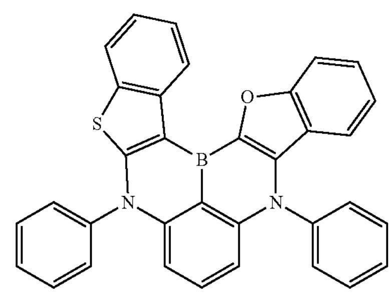

7
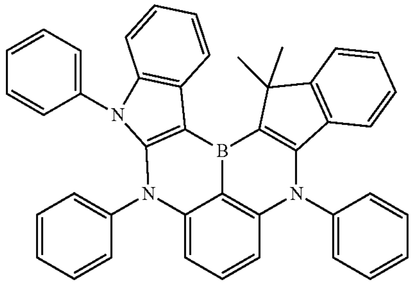
8
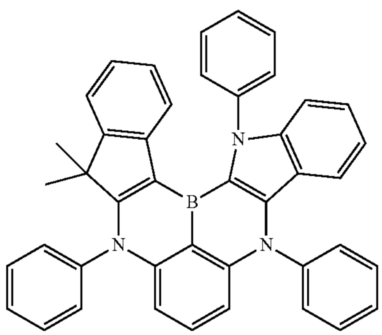
9
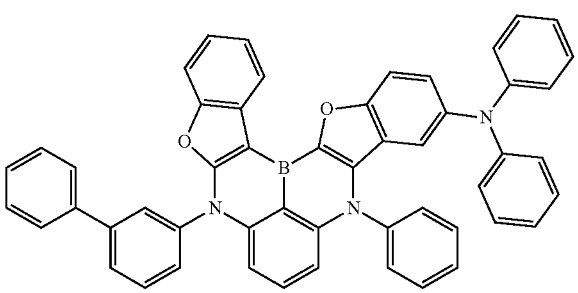
10
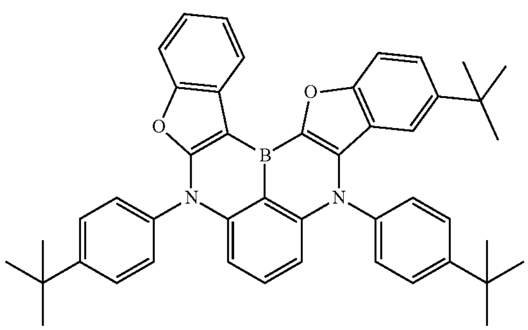
11
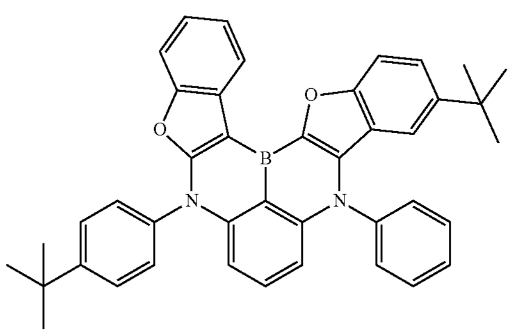
12
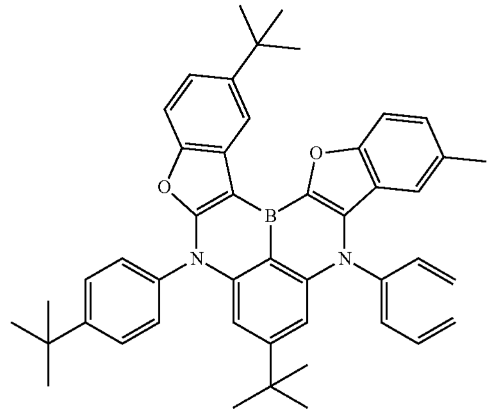
13
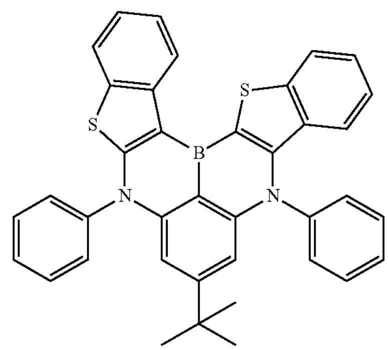
14
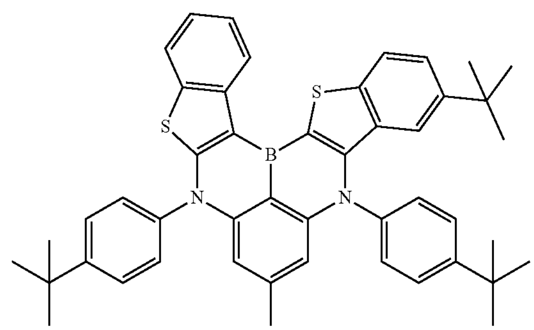
15
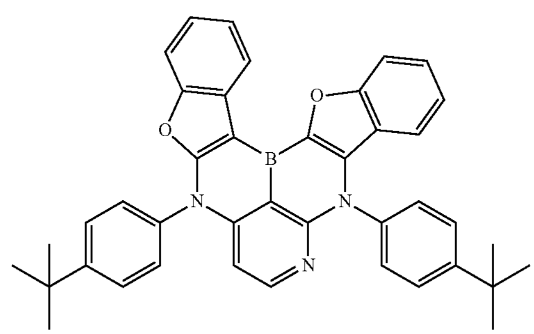

-continued
16
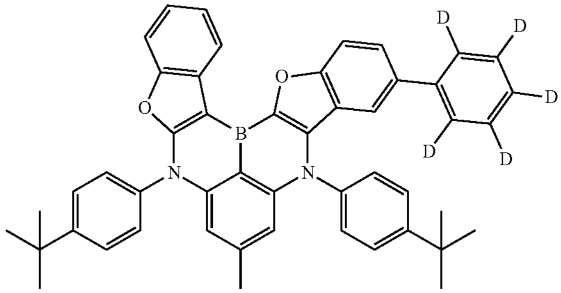
17
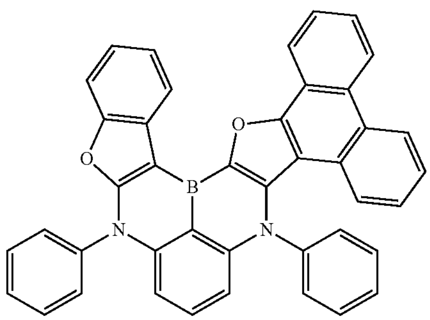
18
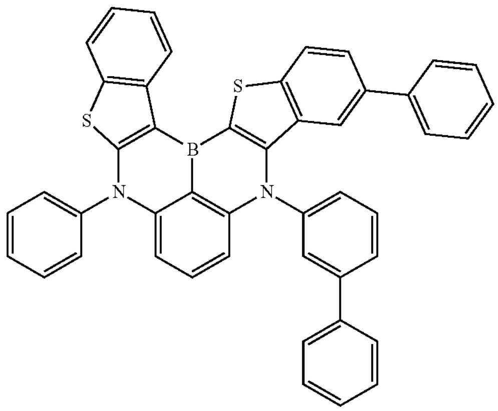
19
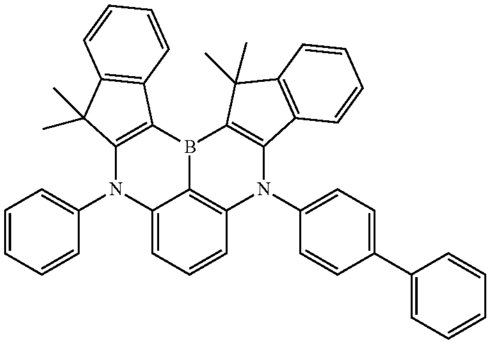
-continued
20
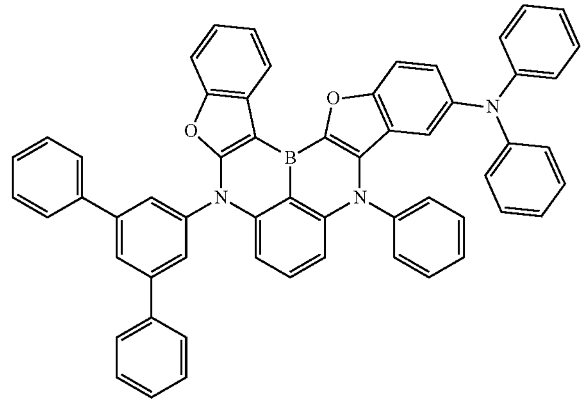
21
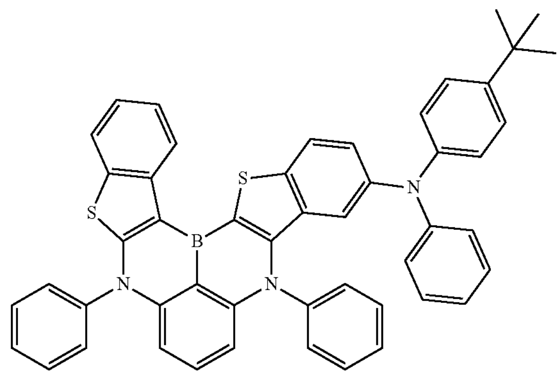
22
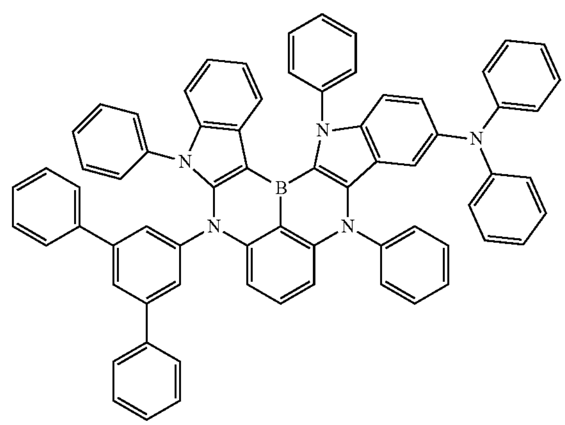
23
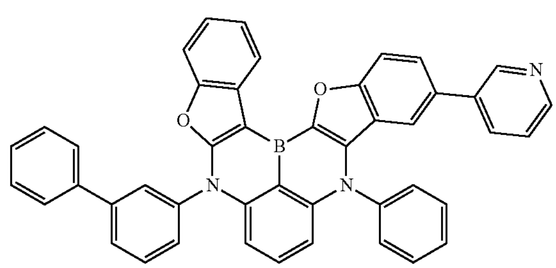

24
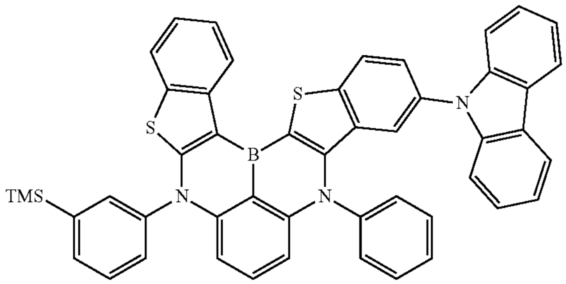
25
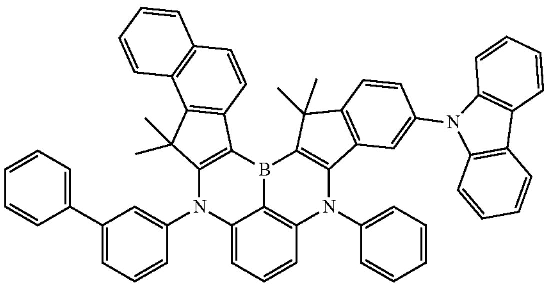
26
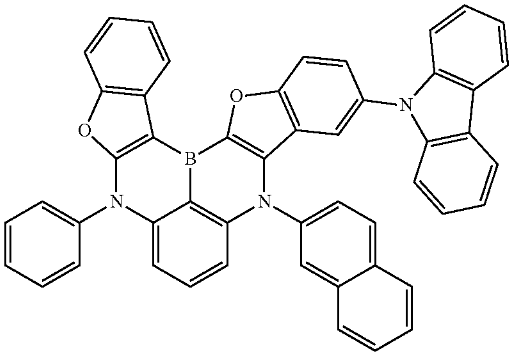
27
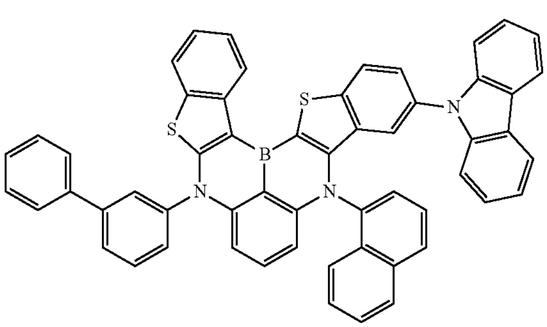
28
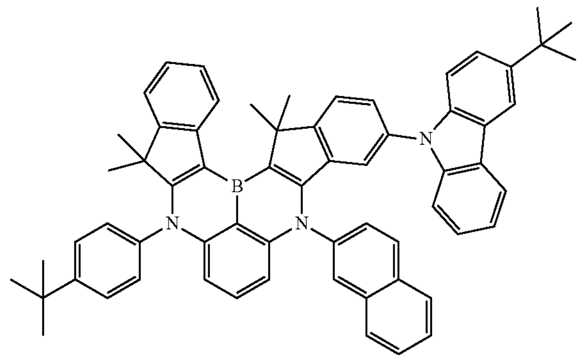
29
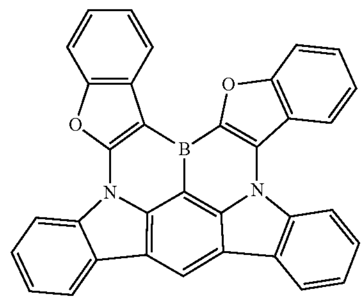
30
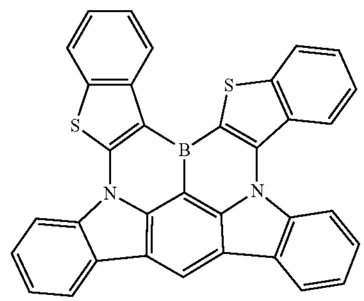
31
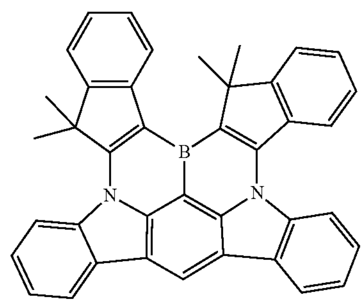
32
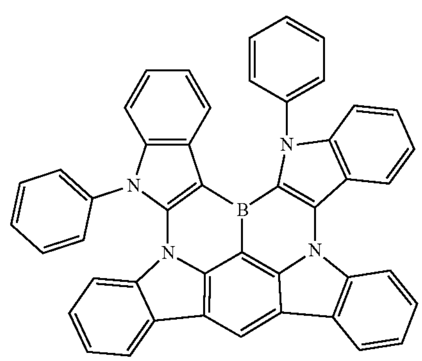

-continued
33
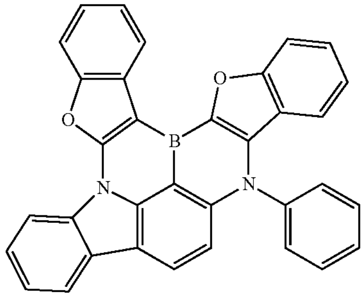
34
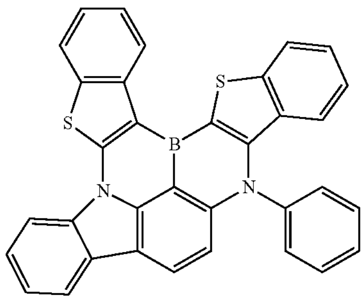
35
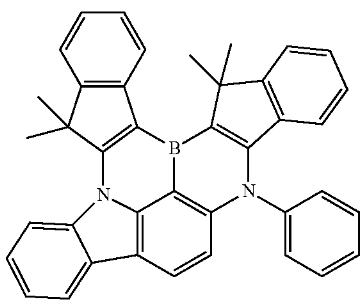
36
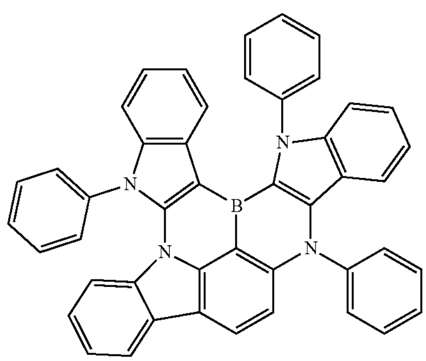
37
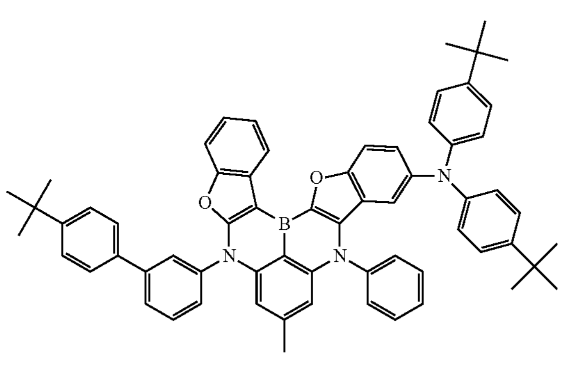
-continued
38
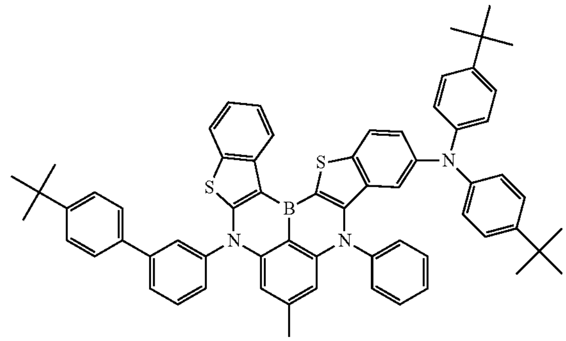
39
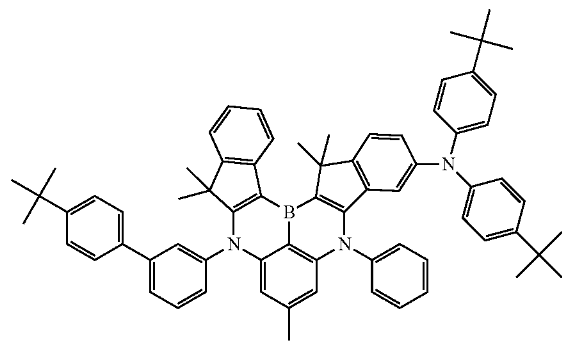
40
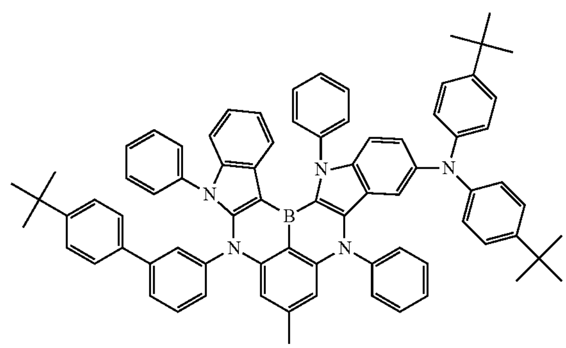
41
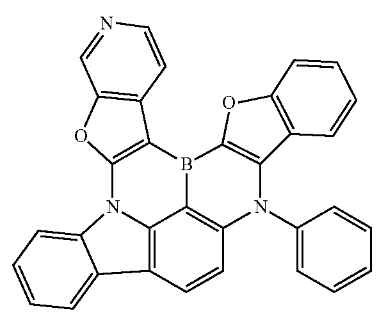

-continued
42
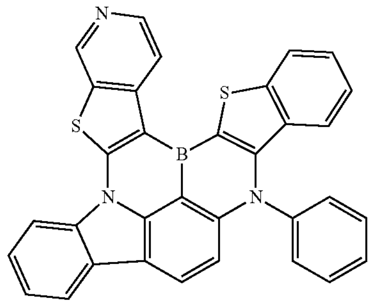
43
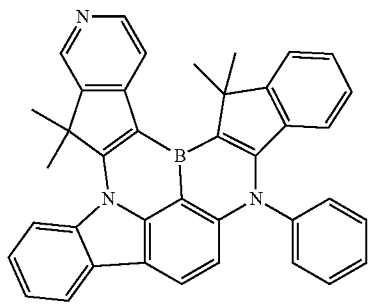
44
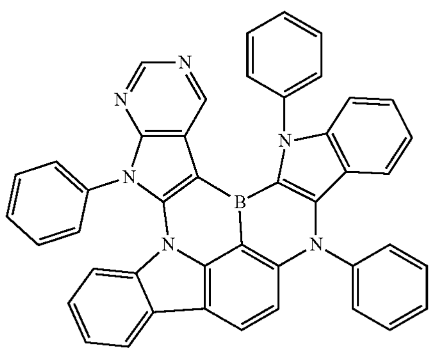
45
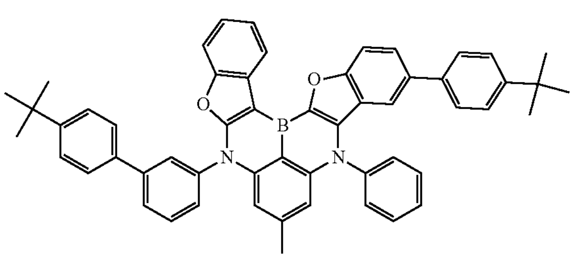
46
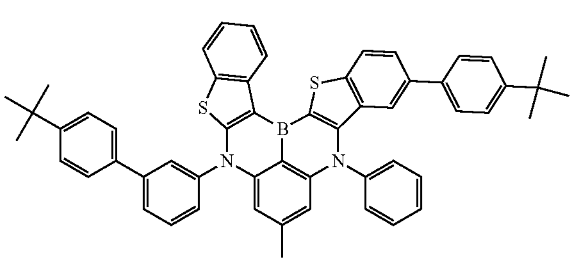
-continued
47
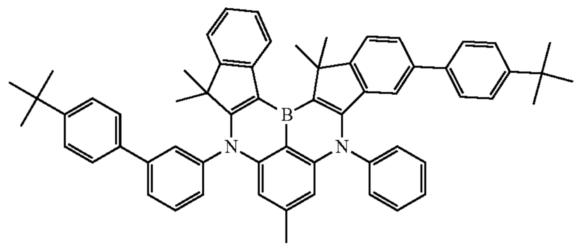
48
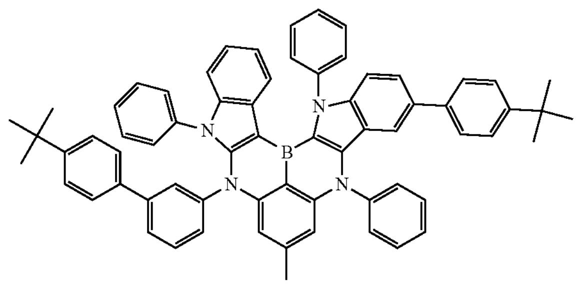
49
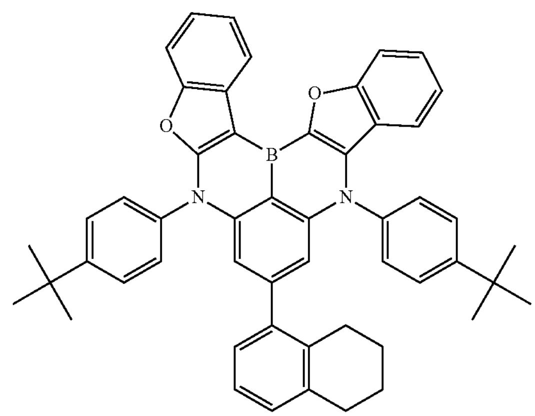
50
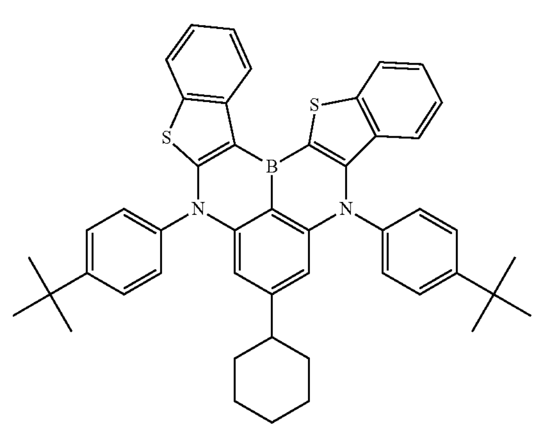

-continued
51
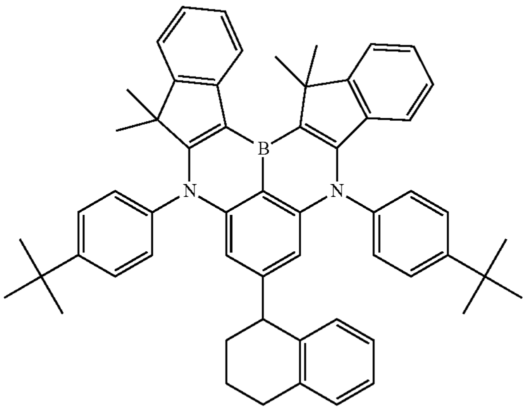
52
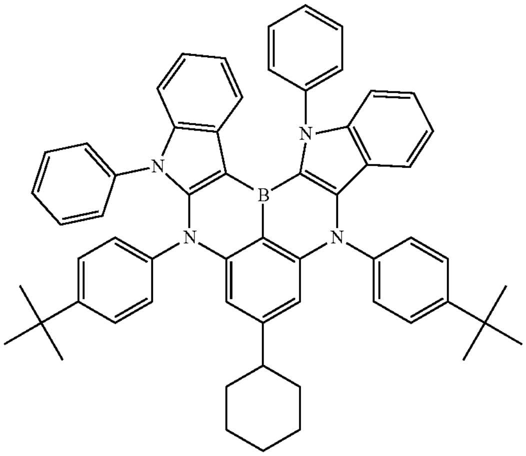
53
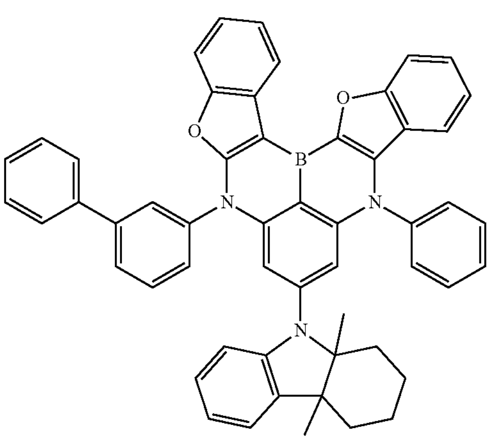
-continued
54
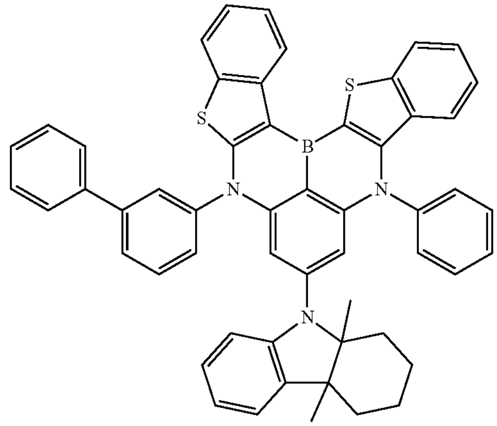
55
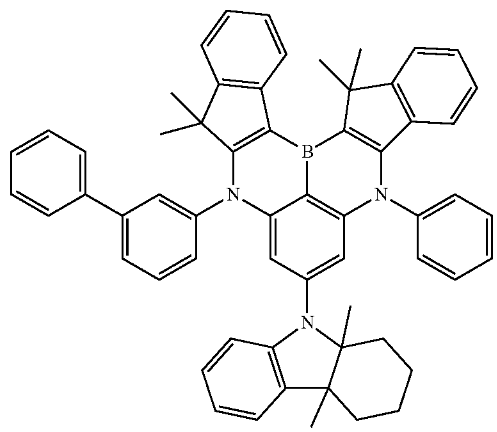
56
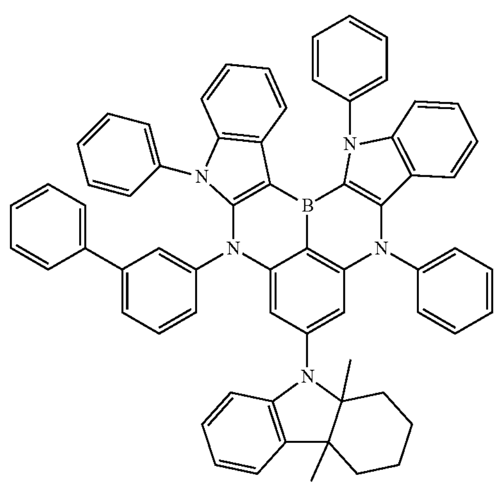

-continued
57
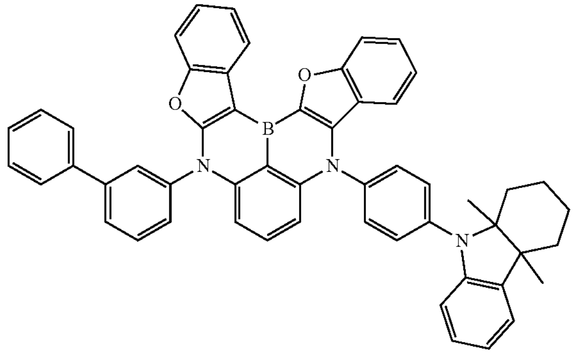
58
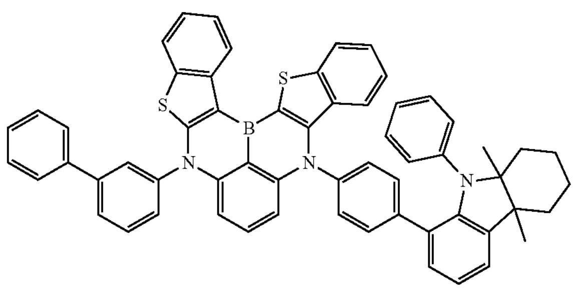
59
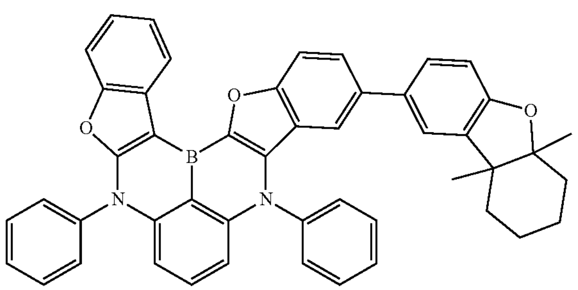
60
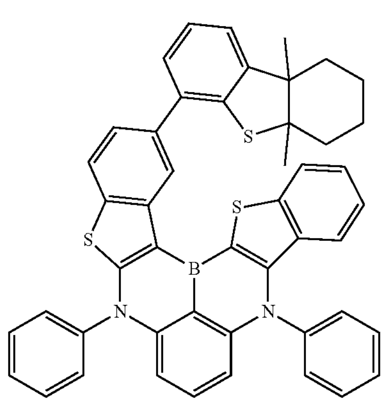
-continued
61
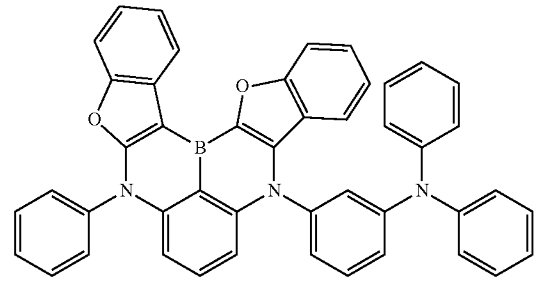
62
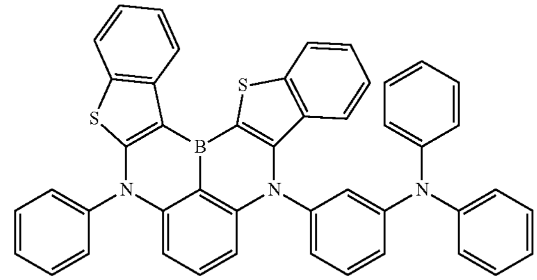
63
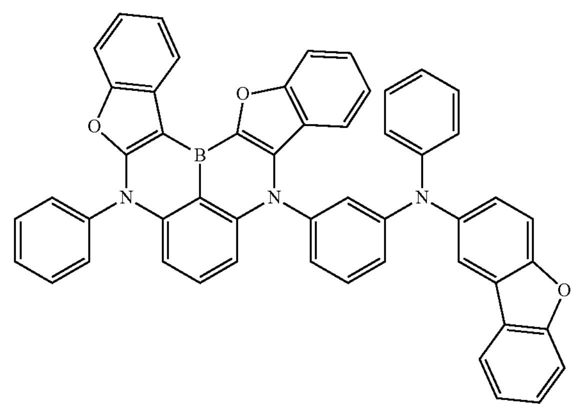
64
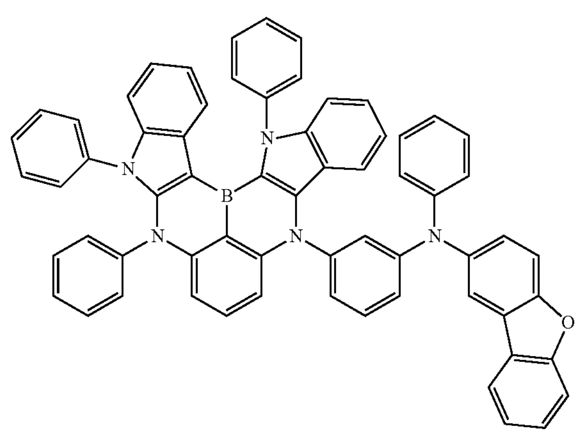

-continued
65
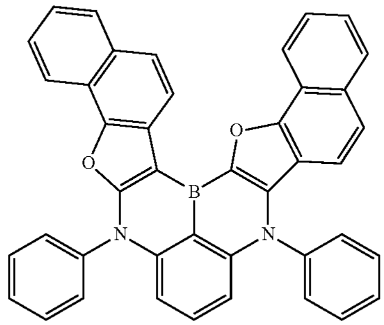
66
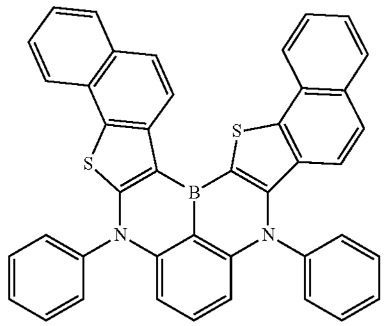
67
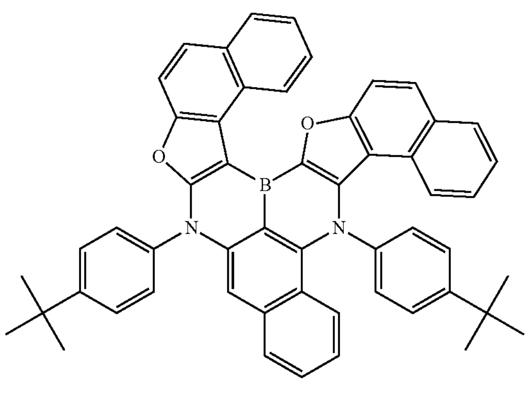
68
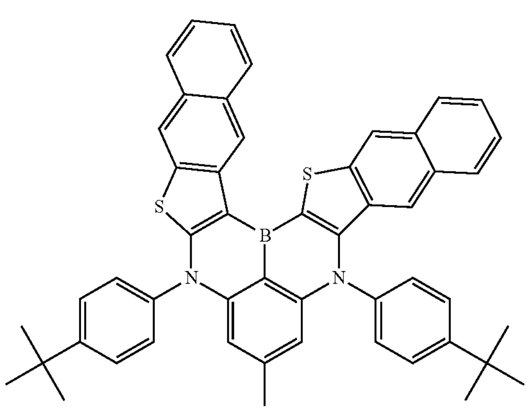
-continued
69
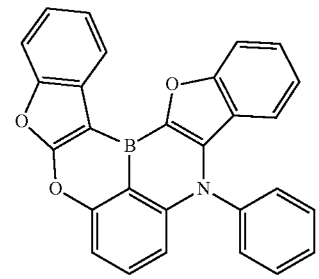
70
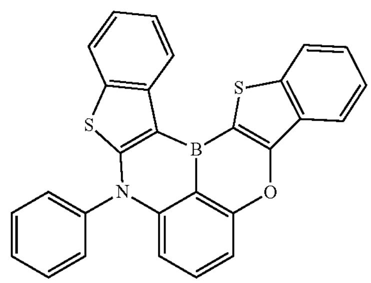
71
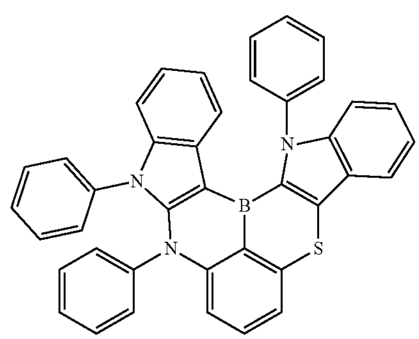
72
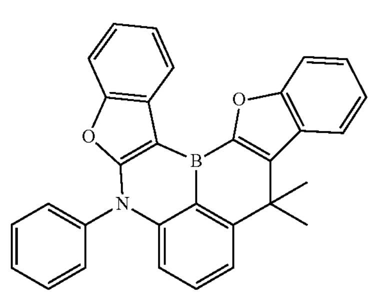

-continued
73
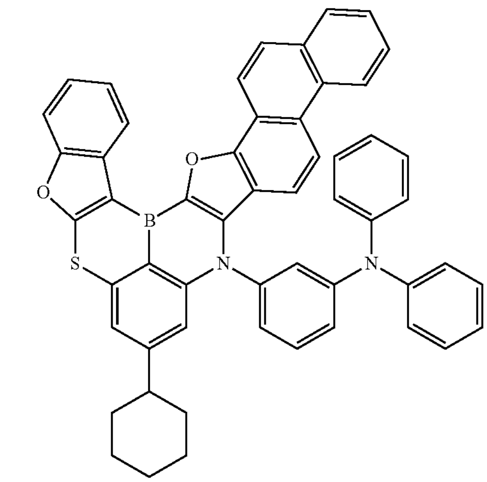
74
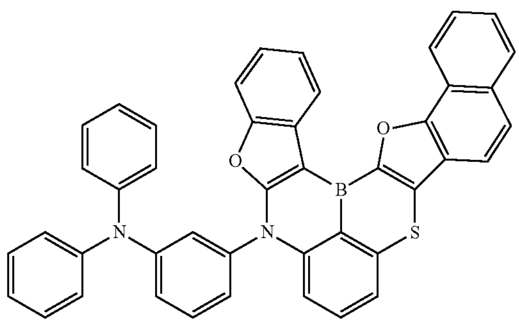
75
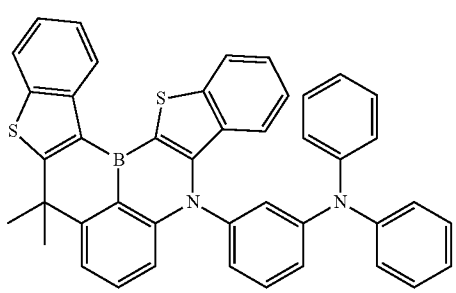
76
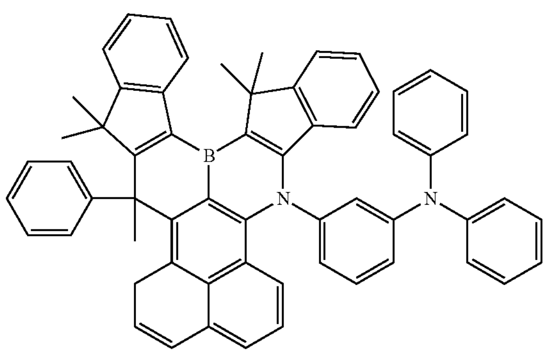
-continued
77
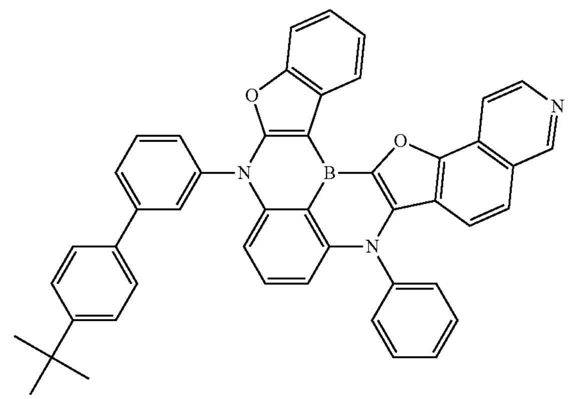
78
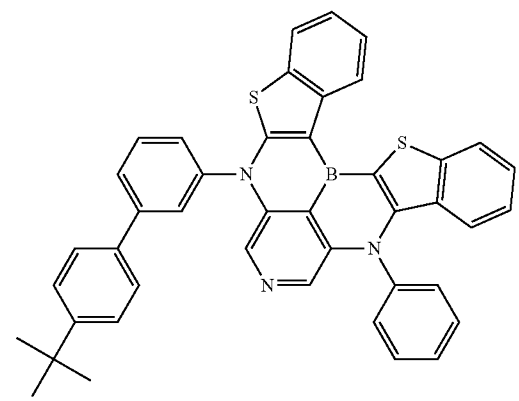
79
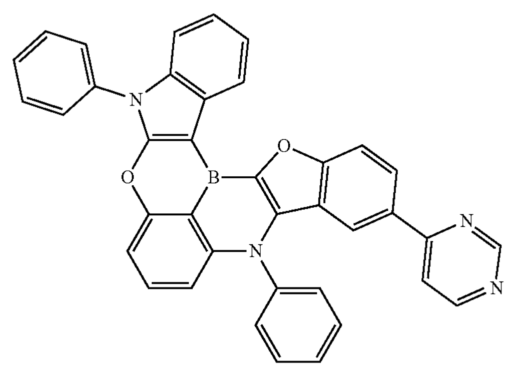
80
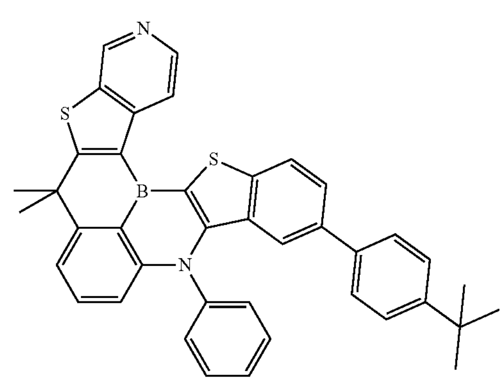

-continued
81
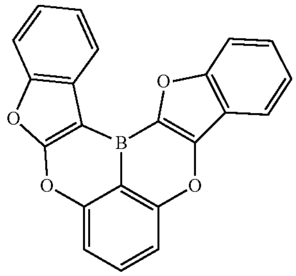
82
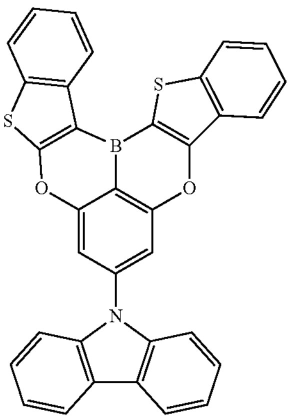
83
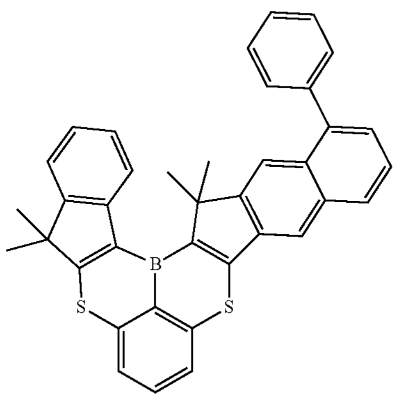
84
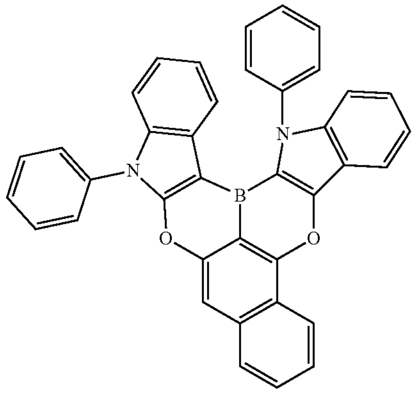
-continued
85
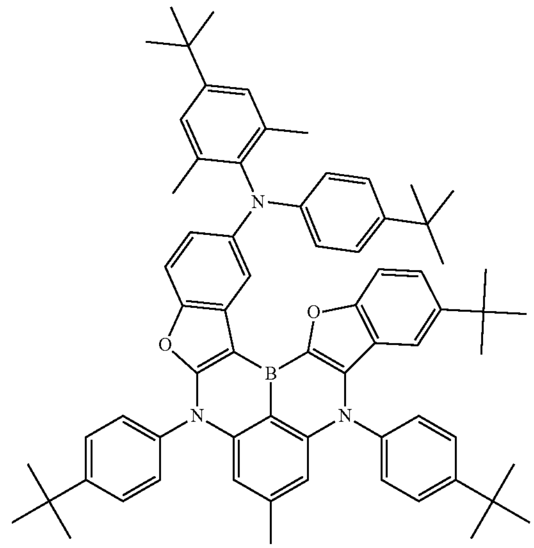
86
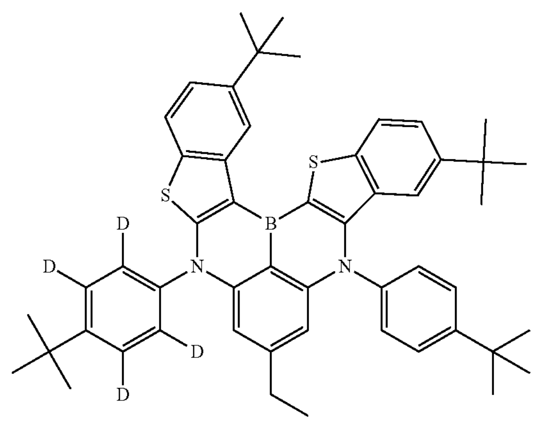
87
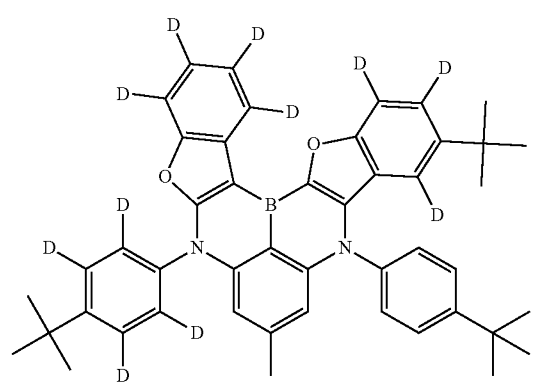

-continued
88
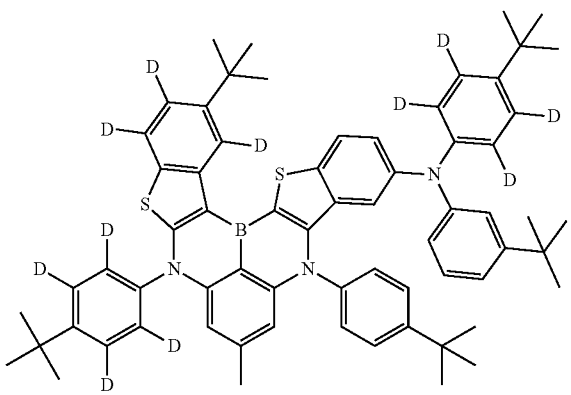
89
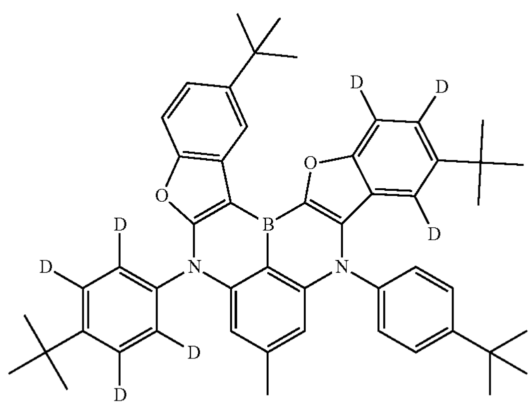
90
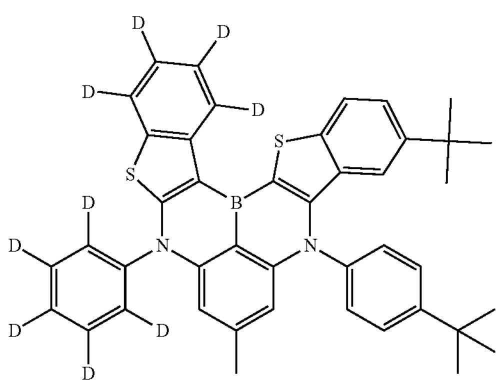
91
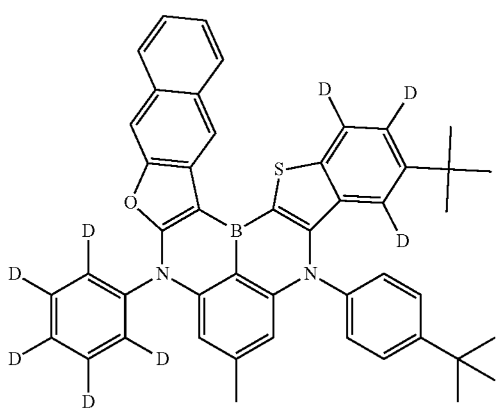
-continued
92
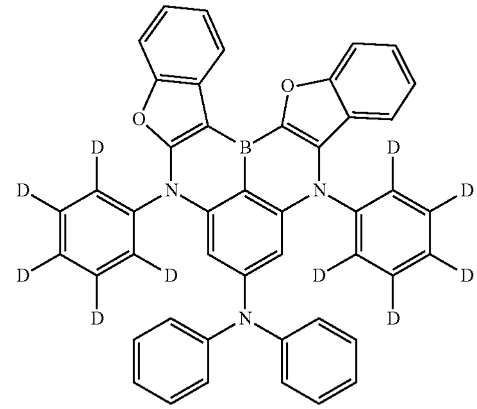
93
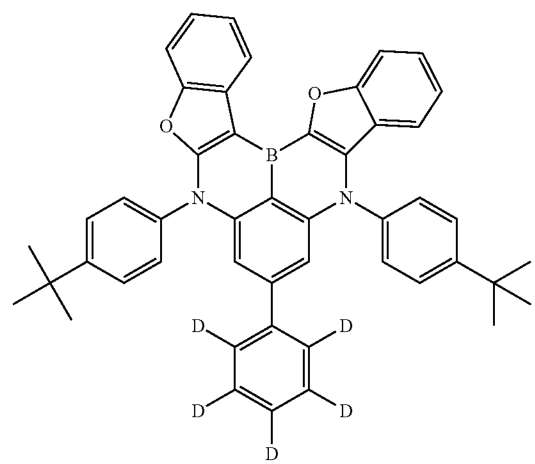
94
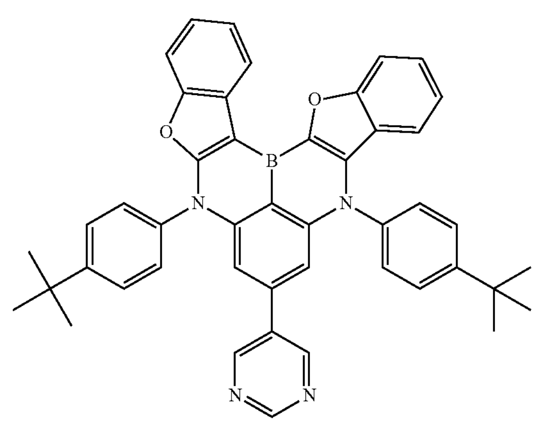

95
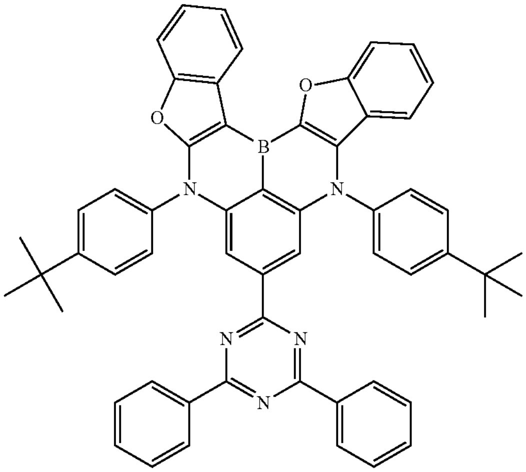
96
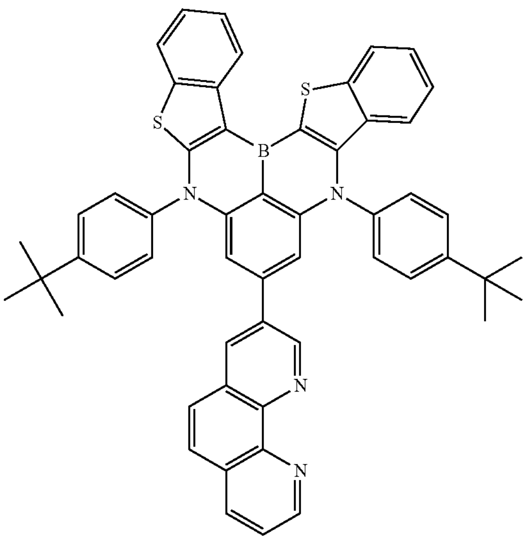
97
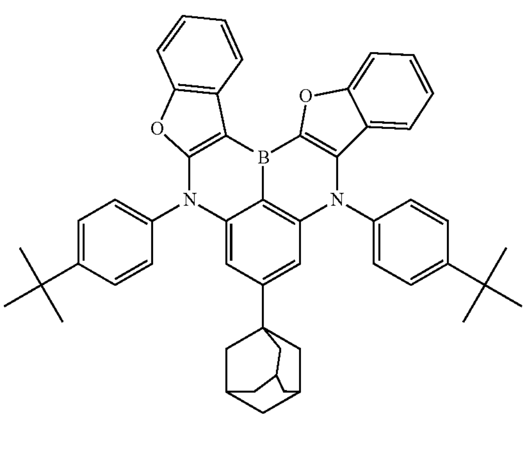
98
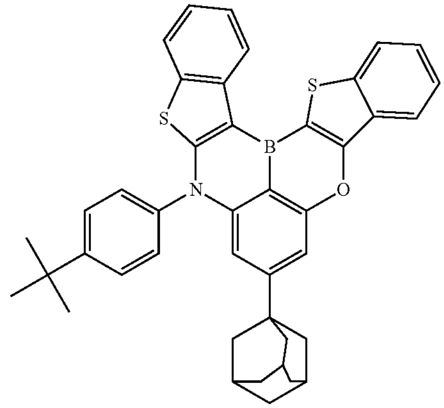
99
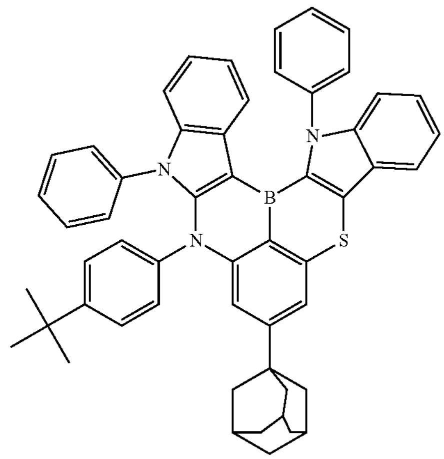
100
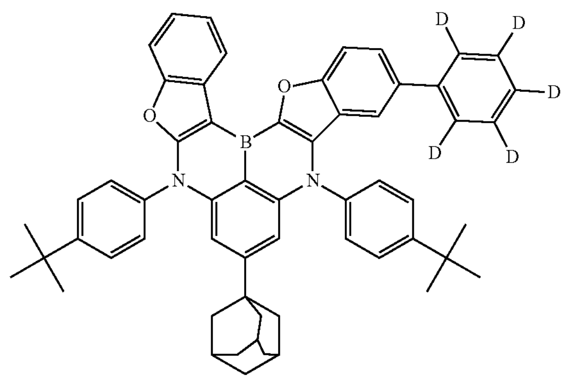
101
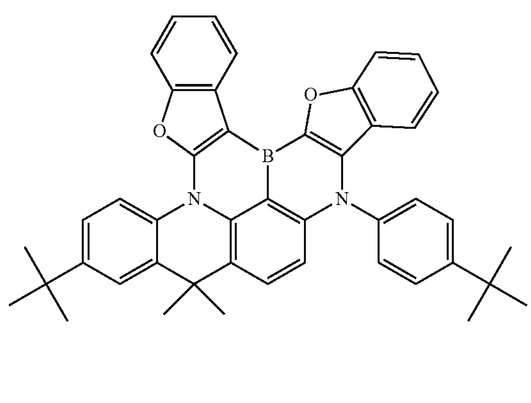

102
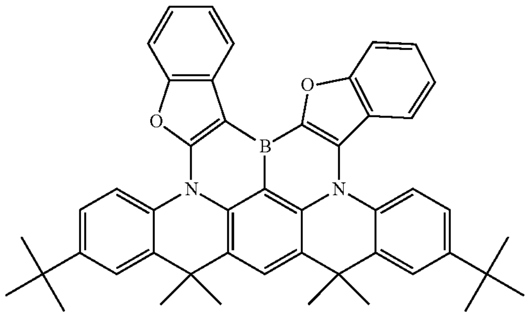
103
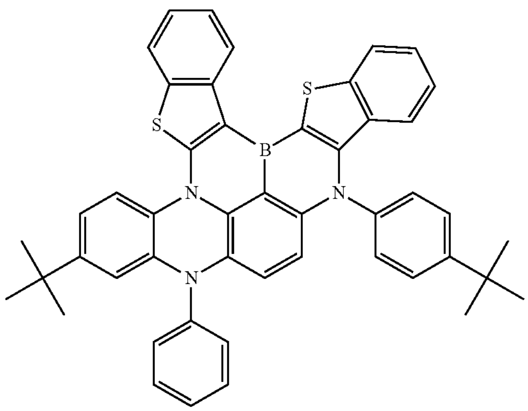
104
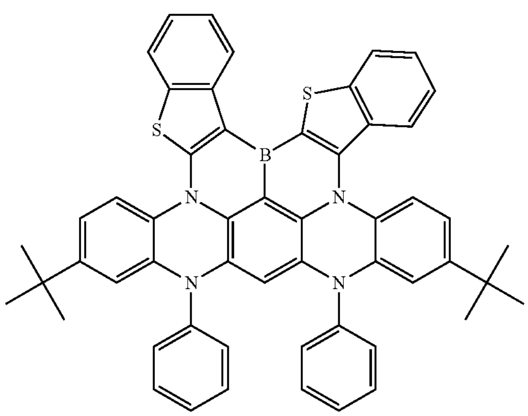
105
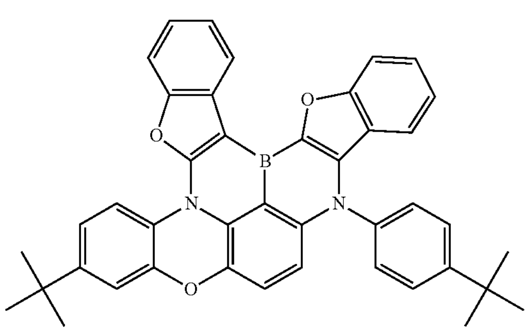
106
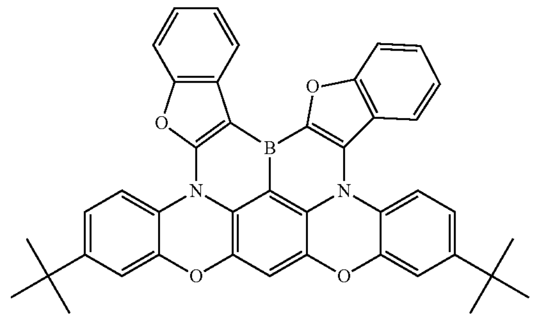
107
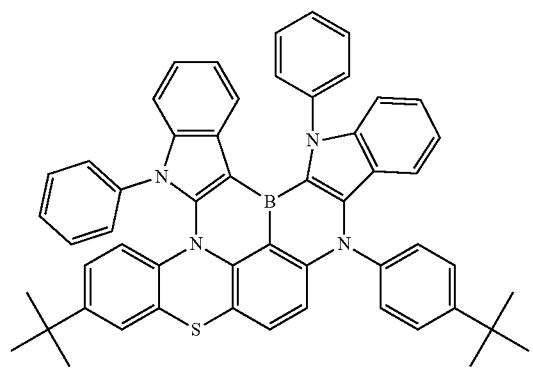
108
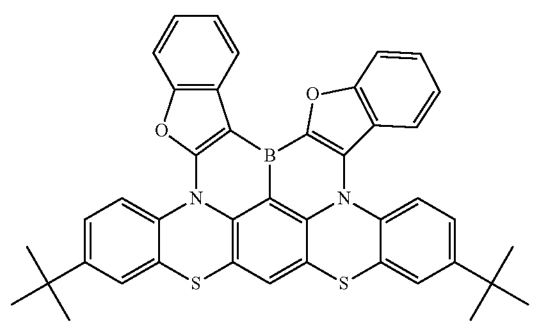
109
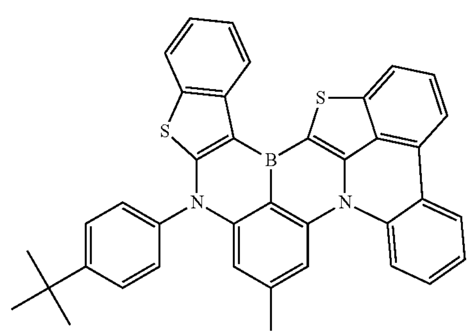

-continued
110
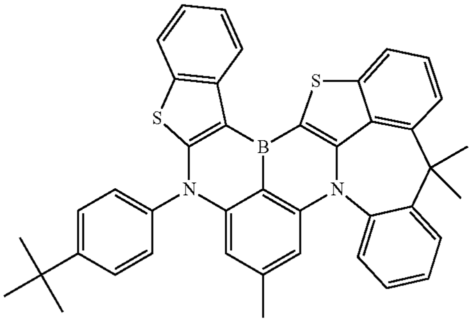
111
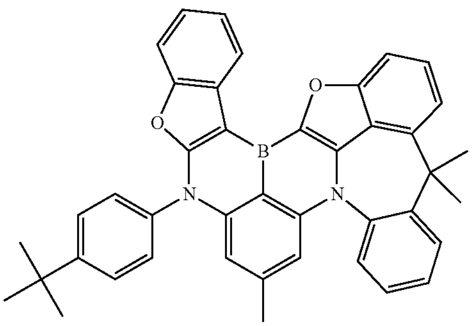
112
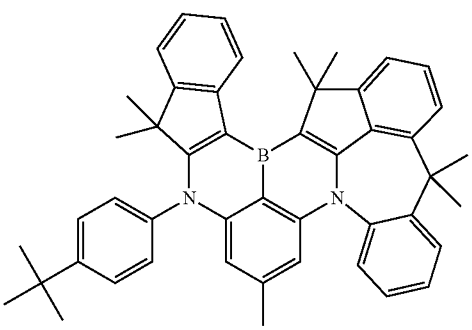
113
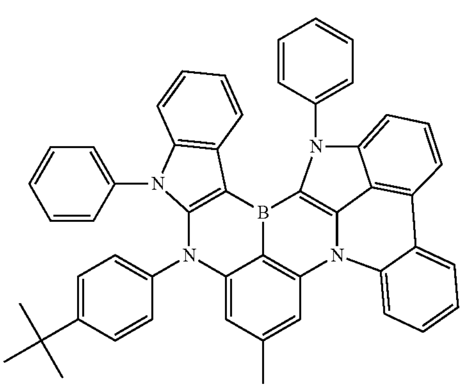
-continued
114
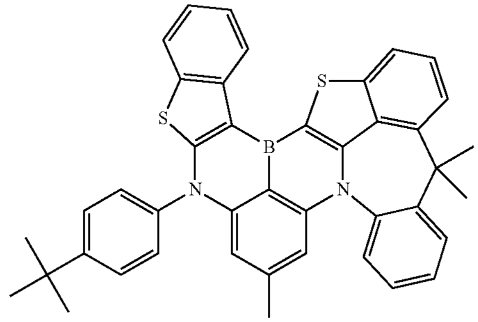
115
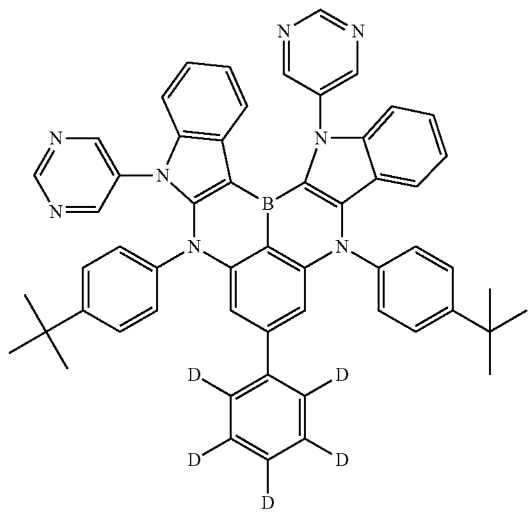
116
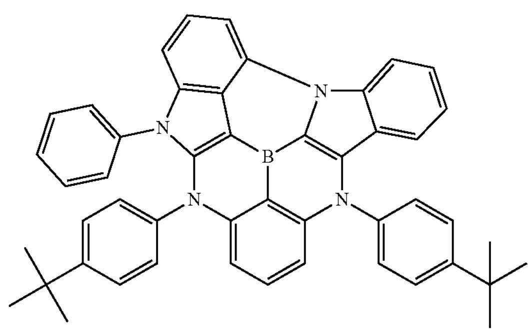
117
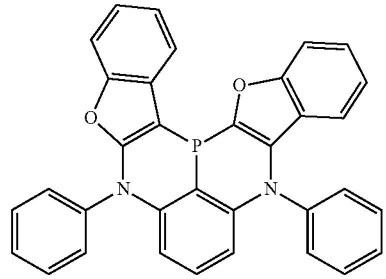

-continued
118
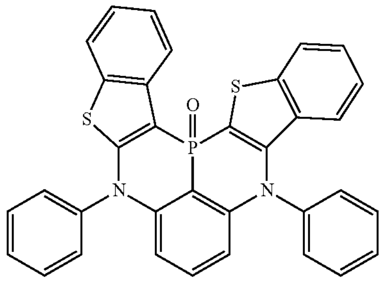
119
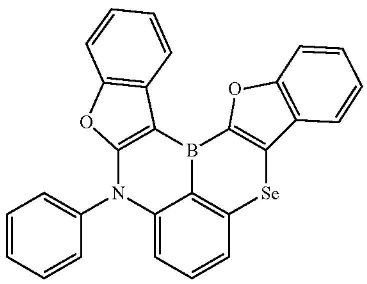
120
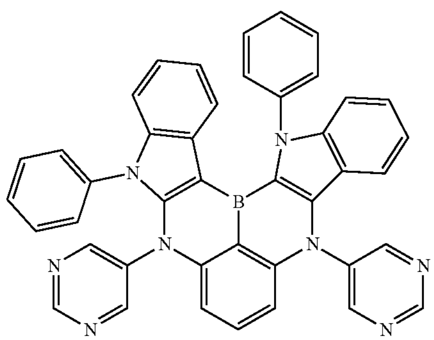
121
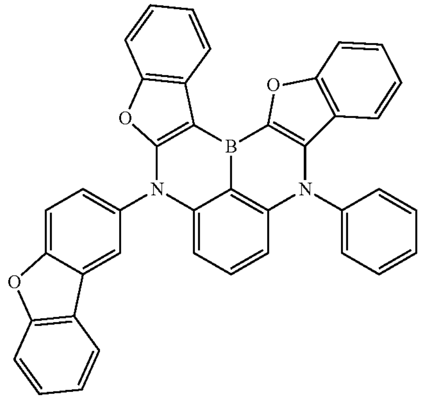
-continued
122
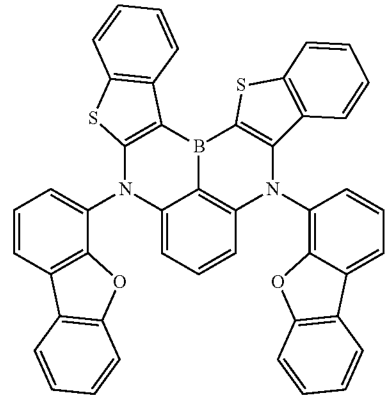
123
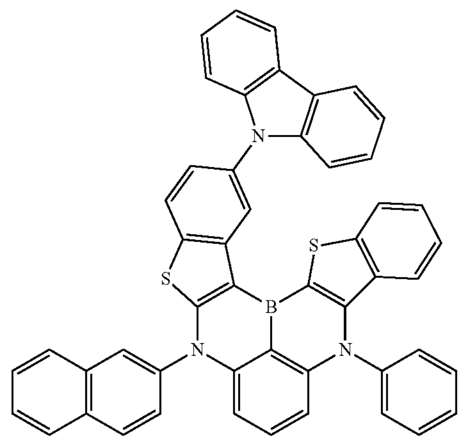
124
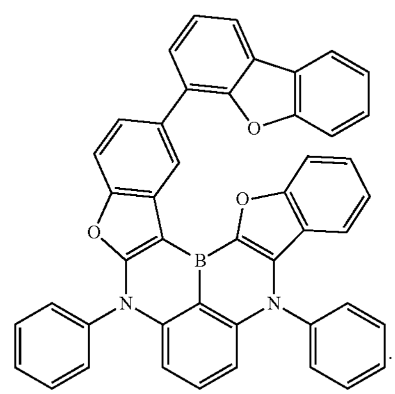
More specifically, the polycyclic aromatic compound represented by Formula A-5 may be selected from the following compounds:
125
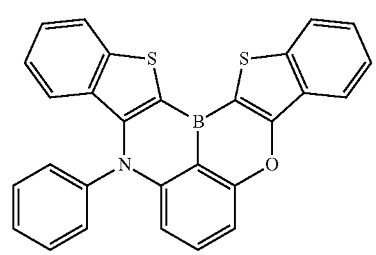

126
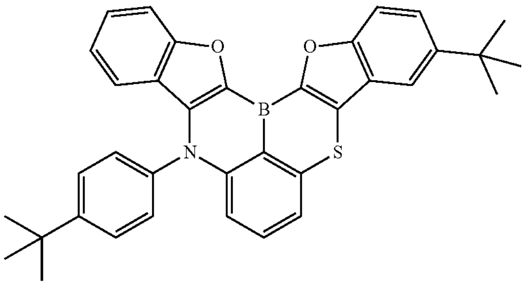
127
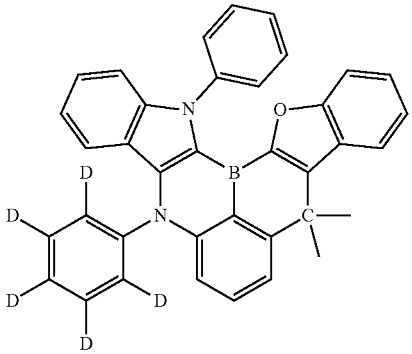
128
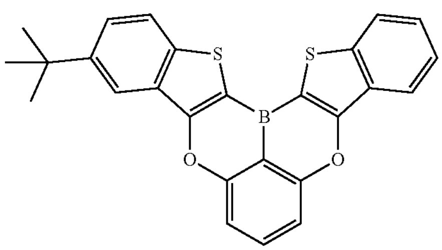
129
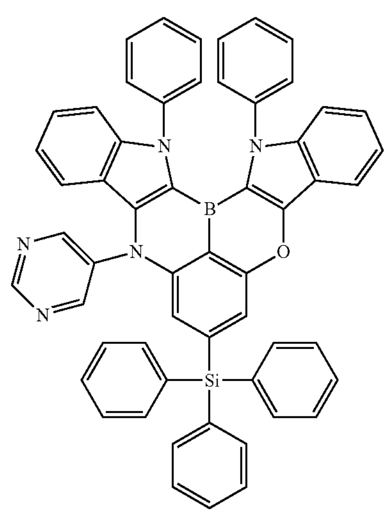
130
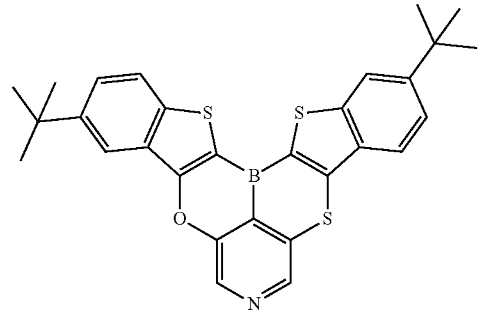
131
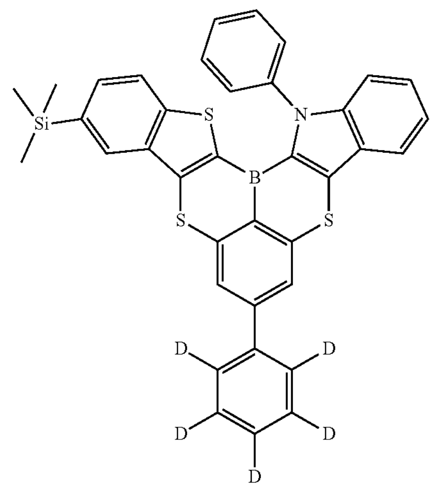
132
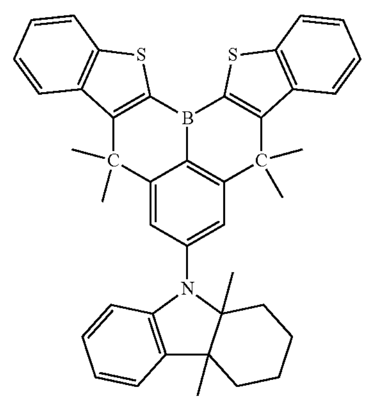
123
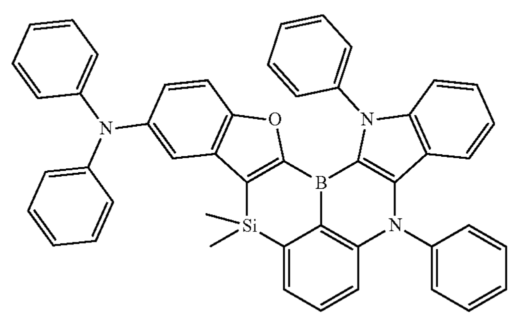

-continued

134

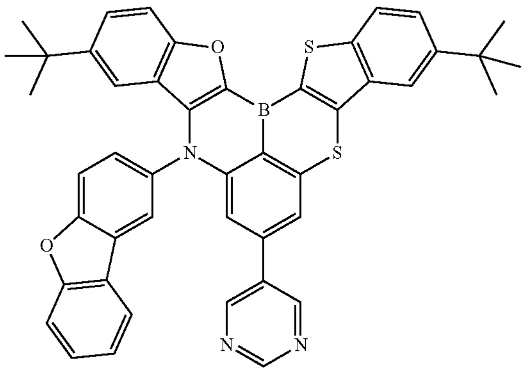

135

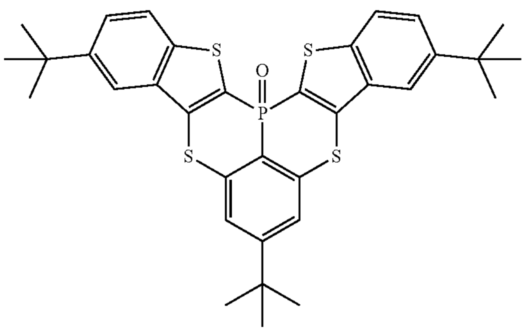

136

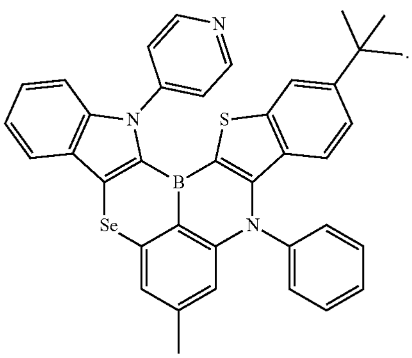

The specific examples of the substituents defined above can be found in the compounds of Formulae i to 136 but are not intended to limit the scope of the compound represented by Formula A-5 or A-7.

The introduction of substituents, including B, P or P=O, to form polycyclic aromatic structures allows the organic light emitting materials to have inherent characteristics of the substituents. For example, the introduced substituents may be those that are typically used in materials for hole injecting layers, hole transport layers, light emitting layers, electron transport layers, electron injecting layers, electron blocking layers, and hole blocking layers of organic electroluminescent devices. This introduction meets the requirements of the organic layers and enables the fabrication of highly efficient organic electroluminescent devices.

A further aspect of the present invention is directed to an organic electroluminescent device including a first electrode, a second electrode, and one or more organic layers interposed between the first and second electrodes wherein at least one of the organic layers includes the organic electroluminescent compound represented by Formula A-1 or A-2 and optionally another organic electroluminescent compound represented by Formula A-5 or A-7.

That is, according to one embodiment of the present invention, the organic electroluminescent device has a structure in which one or more organic layers are arranged between a first electrode and a second electrode. The organic electroluminescent device of the present invention may be fabricated by a suitable method known in the art using suitable materials known in the art, except that the organic electroluminescent compound of Formula A-5 or A-7 is used to form the corresponding organic layer.

The organic layers of the organic electroluminescent device according to the present invention may form a monolayer structure. Alternatively, the organic layers may have a multilayer laminate structure. For example, the structure of the organic layers may include a hole injecting layer, a hole transport layer, a hole blocking layer, a light emitting layer, an electron blocking layer, an electron transport layer, and an electron injecting layer, but is not limited thereto. The number of the organic layers is not limited and may be increased or decreased. Preferred structures of the organic layers of the organic electroluminescent device according to the present invention will be explained in more detail in the Examples section that follows.

A more detailed description will be given concerning exemplary embodiments of the organic electroluminescent device according to the present invention.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer. The organic electroluminescent device of the present invention may further include one or more organic layers such as a capping layer that have various functions depending on the desired characteristics of the device.

The light emitting layer of the organic electroluminescent device according to the present invention includes, as a host compound, an anthracene derivative represented by Formula C:

(C)

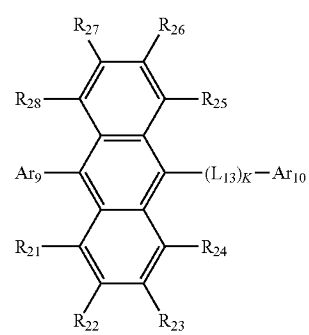

wherein $R_{21}$ to $R_{28}$ are identical to or different from each other and are as defined for $R_1$ to $R_5$ in Formula A-5 or A-7, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, preferably a single bond or substituted or unsubstituted $C_6$-$C_{20}$ arylene, and k is an integer from 1 to 3, provided that when k is 2 or more, the linkers $L_{13}$ are identical to or different from each other.

$Ar_9$ in Formula C is represented by Formula C-1:

(C-1)

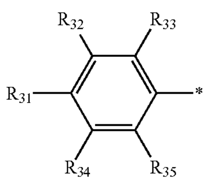

wherein $R_{31}$ to $R_{35}$ are identical to or different from each other and are as defined for $R_1$ to $R_5$ in Formula A-5 or A-7, and each of $R_{31}$ to $R_{35}$ is optionally bonded to an adjacent substituent to form a saturated or unsaturated ring.

The compound of Formula C employed in the organic electroluminescent device of the present invention may be specifically selected from the compounds of Formulae C1 to C48:

C1

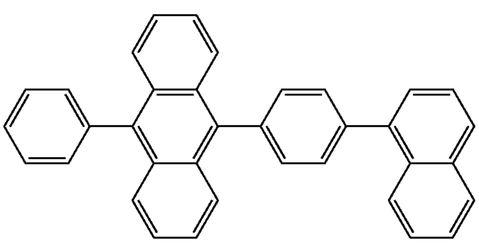

C2

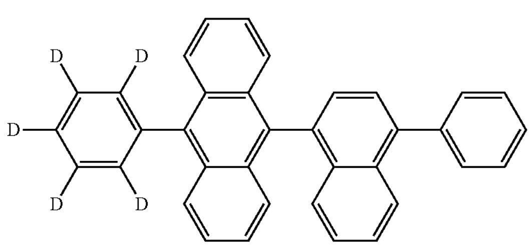

-continued

C3

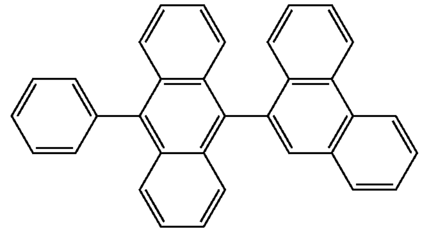

C4

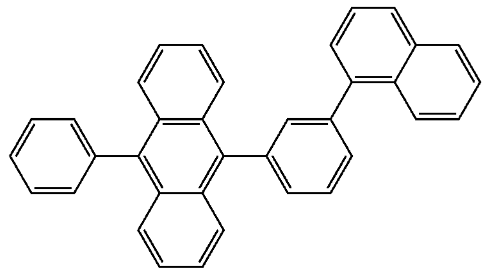

C5

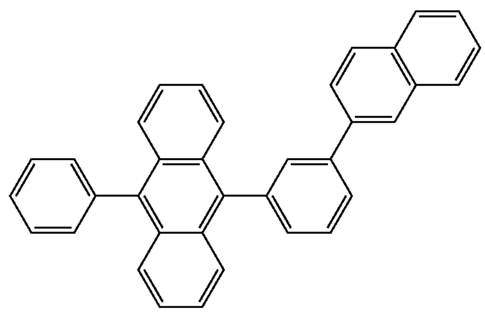

C6

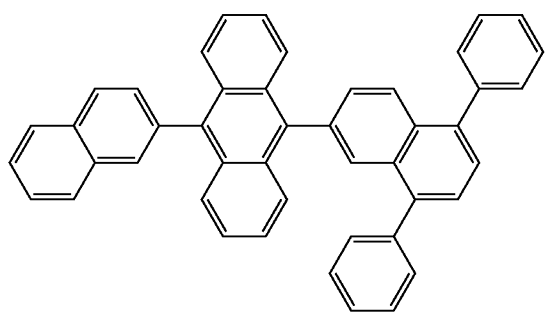

C7

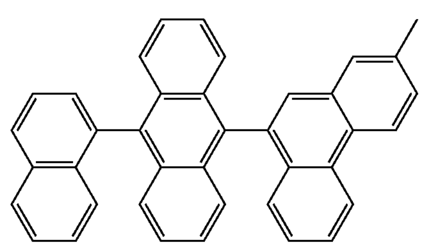

-continued
C8
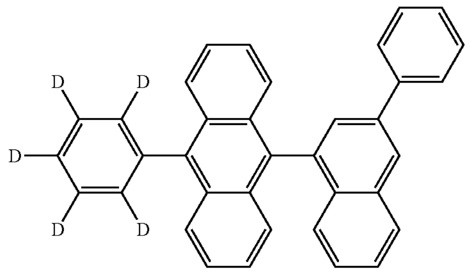
C9
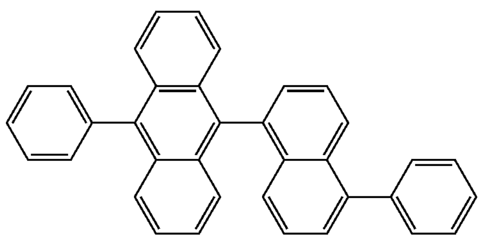
C10
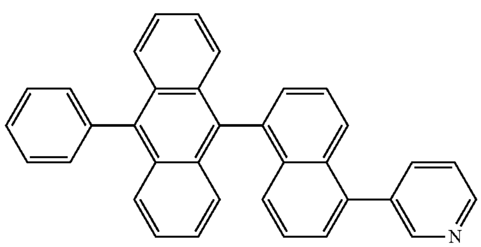
C11
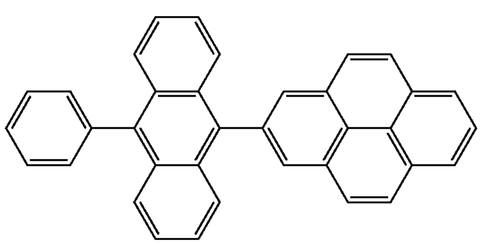
C12
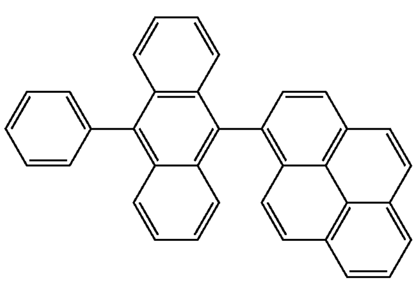
C13
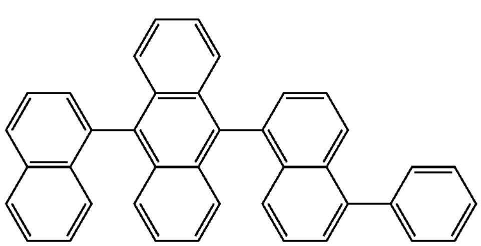
-continued
C14
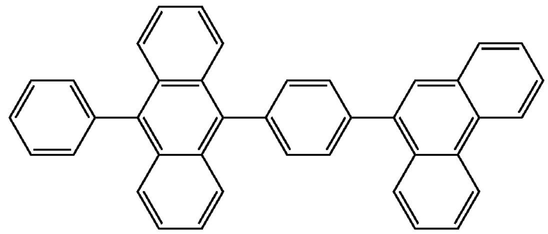
C15
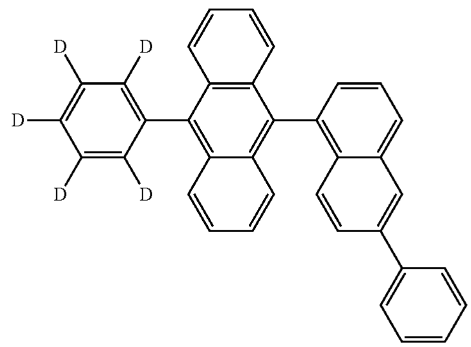
C16
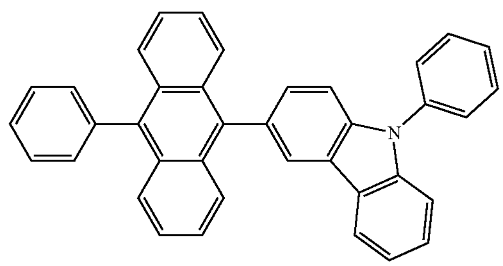
C17
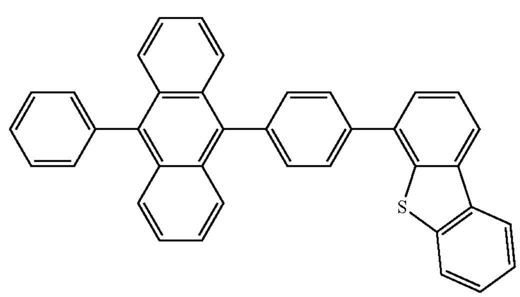
C18
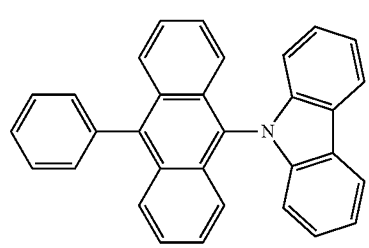

-continued
C19
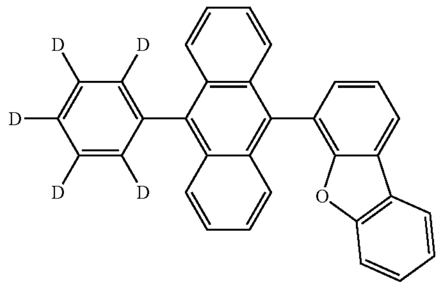
C20
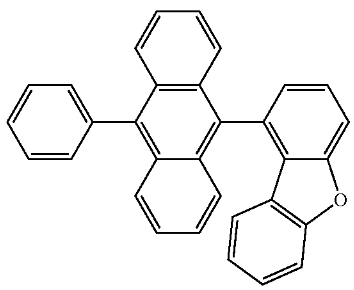
C21
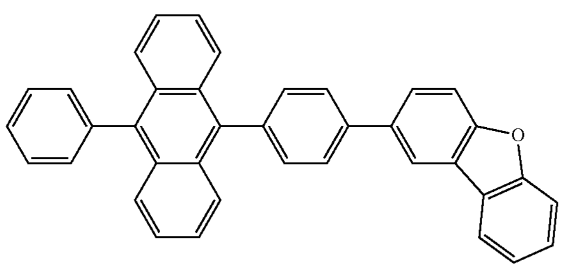
C22
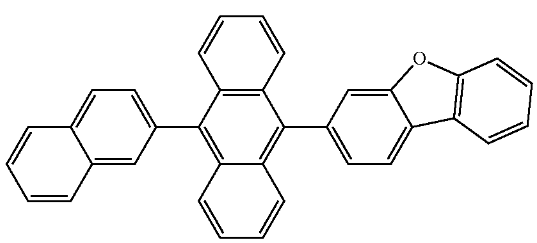
C23
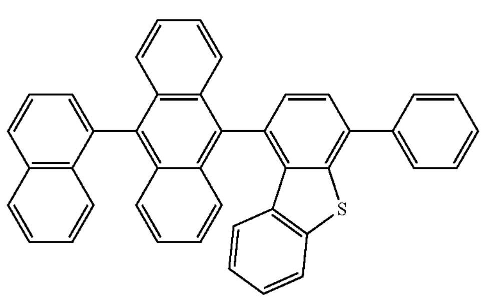
-continued
C24
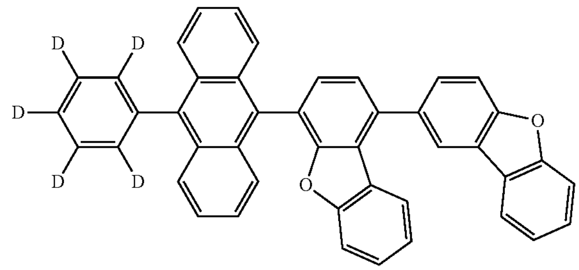
C25
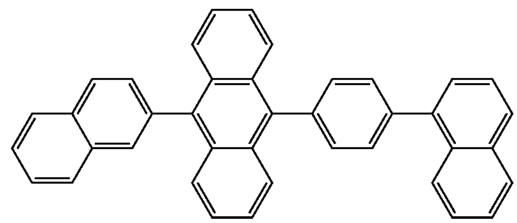
C26
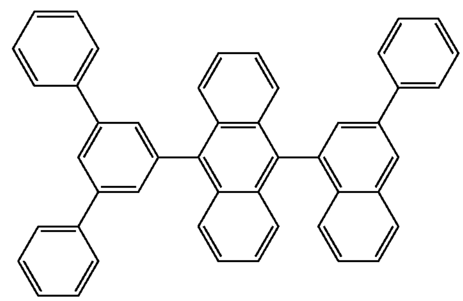
C27
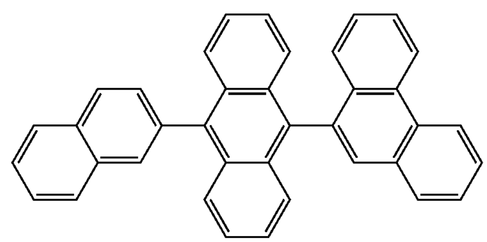
C28
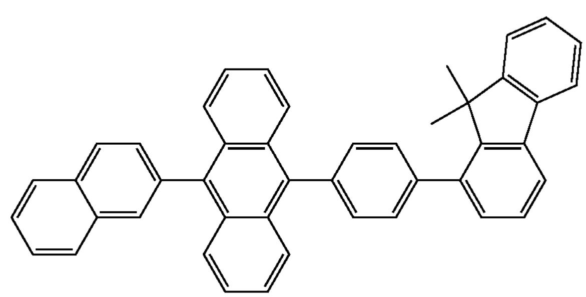
C29
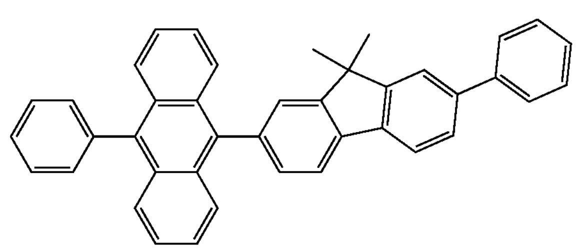

-continued
C30
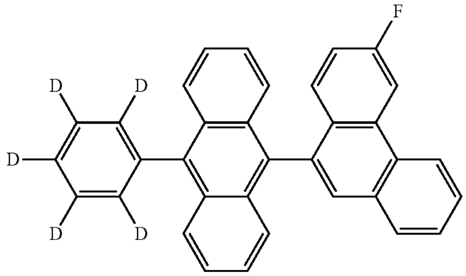
C31
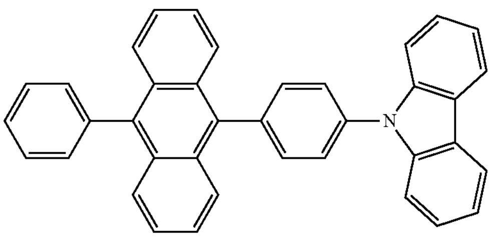
C32
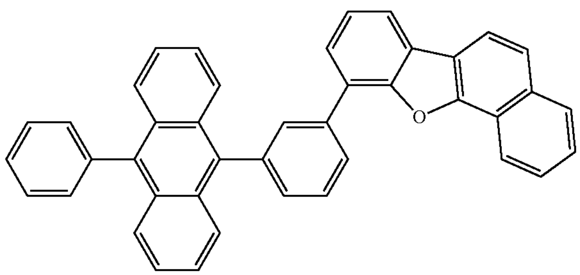
C33
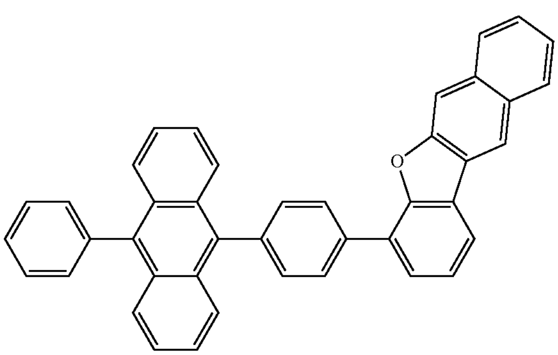
C34
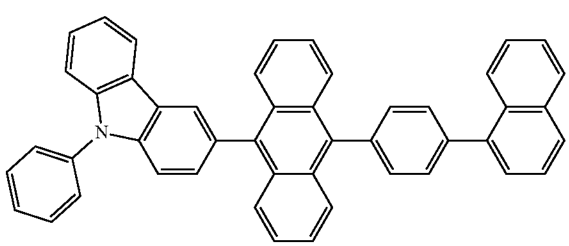
-continued
C35
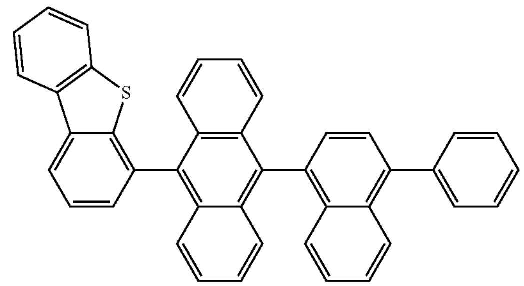
C36
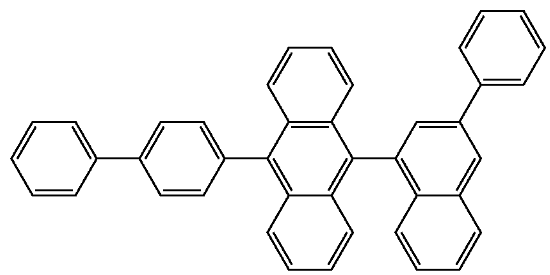
C37
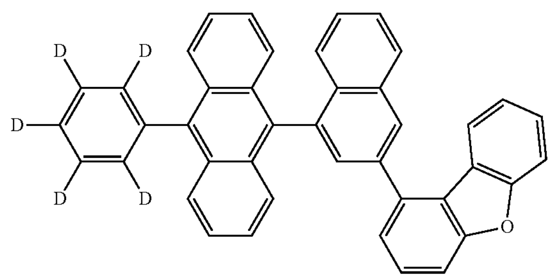
C38
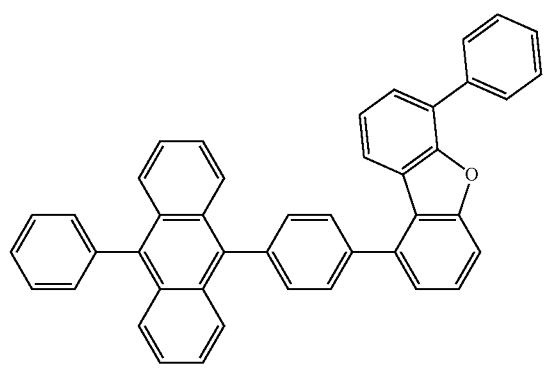
C39
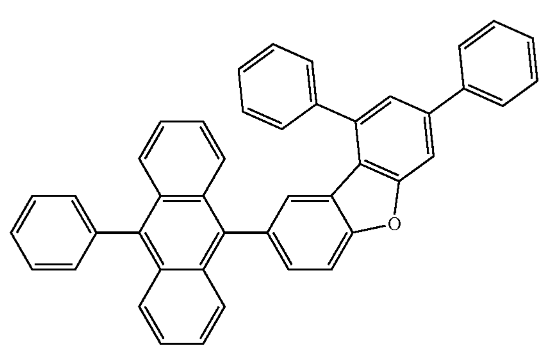

-continued
C40
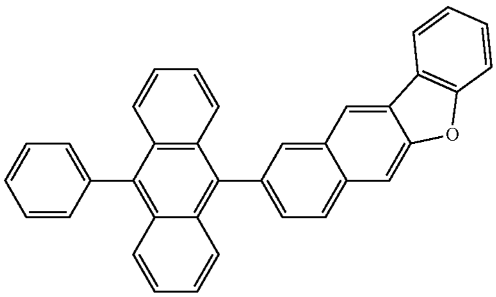
C41
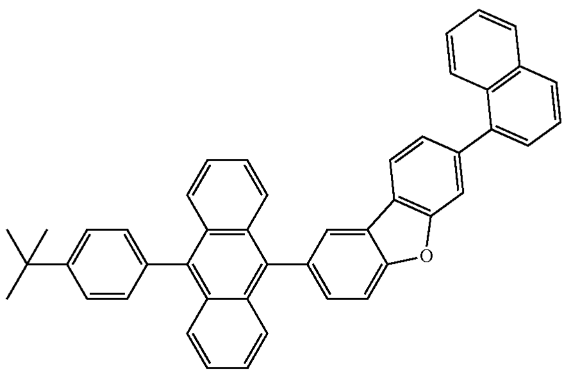
C42
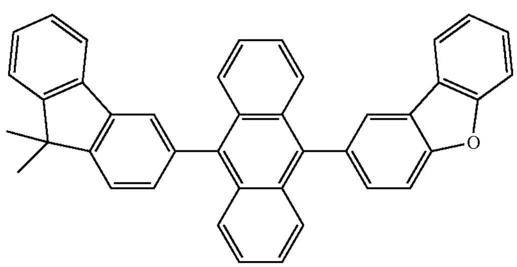
C43
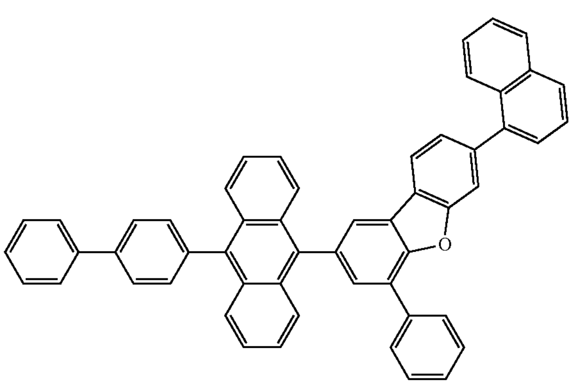
-continued
C44
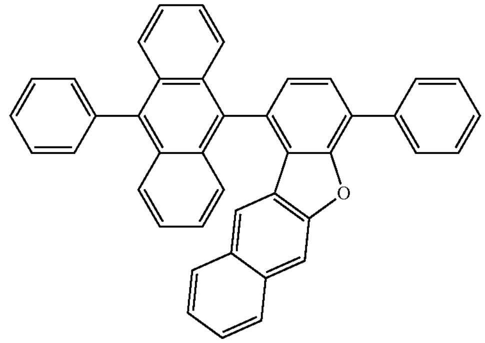
C45
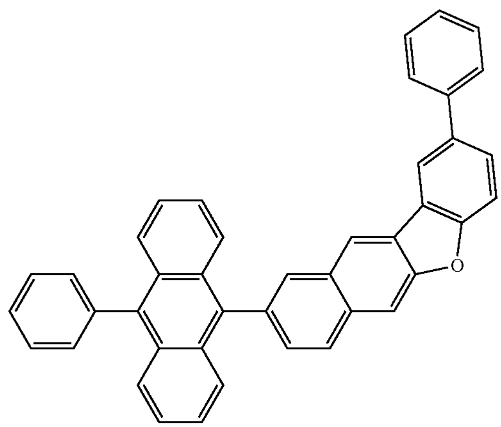
C46
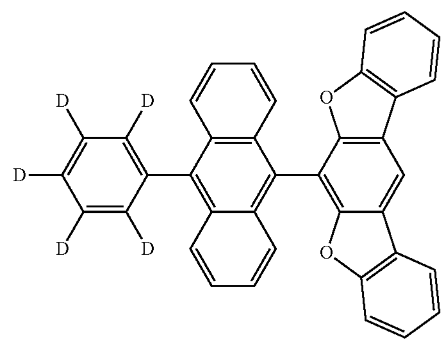
C47
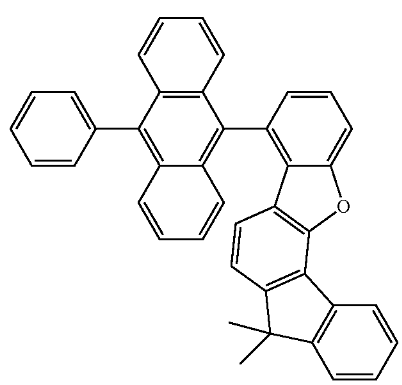

-continued

C48

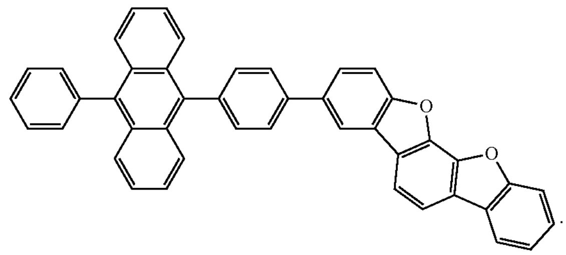

The organic electroluminescent device of the present invention may further include one or more organic layers, for example, a hole transport layer and an electron blocking layer, each of which may include a compound represented by Formula D:

(D)

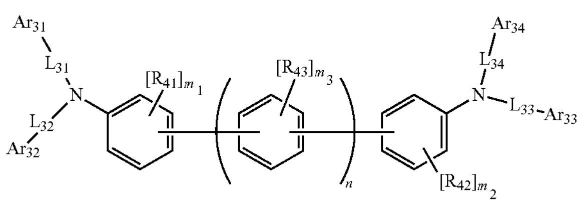

wherein $R_{41}$ to $R_{43}$ are identical to or different from each other and are each independently selected from hydrogen, deuterium, substituted or unsubstituted $C_1$-$C_{20}$ alkyl, substituted or unsubstituted $C_6$-$C_{50}$ aryl, substituted or unsubstituted $C_7$-$C_{50}$ arylalkyl, substituted or unsubstituted $C_3$-$C_{30}$ cycloalkyl, substituted or unsubstituted $C_1$-$C_{30}$ alkylsilyl, substituted or unsubstituted $C_6$-$C_{30}$ arylsilyl, and halogen, $L_{31}$ to $L_{34}$ are identical to or different from each other and are each independently single bonds or selected from substituted or unsubstituted $C_6$-$C_{50}$ arylene and substituted or unsubstituted $C_2$-$C_{50}$ heteroarylene, $Ar_{31}$ to $Ar_{34}$ are identical to or different from each other and are each independently selected from substituted or unsubstituted $C_6$-$C_{50}$ aryl and substituted or unsubstituted $C_2$-$C_{50}$ heteroaryl, n is an integer from 0 to 4, provided that when n is 2 or greater, the aromatic rings containing $R_{43}$ are identical to or different from each other, $m_1$ to $m_3$ are integers from 0 to 4, provided that when both $m_1$ and $m_3$ are 2 or more, the $R_{41}$, $R_{42}$, and $R_{43}$ groups are identical to or different from each other, and hydrogen or deuterium atoms are bonded to the carbon atoms of the aromatic rings to which $R_{41}$ to $R_{43}$ are not attached.

In Formula D, at least one of $Ar_{31}$ to $Ar_{34}$ is represented by Formula E:

(E)

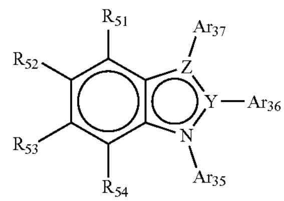

wherein $R_{51}$ to $R_{54}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, which are optionally linked to each other to form a ring, Y is a carbon or nitrogen atom, Z is a carbon, oxygen, sulfur or nitrogen atom, $Ar_{35}$ to $Ar_{37}$ are identical to or different from each other and are each independently selected from substituted or unsubstituted $C_5$-$C_{50}$ aryl and substituted or unsubstituted $C_3$-$C_{50}$ heteroaryl, provided that when Z is an oxygen or sulfur atom, $Ar_{37}$ is nothing, provided that when Y and Z are nitrogen atoms, only one of $Ar_{35}$, $Ar_{36}$, and $Ar_{37}$ is present, provided that when Y is a nitrogen atom and Z is a carbon atom, $Ar_{36}$ is nothing, with the proviso that one of $R_{51}$ to $R_{54}$ and $Ar_{35}$ to $Ar_{37}$ is a single bond linked to one of the linkers $L_{31}$ to $L_{34}$ in Formula D.

The compound of Formula D employed in the organic electroluminescent device of the present invention may be specifically selected from the compounds of Formulae D1 to D79:

D1

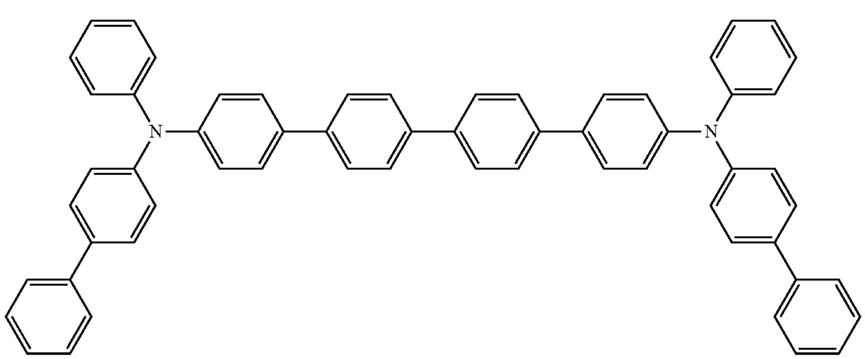

-continued
D2
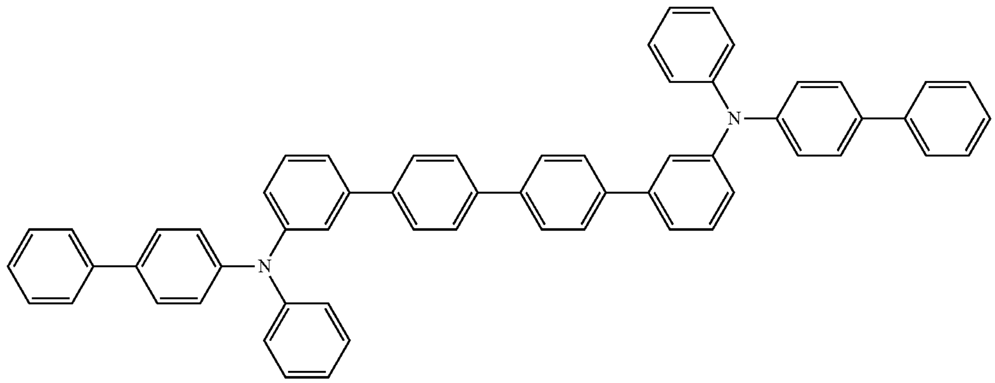
D3
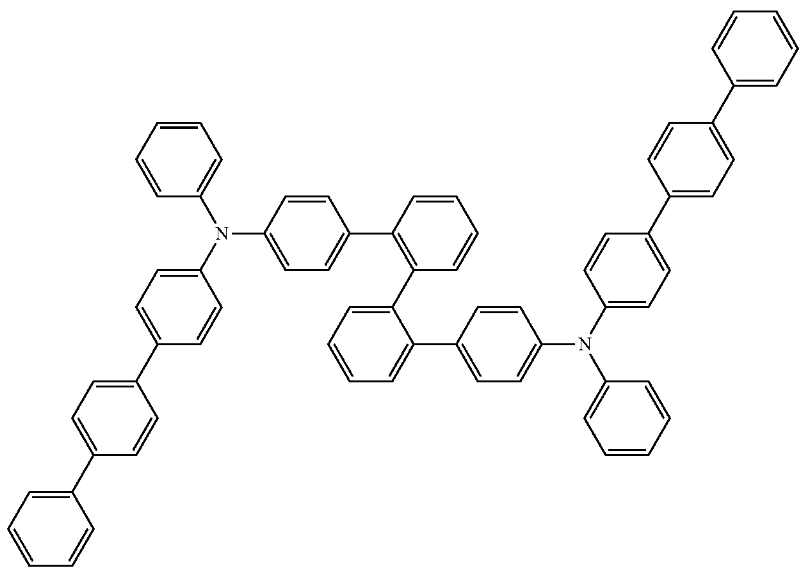
D4
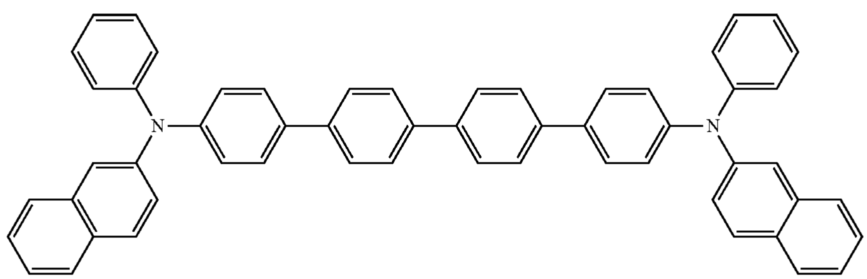
D5
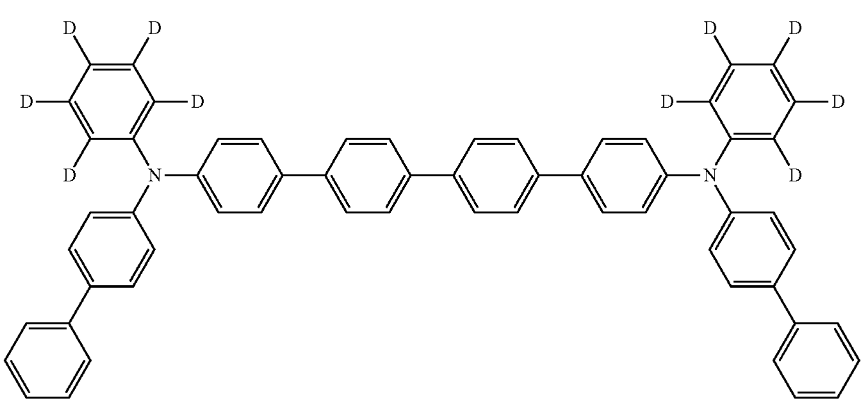

-continued
D6
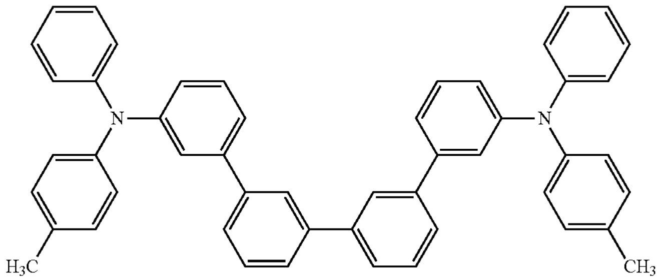
D7
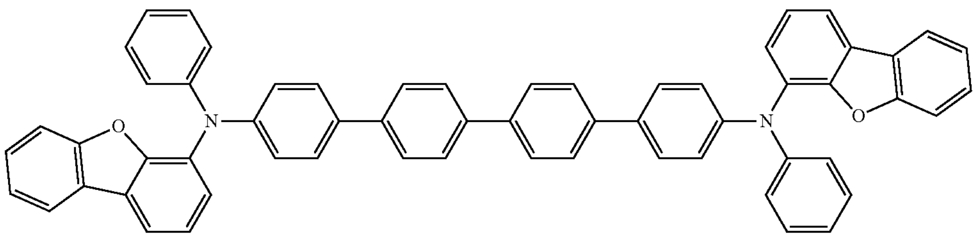
D8
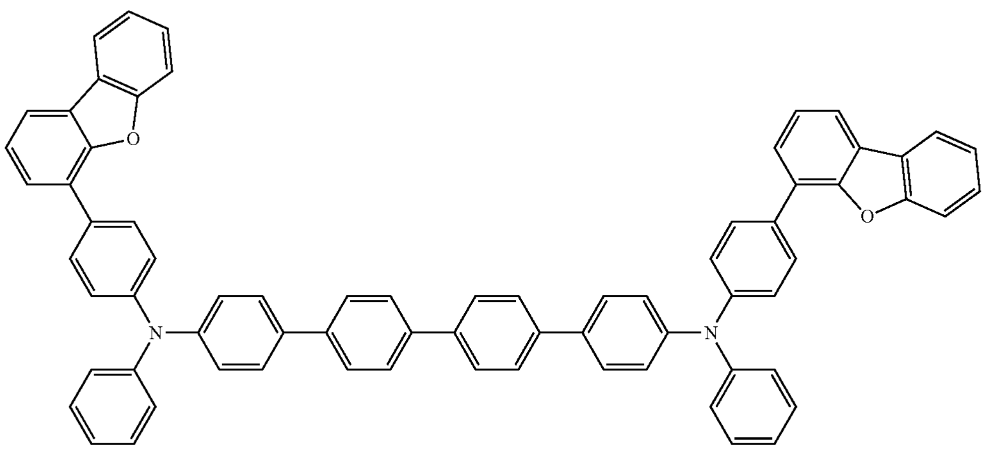
D9
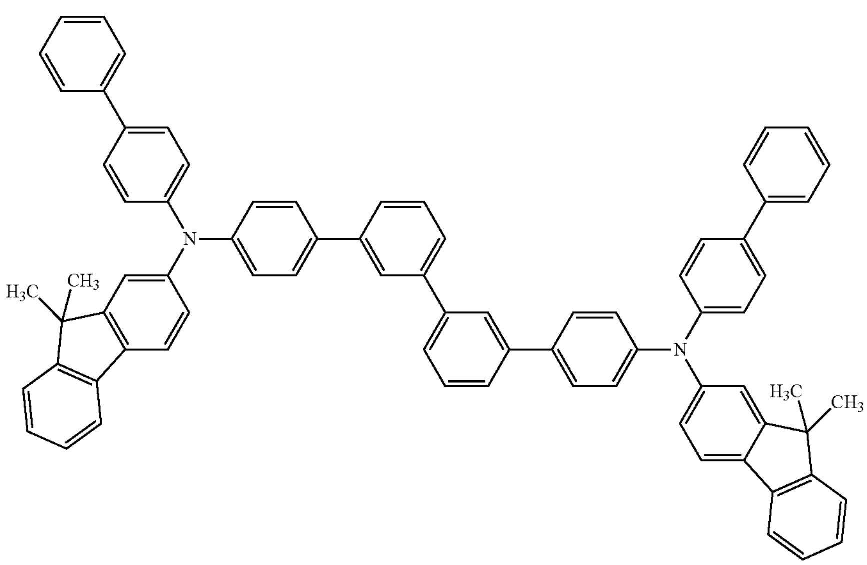

-continued
D10
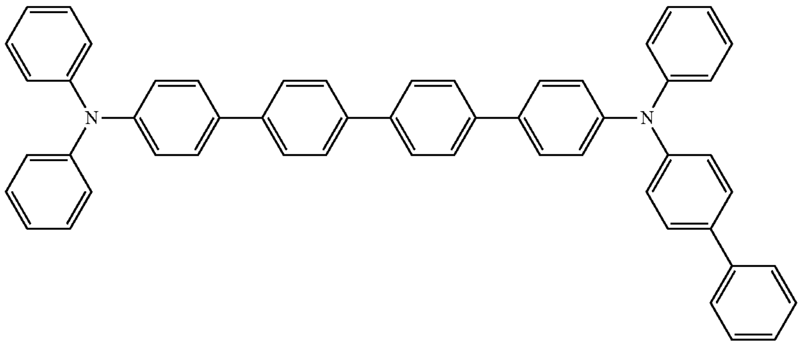
D11
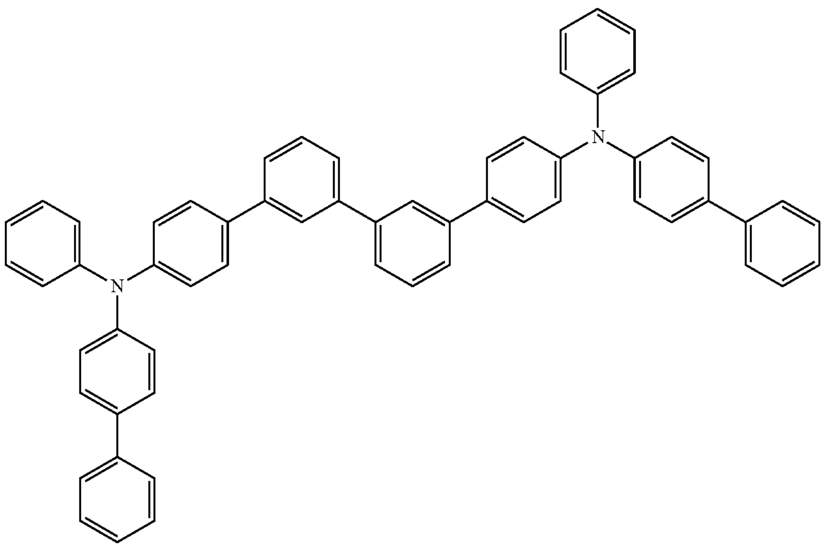
D12
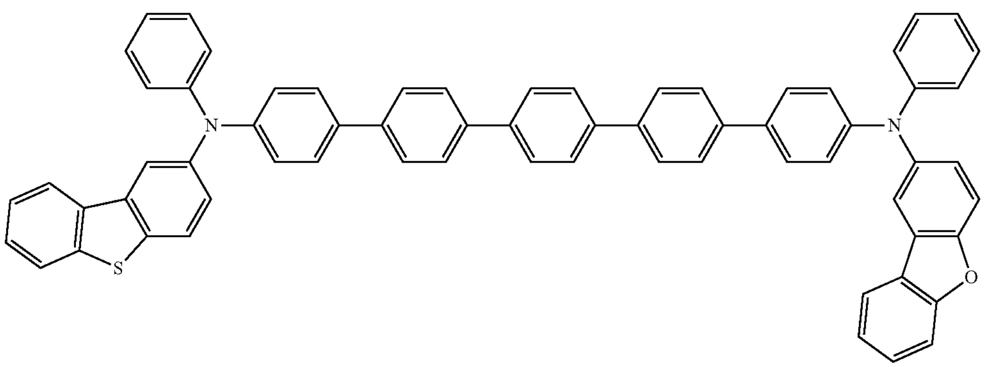
D13
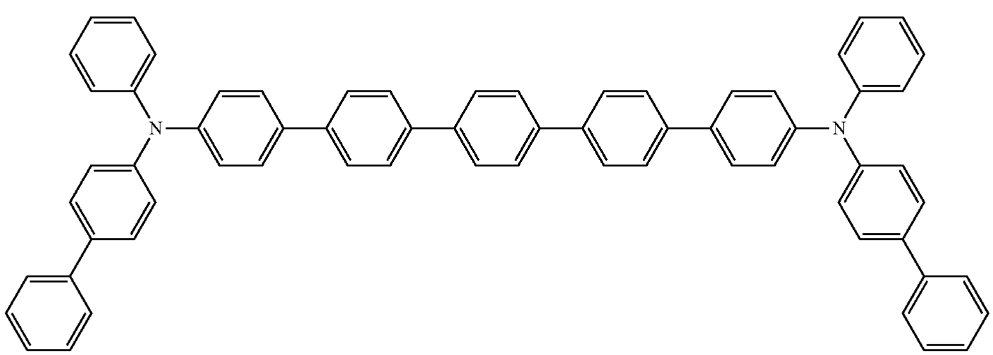

-continued
D14
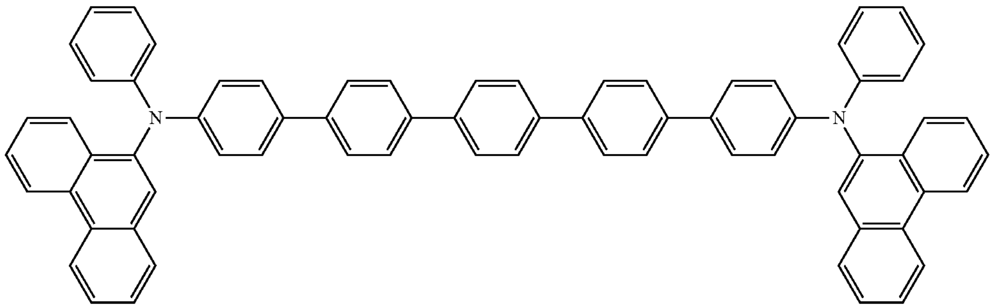
D15
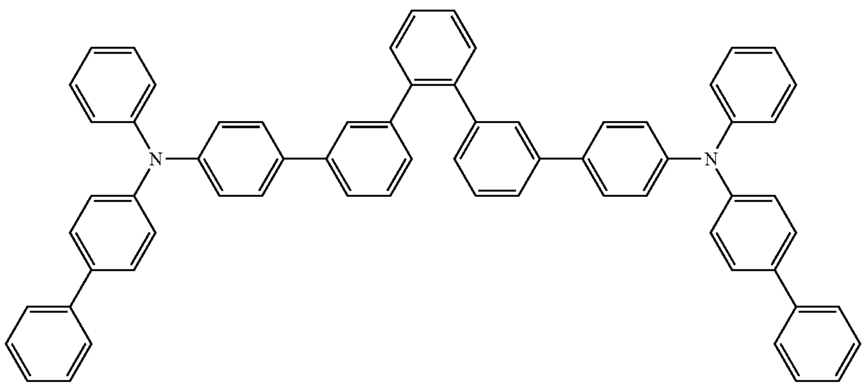
D16
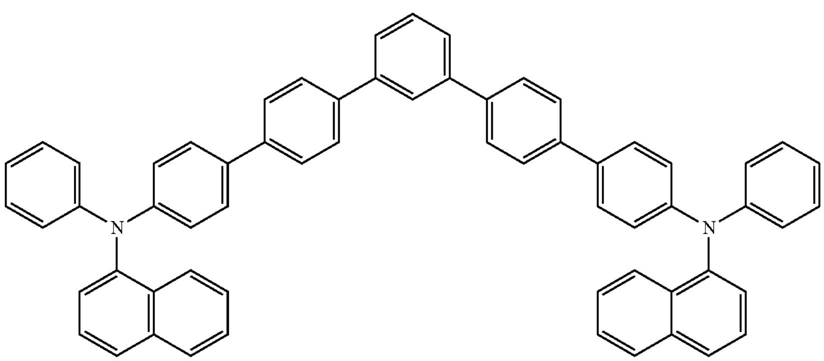
D17
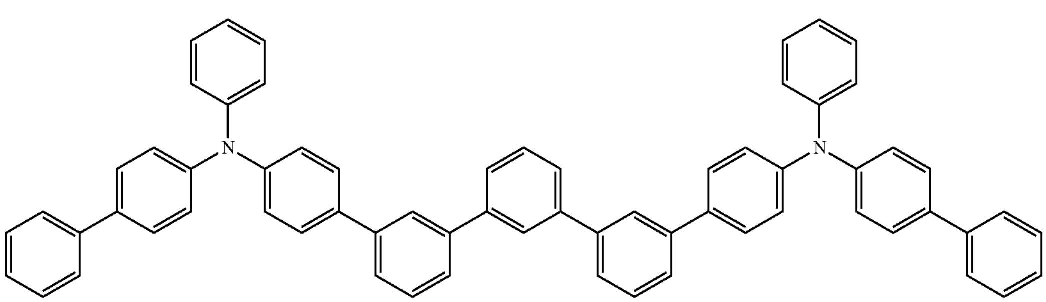

-continued
D18
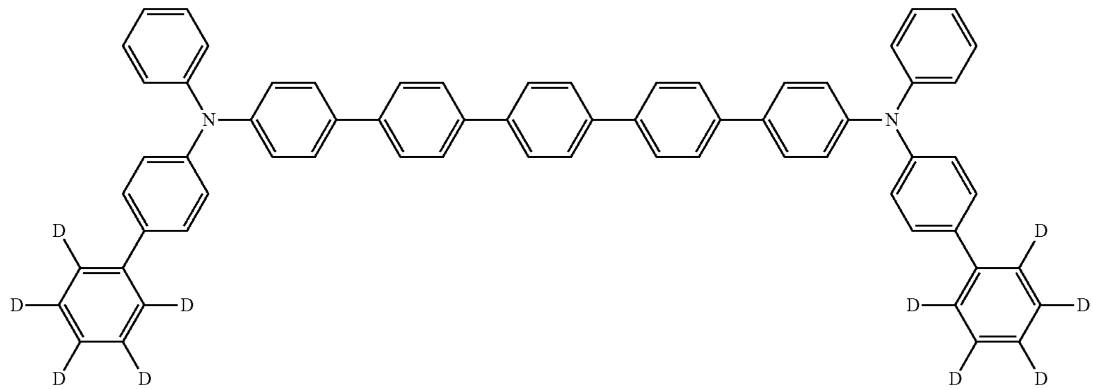
D19
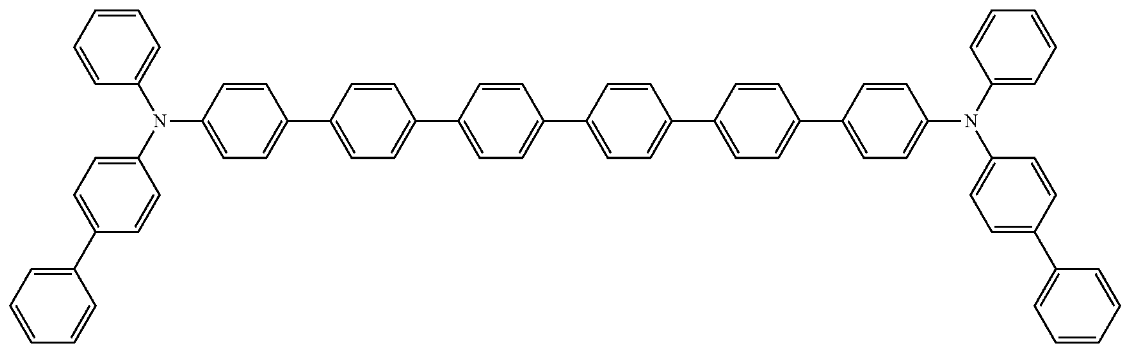
D20
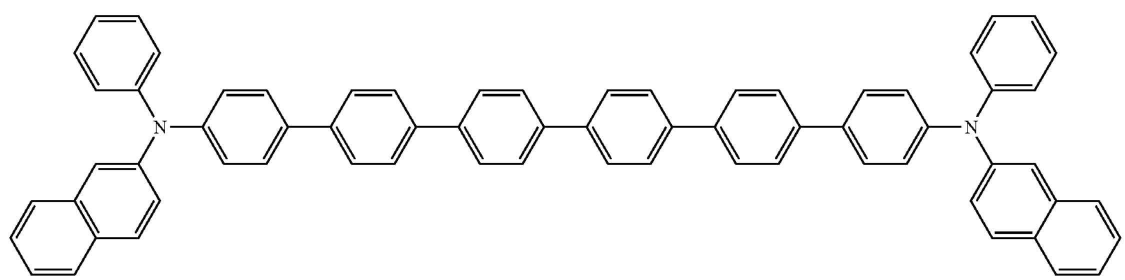
D21
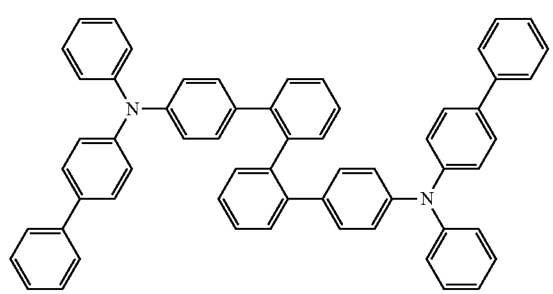
D22
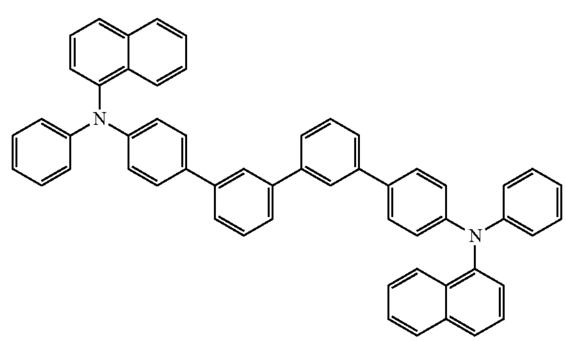

-continued
D23
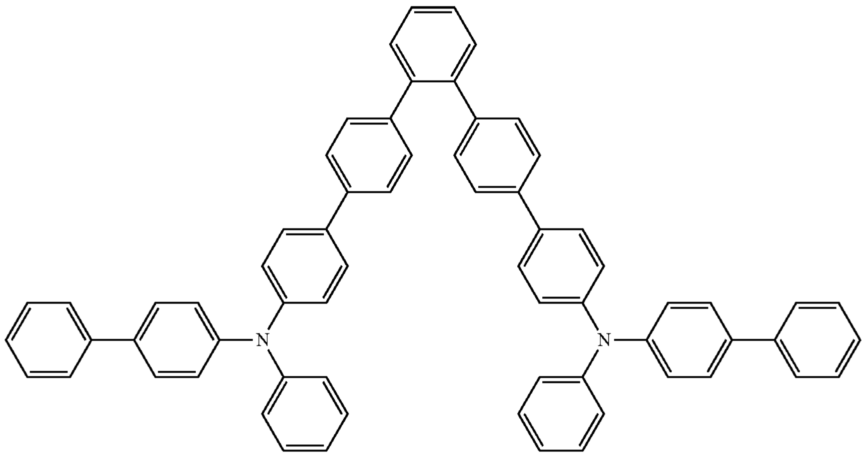
D24
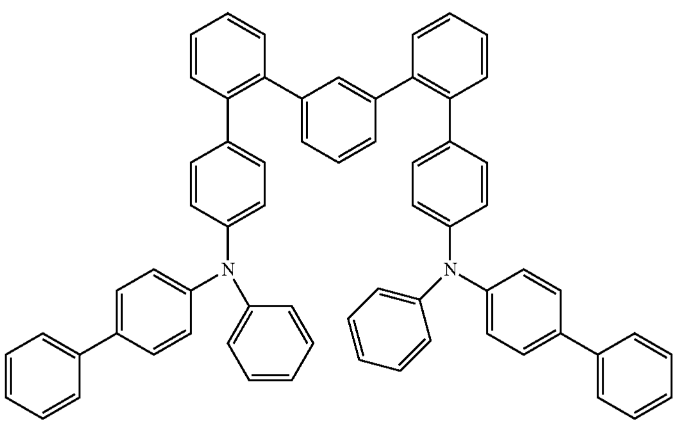
D25
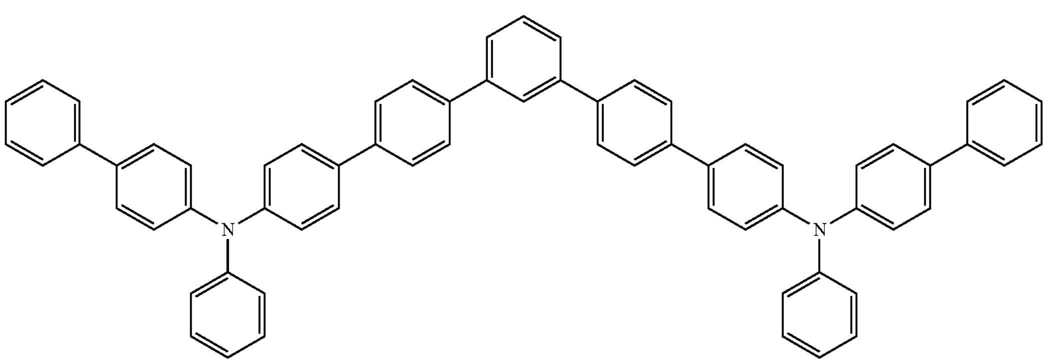

-continued
D26
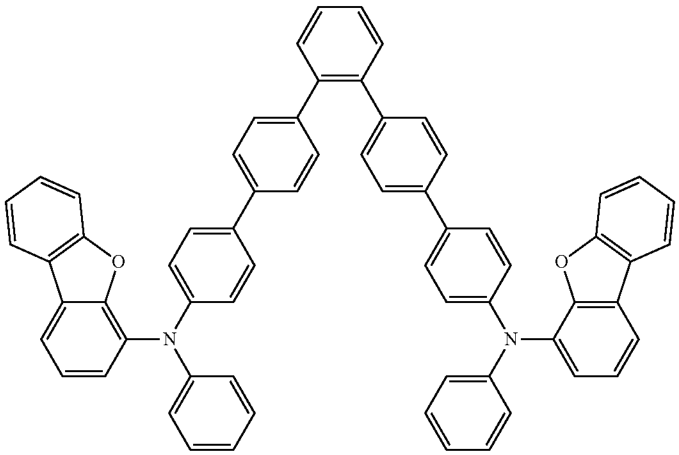
D27
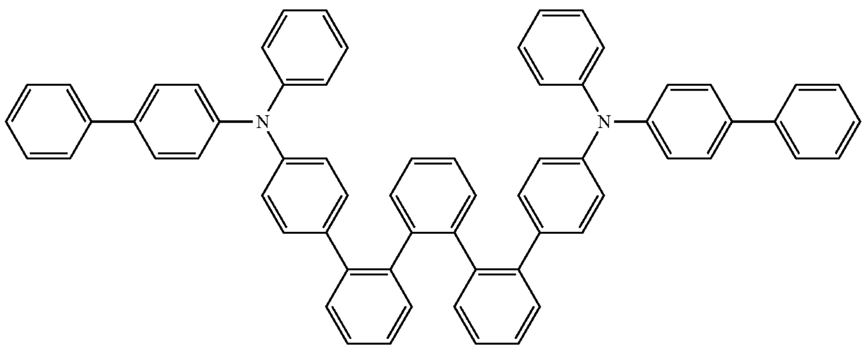
D28
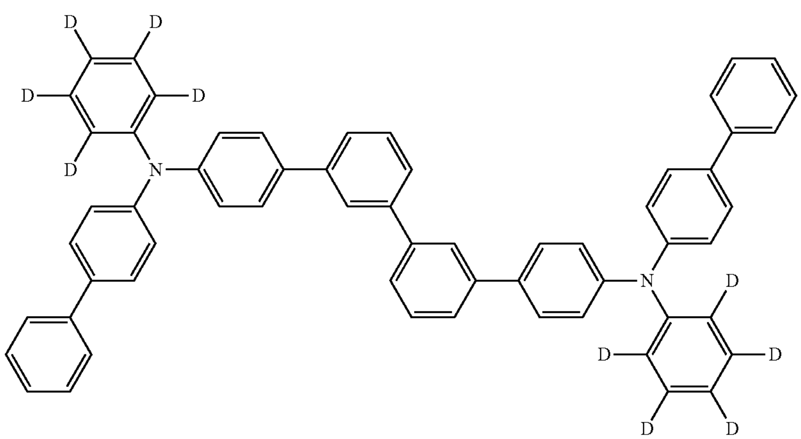
D29
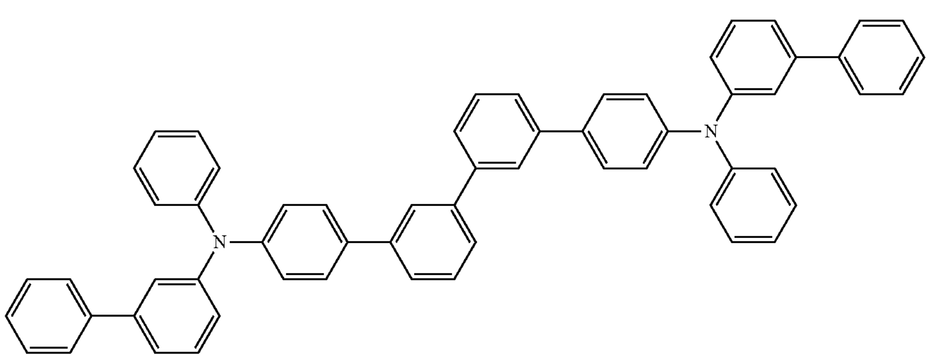

-continued
D30
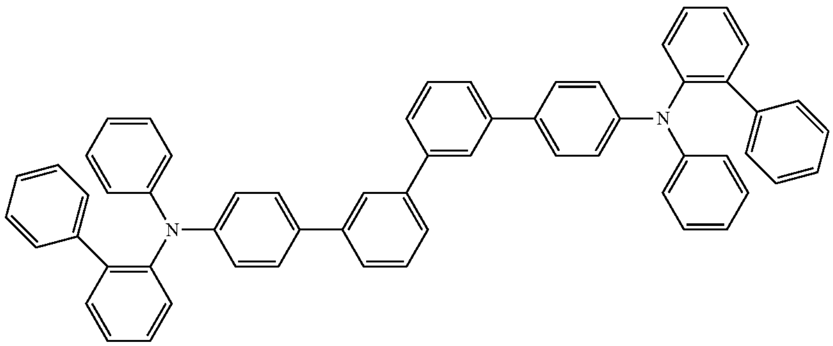
D31
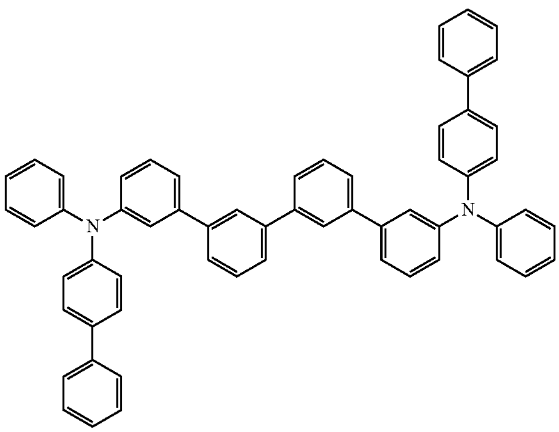
D32
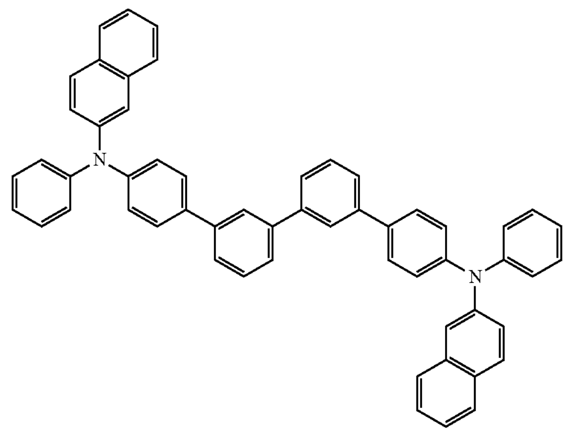
D33
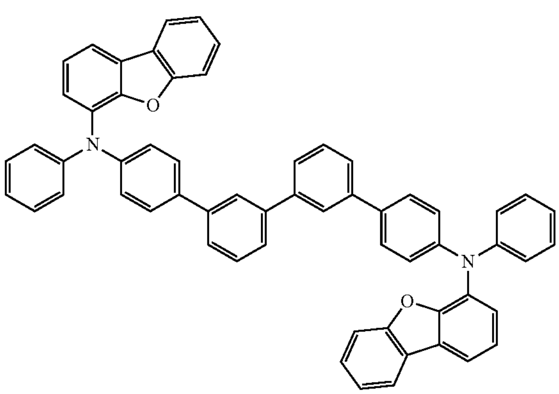
D34
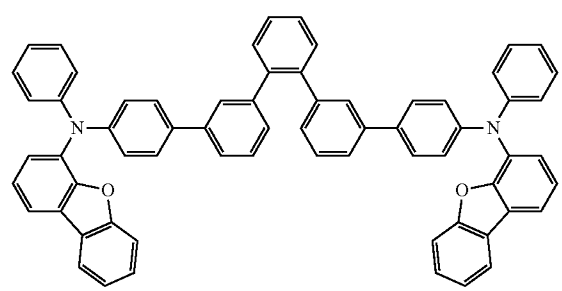
D35
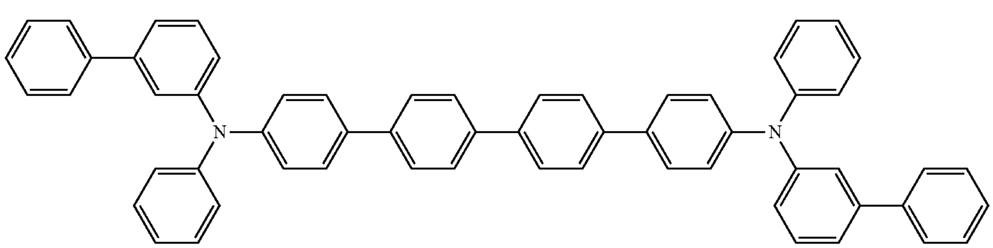

-continued
D36
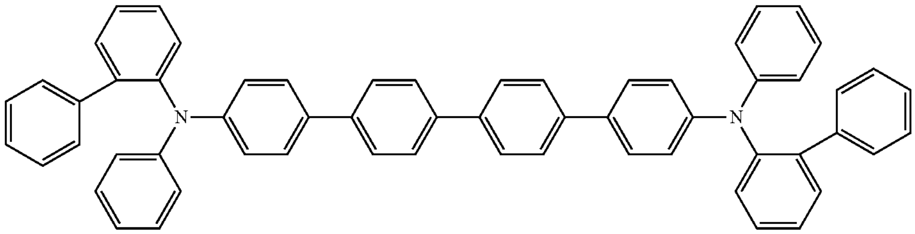
D37
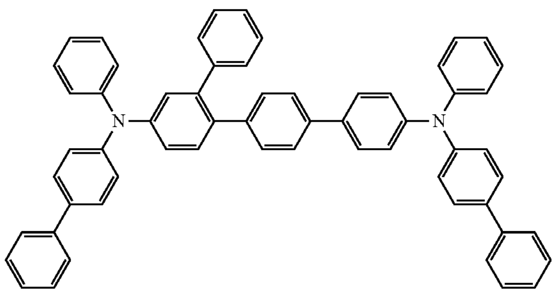
D38
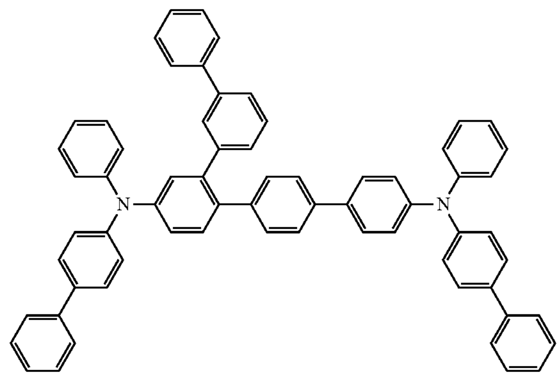
D39
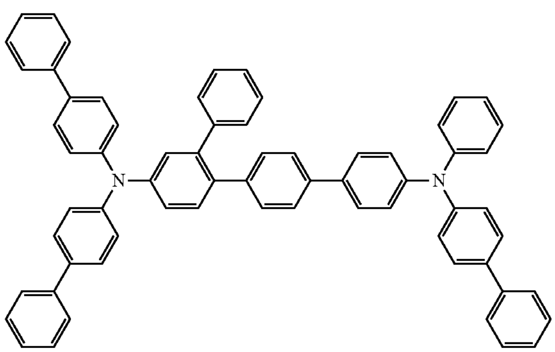
D40
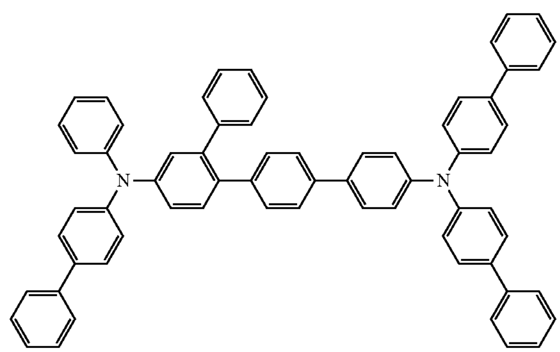
D41
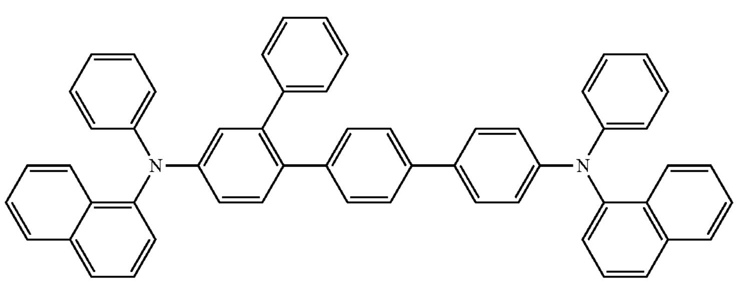

-continued
D42
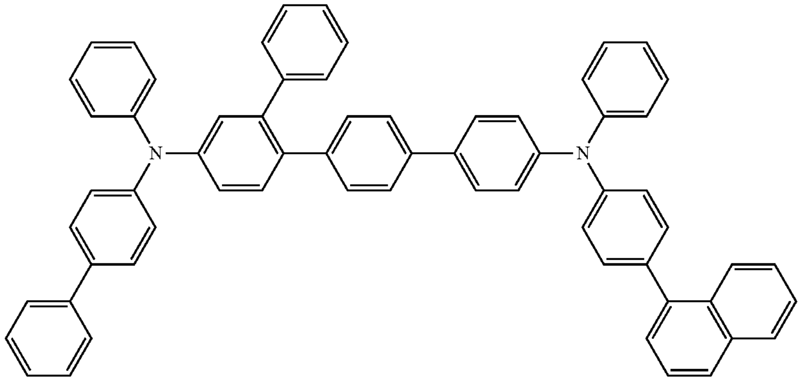
D43
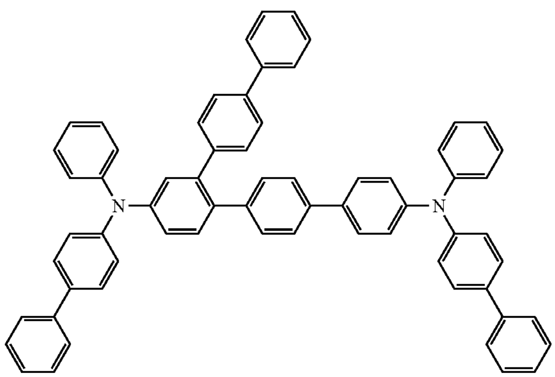
D44
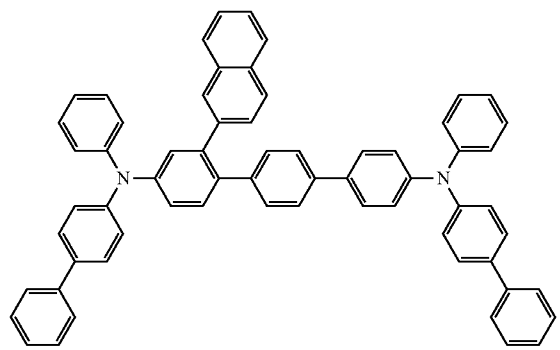
D45
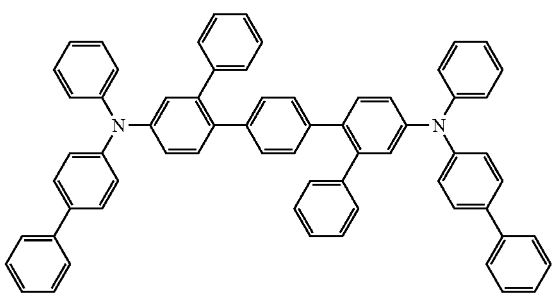
D46
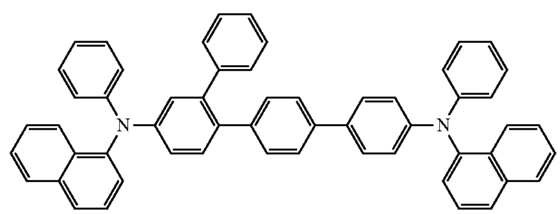
D47
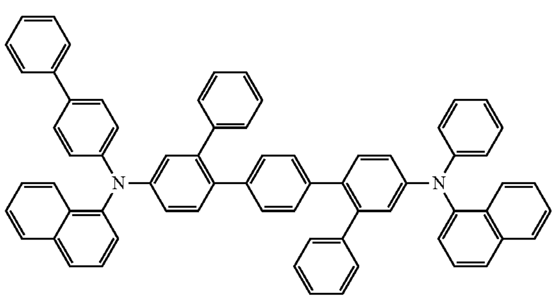
D48
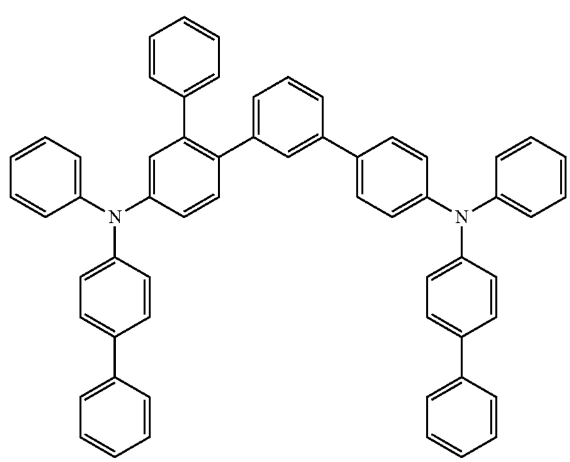

-continued
D49
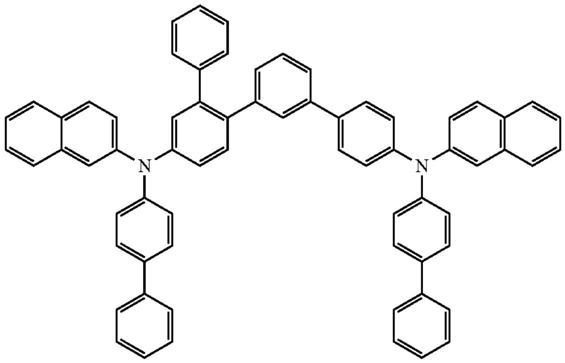
D50
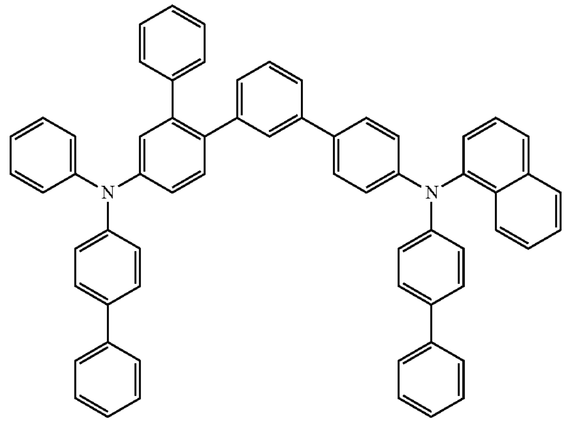
D51
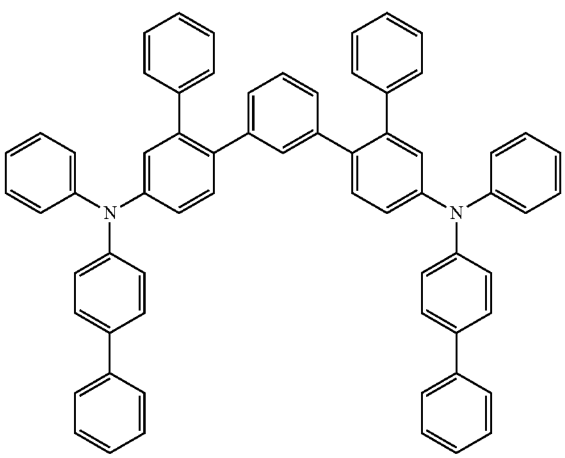
D52
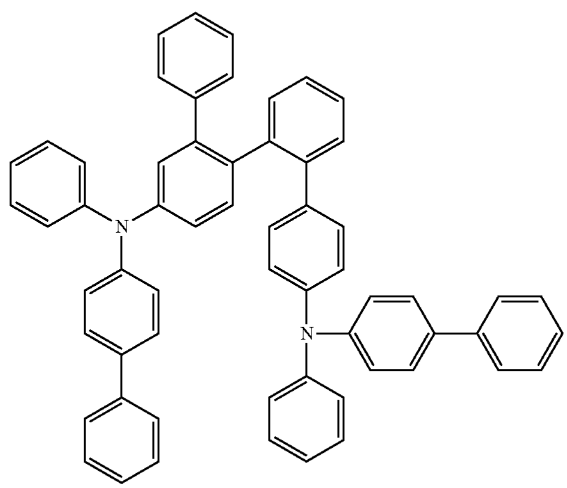
D53
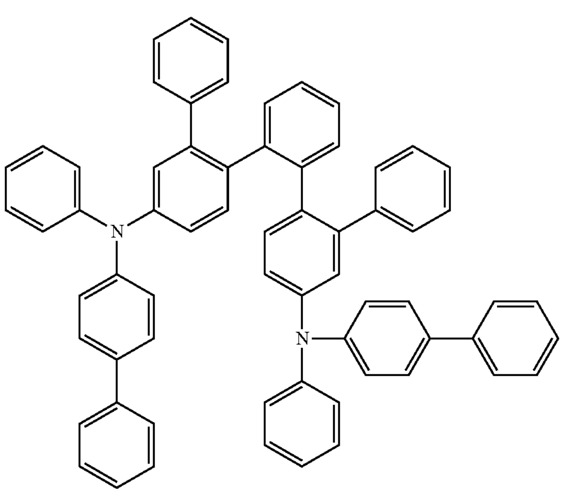

-continued
D54
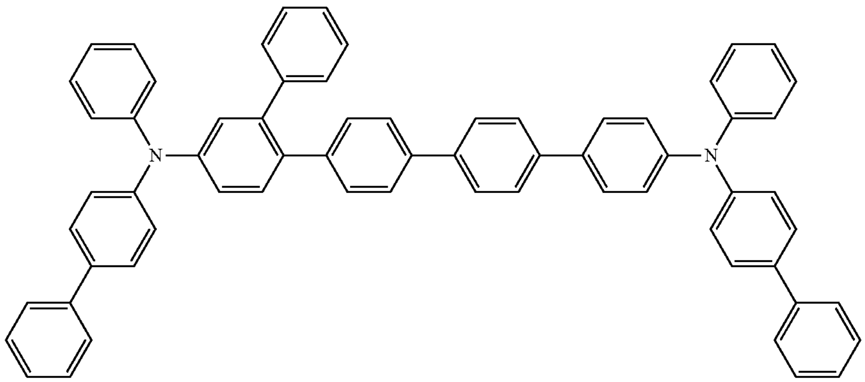
D55
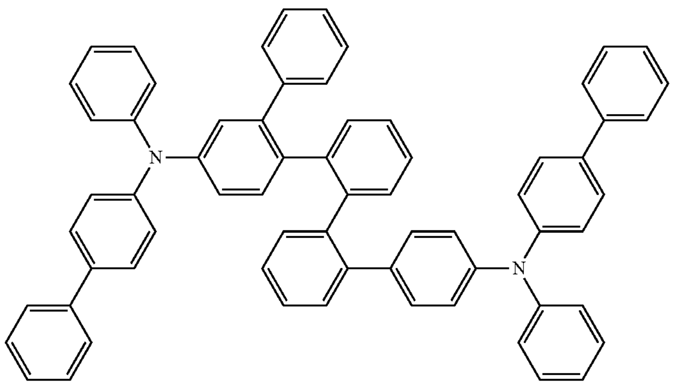
D56
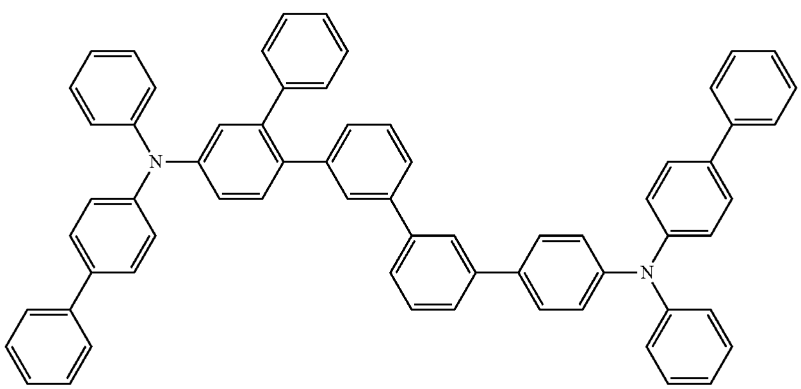
D57
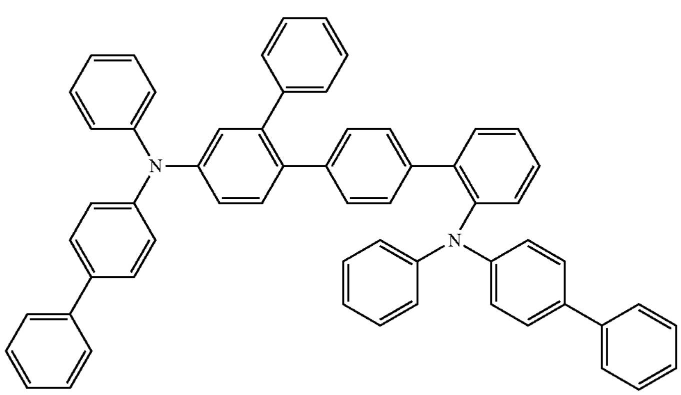

-continued
D58
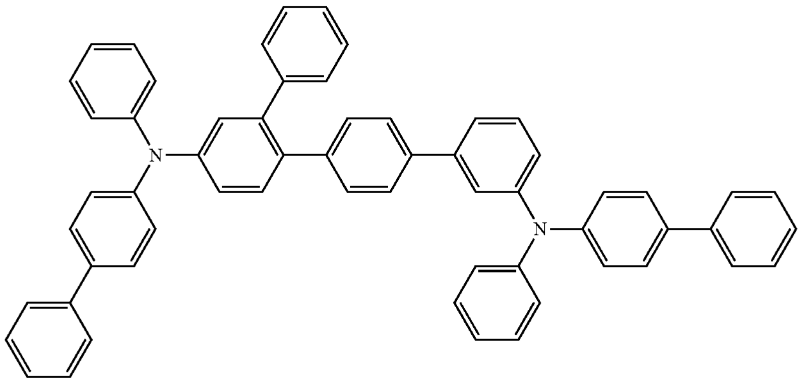
D59
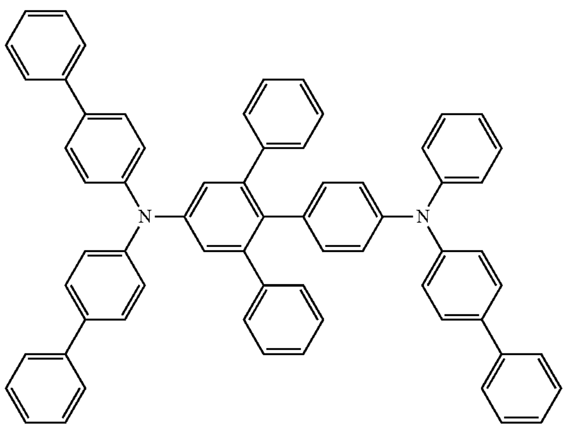
D60
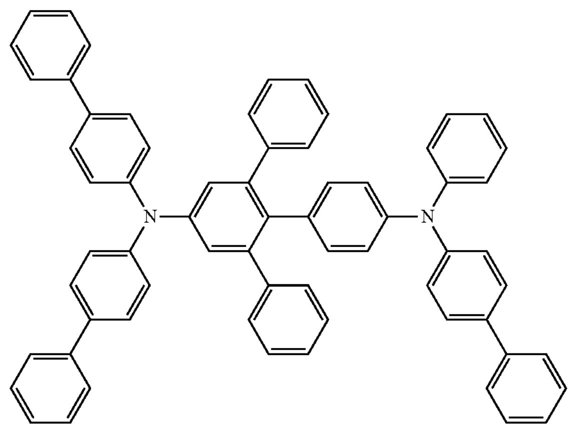
D61
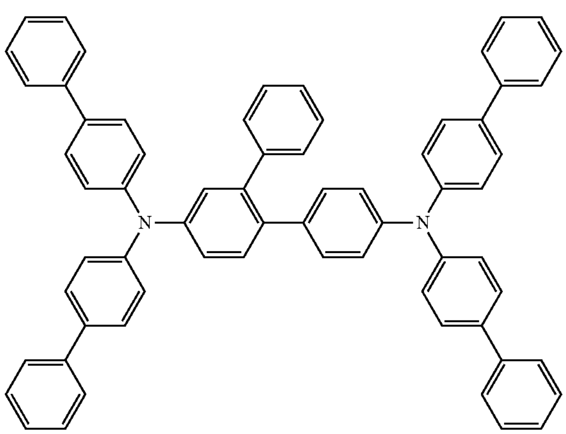
D62
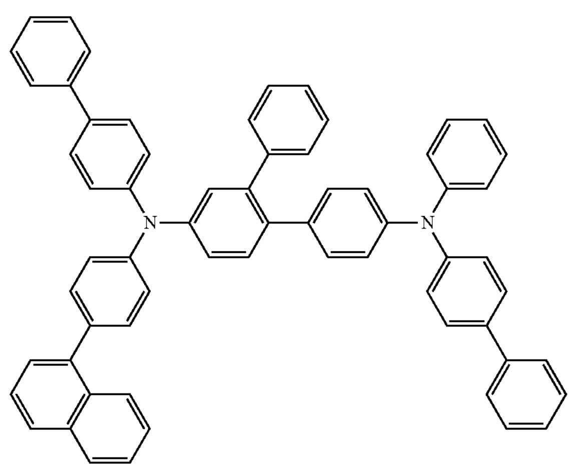

-continued
D63
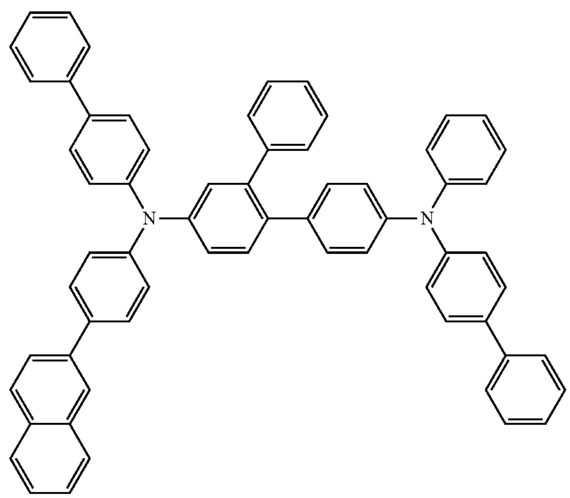
D64
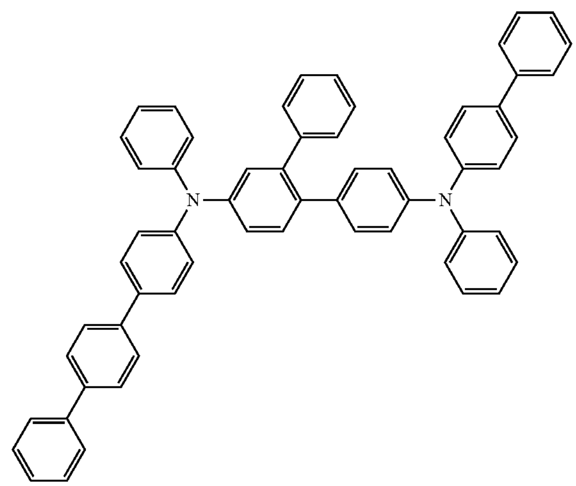
D65
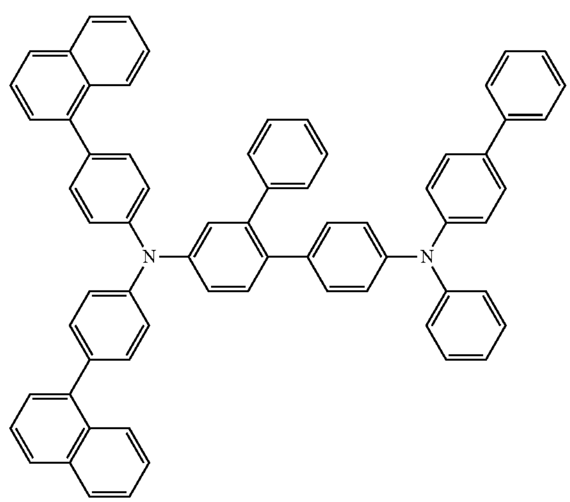
D66
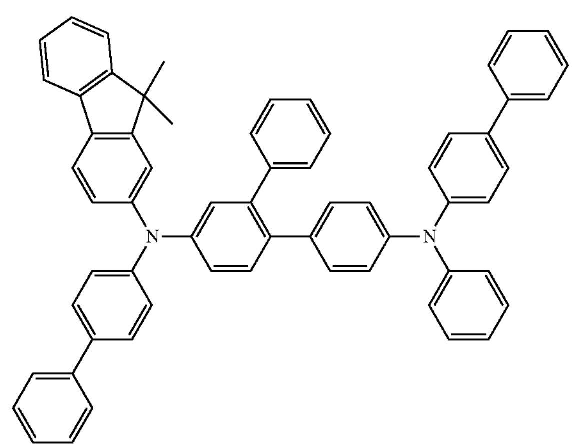
D67
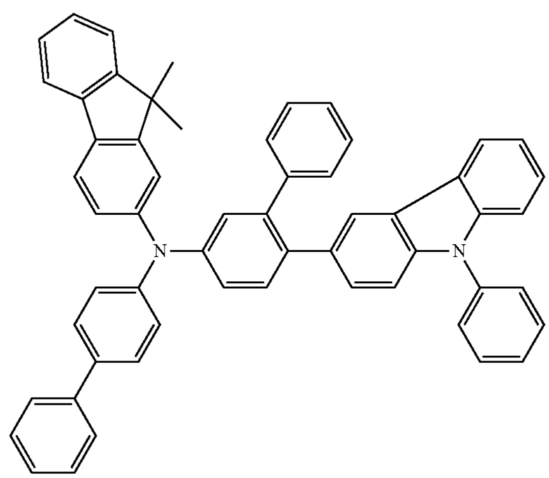
D68
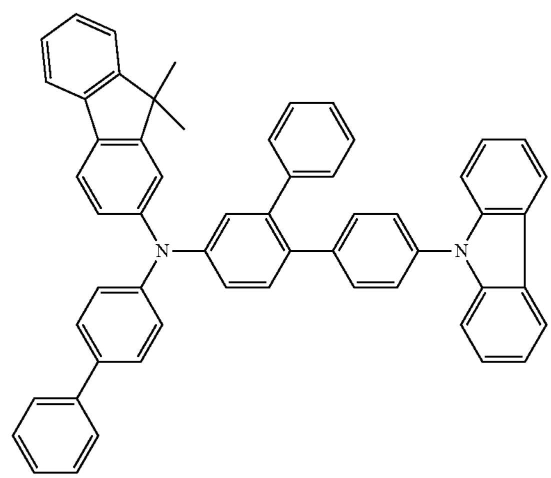

-continued
D69
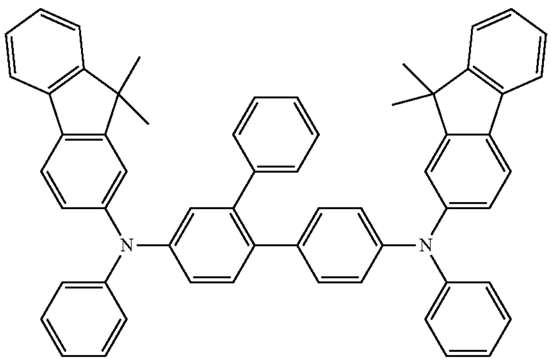
D70
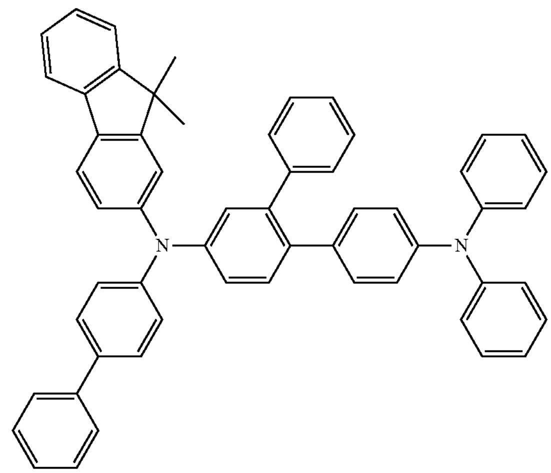
D71
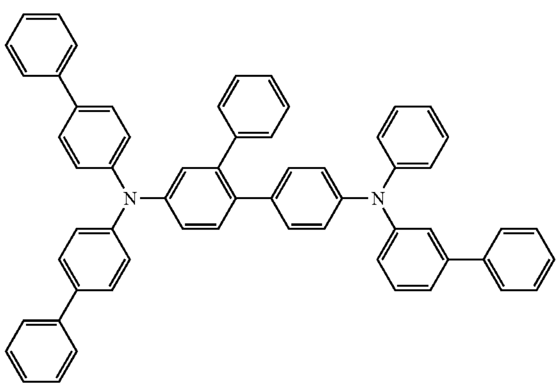
D72
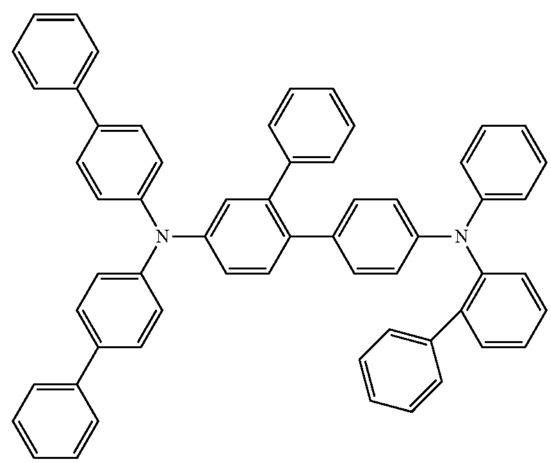
D73
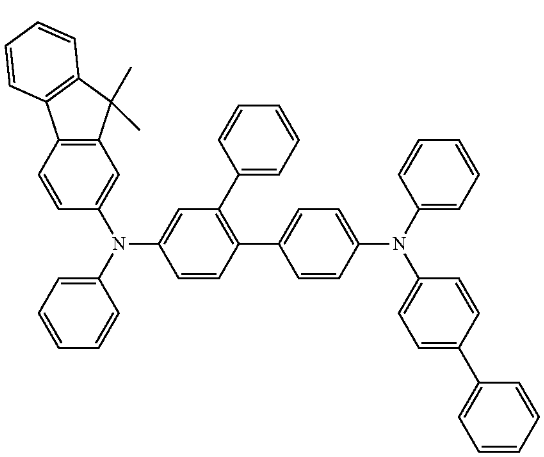
D74
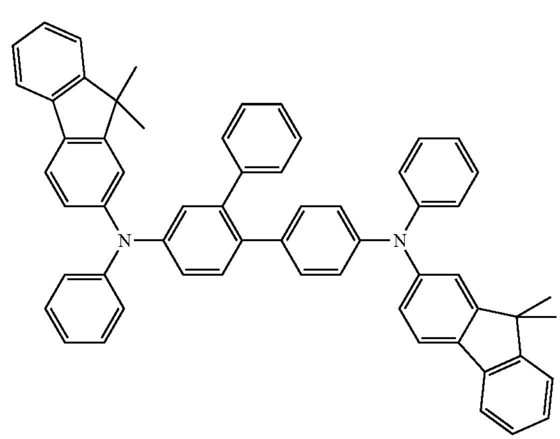

-continued
D75
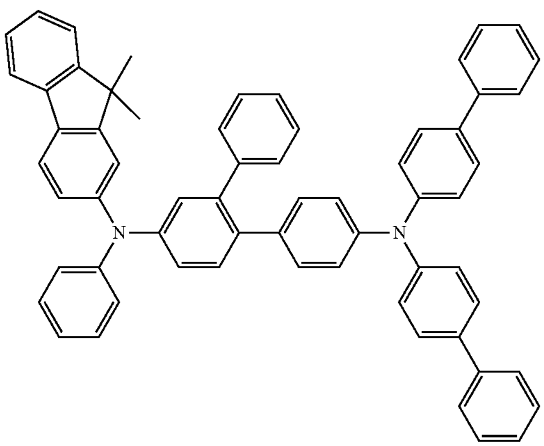
D76
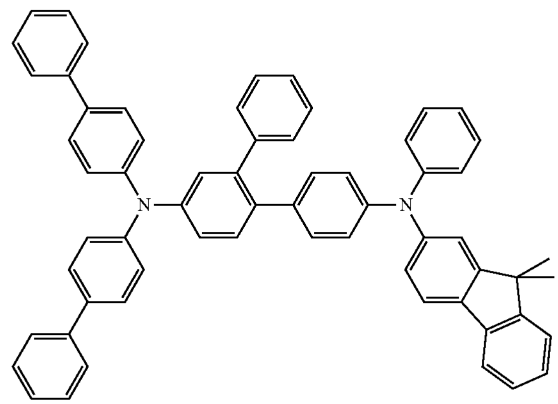
D77
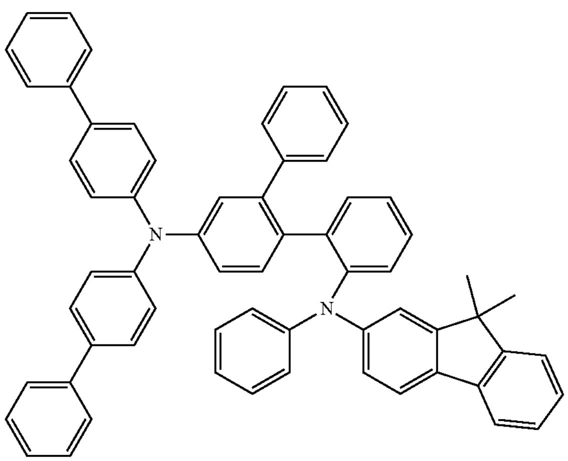
D78
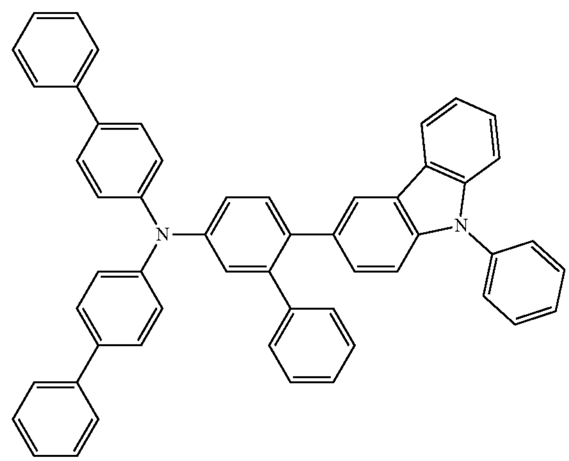
D79
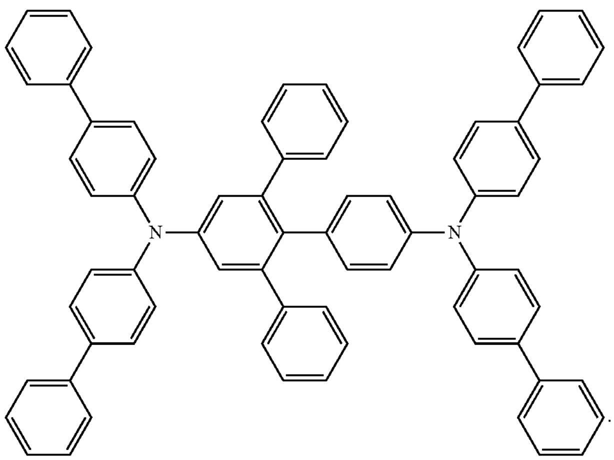

The compound of Formula D employed in the organic electroluminescent device of the present invention may be specifically selected from the compounds of Formulae D101 to D145:
D101
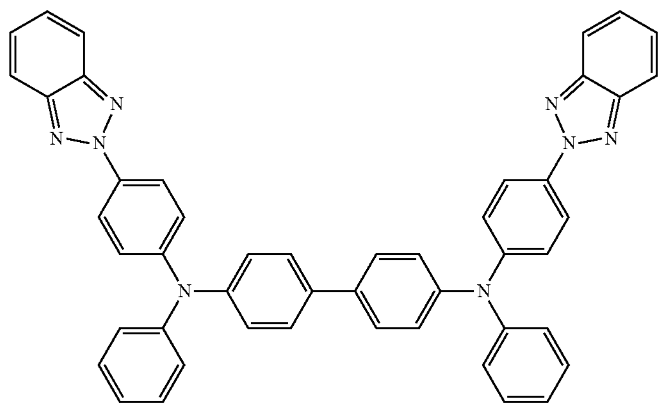
D102
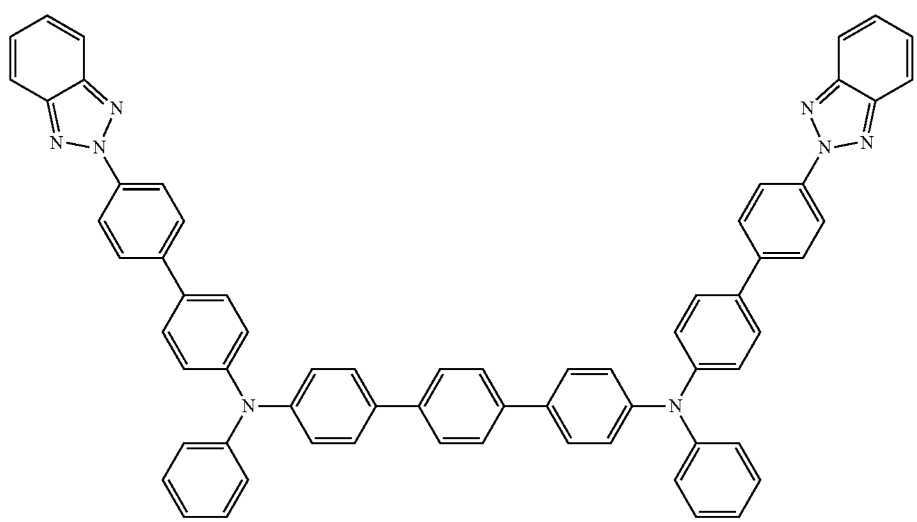
D103
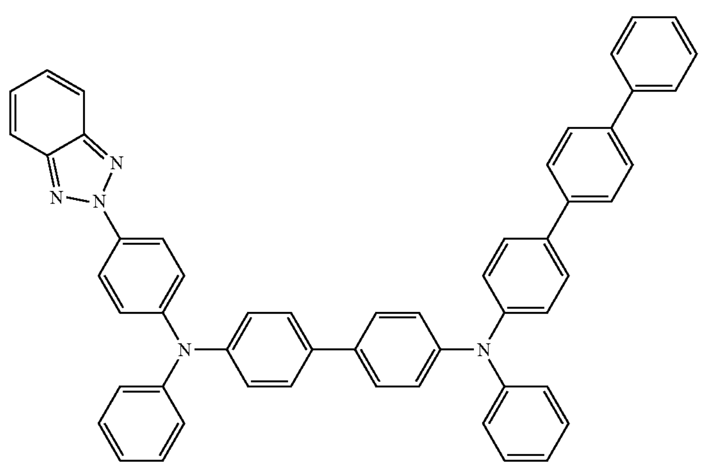

-continued
D104
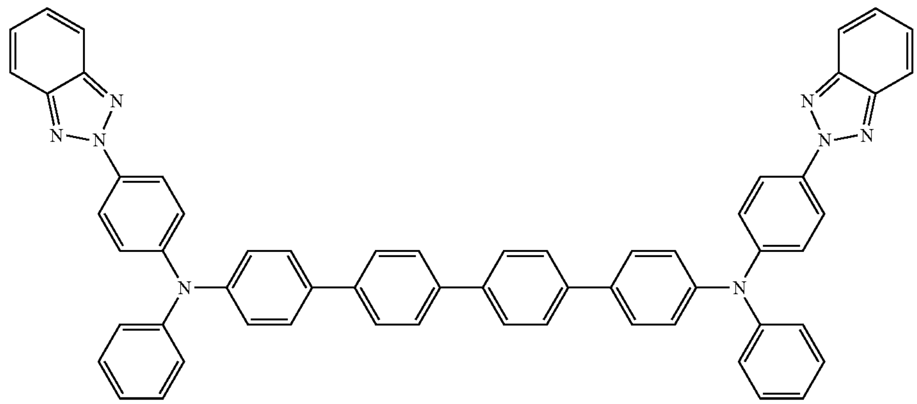
D105
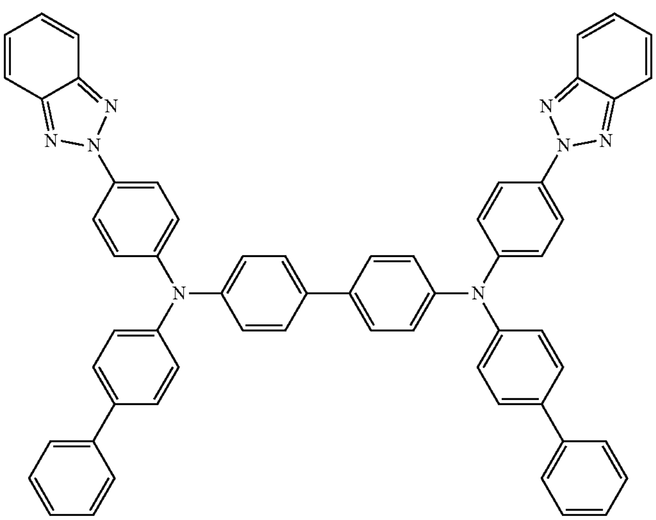
D106
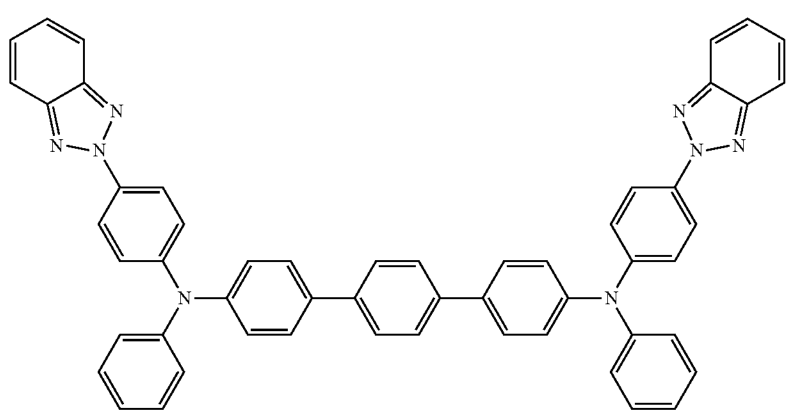

-continued
D107
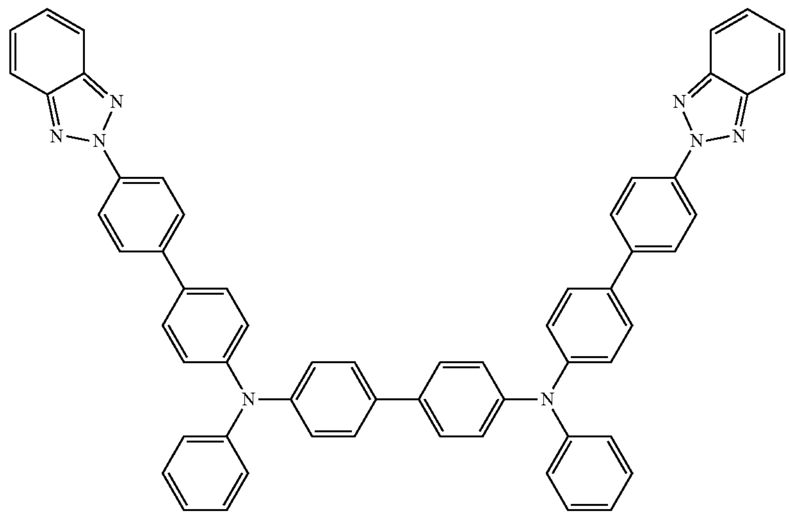
D108
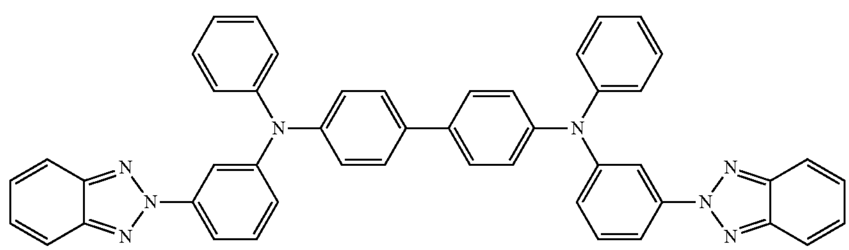
D109
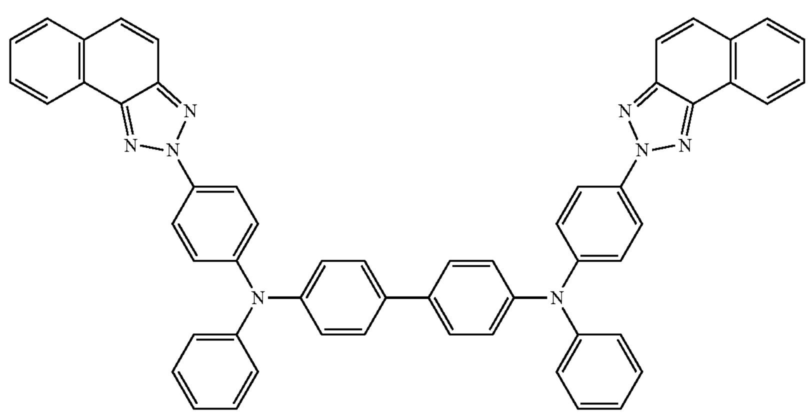
D110
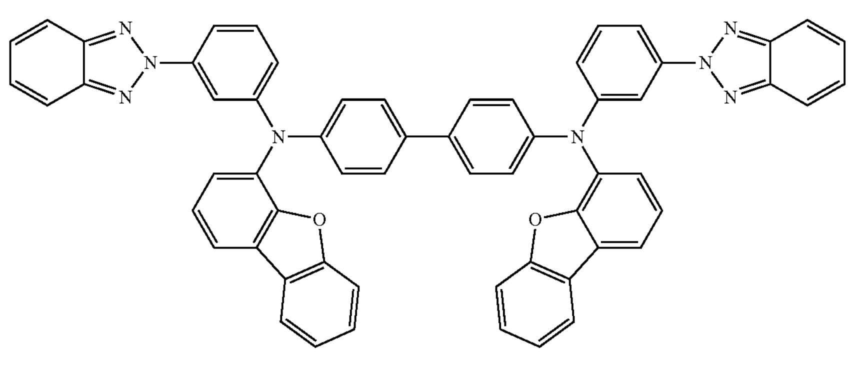

-continued
D111
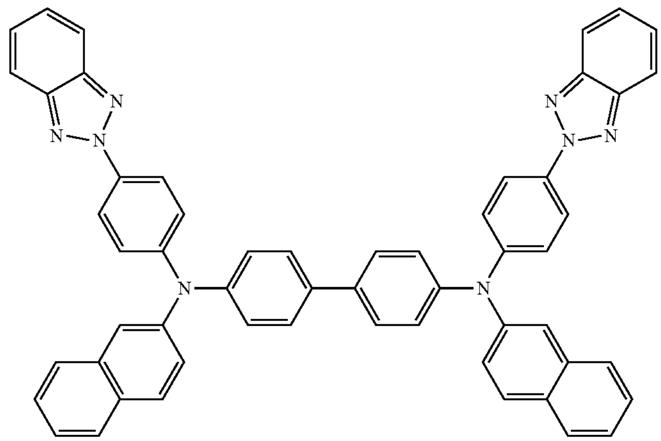
D112
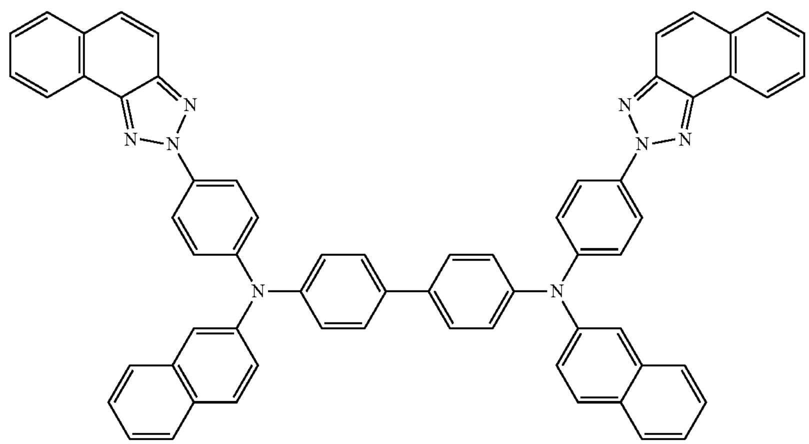
D113
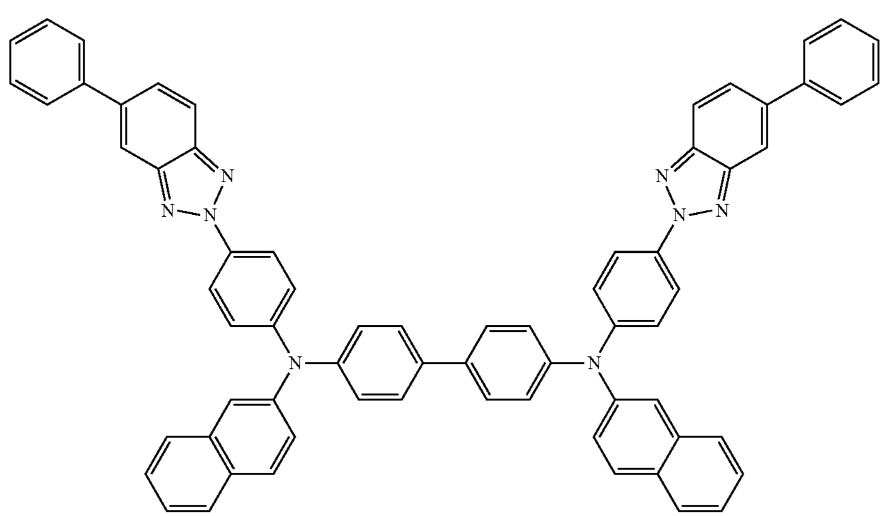

-continued
D114
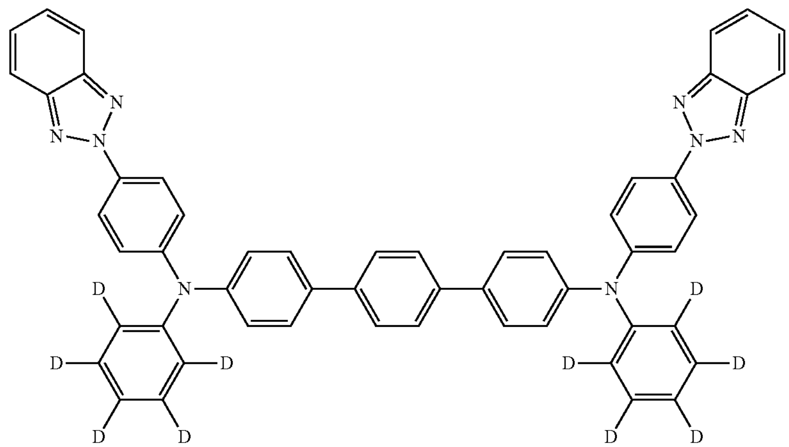
D115
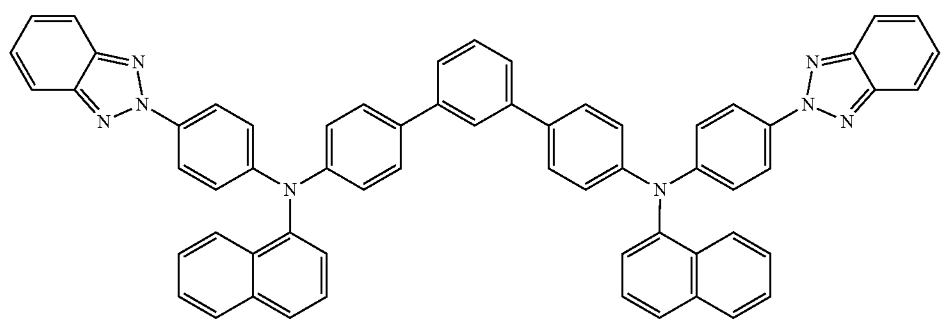
D116
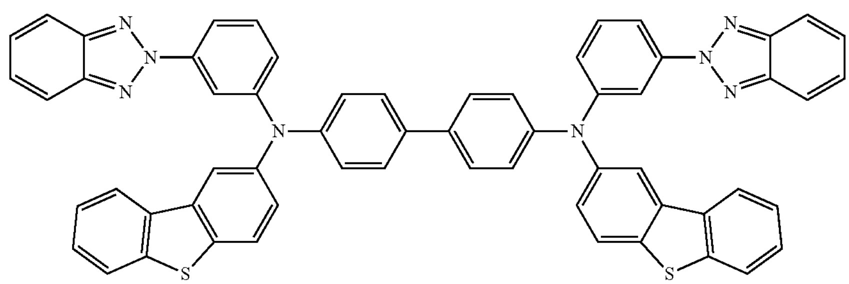
D117
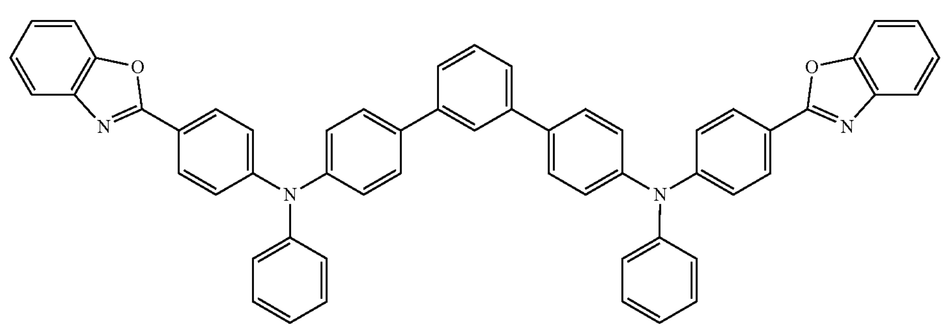

-continued
D118
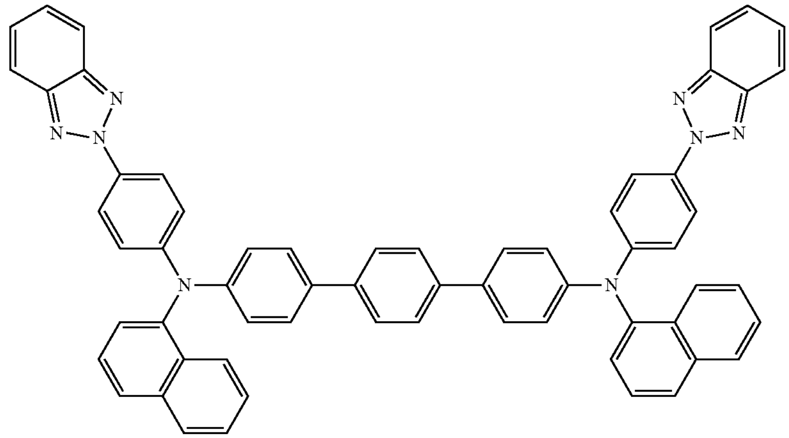
D119
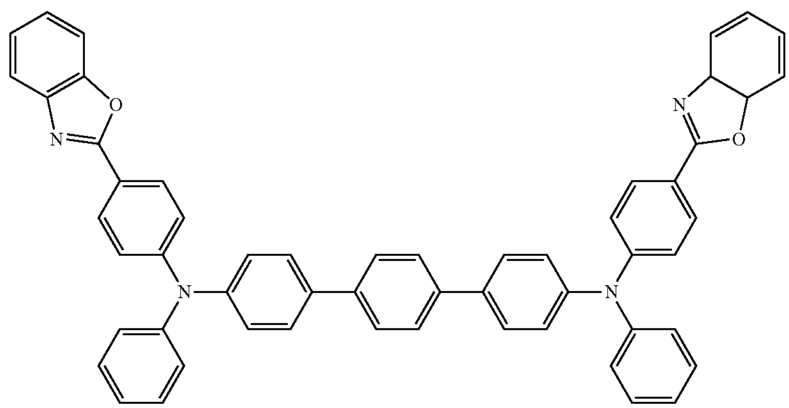
D120
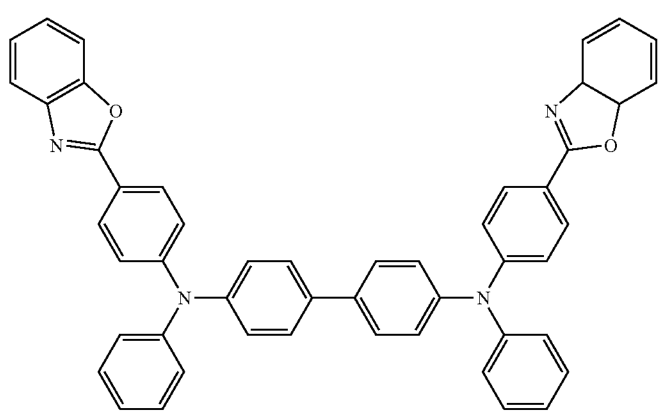

-continued
D121
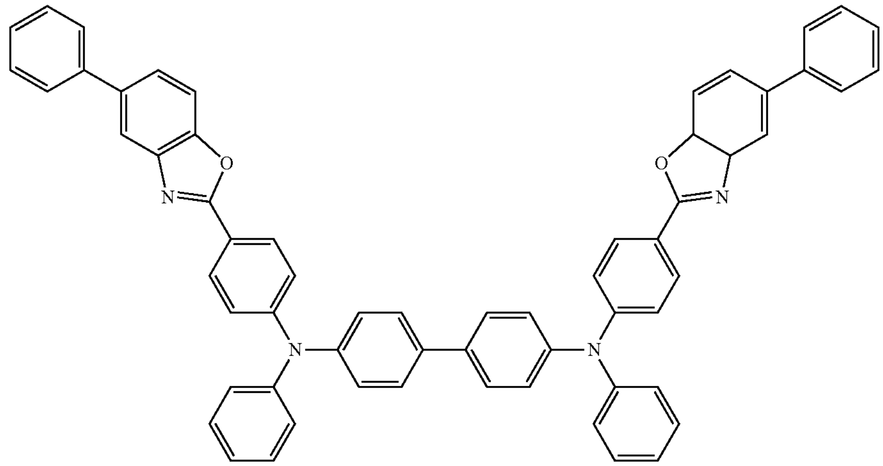
D122
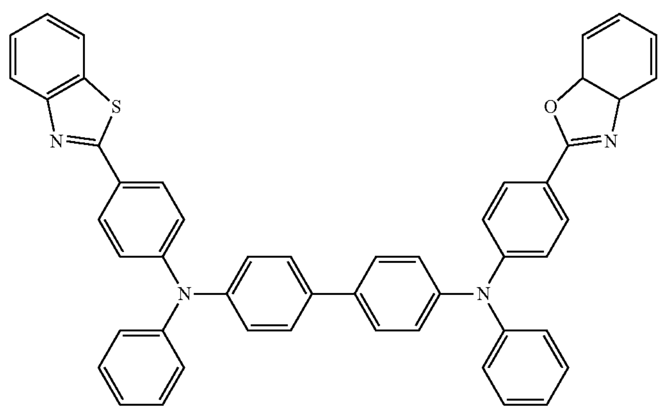
D123
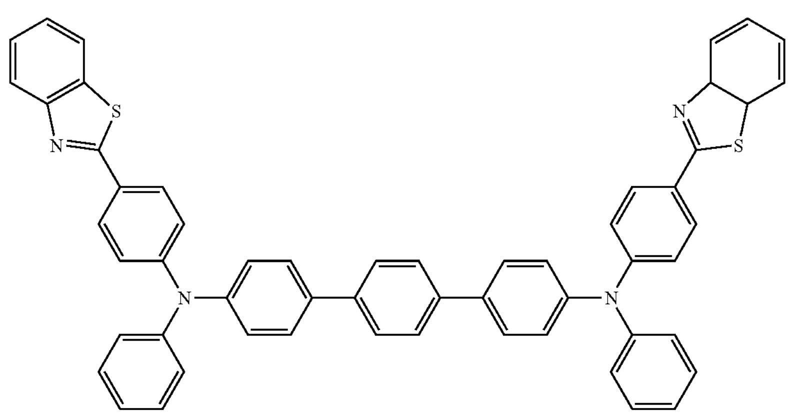

-continued
D124
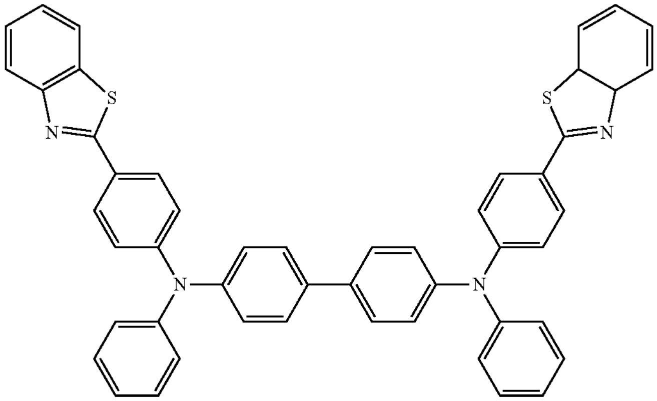
D125
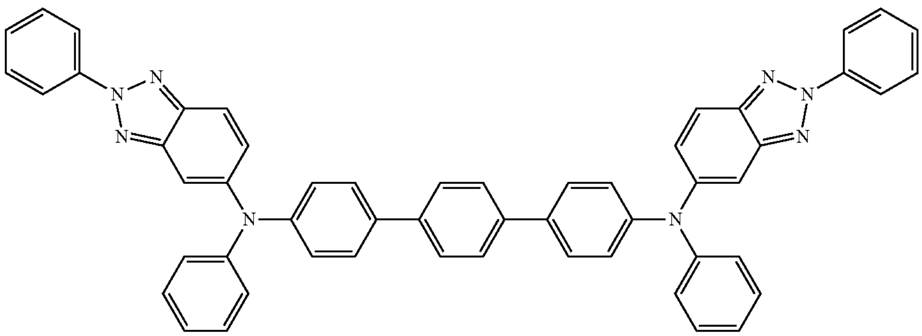
D126
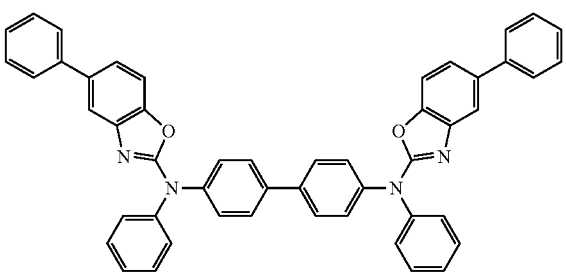
D127
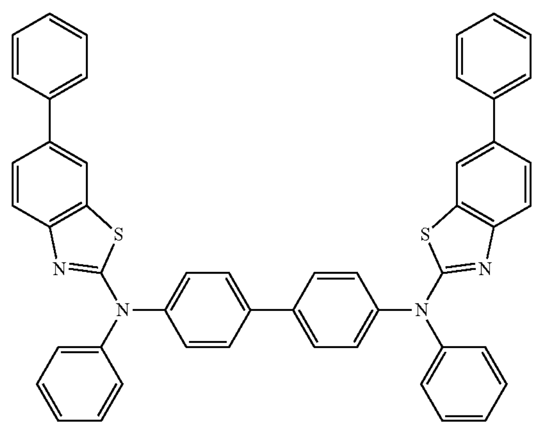
D128
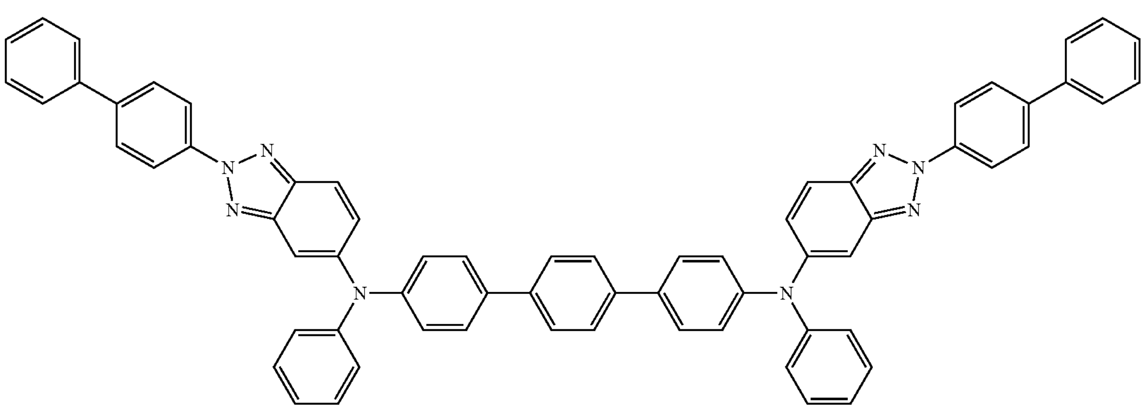

-continued
D129
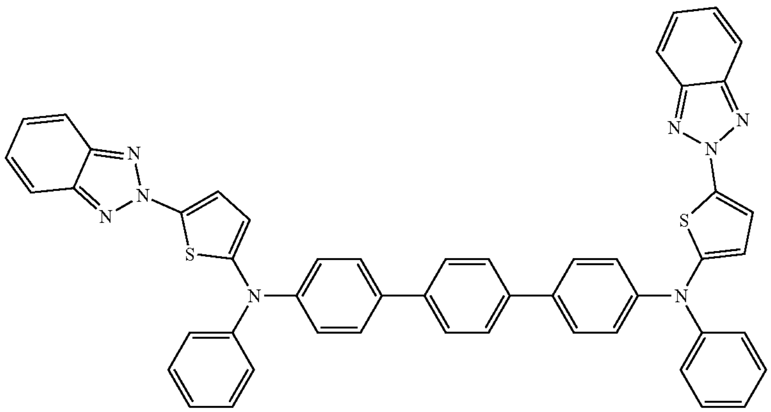
D130
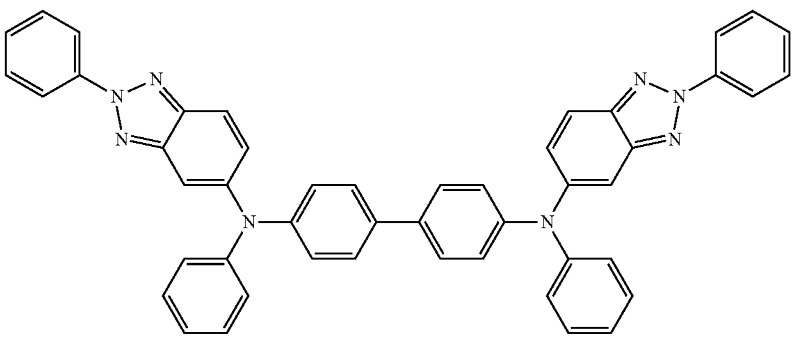
D131
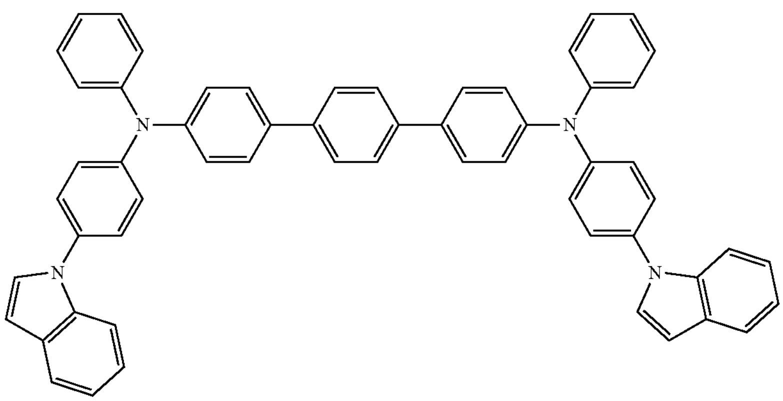
D132
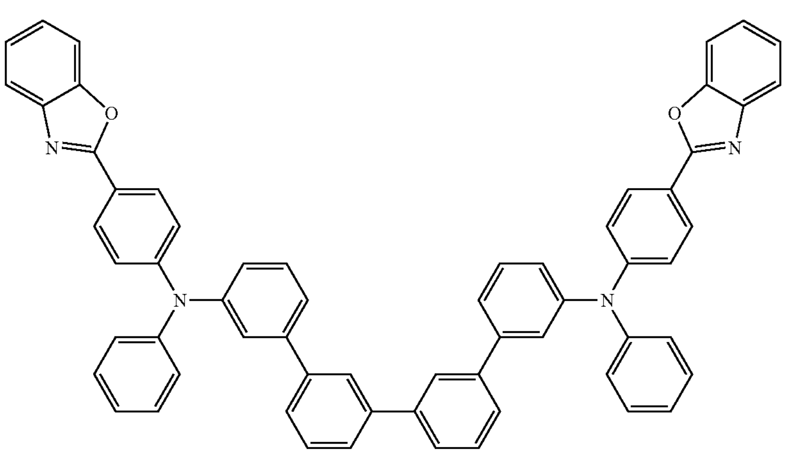

-continued
D133
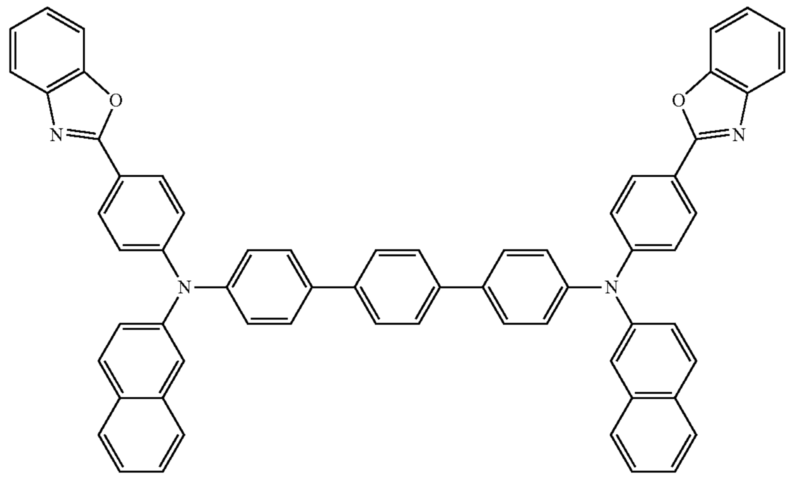
D134
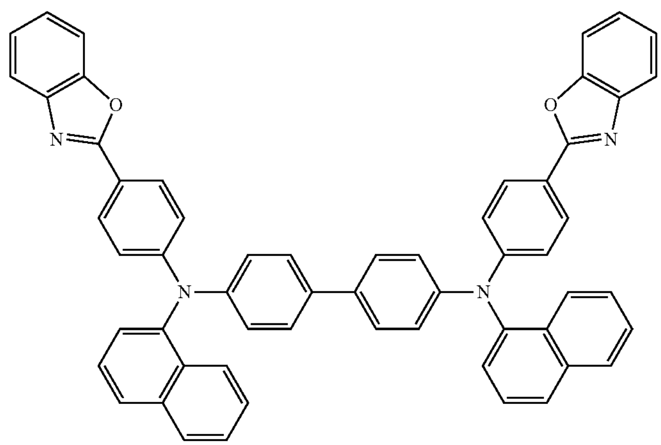
D135
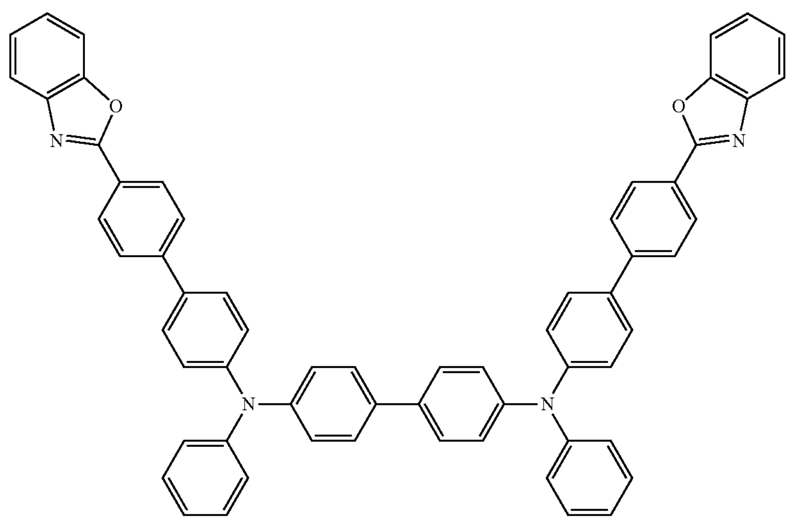

-continued
D136
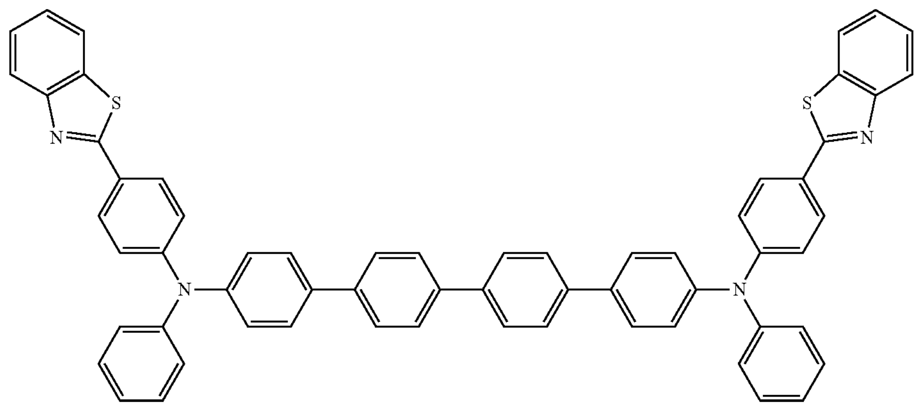
D137
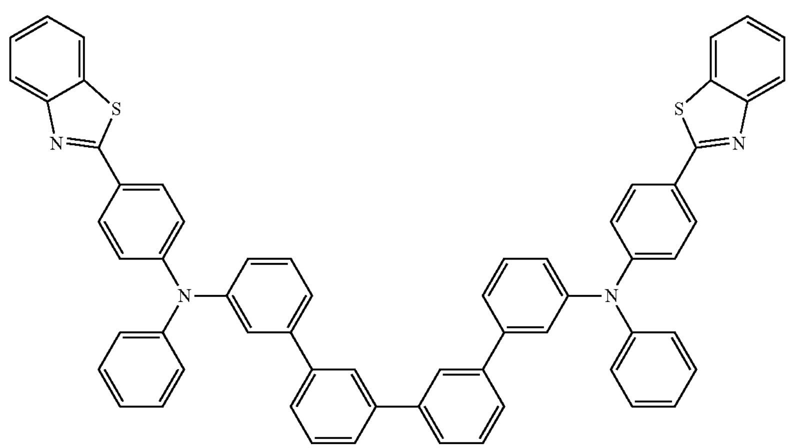
D138
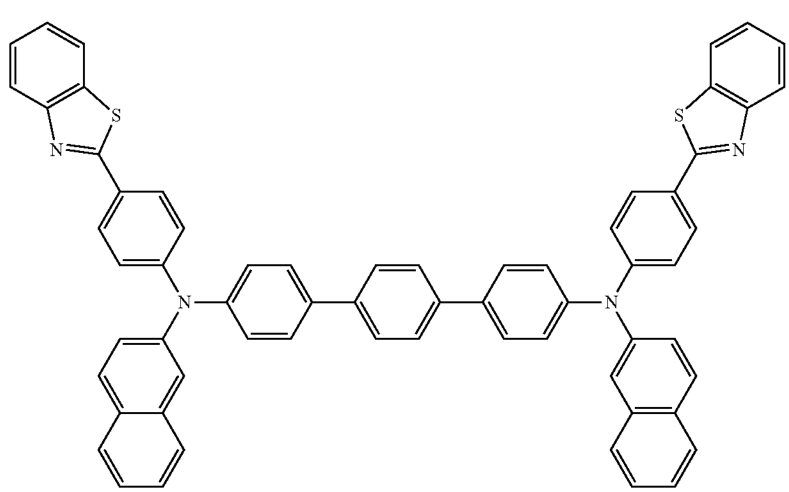

-continued
D139
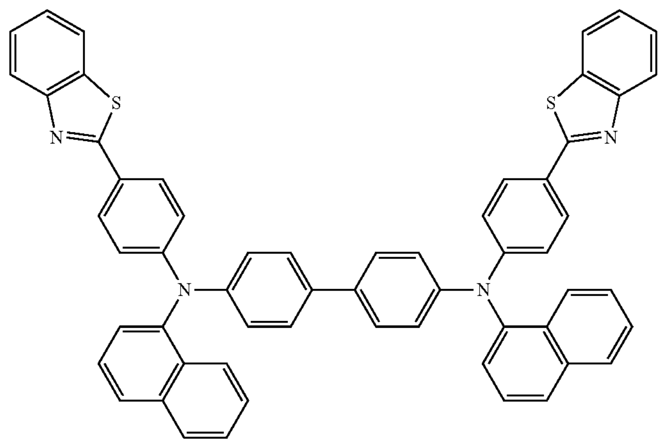
D140
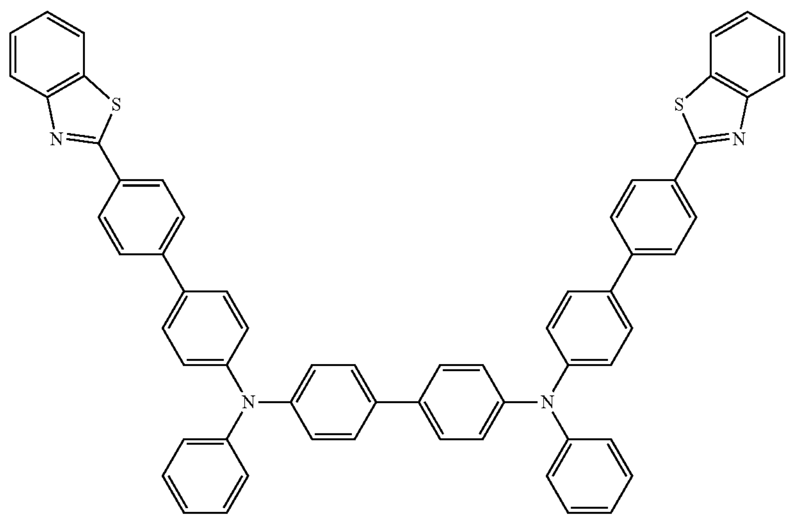
D141
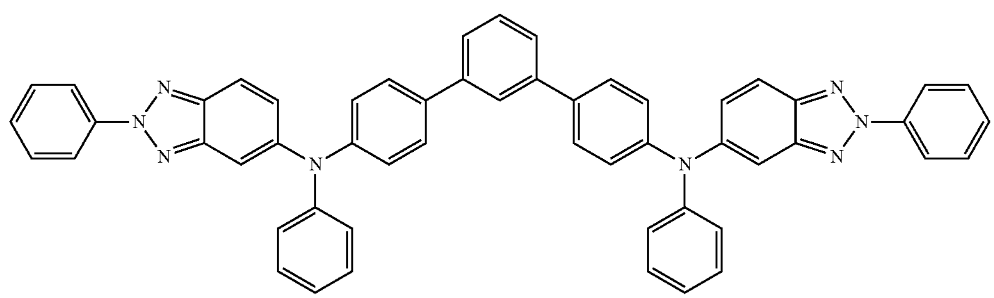
D142
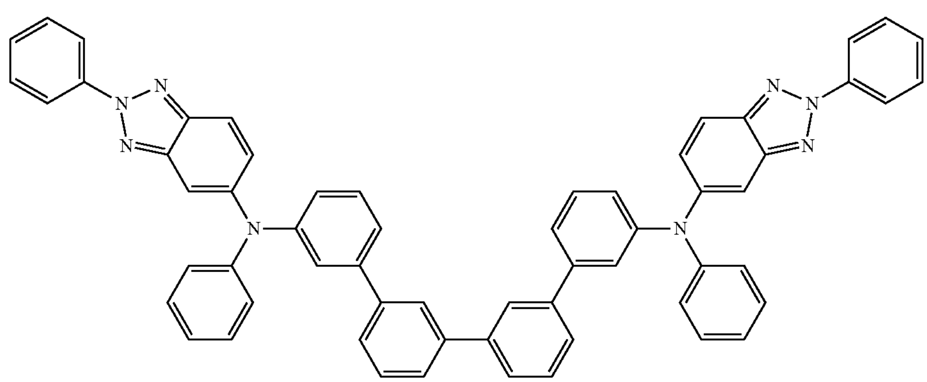

-continued

D143

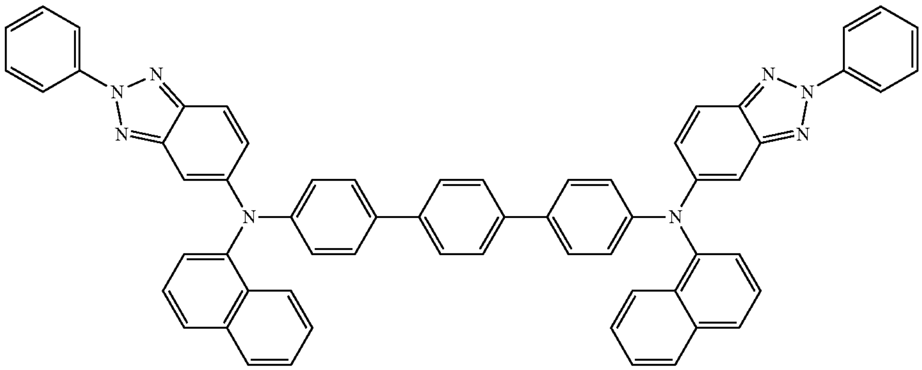

D144

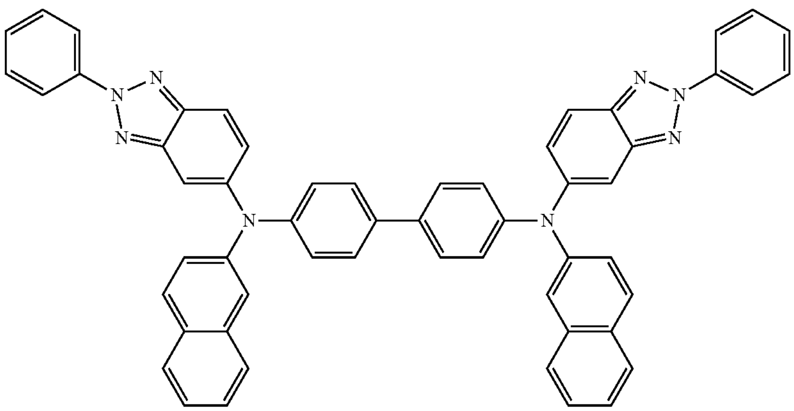

D145

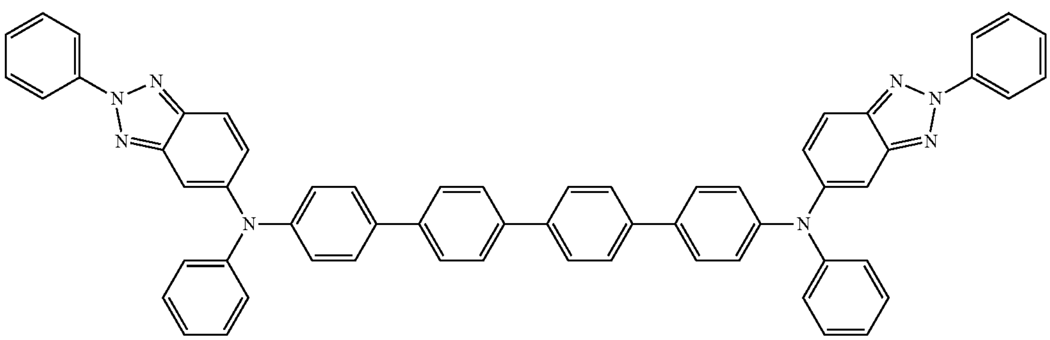

The organic electroluminescent device of the present invention may further include one or more organic layers, for example, a hole transport layer and an electron blocking layer, each of which may include a compound represented by Formula F:

(F)

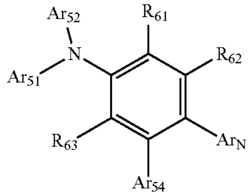

wherein $R_{61}$ to $R_{63}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, substituted or unsubstituted $C_1$-$C_{30}$ alkylgermanium, substituted or unsubstituted $C_1$-$C_{30}$ arylgermanium, cyano, nitro, and halogen, and $Ar_{51}$ to $Ar_{54}$ are identical to or different from each other and are each independently substituted or unsubstituted $C_6$-$C_{40}$ aryl or substituted or unsubstituted $C_2$-$C_{30}$ heteroaryl.

The compound of Formula F employed in the organic electroluminescent device of the present invention may be specifically selected from the compounds of Formulae F1 to F33:
F1
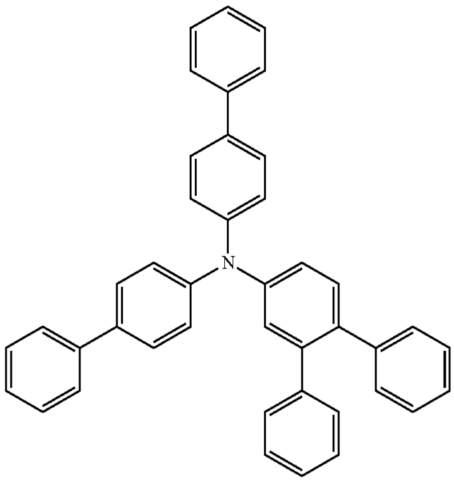
F2
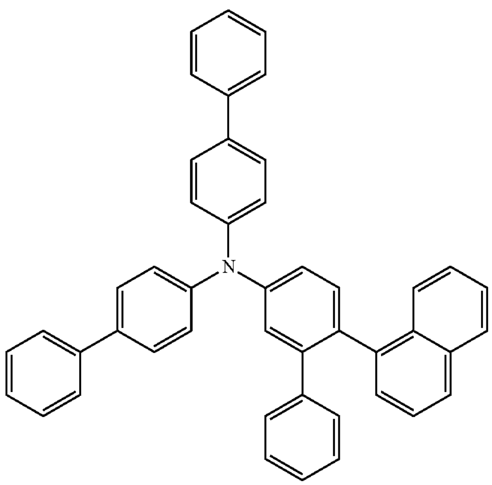
F3
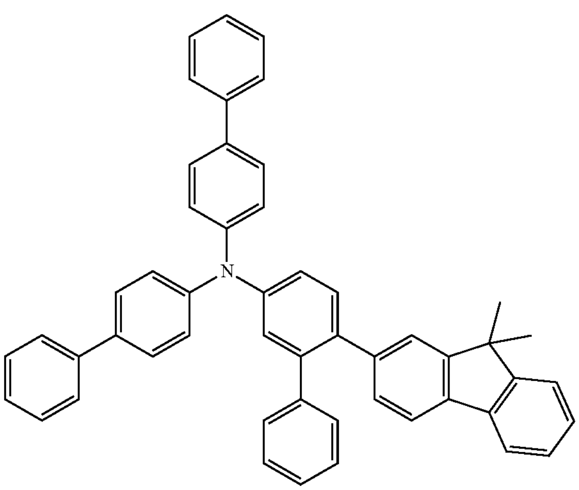
-continued
F4
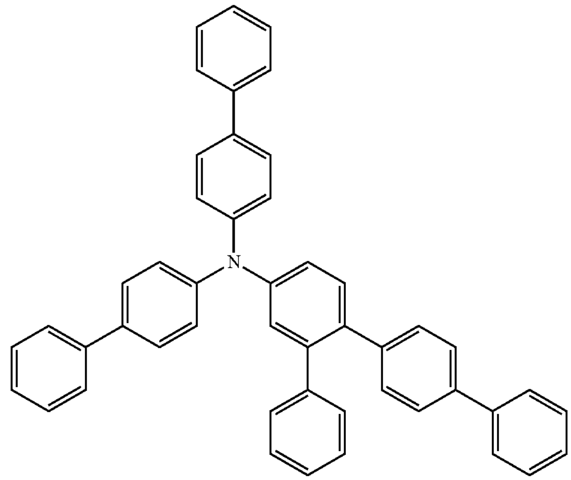
F5
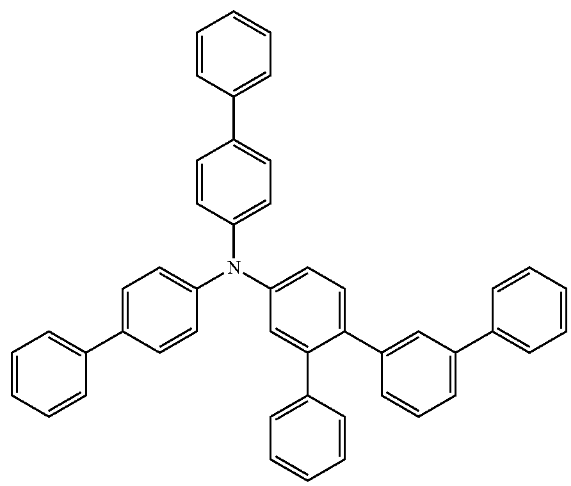
F6
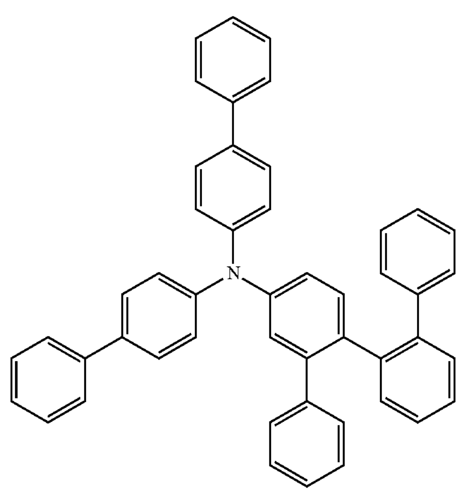

-continued
F7
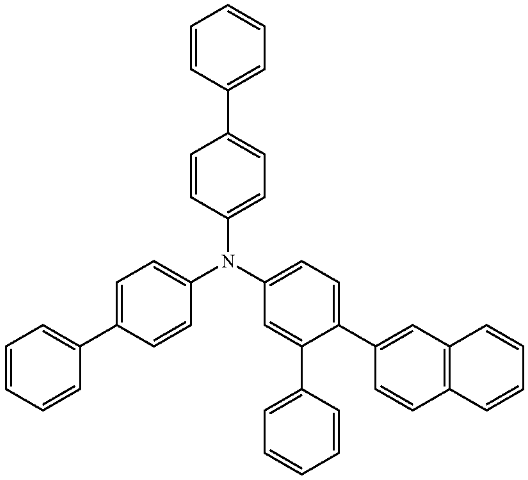
F8
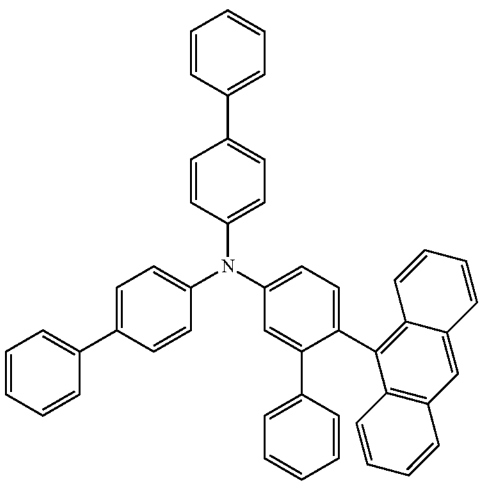
F9
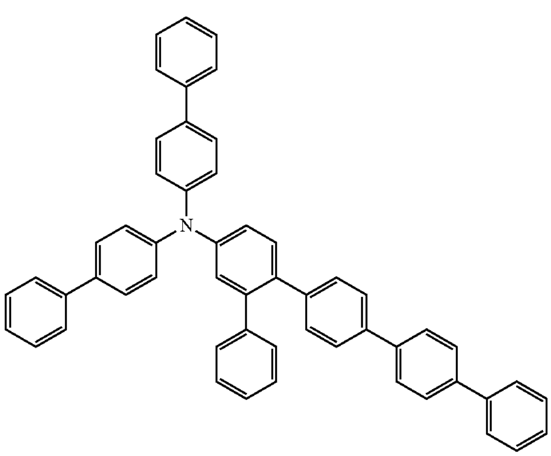
-continued
F10
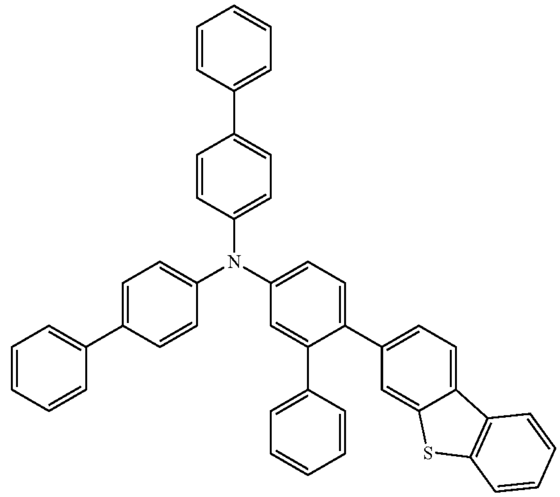
F11
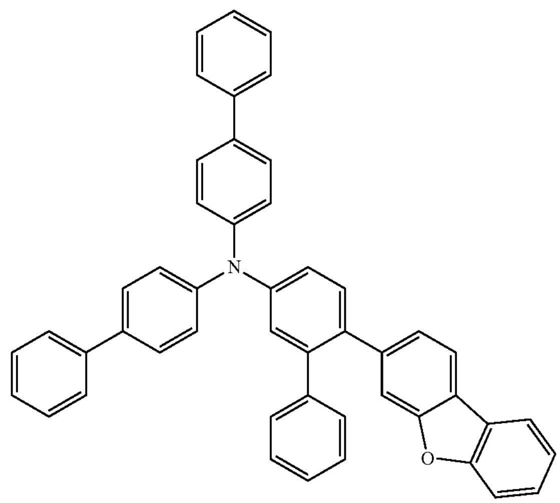
F12
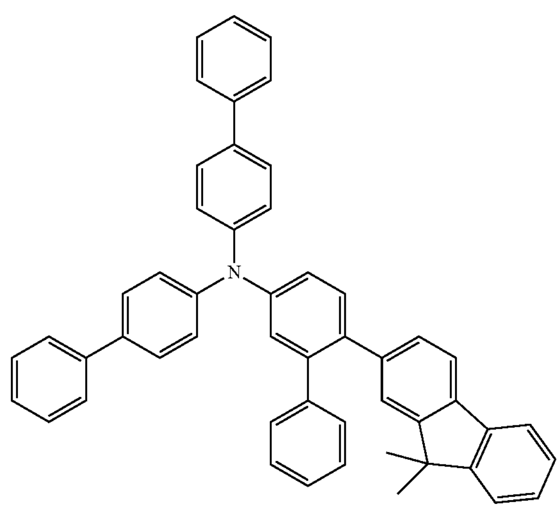

-continued
F13
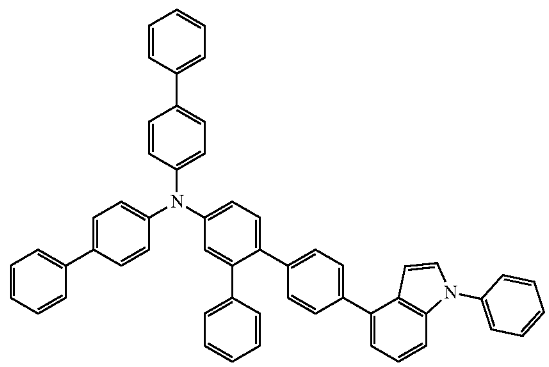
F14
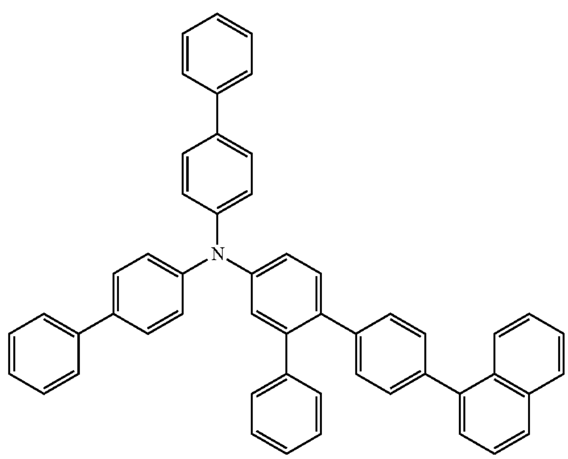
F15
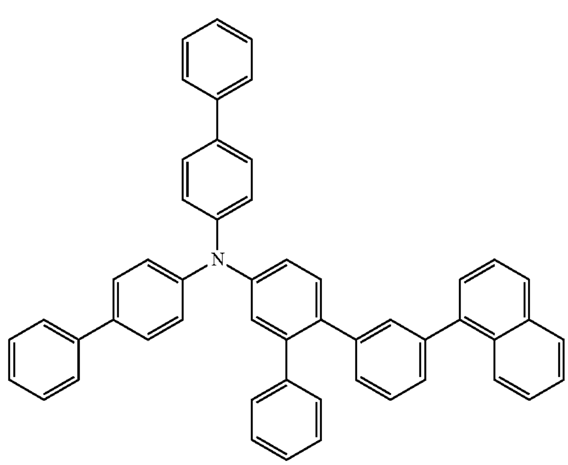
-continued
F16
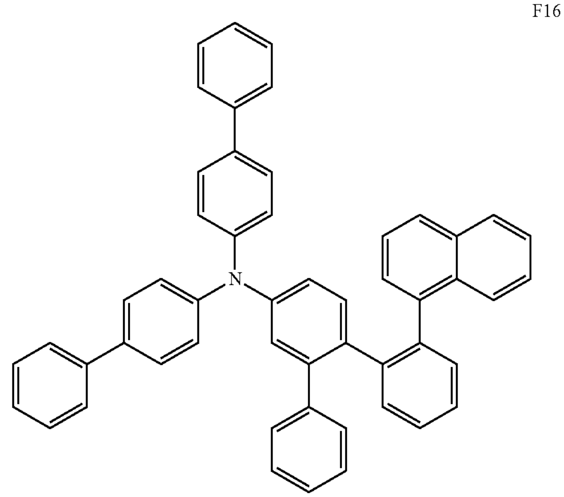
F17
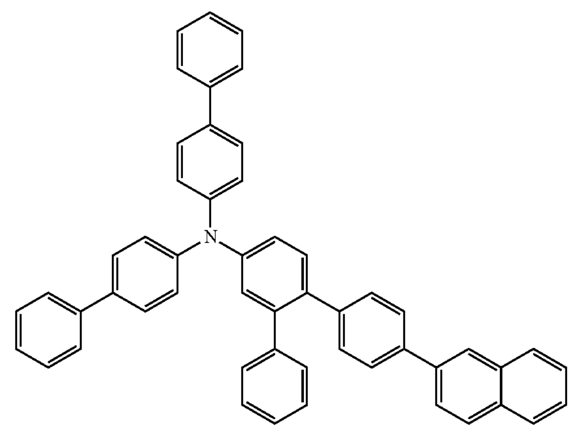
F18
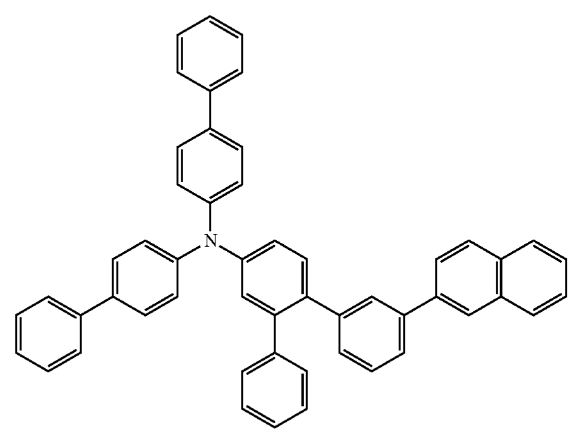

-continued
F19
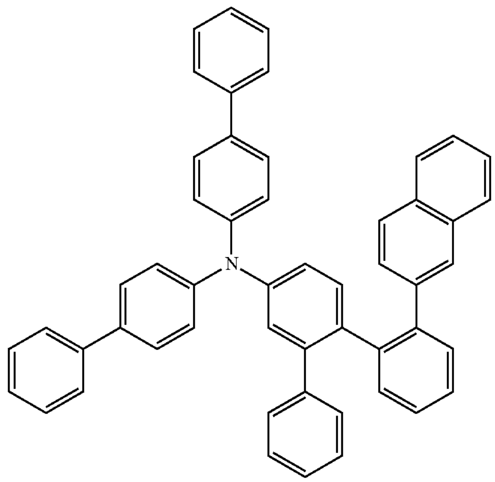
F20
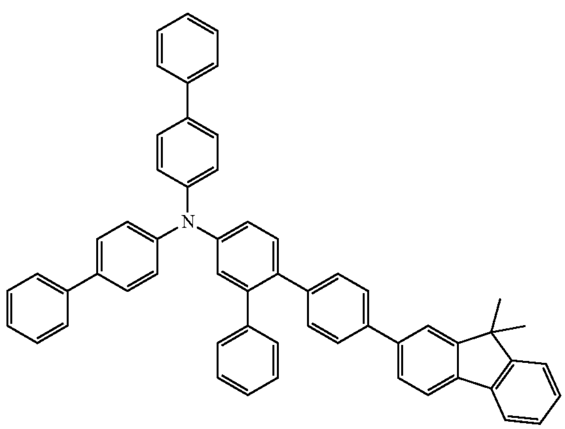
F21
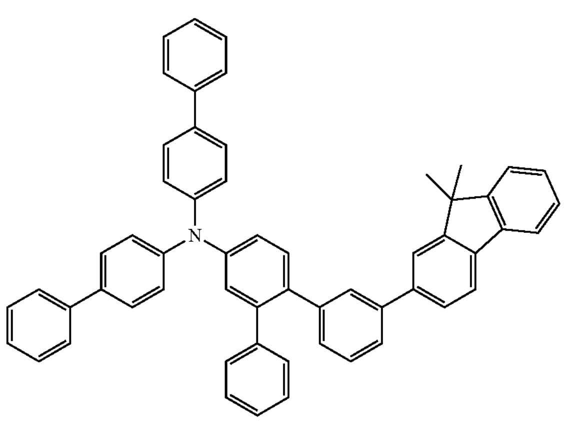
-continued
F22
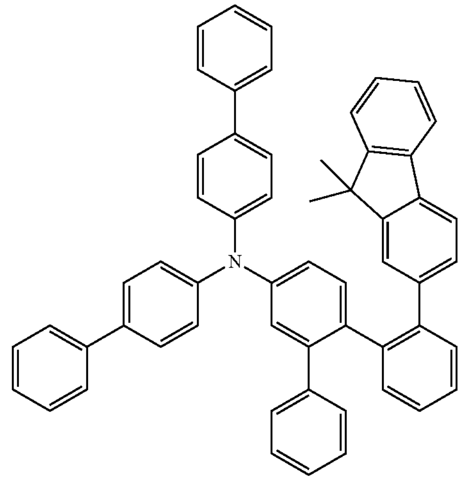
F23
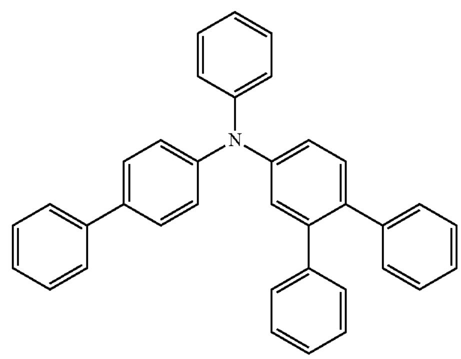
F24
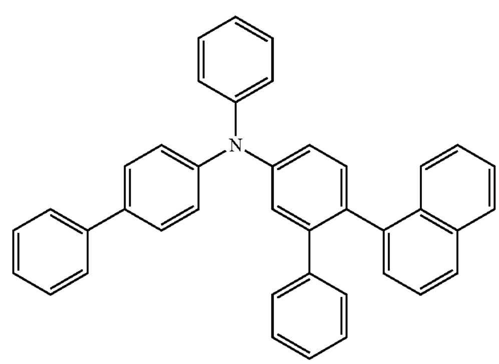
F25
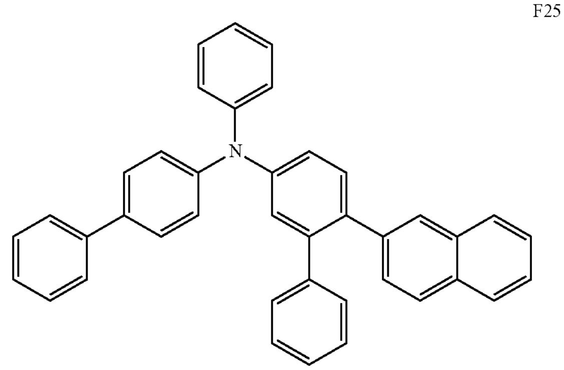

F26
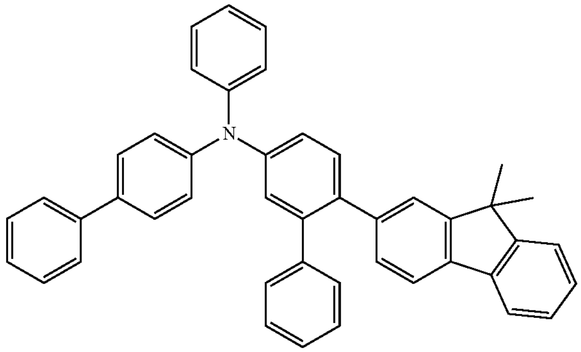
F27
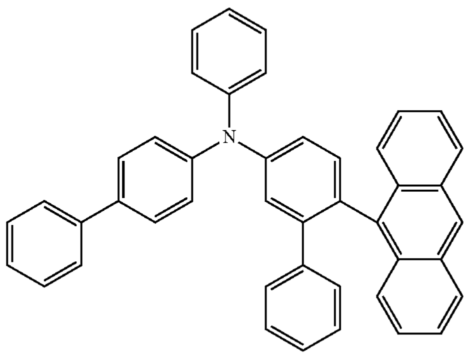
F28
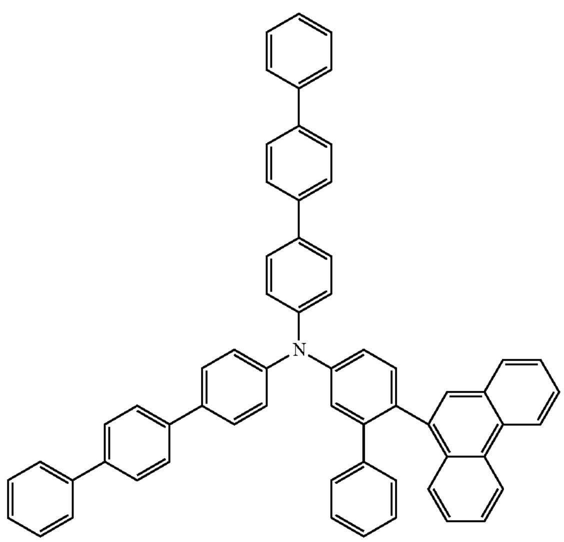
F29
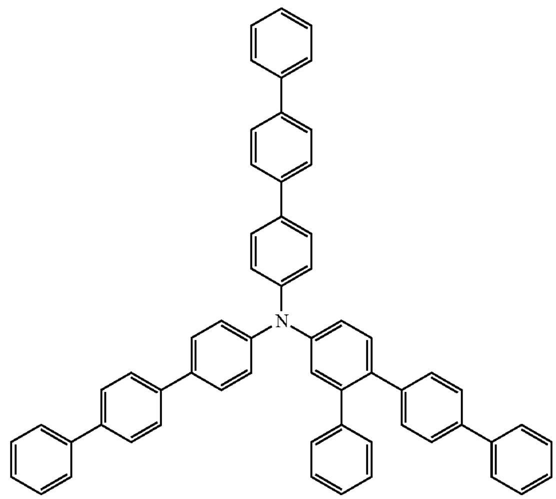
F30
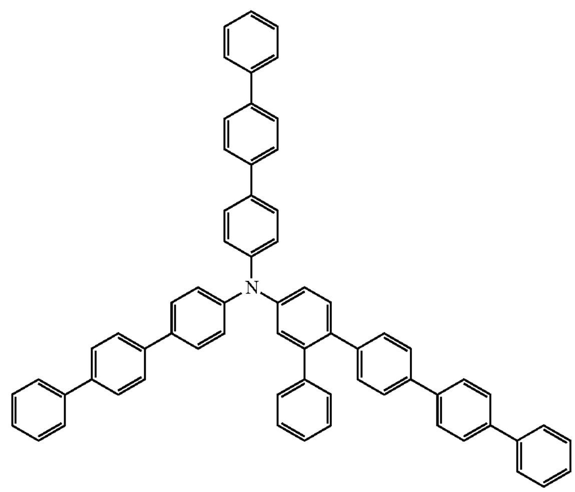
F31
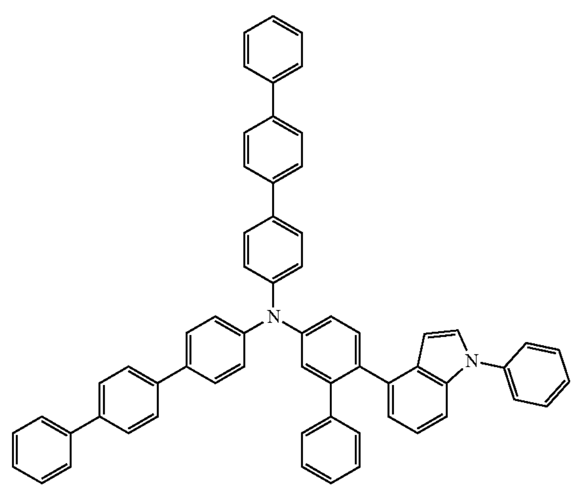

-continued

F32

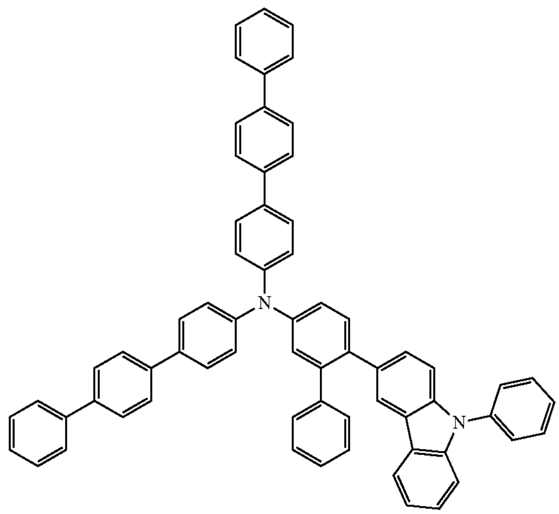

F33

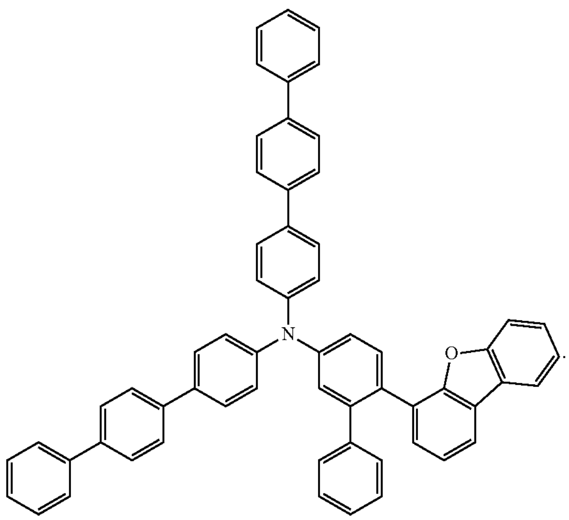

A specific structure of the organic electroluminescent device according to the present invention, a method for fabricating the device, and materials for the organic layers will be described below.

First, a material for the anode is coated on the substrate to form the anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide, such as indium tin oxide (ITO), indium zinc oxide (IZO), tin oxide ($SnO_2$) or zinc oxide (ZnO), is used as the anode material.

A material for the hole injecting layer is coated on the anode by vacuum thermal evaporation or spin coating to form the hole injecting layer. Then, a material for the hole transport layer is coated on the hole injecting layer by vacuum thermal evaporation or spin coating to form the hole transport layer.

The material for the hole injecting layer is not specially limited so long as it is usually used in the art. Specific examples of such materials include 4,4',4"-tris(2-naphthyl(phenyl)amino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), and N,N'-diphenyl-N,N'-bis[4-(phenyl-m-tolylamino)phenyl]biphenyl-4,4'-diamine (DNTPD).

The material for the hole transport layer is not specially limited so long as it is commonly used in the art. Examples of such materials include N,N'-bis(3-methylphenyl)-N,N'-diphenyl-[1,1-biphenyl]-4,4'-diamine (TPD) and N,N'-di(naphthalen-1-yl)-N,N'-diphenylbenzidine (α-NPD).

Subsequently, a hole auxiliary layer and the light emitting layer are sequentially laminated on the hole transport layer. A hole blocking layer may be optionally formed on the organic light emitting layer by vacuum thermal evaporation or spin coating. The hole blocking layer blocks holes from entering the cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited so long as it has the ability to transport electrons and a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, $BeBq_2$, OXD-7, and Liq.

The electron transport layer is deposited on the hole blocking layer by vacuum thermal evaporation or spin coating, and the electron injecting layer is formed thereon. A metal for the cathode is deposited on the electron injecting layer by vacuum thermal evaporation to form the cathode, completing the fabrication of the organic electroluminescent device.

As the metal for the formation of the cathode, there may be used, for example, lithium (Li), magnesium (Mg), aluminum (Al), aluminum-lithium (Al—Li), calcium (Ca), magnesium-indium (Mg—In) or magnesium-silver (Mg—Ag). The organic electroluminescent device may be of top emission type. In this case, a transmissive material, such as ITO or IZO, may be used to form the cathode.

The material for the electron transport layer functions to stably transport electrons injected from the cathode. The electron transport material may be any of those known in the art and examples thereof include, but are not limited to, quinoline derivatives, particularly, tris(8-quinolinolate)aluminum (Alq3), TAZ, Balq, beryllium bis(benzoquinolin-10-olate (Bebg2), ADN, and oxadiazole derivatives, such as PBD, BMD, and BND.

Each of the organic layers can be formed by a monomolecular deposition or solution process. According to the monomolecular deposition process, the material for each layer is evaporated under heat and vacuum or reduced pressure to form the layer in the form of a thin film. According to the solution process, the material for each layer is mixed with a suitable solvent, and then the mixture is formed into a thin film by a suitable method, such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

The present invention will be explained in more detail with reference to the following examples. However, it will be obvious to those skilled in the art that these examples are in no way intended to limit the scope of the invention.

Synthesis Example 1. Synthesis of Compound 1

Synthesis of Intermediate 1-a

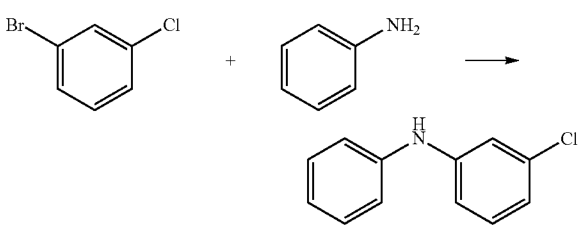

<Intermediate 1-a>

5 g (26 mmol) of 1-bromo-3-chlorobenzene, 2.92 g (31 mmol) of aniline, 0.1 g (1 mmol) of palladium acetate, 5 g (52 mmol) of sodium tert-butoxide, 0.3 g (1 mmol) of bis(diphenylphosphino)-1,1'-binaphthyl, and 50 mL of toluene were placed in a 100 mL reactor. The mixture was refluxed with stirring for 24 h. After completion of the reaction, the reaction mixture was filtered. The filtrate was concentrated and purified by column chromatography to afford Intermediate 1-a (4.3 g, yield 81%).

Synthesis of Intermediate 1-b

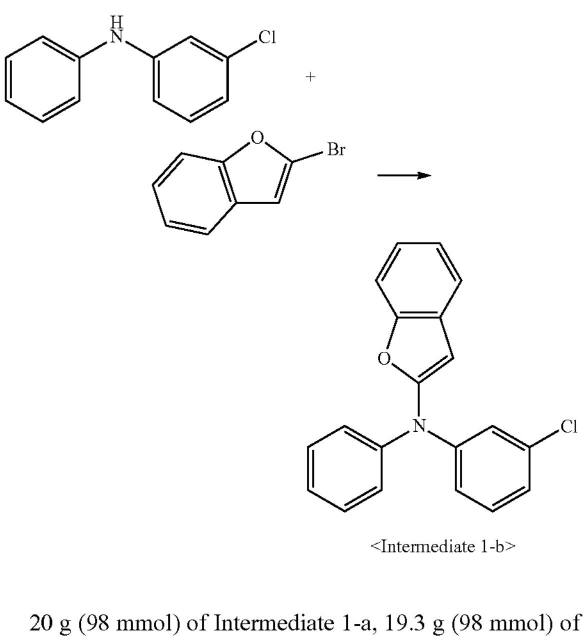

<Intermediate 1-b>

20 g (98 mmol) of Intermediate 1-a, 19.3 g (98 mmol) of 2-bromobenzofuran, 0.5 g (2 mmol) of palladium acetate, 18.9 g (196 mmol) of sodium tert-butoxide, 0.8 g (4 mmol) of tri-tert-butylphosphine, and 200 mL of toluene were placed in a 250 mL reactor. The mixture was refluxed with stirring for 5 h. After completion of the reaction, the reaction mixture was filtered. The filtrate was concentrated and purified by column chromatography to afford Intermediate 1-b (20 g, yield 64%).

Synthesis of Intermediate 1-c

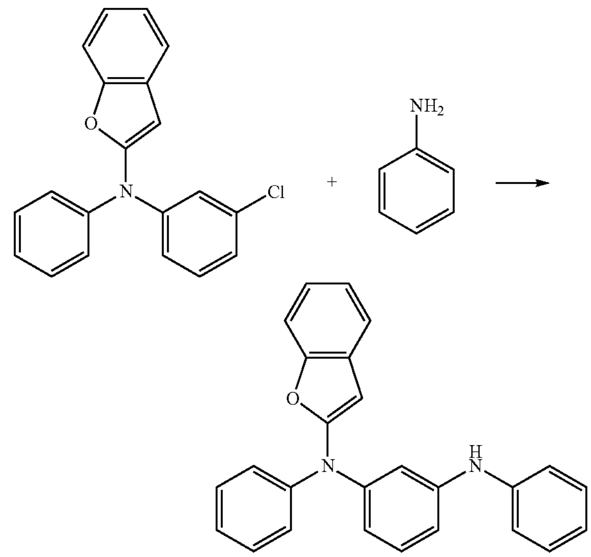

<Intermediate 1-c>

Intermediate 1-c (yield 72%) was synthesized in the same manner as in the synthesis of Intermediate 1-a, except that Intermediate 1-b was used instead of 1-bromo-3-chlorobenzene.

Synthesis of Intermediate 1-d

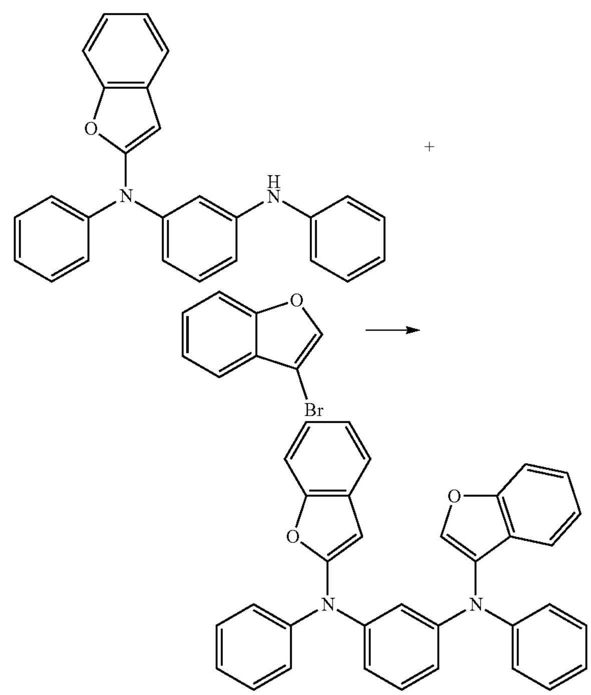

<Intermediate 1-d>

Intermediate 1-d (yield 65%) was synthesized in the same manner as in the synthesis of Intermediate 1-b, except that Intermediate 1-c and 3-bromobenzofuran were used instead of Intermediate 1-a and 2-bromobenzofuran, respectively.

Synthesis of Compound 1

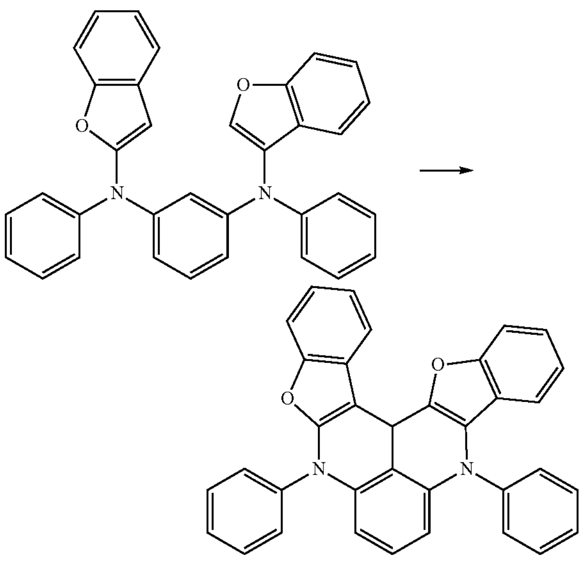

<Compound 1>

12 g (43 mmol) of Intermediate 1-d and 120 mL of tert-butylbenzene were placed in a 300 mL reactor, and 6.9 mL (73 mmol) of n-butyllithium was added dropwise thereto at −78° C. After the dropwise addition was finished, the mixture was stirred at 60° C. for 3 h. Thereafter, the reactor was flushed with nitrogen at 60° C. to remove heptane. After dropwise addition of 12.2 g (49 mmol) of boron tribromide at −78° C., the resulting mixture was stirred at room temperature for 1 h and 6.3 g (49 mmol) of N,N-diisopropylethylamine was added dropwise thereto at 0° C. After the dropwise addition was finished, the mixture was stirred at 120° C. for 2 h. After completion of the reaction, the reaction mixture was added with an aqueous sodium acetate solution at room temperature, stirred, and extracted with ethyl acetate. The organic layer was concentrated and purified by column chromatography to give Compound 1 (1.2 g, yield 10%).

MS (MALDI-TOF): m/z 500.17 [$M^+$]

Synthesis Example 2. Synthesis of Compound 2

Compound 2 (yield 8%) was synthesized in the same manner as in Synthesis Example 1, except that 2-bromobenzothiophene was used instead of 2-bromobenzofuran used in the synthesis of Intermediate 1-b and 3-bromobenzothiophene was used instead of 3-bromobenzofuran used in the synthesis of Intermediate 1-d.

MS (MALDI-TOF): m/z 532.12 [$M^+$]

Synthesis Example 3. Synthesis of Compound 7

Compound 7 (yield 10%) was synthesized in the same manner as in Synthesis Example 1, except that 2-bromo-1-phenyl-1H-indole was used instead of 2-bromobenzofuran used in the synthesis of Intermediate 1-b and 3-bromo-1,1-dimethyl-1H-indene was used instead of 3-bromobenzofuran used in the synthesis of Intermediate 1-d.

MS (MALDI-TOF): m/z 601.27 [$M^+$]

Synthesis Example 4. Synthesis of Compound 13

Synthesis of Intermediate 4-a

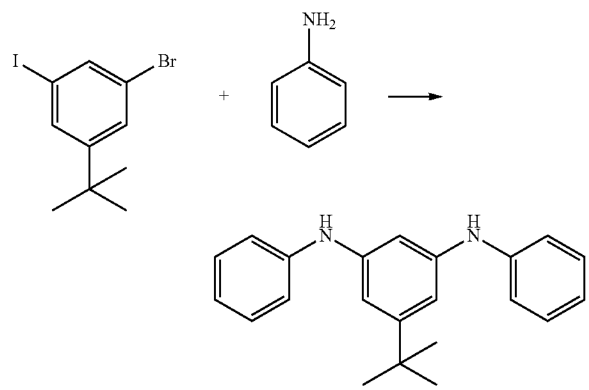

<Intermediate 4-a>

60 g (177 mmol) of 1-bromo-3-(tert-butyl)-5-iodobenzene, 39.6 g (425 mmol) of aniline, 1.6 g (7 mmol) of palladium acetate, 51 g (531 mmol) of sodium tert-butoxide, 4.4 g (7 mmol) of bis(diphenylphosphino)-1,1'-binaphthyl, and 600 mL of toluene were placed in a 1 L reactor. The mixture was refluxed with stirring for 24 h. After completion of the reaction, the reaction mixture was filtered. The filtrate was concentrated and purified by column chromatography to afford Intermediate 4-a (30 g, yield 53%).

Synthesis of Intermediate 4-b

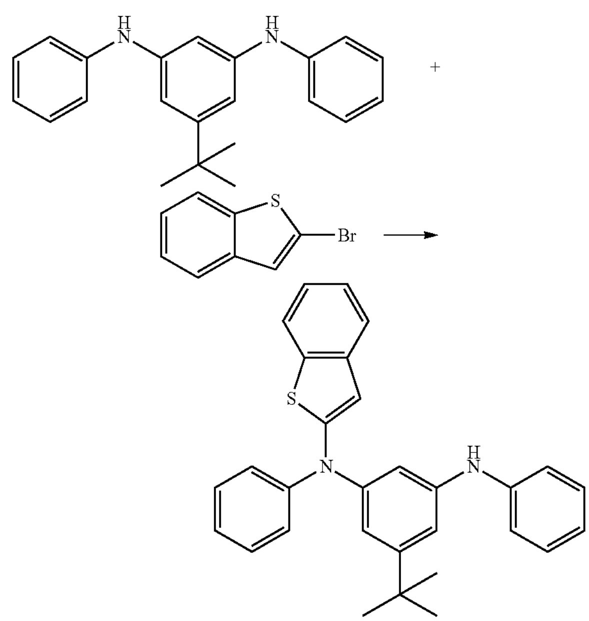

<Intermediate 4-b>

10 g (32 mmol) of Intermediate 4-a, 6.7 g (32 mmol) of 2-bromobenzothiophene, 0.2 g (1 mmol) of palladium acetate, 6.1 g (63 mmol) of sodium tert-butoxide, 0.3 g (1 mmol) of tri-tert-butylphosphine, and 150 mL of toluene were placed in a 250 mL reactor. The mixture was refluxed with stirring for 5 h. After completion of the reaction, the reaction mixture was filtered. The filtrate was concentrated and purified by column chromatography to afford Intermediate 4-b (9 g, yield 63%).

Synthesis of Compound 13

Compound 13 (yield 10%) was synthesized in the same manner as in Synthesis Example 1, except that Intermediate 4-b was used instead of Intermediate 1-c and 3-bromobenzothiophene was used instead of 3-bromobenzofuran used in the synthesis of Intermediate 1-d.

MS (MALDI-TOF): m/z 588.19 [$M^+$]

Synthesis Example 5. Synthesis of Compound 12

Compound 12 (yield 10%) was synthesized in the same manner as in Synthesis Example 4, except that 4-(tert-butyl) aniline was used instead of aniline used in the synthesis of Intermediate 4-a, 2-bromo-5-(tert-butyl)benzofuran was used instead of 2-bromobenzothiophene used in the synthesis of Intermediate 4-b, and 3-bromo-5-(tert-butyl)benzofuran was used instead of 3-bromobenzothiophene used in the synthesis of Compound 13.

MS (MALDI-TOF): m/z 780.48[$M^+$]

Synthesis Example 6. Synthesis of Compound 29

Synthesis of Intermediate 6-a

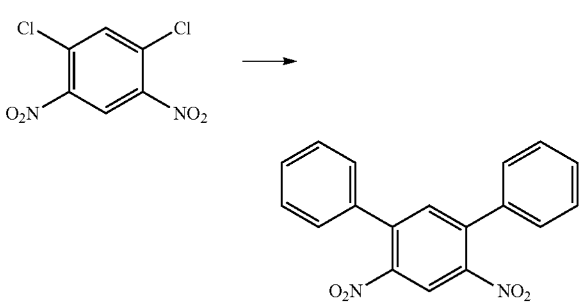

<Intermediate 6-a>

30.0 g (127 mmol) of 1,5-dichloro-2,4-dinitrobenzene, 46.3 g (380 mmol) of phenylboronic acid, 2.9 g (2.5 mmol) of tetrakis(triphenylphosphine) palladium, 40.3 g (380 mmol) of sodium carbonate, 90 mL of ethanol, 150 mL of toluene, and 120 mL of water were placed in a 1 L reactor. The mixture was refluxed with stirring. After completion of the reaction, the reaction mixture was extracted with water and ethyl acetate. The organic layer was concentrated and purified by column chromatography to afford Intermediate 6-a (25 g, yield 62%).

Synthesis of Intermediate 6-b

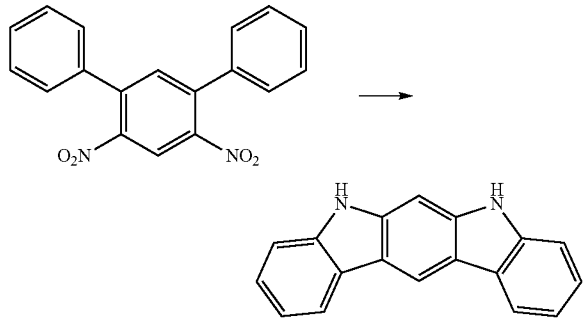

<Intermediate 6-b>

25 g (78 mmol) of Intermediate 6-a, 102.4 g (390 mmol) of triphenylphosphine, and 400 mL of dichlorobenzene were placed in a 1 L reactor. The mixture was refluxed with stirring for 3 days. After completion of the reaction, the dichlorobenzene was removed, followed by column chromatography to afford Intermediate 6-b (9.8 g, yield 49%).

Synthesis of Intermediate 6-c

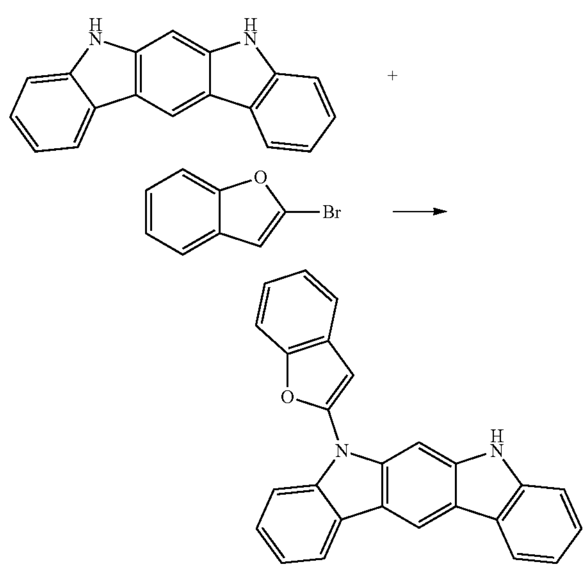

<Intermediate 6-c>

11 g (43 mmol) of Intermediate 6-b, 8.5 g (43 mmol) of 2-bromobenzofuran, 5.5 g (86 mmol) of a copper powder, 2.3 g (9 mmol) of 18-crown-6-ether, and 17.8 g (129 mmol) of potassium carbonate were placed in a 250 mL reactor, and 110 mL of dichlorobenzene was added thereto. The mixture was refluxed with stirring at 180° C. for 24 h. After completion of the reaction, the dichlorobenzene was removed, followed by column chromatography to afford Intermediate 6-c (8.5 g, yield 53%).

Synthesis of Intermediate 6-d

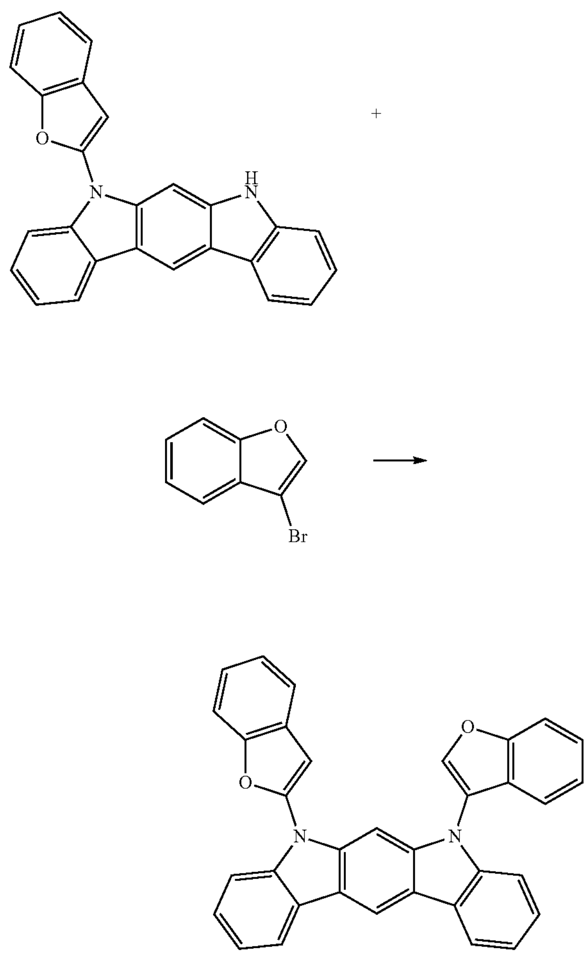

<Intermediate 6-d>

Intermediate 6-d (yield 61%) was synthesized in the same manner as in the synthesis of Intermediate 6-c, except that Intermediate 6-c and 3-bromobenzofuran were used instead of Intermediate 6-b and 2-bromobenzofuran, respectively.

Synthesis of Compound 29

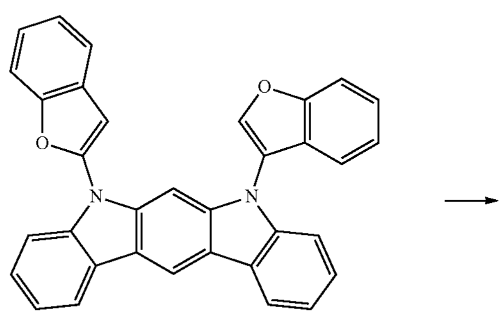

<Compound 29>

-continued

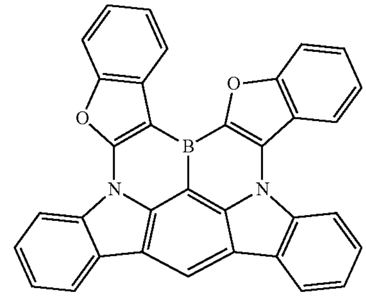

Compound 29 (yield 12%) was synthesized in the same manner as in Synthesis Example 1, except that Intermediate 6-d was used instead of Intermediate 1-d.

MS (MALDI-TOF): m/z 496.14[$M^+$]

Synthesis Example 7. Synthesis of Compound 70

Synthesis of Intermediate 7-a

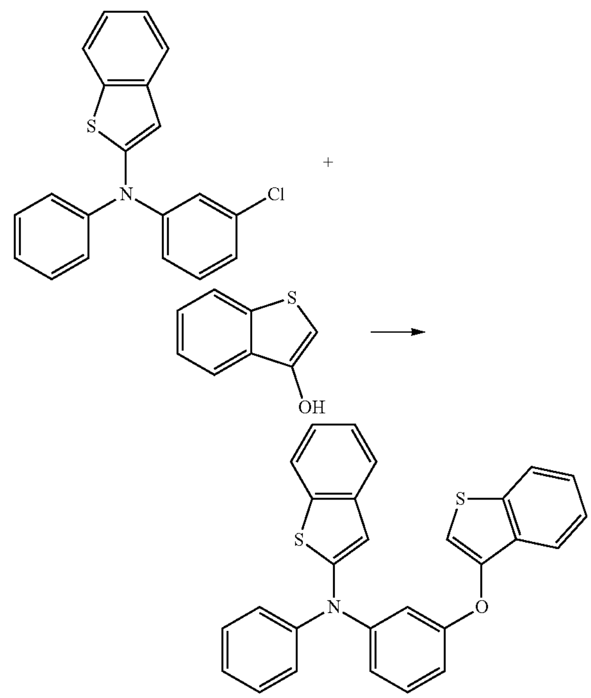

<Intermediate 7-a>

30.0 g (89 mmol) of Intermediate 2-b, 14.7 g (98 mmol) of benzothiophen-3-ol, 24.8 g (179 mmol) of potassium carbonate, and 200 mL of NMP were placed in a 500 mL reactor. The mixture was refluxed with stirring at 160° C. for 12 h. After completion of the reaction, the reaction mixture was cooled to room temperature, distilled under reduced pressure to remove the NMP, and extracted with water and ethyl acetate. The organic layer was concentrated under reduced pressure and purified by column chromatography to afford Intermediate 7-a (27 g, yield 67%).

Synthesis of Compound 70

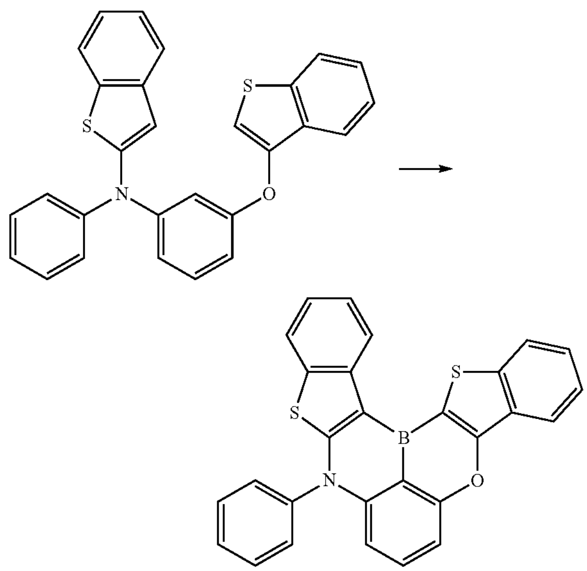

<Compound 70>

Compound 70 (yield 11%) was synthesized in the same manner as in Synthesis Example 1, except that Intermediate 7-a was used instead of Intermediate 1-d.

MS (MALDI-TOF): m/z 457.08[$M^+$]

Synthesis Example 8. Synthesis of Compound 92

Compound 92 (yield 10%) was synthesized in the same manner as in Synthesis Example 4, except that 3,5-dibromo-N,N-diphenylaniline and benzene-ds-amine were used instead of 1-bromo-3-(tert-butyl)-5-iodobenzene and aniline in the synthesis of Intermediate 4-a, respectively, 2-bromobenzofuran was used instead of 2-bromobenzothiophene in the synthesis of Intermediate 4-b, and 3-bromobenzofuran was used instead of 3-bromobenzothiophene in the synthesis of Intermediate 4-c.

MS (MALDI-TOF): m/z 677.31[$M^+$]

Synthesis Example 9. Synthesis of Compound 125

Synthesis of Intermediate 9-b

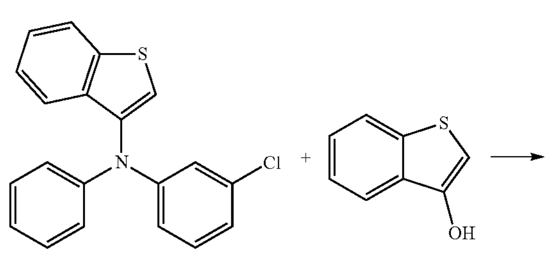

-continued

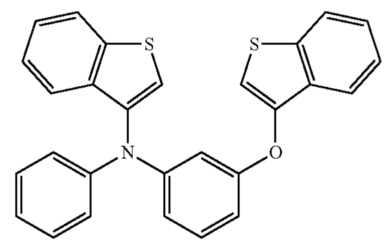

<Intermediate 9-b>

25.0 g (74 mmol) of Intermediate 9-a, 12.3 g (82 mmol) of benzothiophen-3-ol, 20.7 g (150 mmol) of potassium carbonate, and 180 mL of NMP were placed in a 500 mL reactor. The mixture was refluxed with stirring at 160° C. for 12 h. After completion of the reaction, the reaction mixture was cooled to room temperature, distilled under reduced pressure to remove the NMP, and extracted with water and ethyl acetate. The organic layer was concentrated under reduced pressure and purified by column chromatography to afford Intermediate 9-b (23 g, yield 69%).

Synthesis of Compound 125

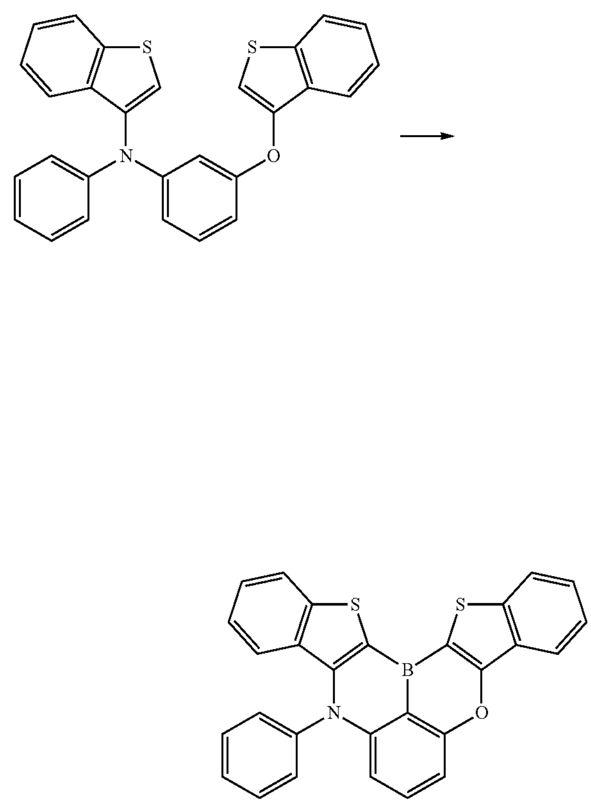

<Compound 125>

Compound 125 (yield 10%) was synthesized in the same manner as in Synthesis Example 1, except that Intermediate 9-b was used instead of Intermediate 1-d.

MS (MALDI-TOF): m/z 457.08[$M^+$]

Synthesis Example 10. Synthesis of Compound 126

Synthesis of Intermediate 10-b

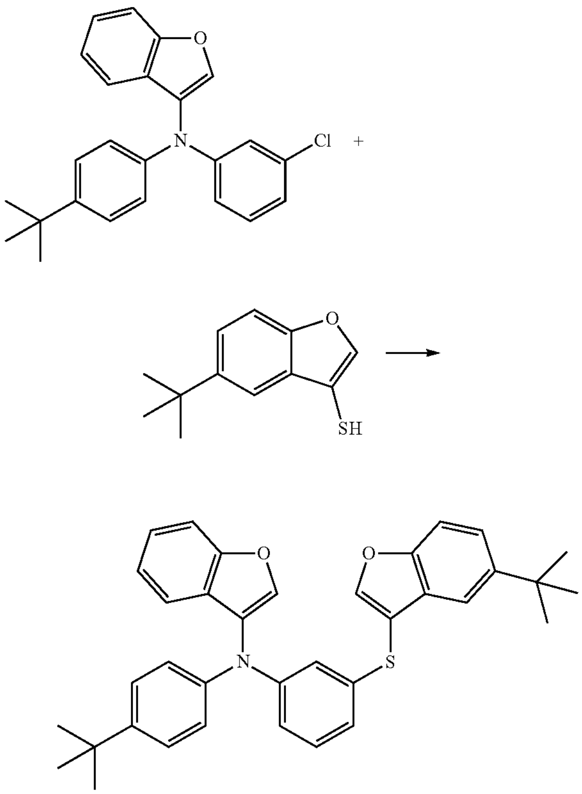

<Intermediate 10-b>

20.0 g (53 mmol) of Intermediate 10-a, 12 g (59 mmol) of 5-tert-butyl-benzofuran-3-thiol, 14.8 g (107 mmol) of potassium carbonate, and 160 mL of NMP were placed in a 500 mL reactor. The mixture was refluxed with stirring at 160° C. for 12 h. After completion of the reaction, the reaction mixture was cooled to room temperature, distilled under reduced pressure to remove the NMP, and extracted with water and ethyl acetate. The organic layer was concentrated under reduced pressure and purified by column chromatography to afford Intermediate 10-b (20 g, yield 69%).

Synthesis of Compound 126

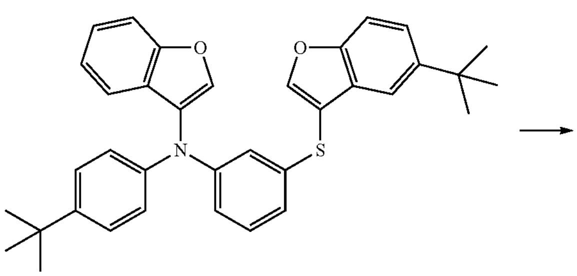

-continued

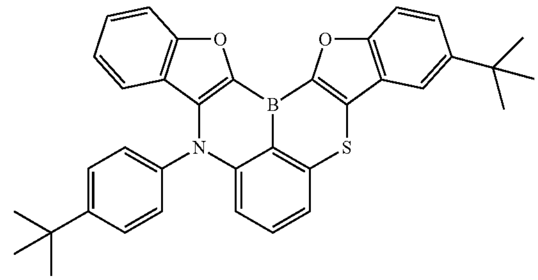

<Compound 126>

Compound 126 (yield 11%) was synthesized in the same manner as in Synthesis Example 1, except that Intermediate 10-b was used instead of Intermediate 1-d.

MS (MALDI-TOF): m/z 553.22[$M^+$]

Synthesis Example 11. Synthesis of Compound 128

Synthesis of Intermediate 11-b

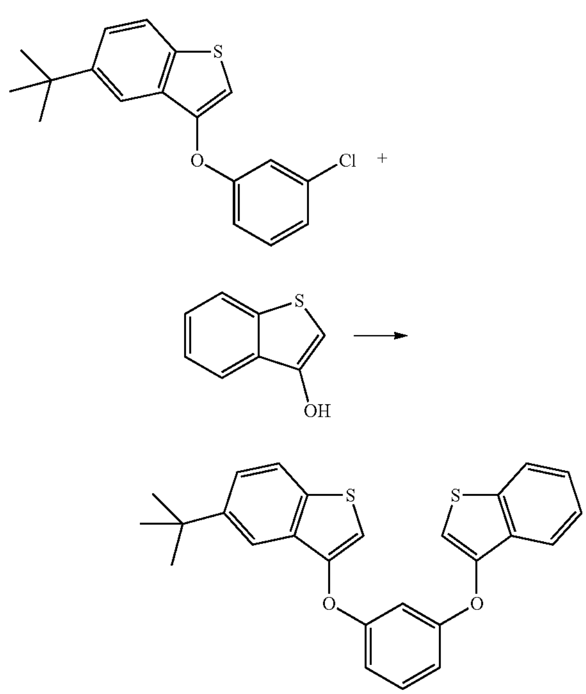

<Intermediate 11-b>

30.0 g (95 mmol) of Intermediate 11-a, 12 g (104 mmol) of benzothiophen-3-ol, 26.3 g (190 mmol) of potassium carbonate, and 200 mL of NMP were placed in a 500 mL reactor. The mixture was refluxed with stirring at 160° C. for 12 h. After completion of the reaction, the reaction mixture was cooled to room temperature, distilled under reduced pressure to remove the NMP, and extracted with water and ethyl acetate. The organic layer was concentrated under reduced pressure and purified by column chromatography to afford Intermediate 11-b (27 g, yield 66%).

Synthesis of Compound 128

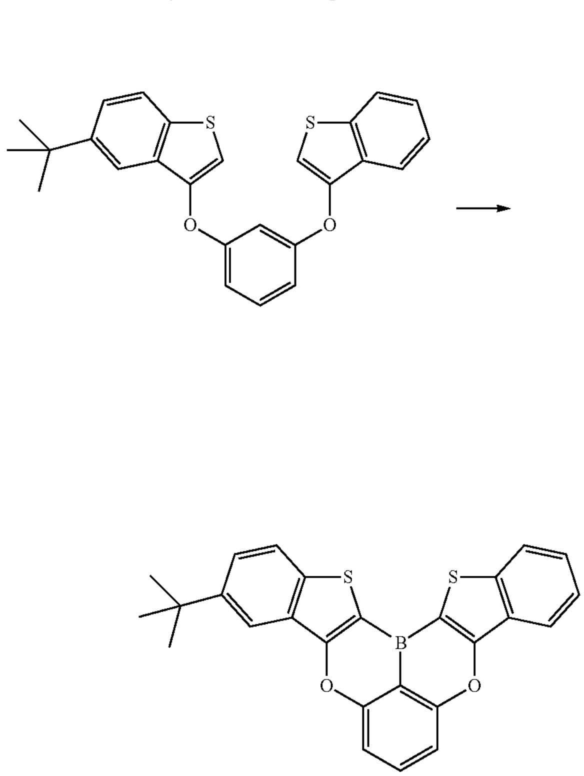

<Compound 128>

Compound 128 (yield 10%) was synthesized in the same manner as in Synthesis Example 1, except that Intermediate 11-b was used instead of Intermediate 1-d.

MS (MALDI-TOF): m/z 438.09[$M^+$]

Examples 1-5: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. DNTPD (700 Å) and the compound of Formula H (250 Å) were deposited in this order on the ITO. A mixture of BH1 as a host and each of Compounds 2, 7, 12, 29, and 125 (3 wt %) was used to form a 250 Å thick light emitting layer. Thereafter, the compound of Formula E-1 and the compound of Formula E-2 in a ratio of 1:1 were used to form a 300 Å thick electron transport layer on the light emitting layer. The compound of Formula E-1 was used to form a 5 Å thick electron injecting layer on the electron transport layer. A1 was deposited on the electron injecting layer to form a 1000 Å thick A1 electrode, completing the fabrication of an organic electroluminescent device. The luminescent properties of the organic electroluminescent device were measured at 0.4 mA.

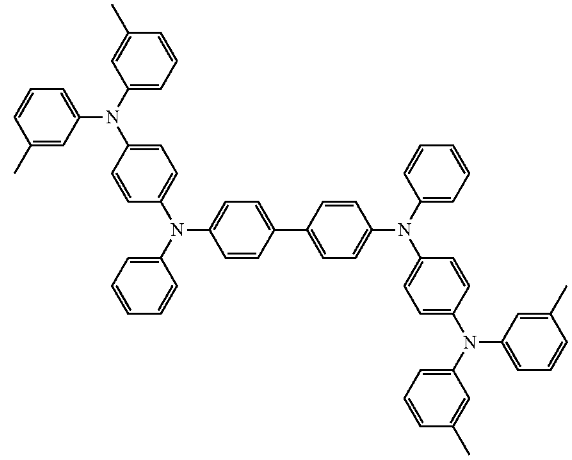

[DNTPD]

[Formula H]

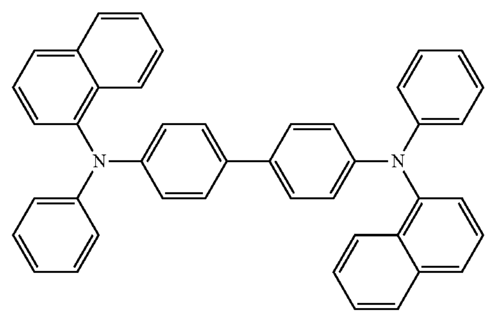

[Formula E-1]

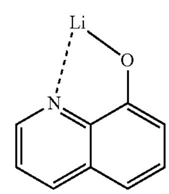

[Formula E-2]

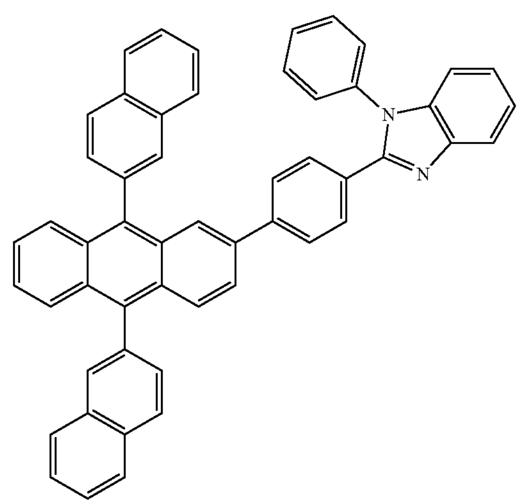

Comparative Examples 1 and 2

Organic electroluminescent devices were fabricated in the same manner as in Example 1, except that BD1 and BD2 were used instead of the inventive compounds. The luminescent properties of the organic electroluminescent devices were measured at 0.4 mA. The structures of BH1, BD1, and BD2 are as follows.

TABLE 1

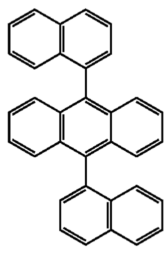 [SMILES: c1ccc2c(-c3c4ccccc4c(-c4cccc5ccccc45)c4ccccc34)cccc2c1]

[BH1]

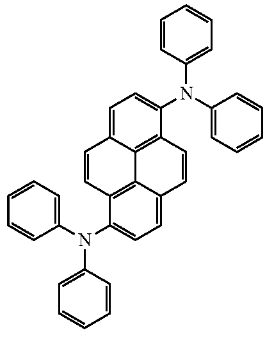 [SMILES: c1ccc(N(c2ccccc2)c2ccc3ccc4c(N(c5ccccc5)c5ccccc5)ccc5ccc2c3c54)cc1]

[BD1]

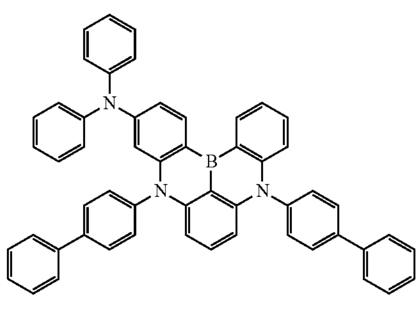 [SMILES: c1ccc(-c2ccc(N3c4ccccc4B4c5ccc(N(c6ccccc6)c6ccccc6)cc5N(c5ccc(-c6ccccc6)cc5)c5cccc3c54)cc2)cc1]

[BD 2]

| Example No. | Dopant | Current density ($mA/cm^2$) | Voltage (V) | External quantum efficiency (%) | T90 (hr) |
|---|---|---|---|---|---|
| Example 1 | Compound 2 | 10 | 3.88 | 8.1 | 117 |
| Example 2 | Compound 7 | 10 | 3.92 | 7.7 | 108 |
| Example 3 | Compound 12 | 10 | 3.83 | 8.3 | 125 |
| Example 4 | Compound 29 | 10 | 3.86 | 8.0 | 115 |
| Example 5 | Compound 125 | 10 | 3.89 | 7.8 | 112 |
| Comparative Example 1 | BD1 | 10 | 4.23 | 4.3 | 47 |
| Comparative Example 2 | BD2 | 10 | 4.11 | 5.8 | 52 |

Examples 6-11: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. DNTPD (700 Å) and the compound of Formula F (250 Å) were deposited in this order on the ITO. A mixture of BH2 as a host and each of Compounds 1, 13, 70, 92, 126, and 128 (3 wt %) was used to form a 250 Å thick light emitting layer. Thereafter, the compound of Formula E-1 and the compound of Formula E-2 in a ratio of 1:1 were used to form a 300 Å thick electron transport layer on the light emitting layer. The compound of Formula E-1 was used to form a 5 Å thick electron injecting layer on the electron transport layer. A1 was deposited on the electron injecting layer to form a 1000 Å thick A1 electrode, completing the fabrication of an organic electroluminescent device. The luminescent properties of the organic electroluminescent device were measured at 0.4 mA.

[DNTPD]

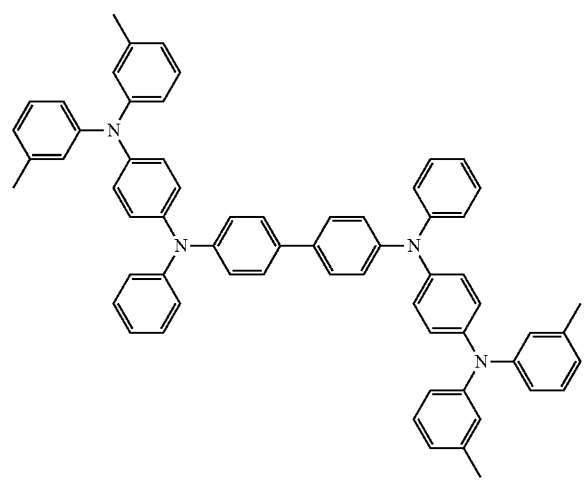

[Formula F]

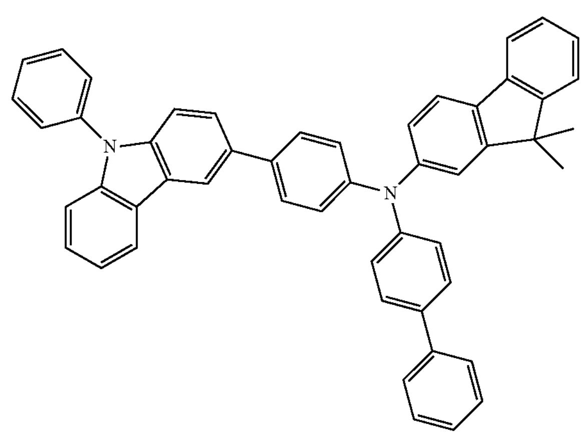

-continued

[Formula E-1]

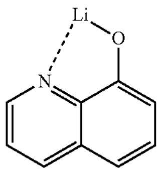

[Formula E-2]

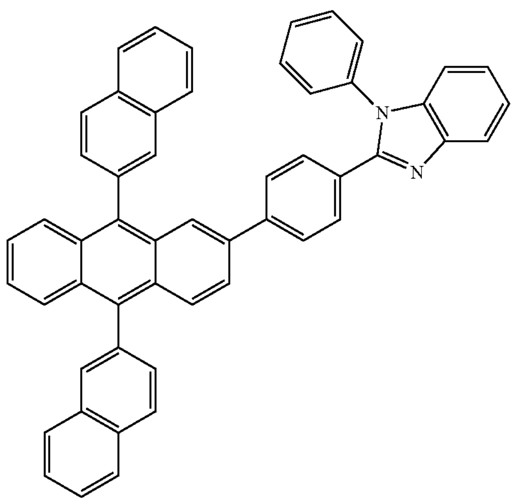

[BH2]

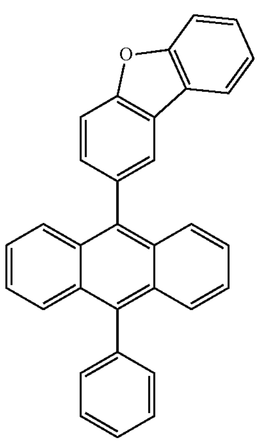

Comparative Examples 3 and 4

Organic electroluminescent devices were fabricated in the same manner as in Example 1, except that BD3 and BD4 were used instead of instead of the inventive compounds. The luminescent properties of the organic electroluminescent devices were measured at 0.4 mA. The structures of BD3 and BD4 are as follows.

TABLE 2

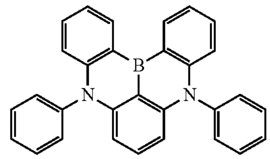 [SMILES: c1ccc(N2c3ccccc3B3c4ccccc4N(c4ccccc4)c4cccc2c43)cc1]

[BD3]

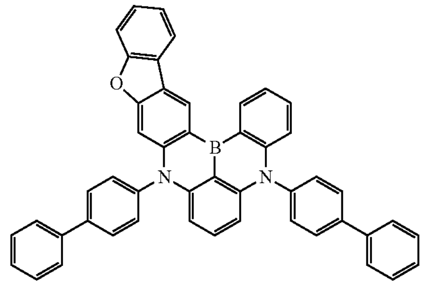 [SMILES: c1ccc(-c2ccc(N3c4ccccc4B4c5cc6c(cc5N(c5ccc(-c7ccccc7)cc5)c5cccc3c54)oc3ccccc36)cc2)cc1]

[BD4]

| Example No. | Dopant | Voltage (V) | External quantum efficiency (%) | T90 (hr) |
|---|---|---|---|---|
| Example 6 | Compound 1 | 3.8 | 8.21 | 120 |
| Example 7 | Compound 13 | 3.7 | 8.53 | 128 |
| Example 8 | Compound 70 | 3.8 | 8.08 | 117 |
| Example 9 | Compound 92 | 3.8 | 8.85 | 140 |
| Example 10 | Compound 126 | 3.8 | 8.27 | 126 |
| Example 11 | Compound 128 | 3.8 | 8.32 | 130 |
| Comparative Example 3 | BD3 | 3.8 | 6.04 | 59 |
| Comparative Example 4 | BD4 | 3.9 | 5.76 | 45 |

What is claimed is:

1. An organic electroluminescent compound represented by Formula A-5 or A-7:

(A-5)

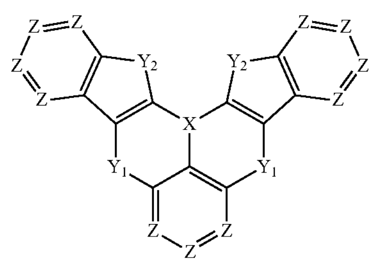

wherein X is selected from B, P, and P═O, the moieties $Y_1$ and $Y_2$ are identical to or different from each other and are each independently selected from $NR_1$, $CR_2R_3$, O, S, Se, and $SiR_4R_5$, with the proviso that the two $Y_1$ moieties are not simultaneously $NR_1$ (wherein $R_1$ to $R_5$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, substituted or unsubstituted $C_3$-$C_{20}$ mixed aliphatic-aromatic cyclic group, nitro, cyano, and halogen, with the proviso that $R_2$ and $R_3$ are optionally linked to each other to form an alicyclic or aromatic monocyclic or polycyclic ring and $R_4$ and $R_5$ are optionally linked to each other to form an alicyclic or aromatic monocyclic or polycyclic ring), and the moieties Z are identical to or different from each other and are each independently CR or N (wherein R is selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, substituted or unsubstituted $C_3$-$C_{20}$ mixed aliphatic-aromatic cyclic group, nitro, cyano, and halogen), with the proviso that $R_1$ is optionally linked to R of the adjacent Z moiety through O, S, $CR_6R_7$ or a single bond to form an alicyclic or aromatic monocyclic or polycyclic ring in which some or all of the carbon atoms are optionally substituted with heteroatoms selected from N, S, and O (wherein $R_6$ and $R_7$ are each independently selected from hydrogen, deuterium, substituted or unsubstituted $C_1$-$C_{30}$ alkyl, substituted or unsubstituted $C_6$-$C_{50}$ aryl, and substituted or unsubstituted $C_3$-$C_{30}$ cycloalkyl, and substituted or unsubstituted $C_2$-$C_{50}$ heteroaryl) and with the proviso that the plurality of R groups are optionally bonded to each other to form an alicyclic or aromatic monocyclic or polycyclic ring in which some or all of the carbon atoms are optionally substituted with heteroatoms selected from N, S, and O; or (A-7)

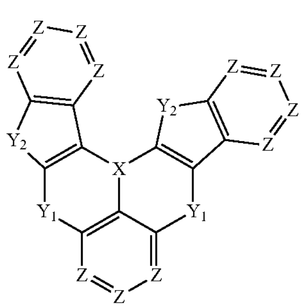

wherein X, $Y_1$, $Y_2$, and Z are as defined in Formula A-5, with the proviso that the two $Y_1$ moieties are optionally simultaneously $NR_1$.

2. The organic electroluminescent compound according to claim 1, wherein the organic electroluminescent compound represented by Formula A-7 is selected from the following compounds:

5

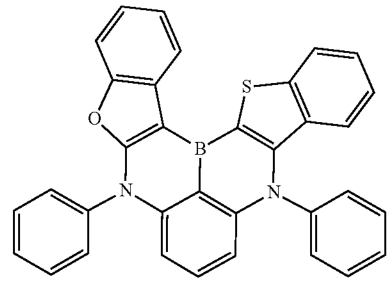

6

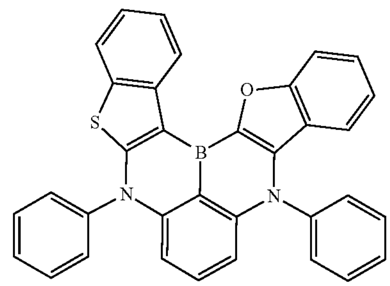

7

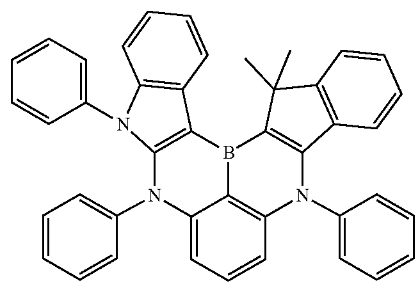

8

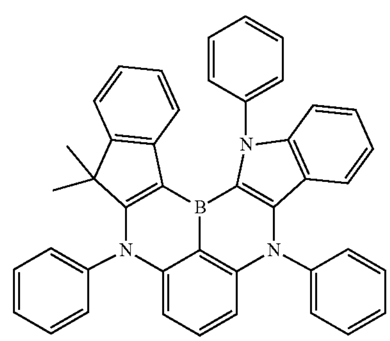

9

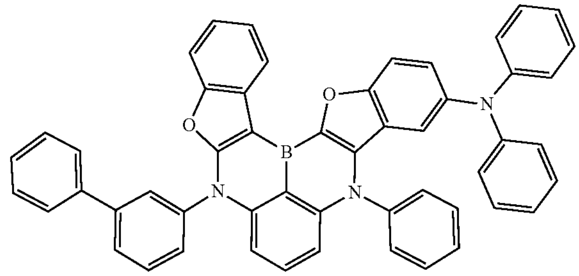

-continued
10
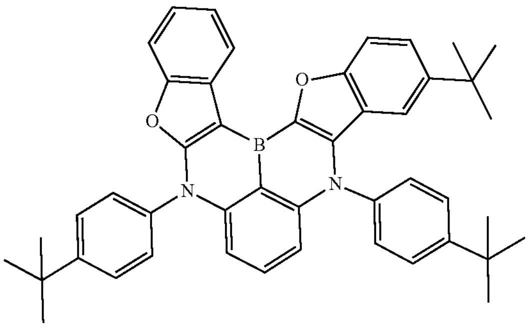
11
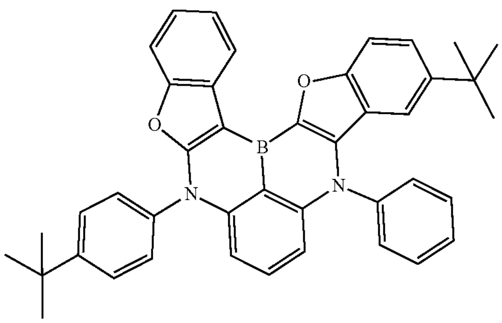
12
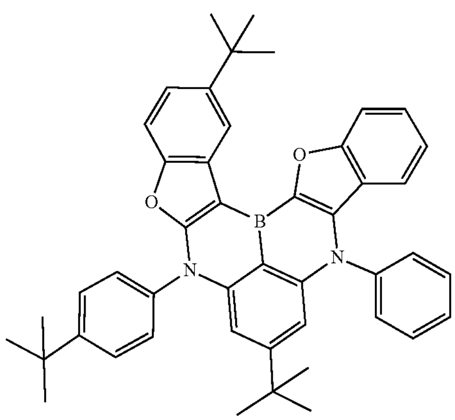
13
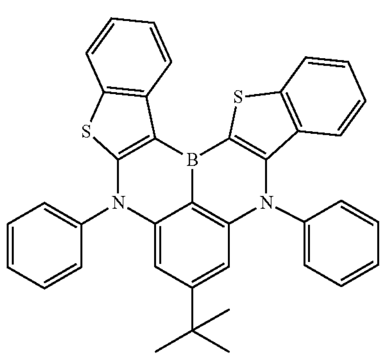
-continued
14
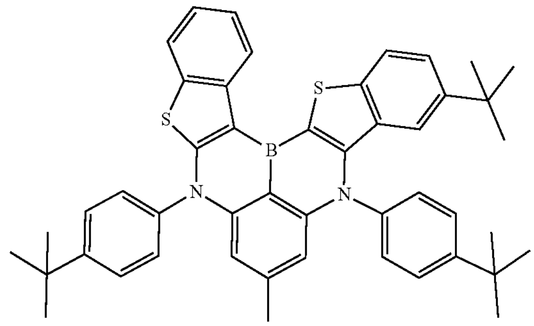
15
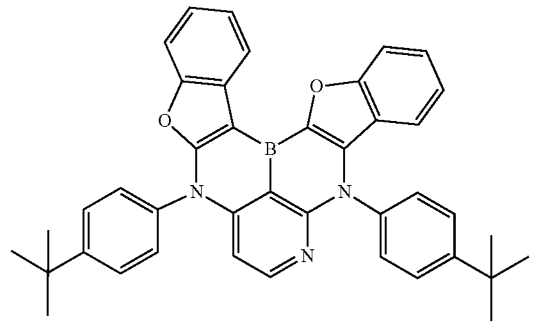
16
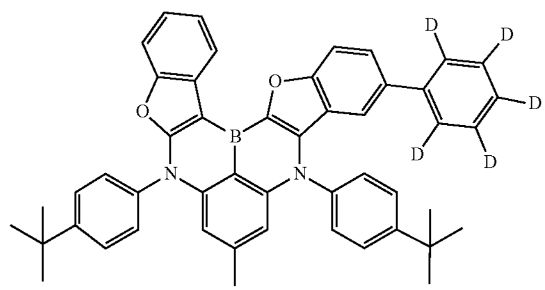
17
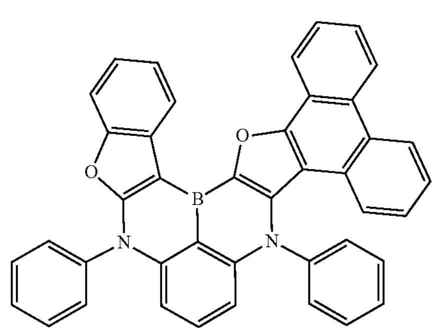

-continued
18
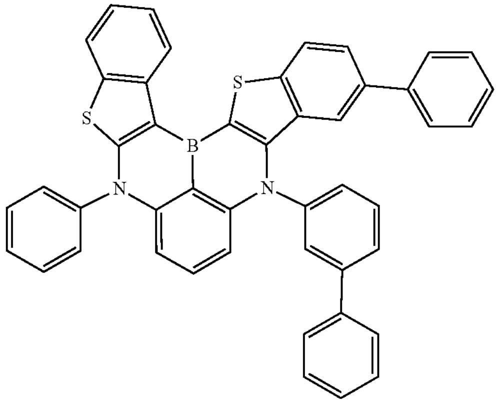
19
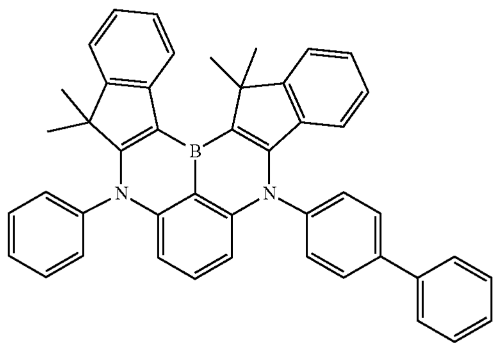
20
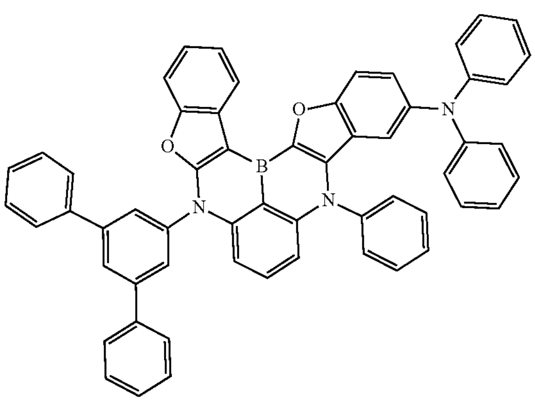
21
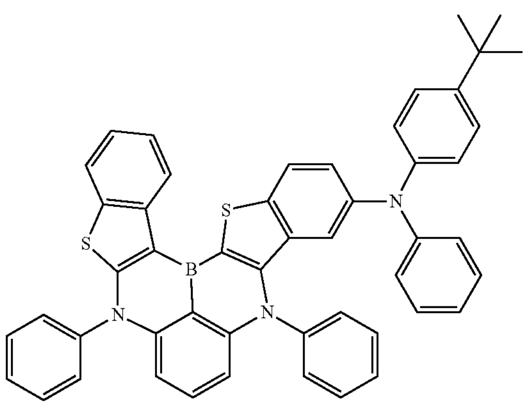
-continued
22
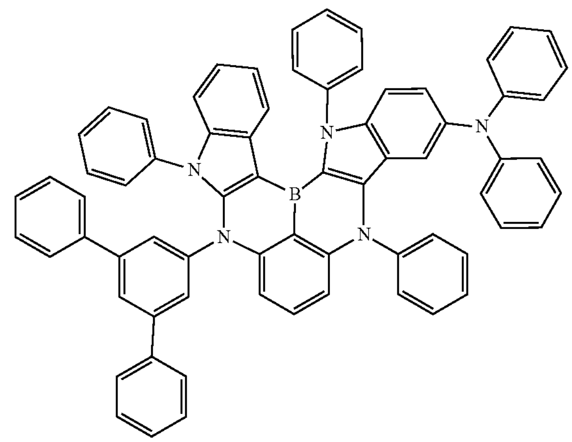
23
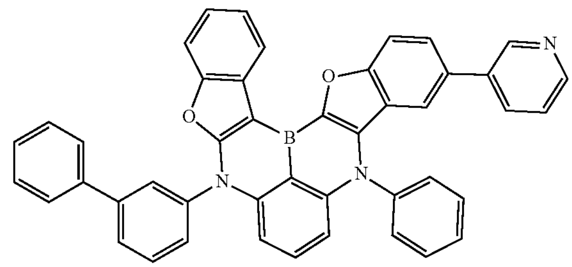
24
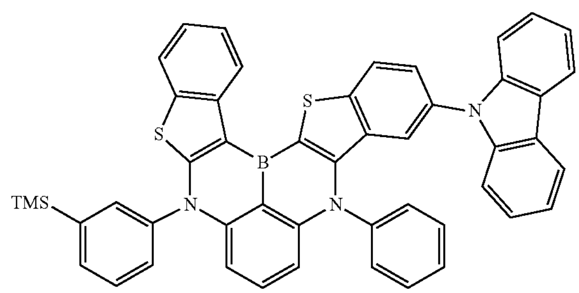
25
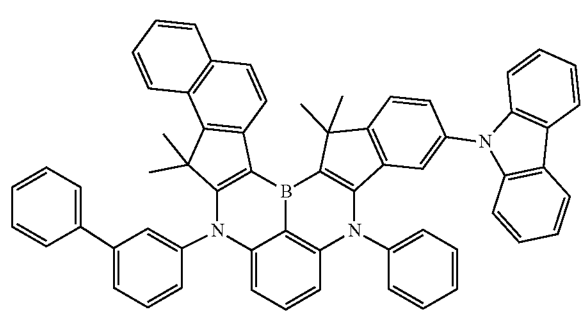

-continued
26
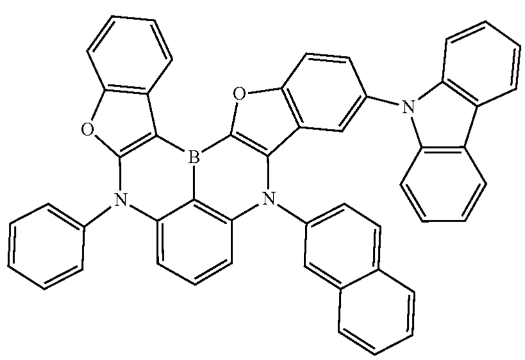
27
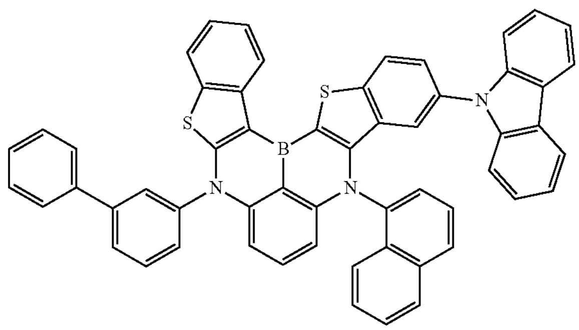
28
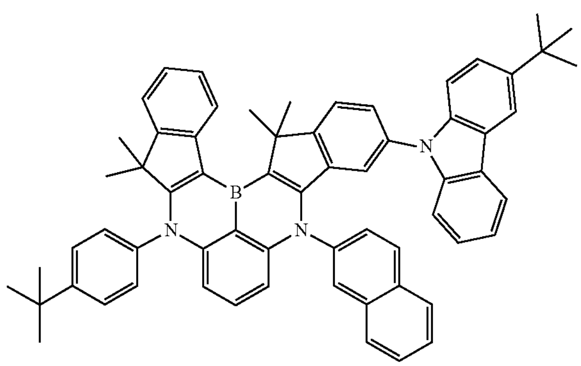
29
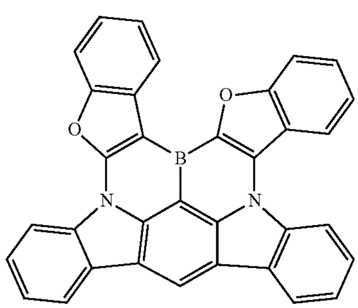
-continued
30
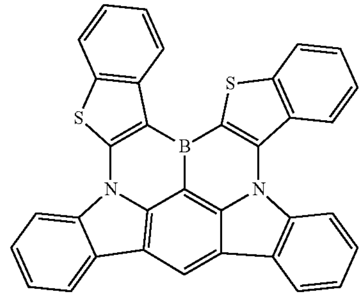
31
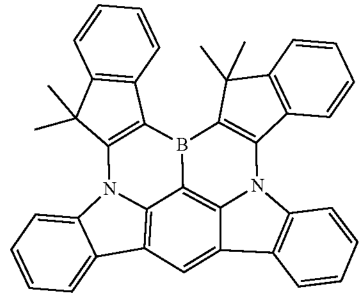
32
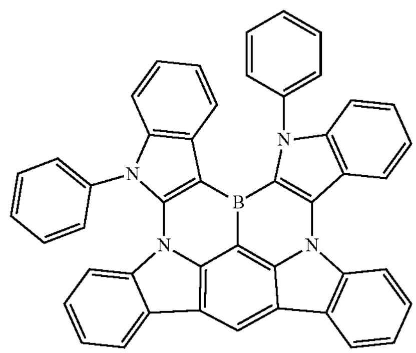
33
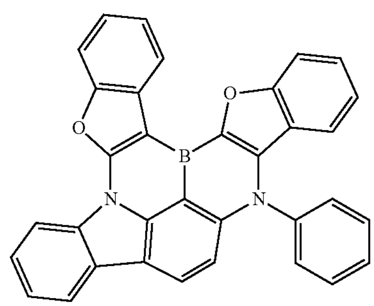
34
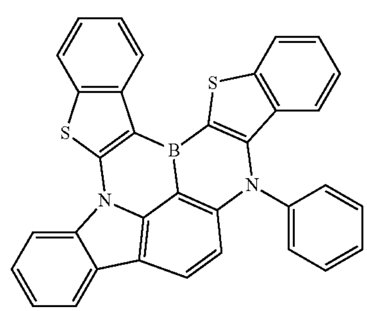

-continued
35
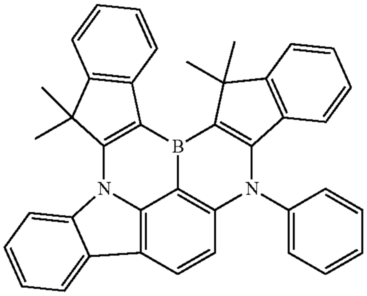
36
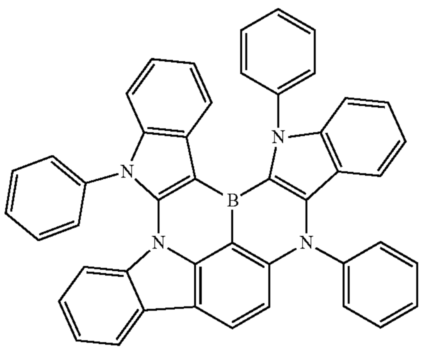
37
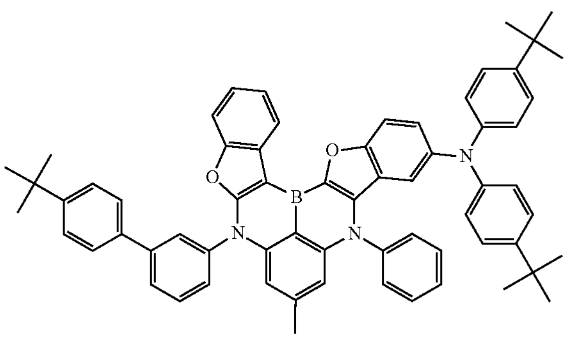
38
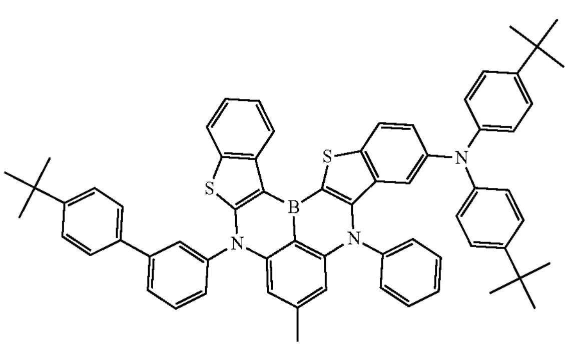
-continued
39
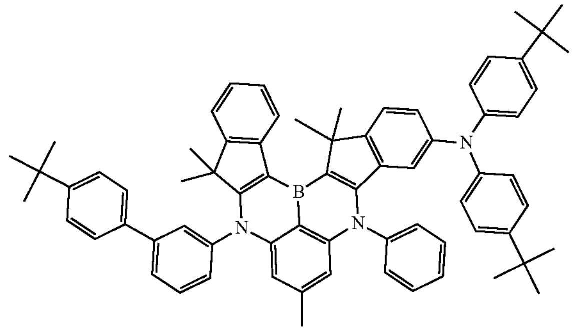
40
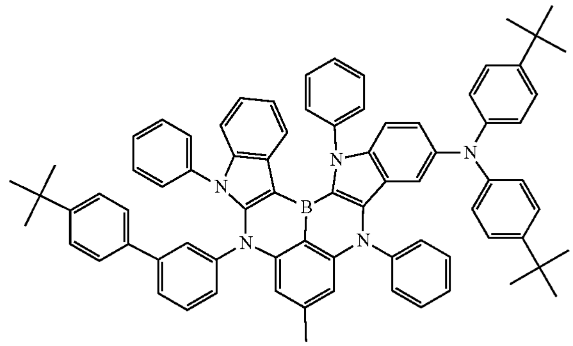
41
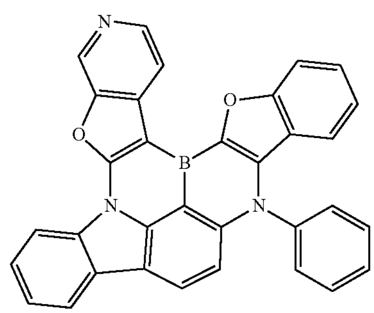
42
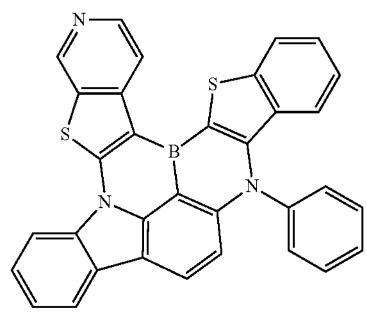
43
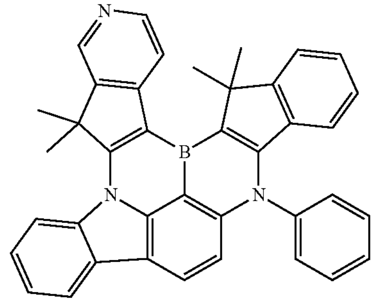

-continued
44
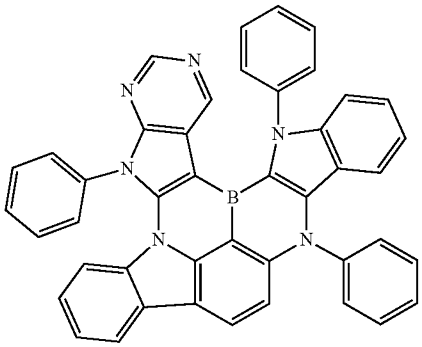
45
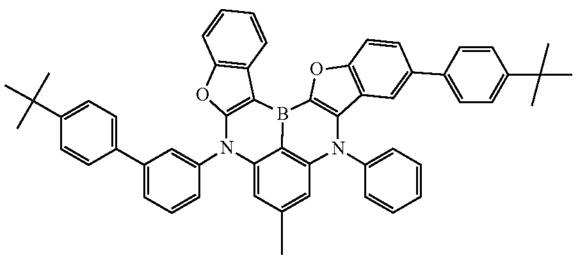
46
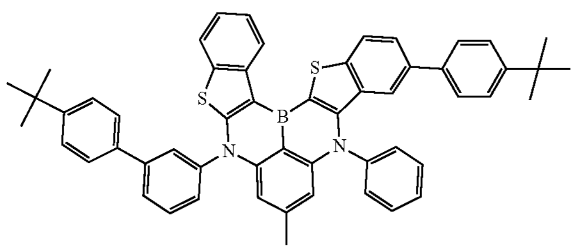
47
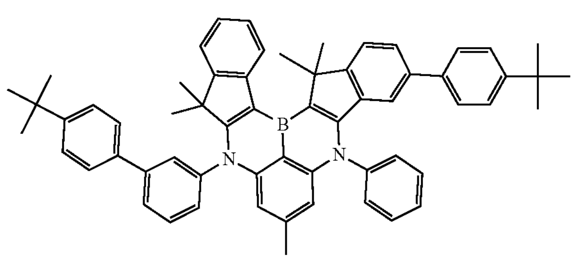
48
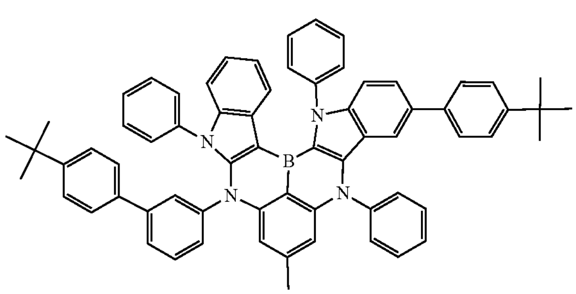
-continued
49
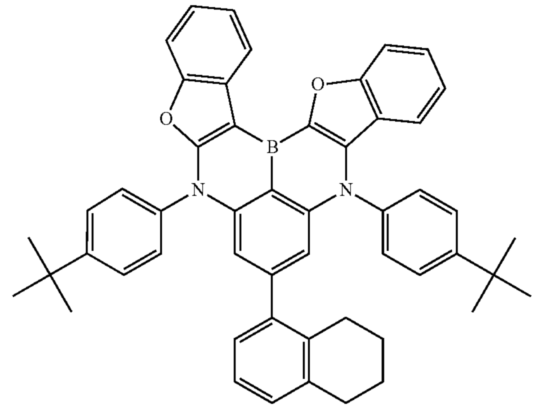
50
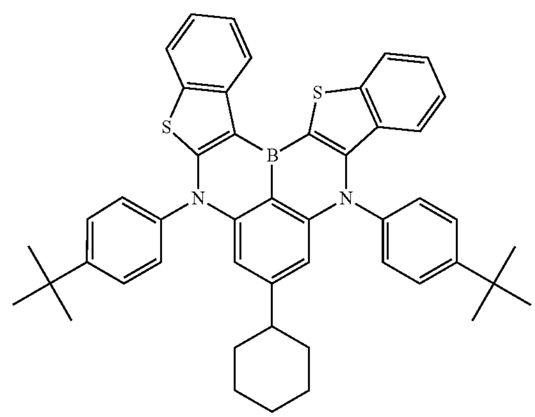
51
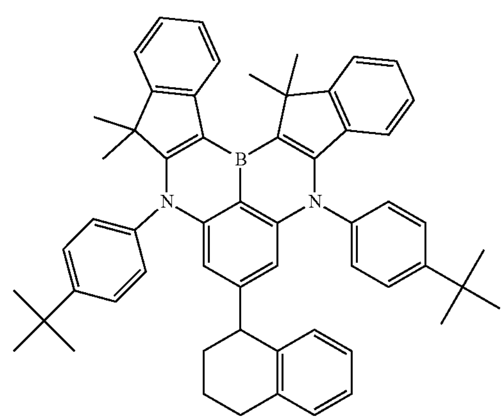

52
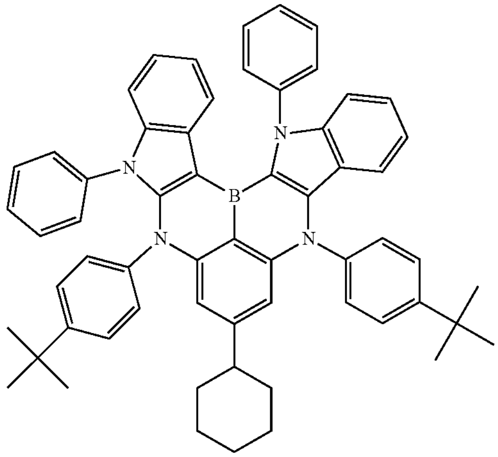
53
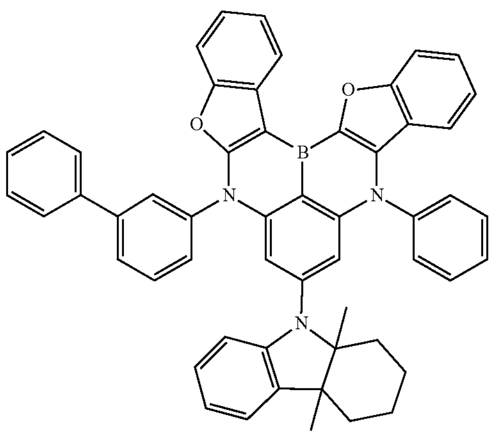
54
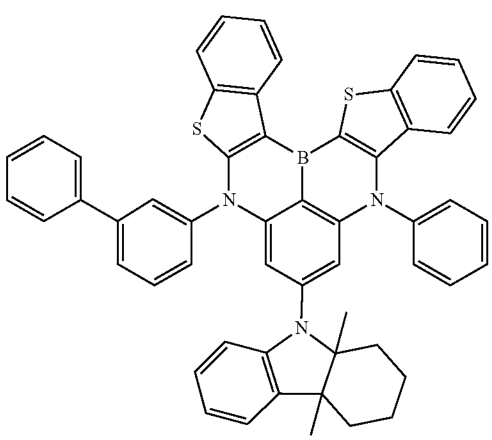
55
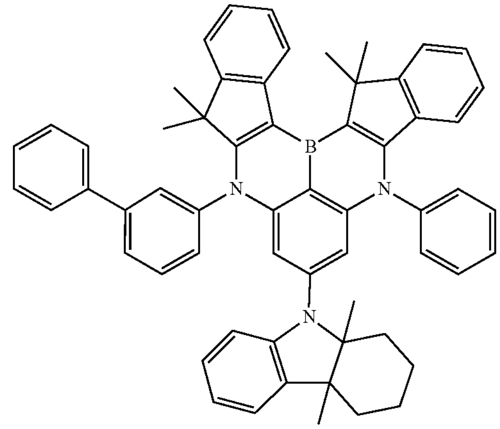
56
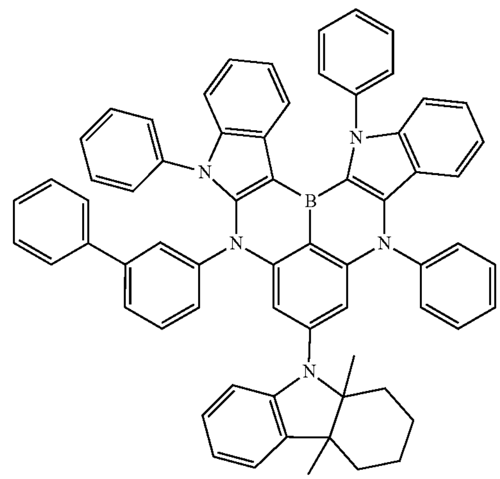
57
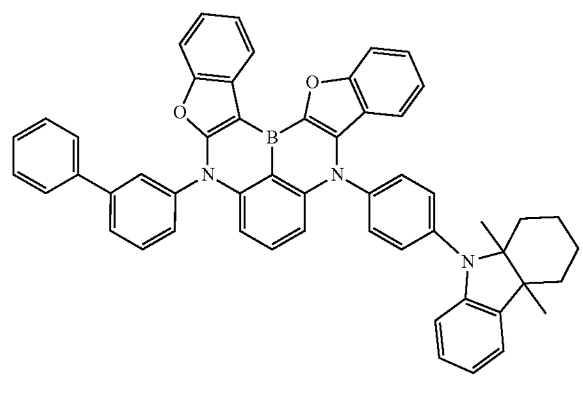
58
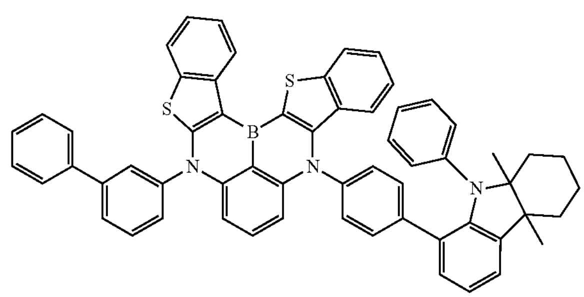

-continued
59
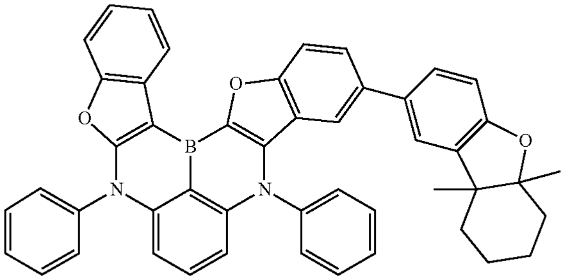
60
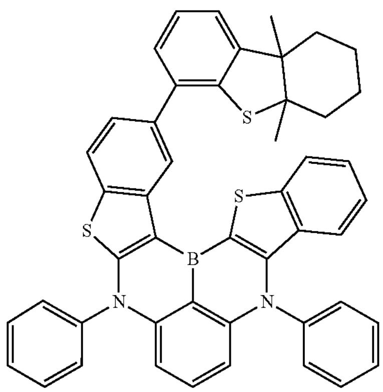
61
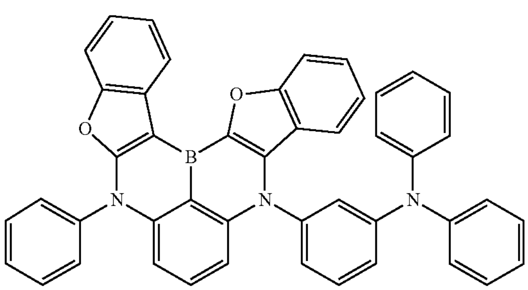
62
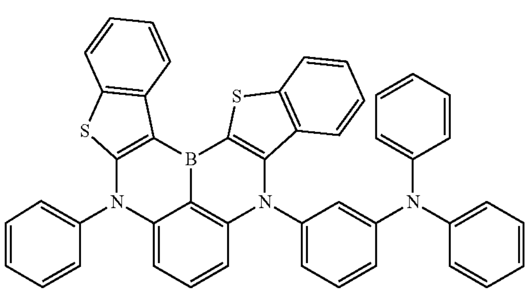
-continued
63
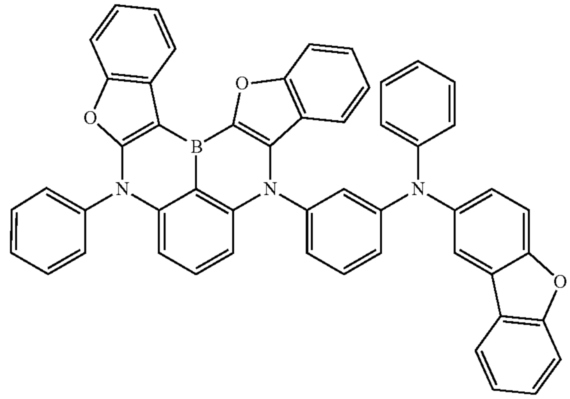
64
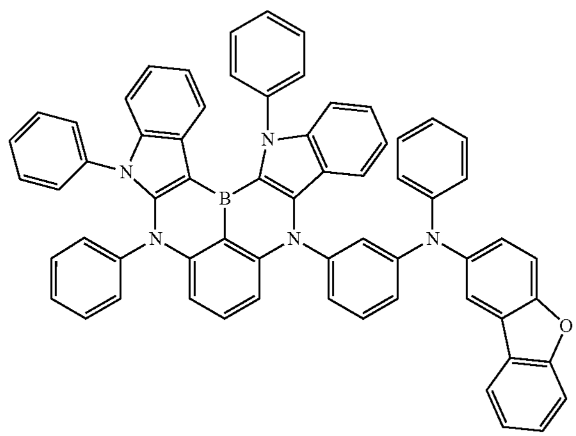
65
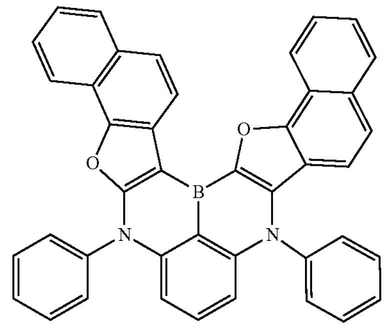
66
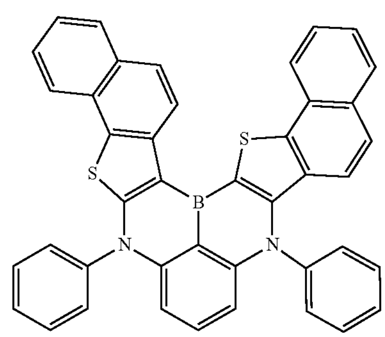

-continued
67
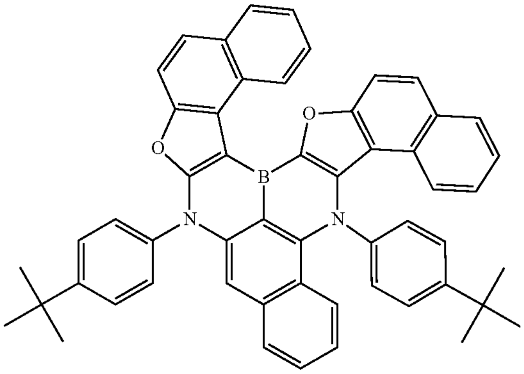
68
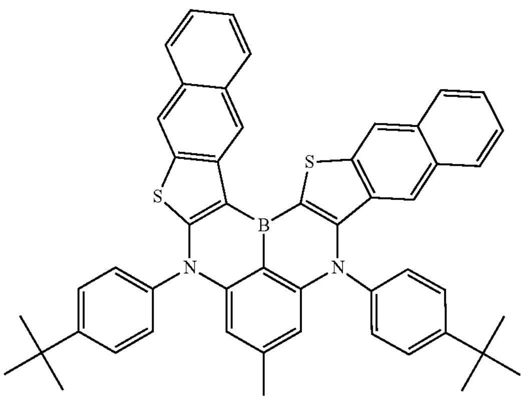
69
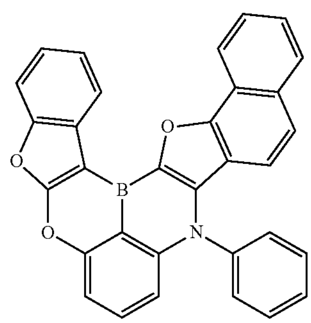
70
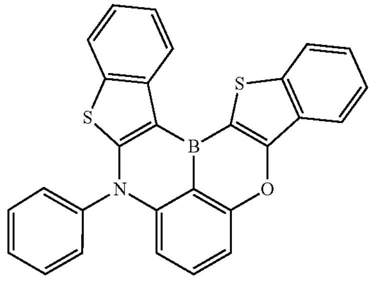
-continued
71
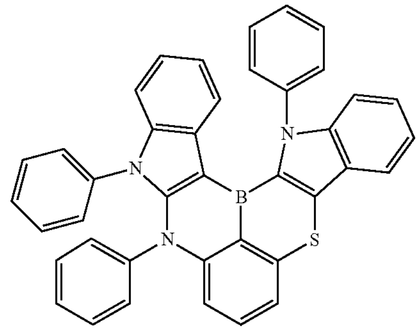
72
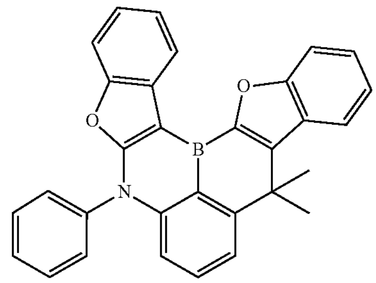
73
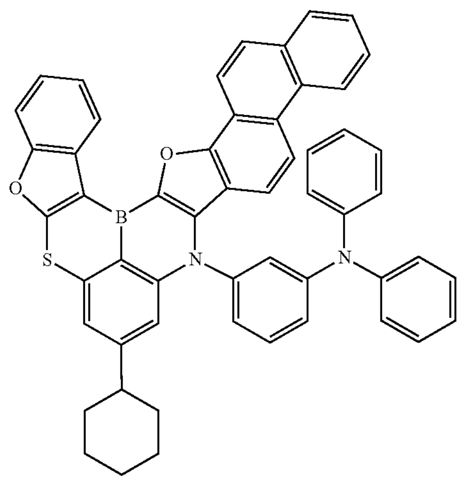
74
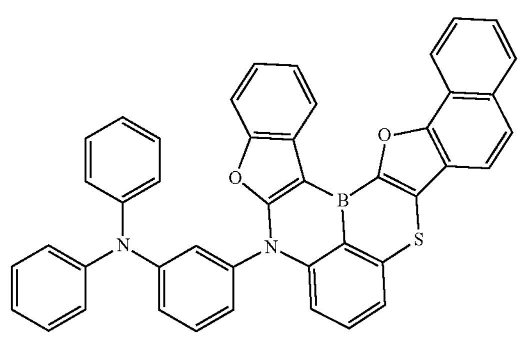

75
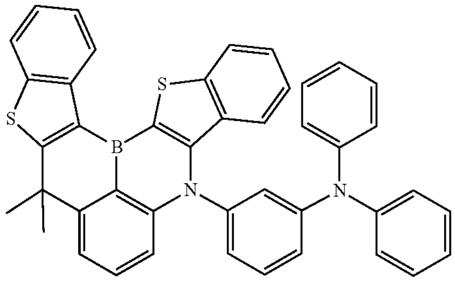
76
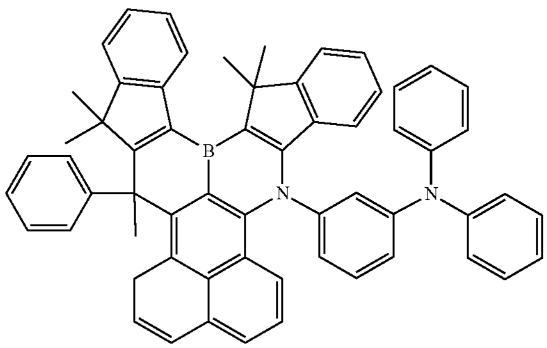
77
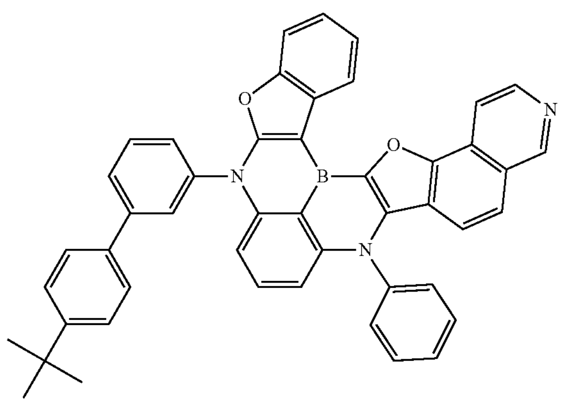
78
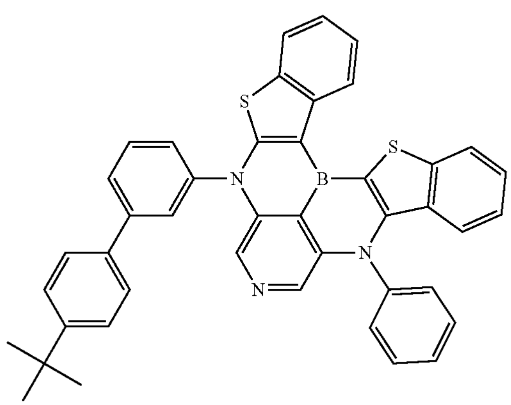
79
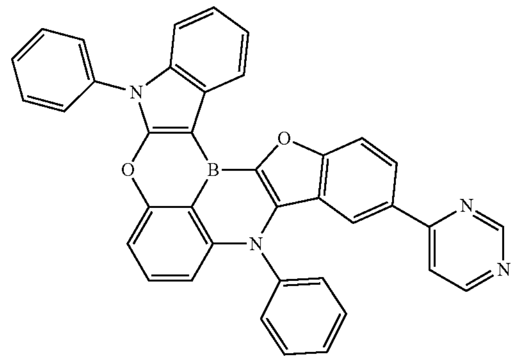
80
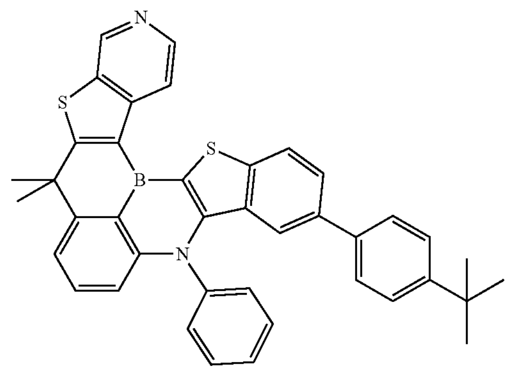
81
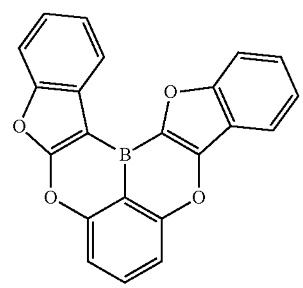
82
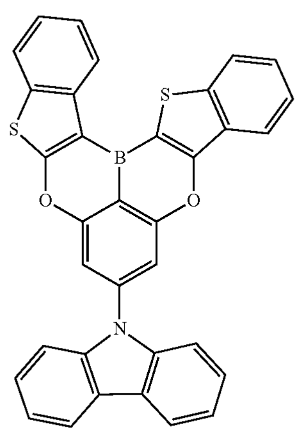

83
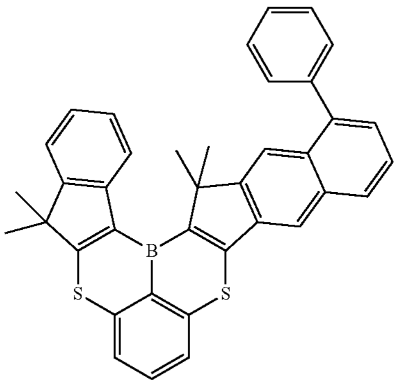
84
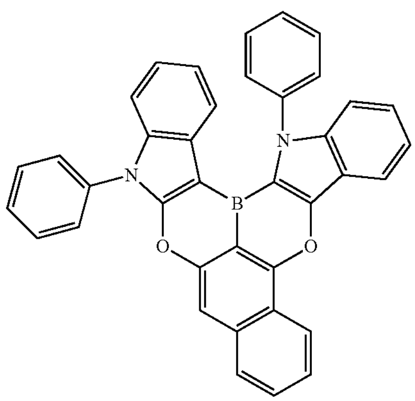
85
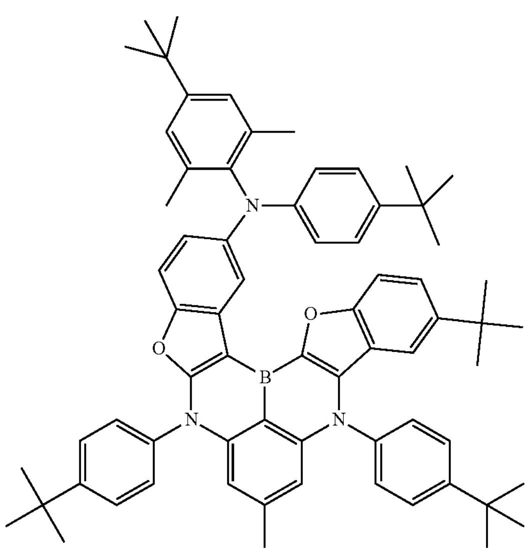
86
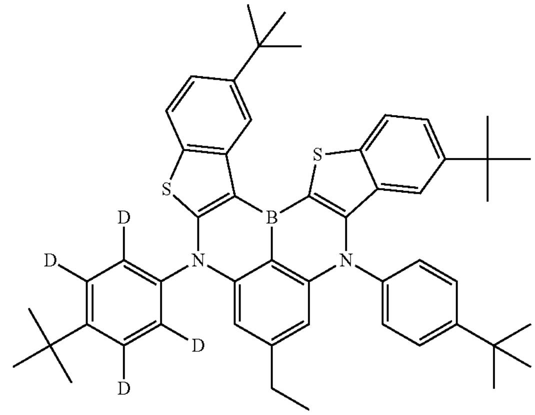
87
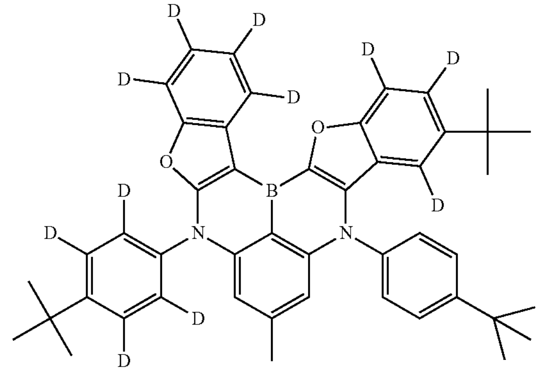
88
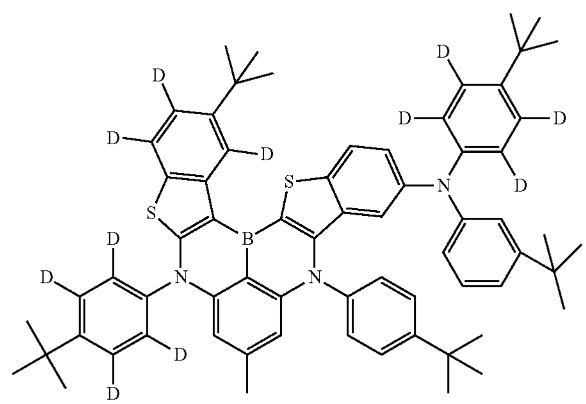
89
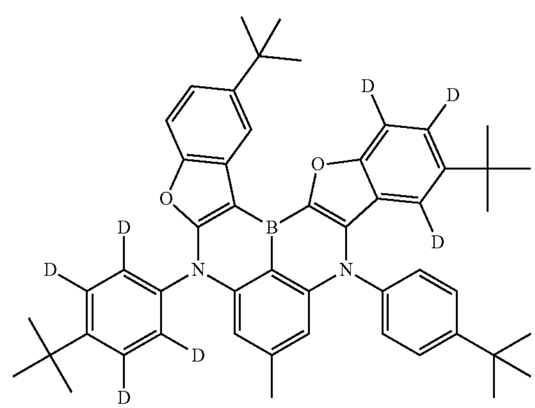

-continued
90
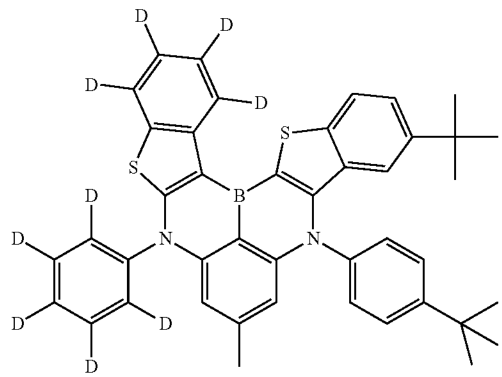
91
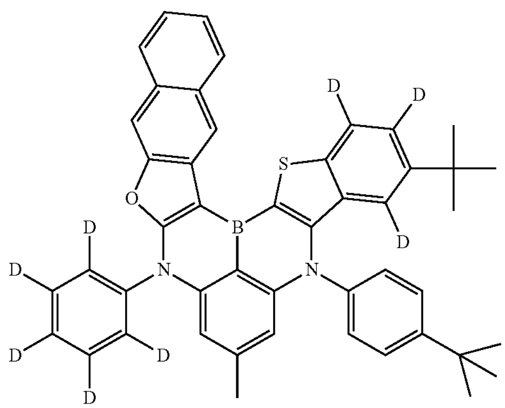
92
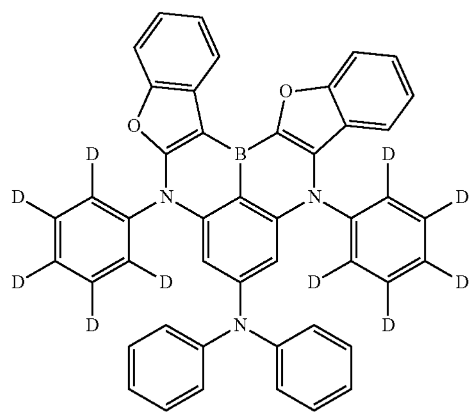
93
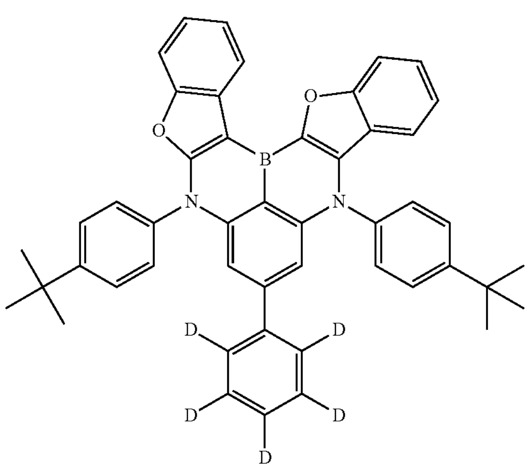
-continued
94
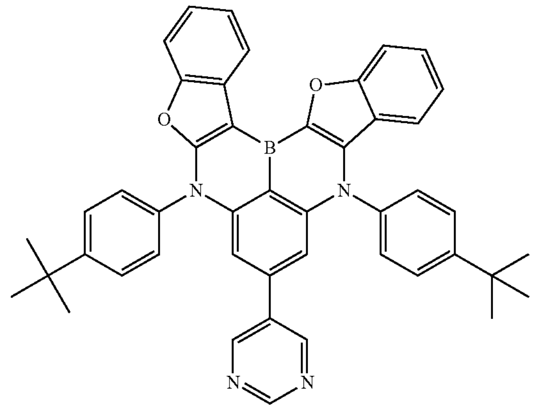
95
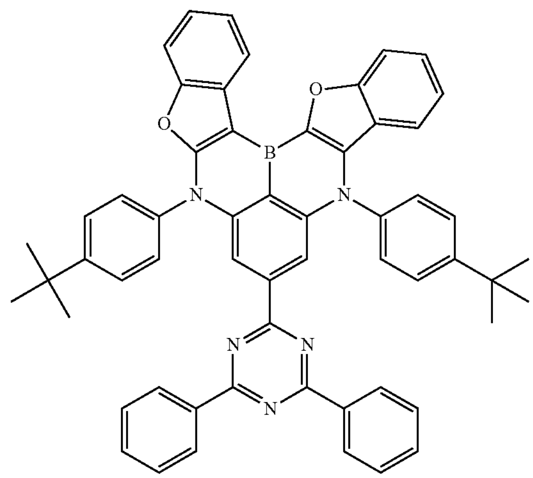
96
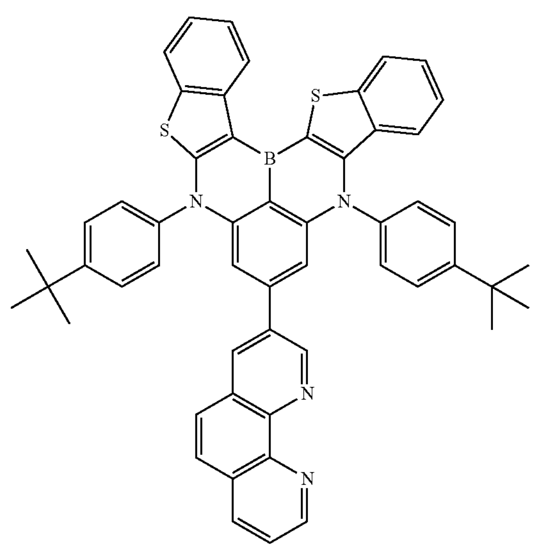

97
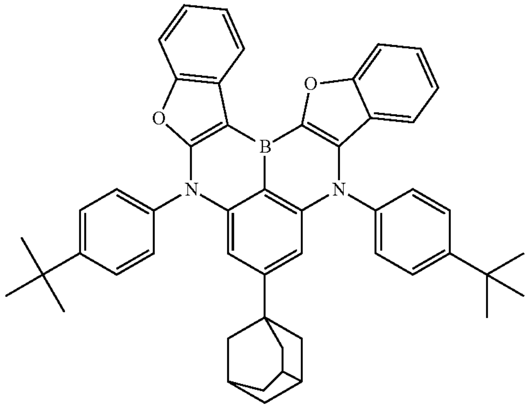
98
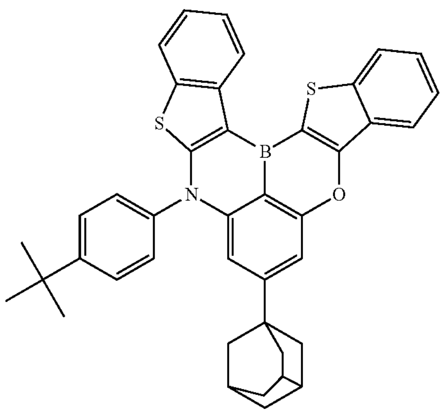
99
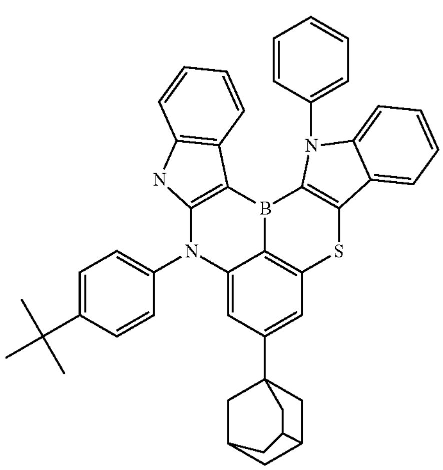
100
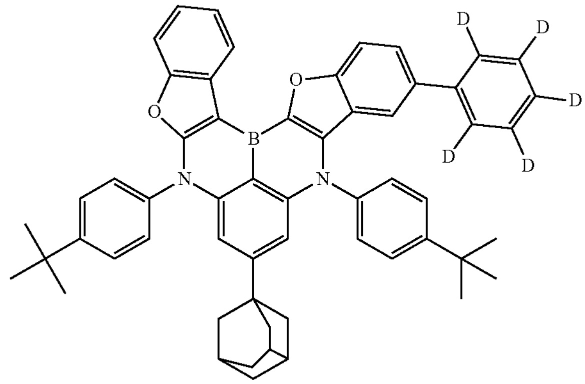
101
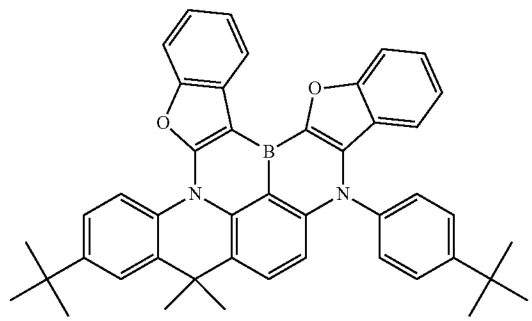
102
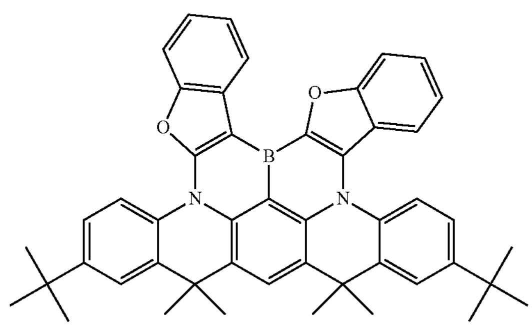
103
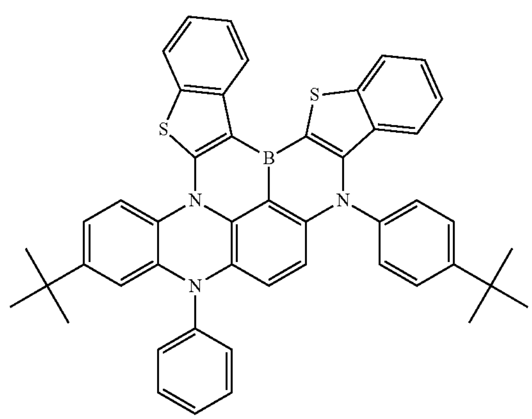

104
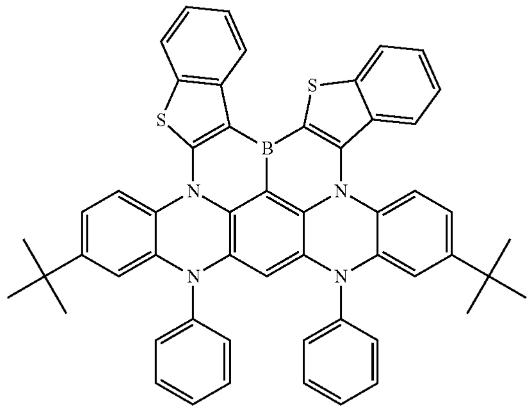
105
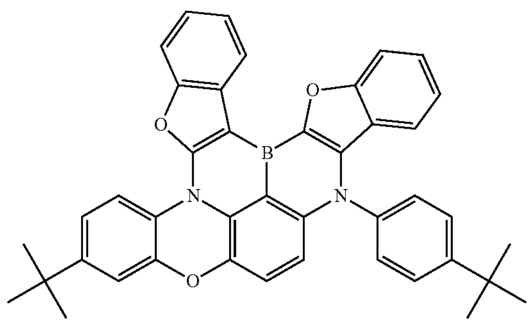
106
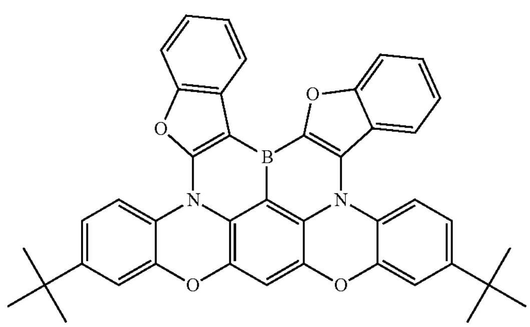
107
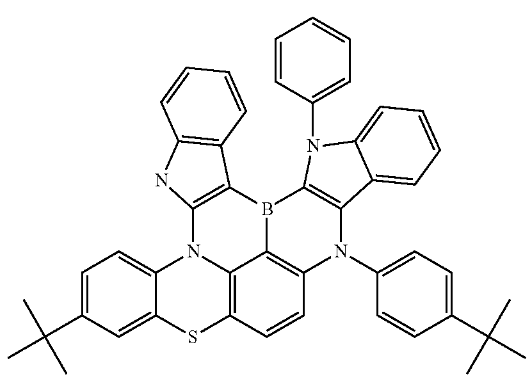
108
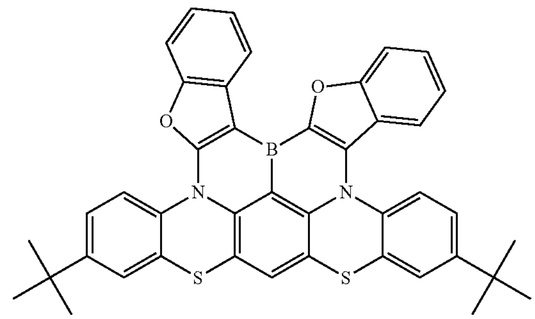
109
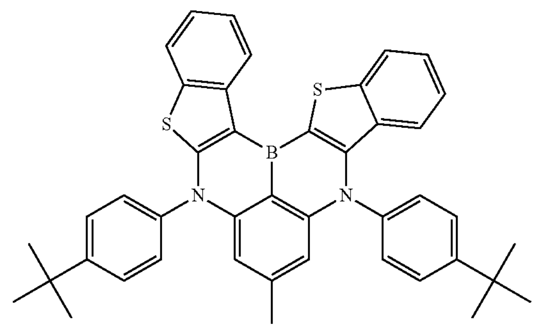
110
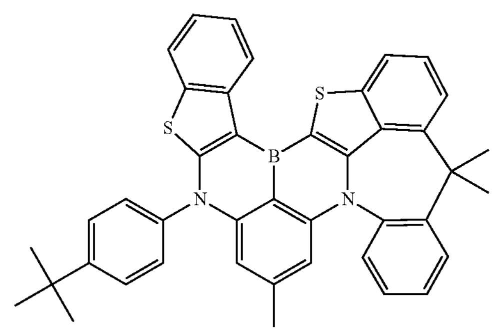
111
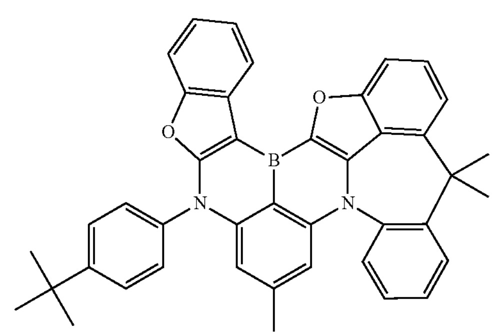

-continued
112
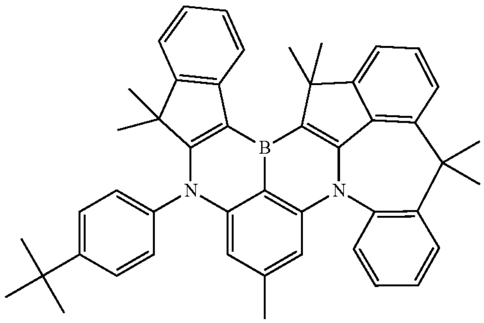
113
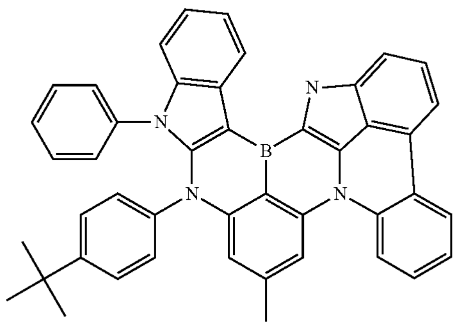
114
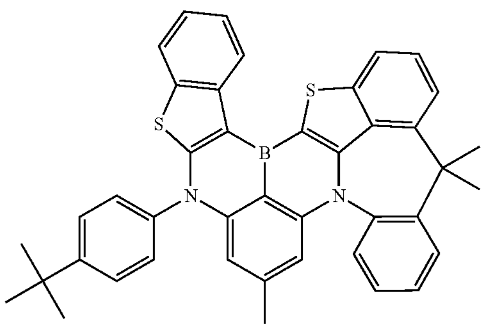
115
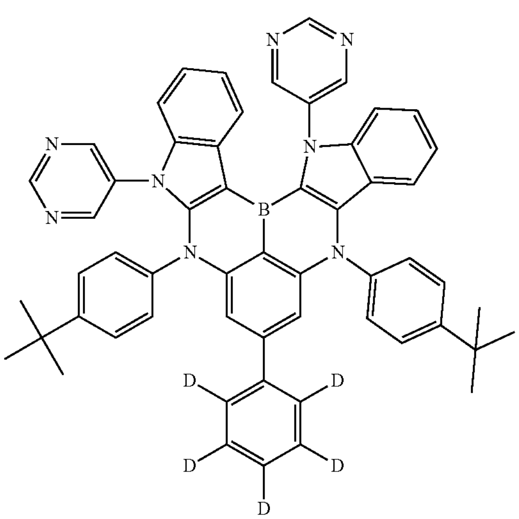
-continued
116
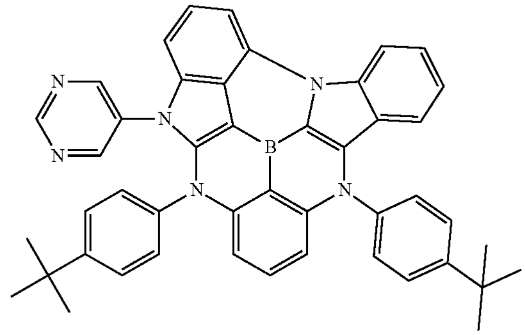
117
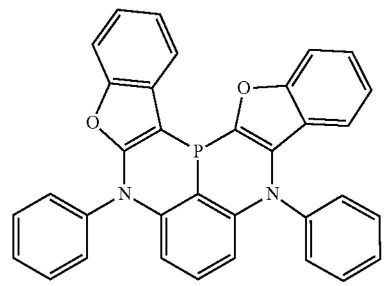
118
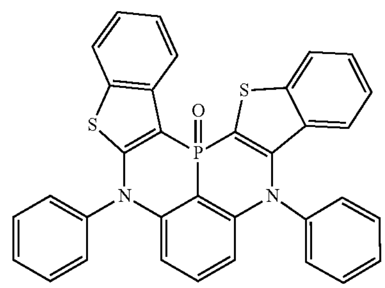
119
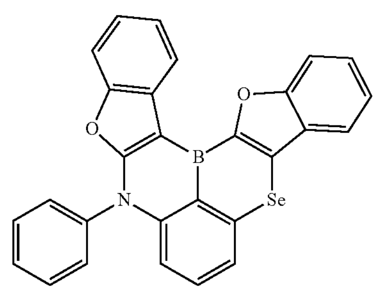
120
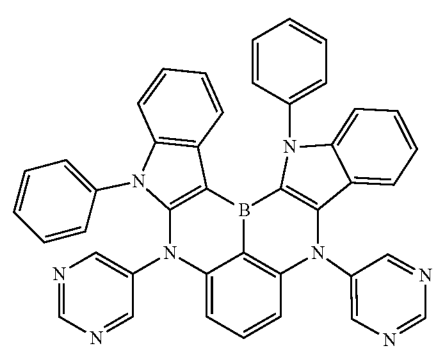

-continued
121
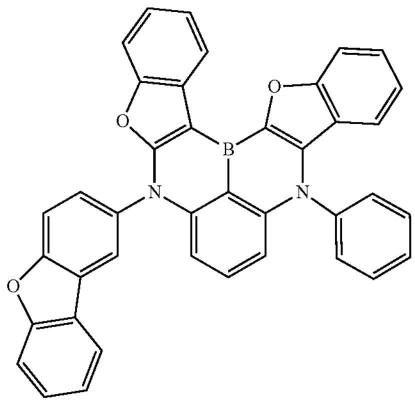
122
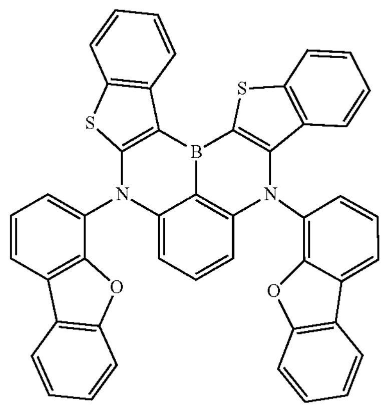
123
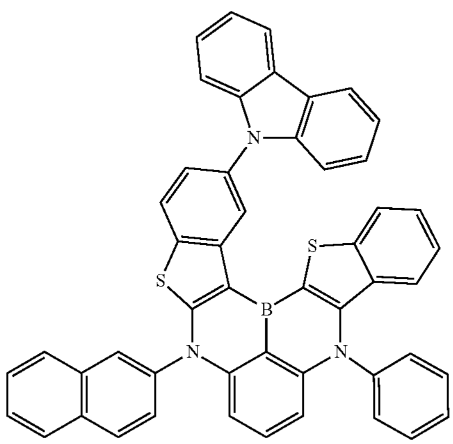
124
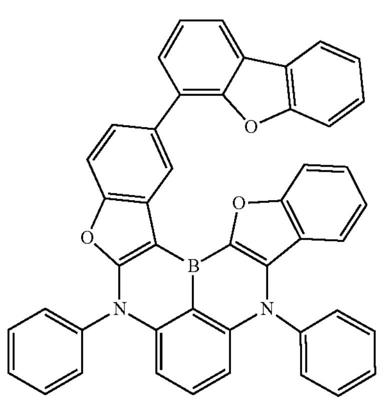
3. The organic electroluminescent compound according to claim 1, wherein the organic electroluminescent compound represented by Formula A-5 is selected from the following compounds:
125
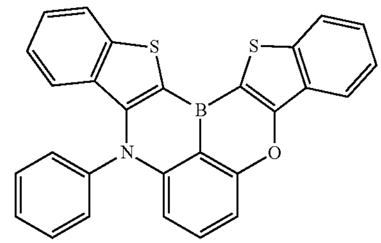
126
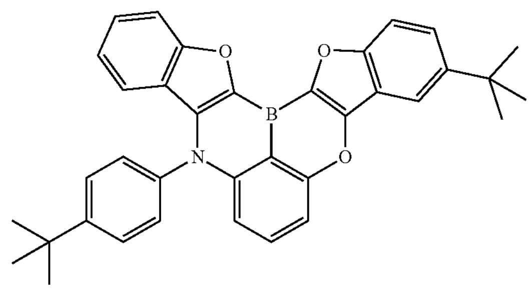
127
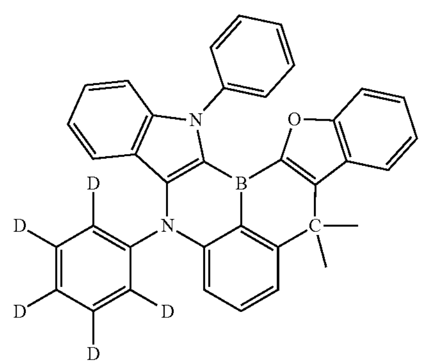
128
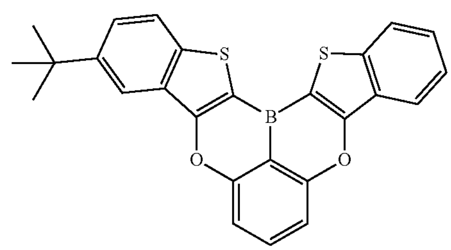

-continued
129
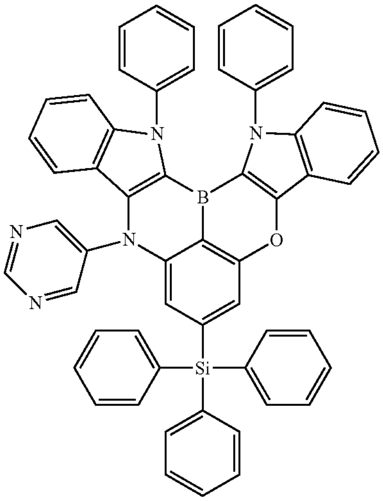
130
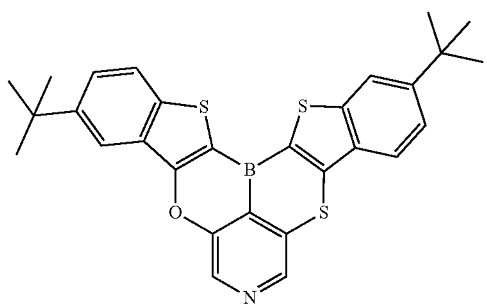
131
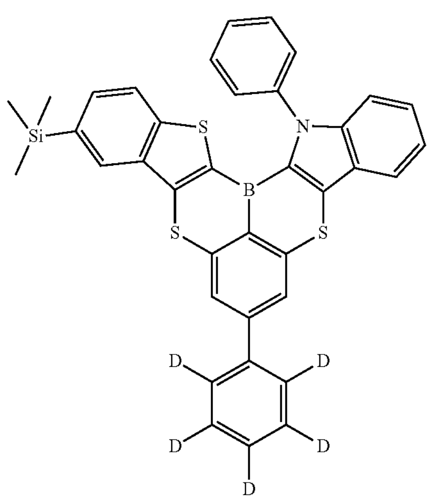
-continued
132
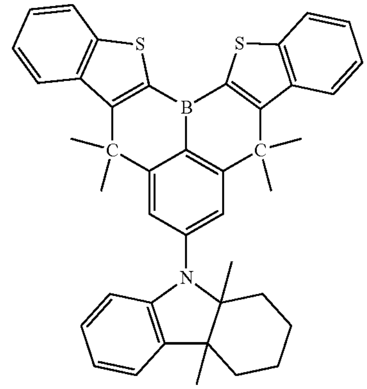
123
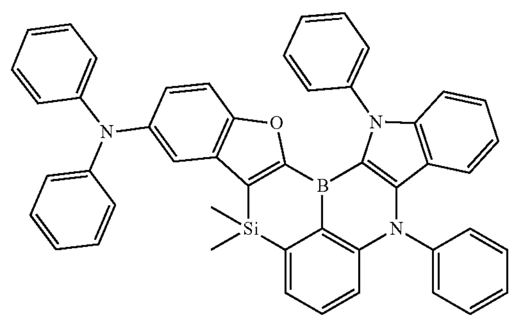
134
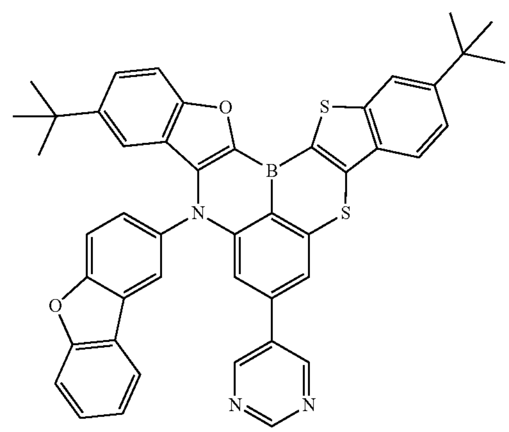
135
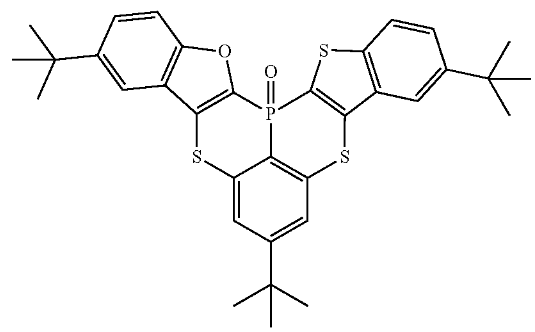

-continued

136

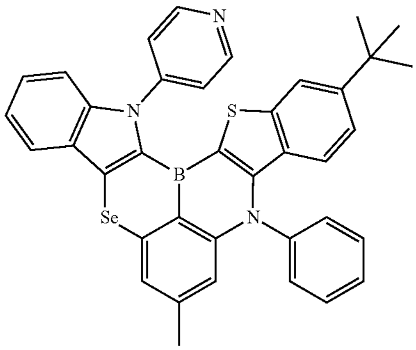

4. An organic electroluminescent device comprising a first electrode, a second electrode opposite to the first electrode, and one or more organic layers interposed between the first and second electrodes wherein at least one of the organic layers comprises the organic electroluminescent compound represented by Formula A-5 or A-7 according to claim 1.

5. The organic electroluminescent according to claim 4, wherein the organic layers comprise an electron injecting layer, an electron transport layer, a hole injecting layer, a hole transport layer, an electron blocking layer, a hole blocking layer, and a light emitting layer, and at least one of the organic layers comprises the organic electroluminescent compound represented by Formula A-5 or A-7.

6. The organic electroluminescent according to claim 5, wherein the light emitting layer comprises, as a host compound, an anthracene derivative represented by Formula C:

(C)

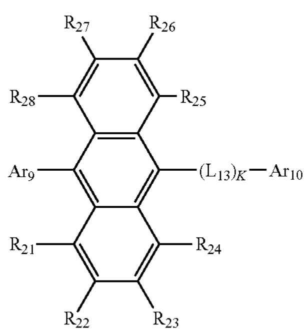

wherein $R_{21}$ to $R_{28}$ are identical to or different from each other and are as defined for $R_1$ to $R_5$ in Formula A-5 or A-7 representing the organic electroluminescent compound according to claim 1, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, and k is an integer from 1 to 3, provided that when k is 2 or more, the linkers $L_{13}$ are identical to or different from each other.

7. The organic electroluminescent according to claim 6, wherein $Ar_9$ in Formula C is represented by Formula C-1:

(C-1)

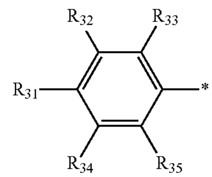

wherein $R_{31}$ to $R_{35}$ are identical to or different from each other and are as defined for $R_1$ to $R_5$ in Formula A-5 or A-7 representing the organic electroluminescent compound according to claim 1 and each of $R_{31}$ to $R_{35}$ is optionally bonded to an adjacent substituent to form a saturated or unsaturated ring.

8. The organic electroluminescent according to claim 6, wherein $L_{13}$ in Formula C is a single bond or is substituted or unsubstituted $C_6$-$C_{20}$ arylene.

9. The organic electroluminescent according to claim 6, wherein the compound of Formula C is selected from the compounds of Formulae C1 to C48:

C1

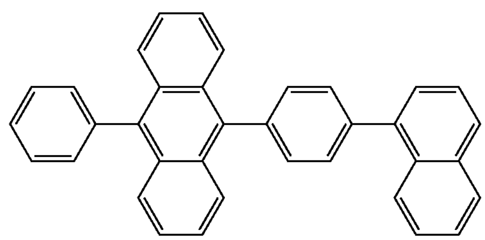

C2

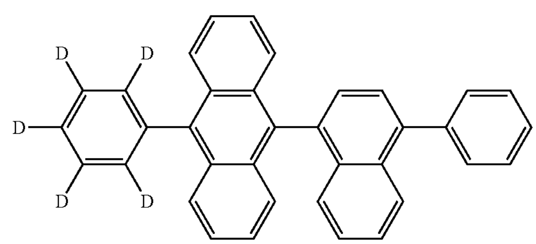

C3

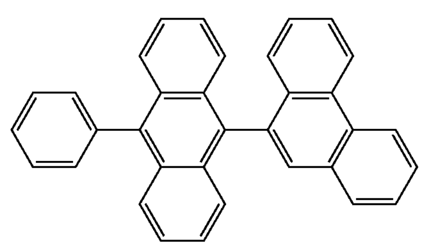

-continued
C4
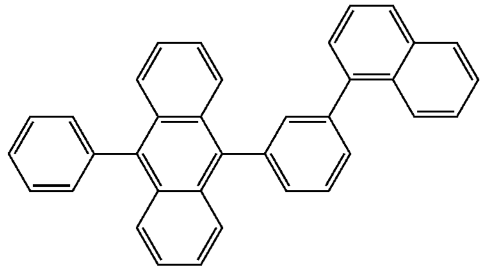
C5
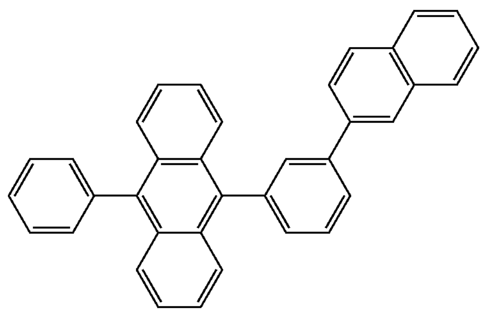
C6
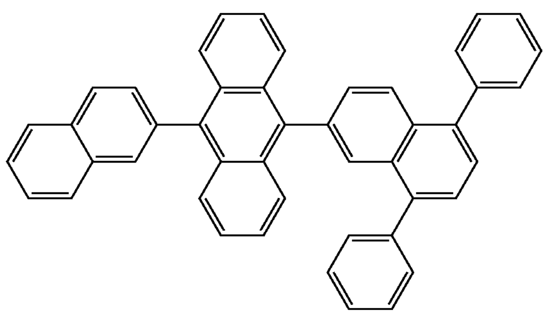
C7
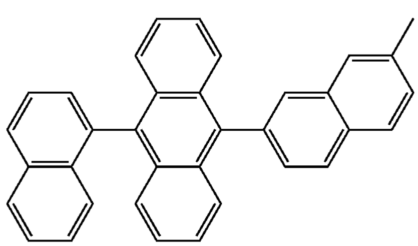
C8
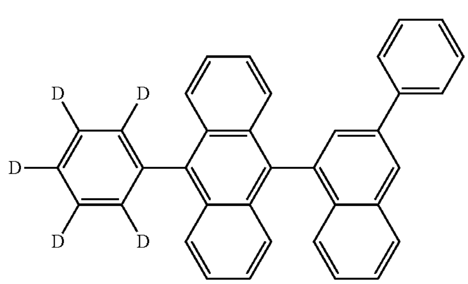
-continued
C9
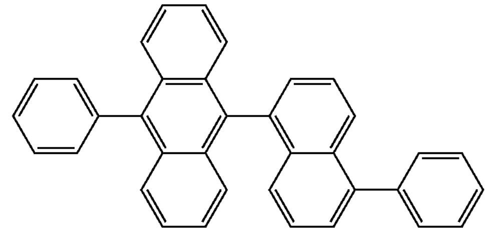
C10
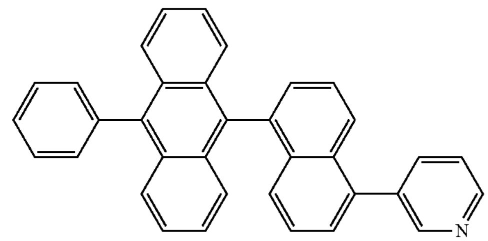
C11
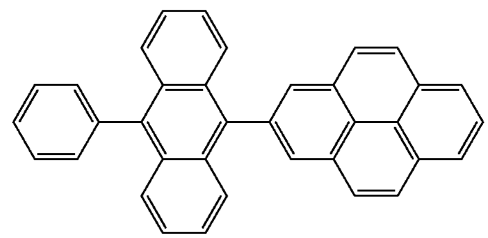
C12
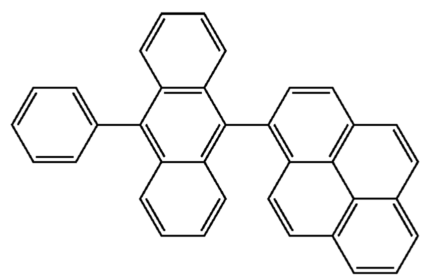
C13
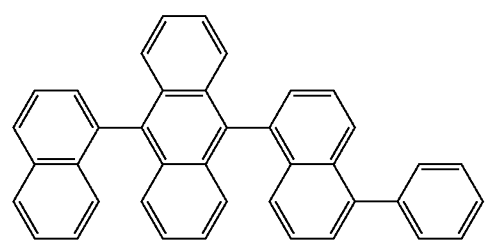
C14
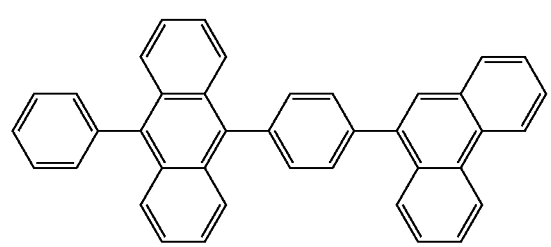

-continued
C15
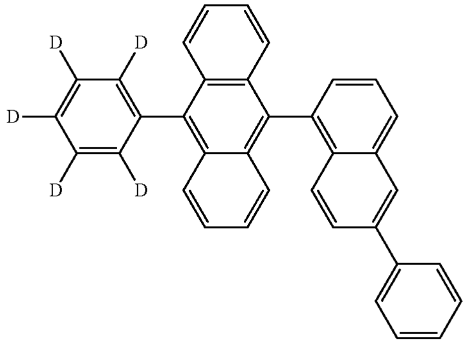
C16
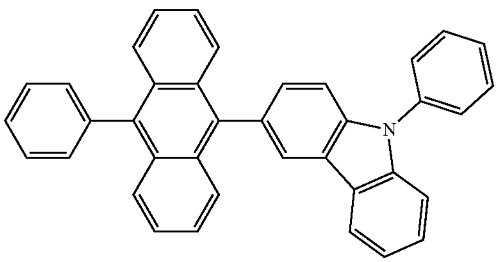
C17
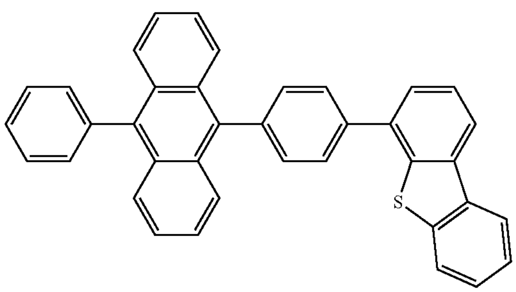
C18
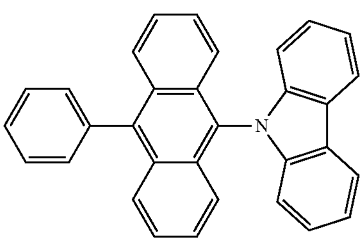
C19
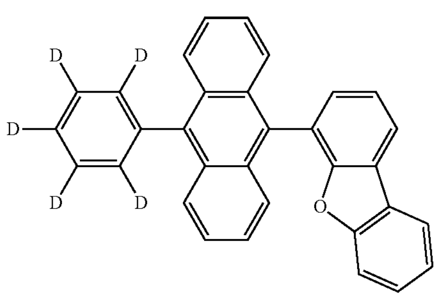
-continued
C20
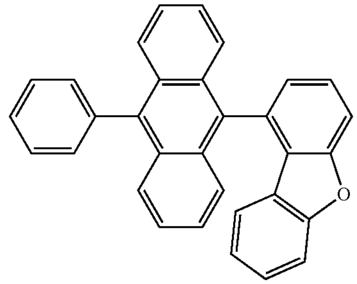
C21
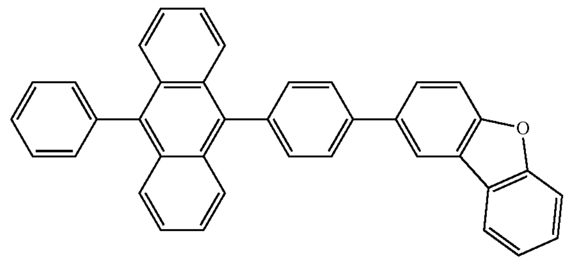
C22
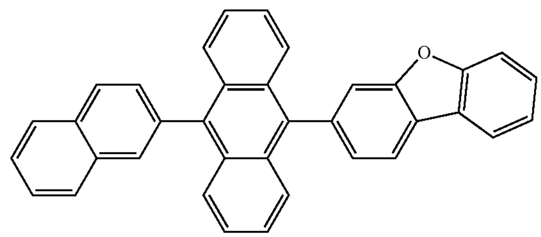
C23
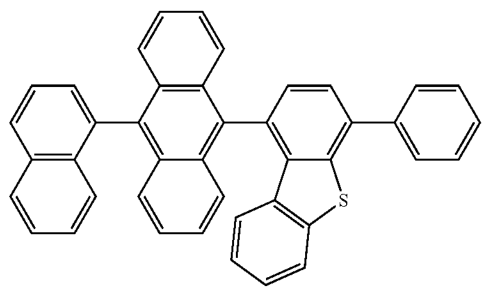
C24
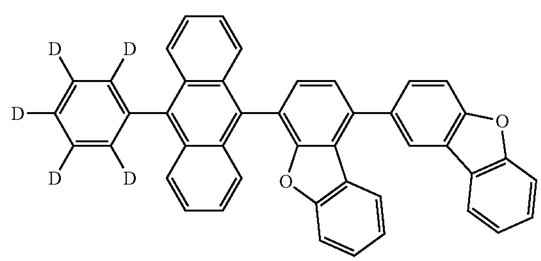

-continued
C25
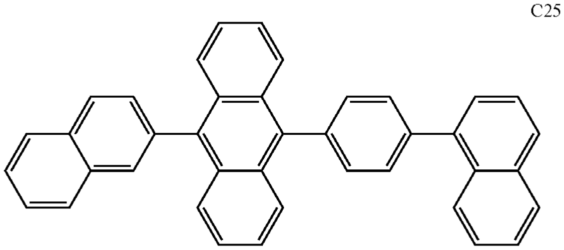
C26
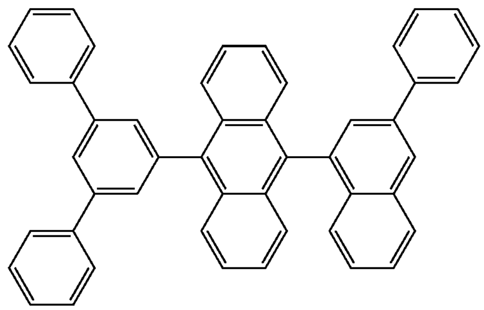
C27
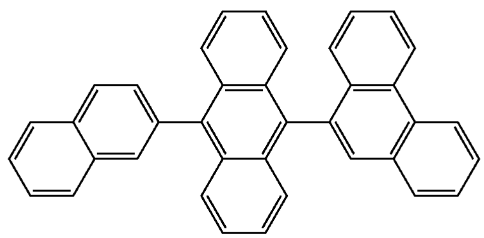
C28
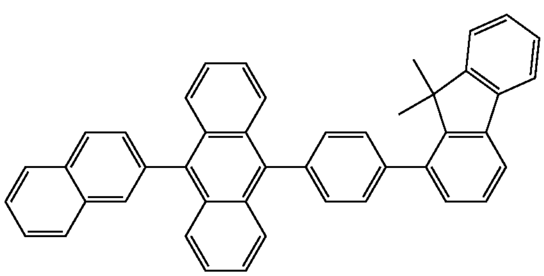
C29
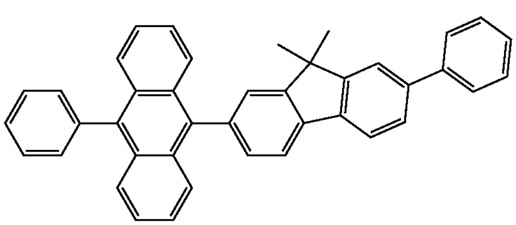
C30
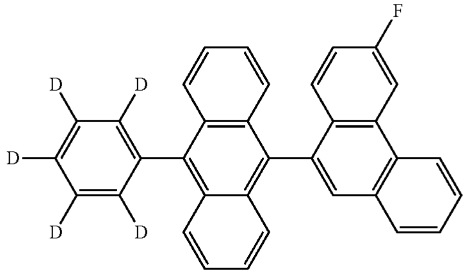
-continued
C31
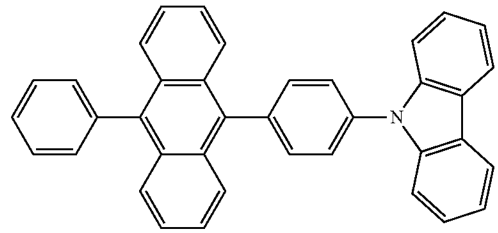
C32
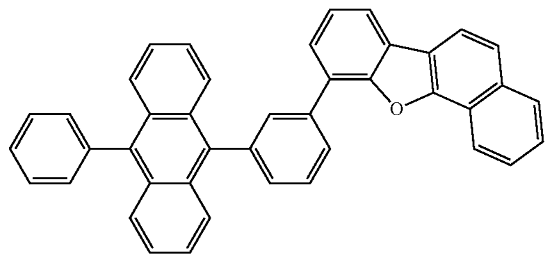
C33
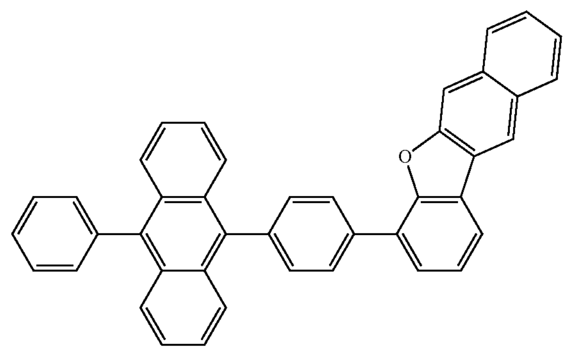
C34
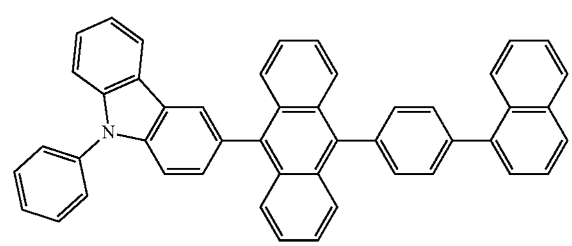
C35
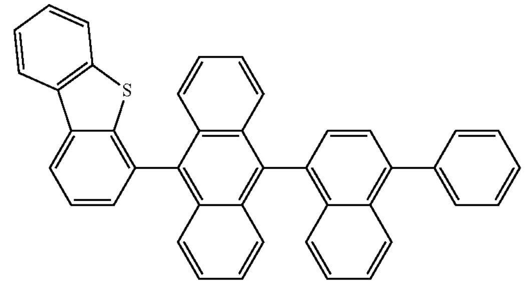

-continued
C36
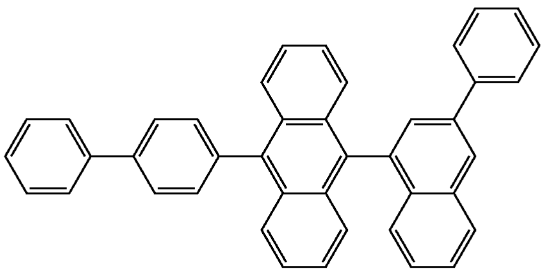
C37
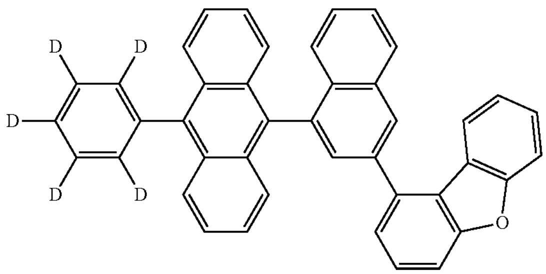
C38
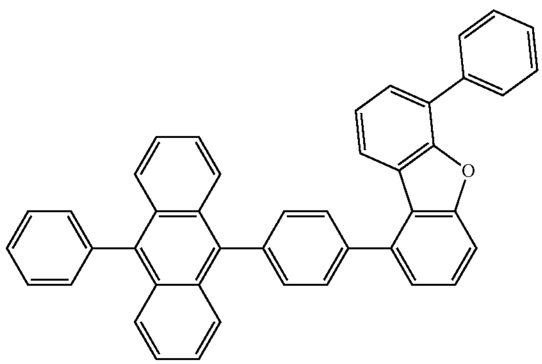
C39
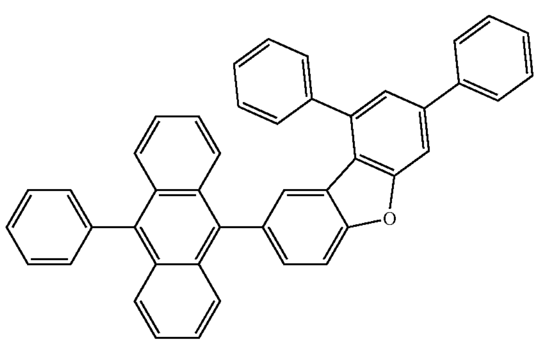
C40
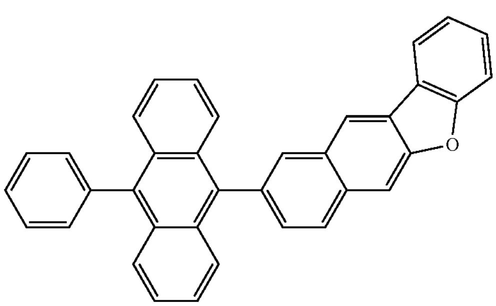
-continued
C41
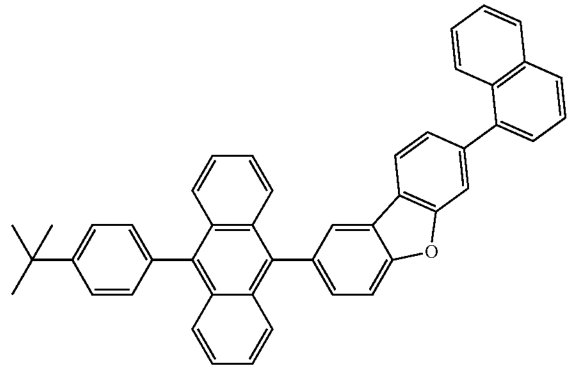
C42
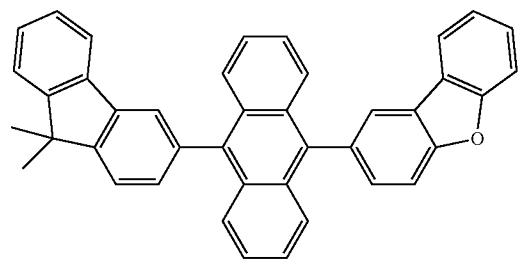
C43
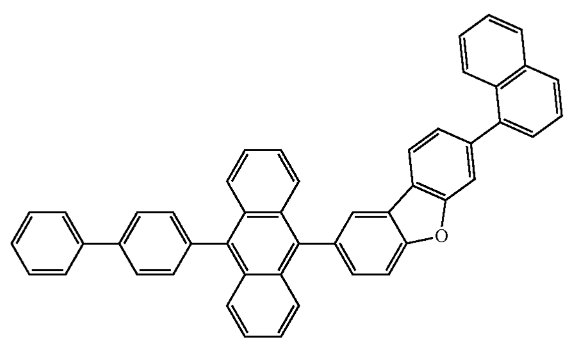
C44
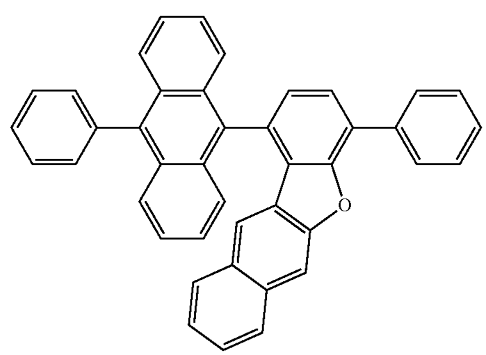

-continued

C45

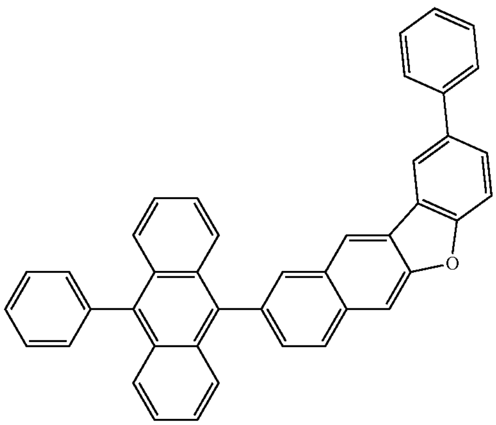

C46

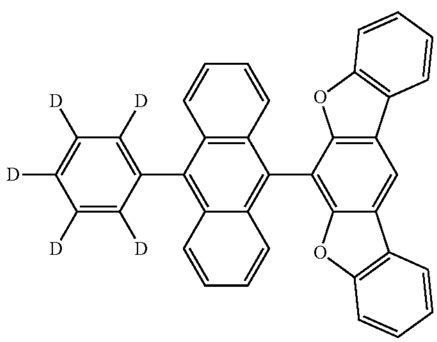

C47

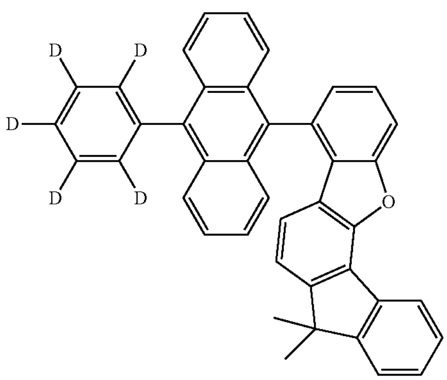

C48

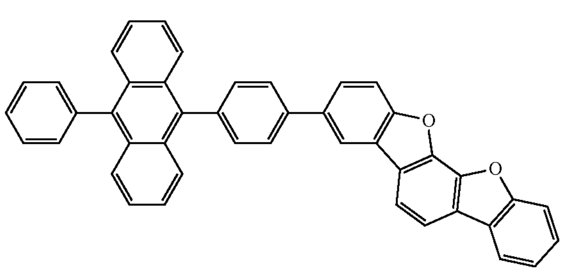

.

10. The organic electroluminescent according to claim 5, wherein each of the hole transport layer and the electron blocking layer comprises a compound represented by Formula D:

(D)

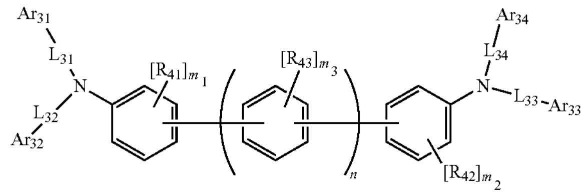

wherein $R_{41}$ to $R_{43}$ are identical to or different from each other and are each independently selected from hydrogen, deuterium, substituted or unsubstituted $C_1$-$C_{20}$ alkyl, substituted or unsubstituted $C_6$-$C_{50}$ aryl, substituted or unsubstituted $C_7$-$C_{50}$ arylalkyl, substituted or unsubstituted $C_3$-$C_{30}$ cycloalkyl, substituted or unsubstituted $C_1$-$C_{30}$ alkylsilyl, substituted or unsubstituted $C_6$-$C_{30}$ arylsilyl, and halogen, $L_{31}$ to $L_{34}$ are identical to or different from each other and are each independently single bonds or selected from substituted or unsubstituted $C_6$-$C_{50}$ arylene and substituted or unsubstituted $C_2$-$C_{50}$ heteroarylene, $Ar_{31}$ to $Ar_{34}$ are identical to or different from each other and are each independently selected from substituted or unsubstituted $C_6$-$C_{50}$ aryl and substituted or unsubstituted $C_2$-$C_{50}$ heteroaryl, n is an integer from 0 to 4, provided that when n is 2 or greater, the aromatic rings containing $R_{43}$ are identical to or different from each other, $m_1$ to $m_3$ are integers from 0 to 4, provided that when both $m_1$ and $m_3$ are 2 or more, the $R_{41}$, $R_{42}$, and $R_{43}$ groups are identical to or different from each other, and hydrogen or deuterium atoms are bonded to the carbon atoms of the aromatic rings to which $R_{41}$ to $R_{43}$ are not attached.

11. The organic electroluminescent according to claim 10, wherein at least one of $Ar_{31}$ to $Ar_{34}$ in Formula D is represented by Formula E (E)

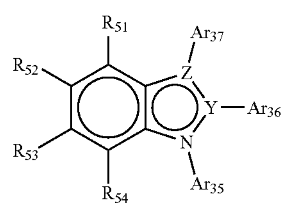

wherein $R_{51}$ to $R_{54}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, which are optionally linked to each other to form a ring, Y is a carbon or nitrogen atom, Z is a carbon, oxygen, sulfur or nitrogen atom, $Ar_{35}$ to $Ar_{37}$ are identical to or different from each other and are each independently selected from substituted or unsubstituted $C_5$-$C_{50}$ aryl and substituted or unsubstituted $C_3$-$C_{50}$ heteroaryl, provided that when Z is an oxygen or sulfur atom, $Ar_{37}$ is nothing, provided that when Y and Z are nitrogen atoms, only one of $Ar_{35}$, $Ar_{36}$, and $Ar_{37}$ is present, provided that when Y is a nitrogen atom and Z is a carbon atom, $Ar_{36}$ is nothing, with the proviso that one of $R_{51}$ to $R_{54}$ and $Ar_{35}$ to $Ar_{37}$ is a single bond linked to one of the linkers $L_{31}$ to $L_{34}$ in Formula D.

12. The organic electroluminescent according to claim 10, wherein the compound of Formula D is selected from the compounds of Formulae D1 to D79:

D1

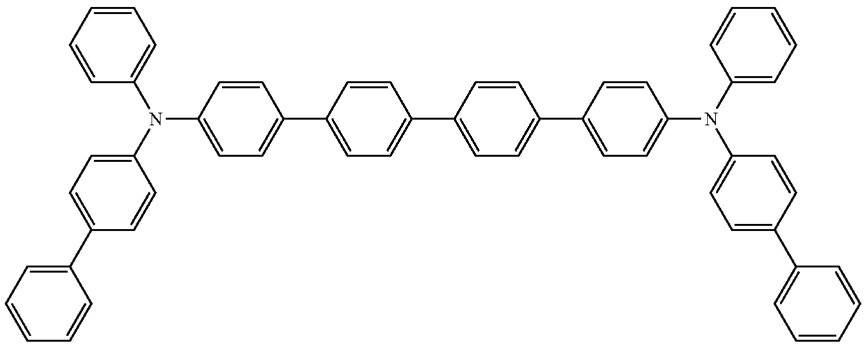

D2

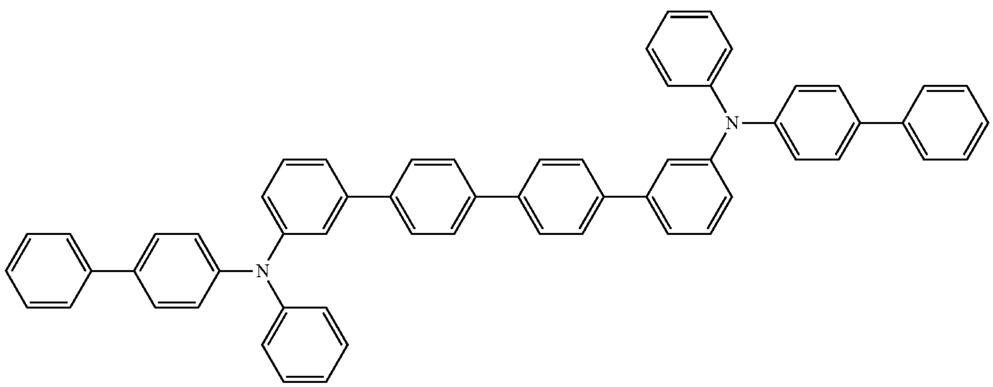

D3

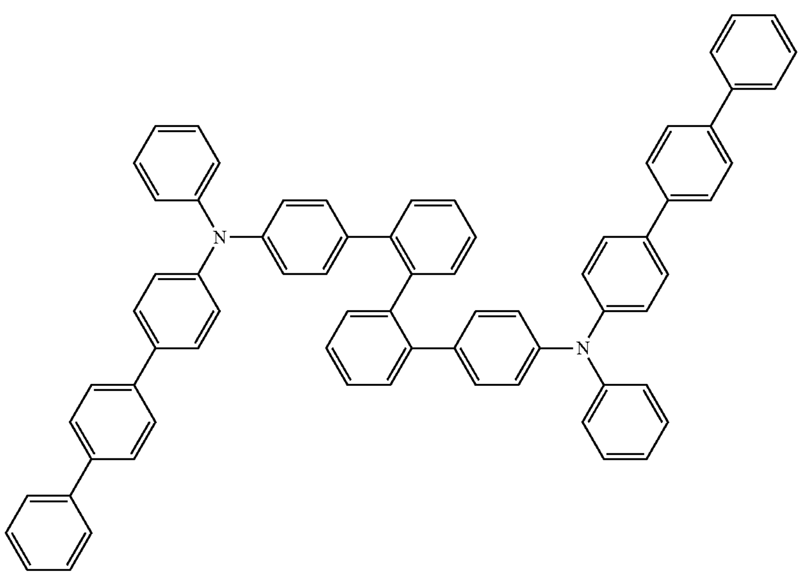

-continued
D4
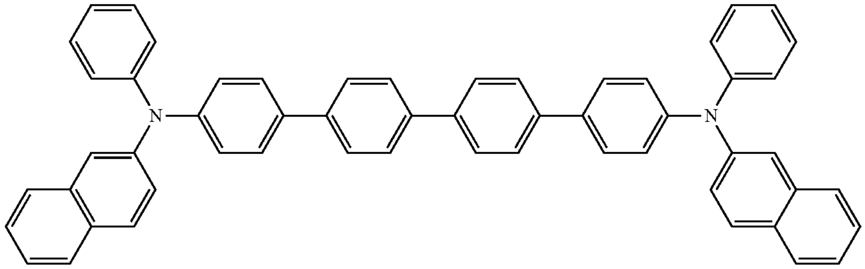
D5
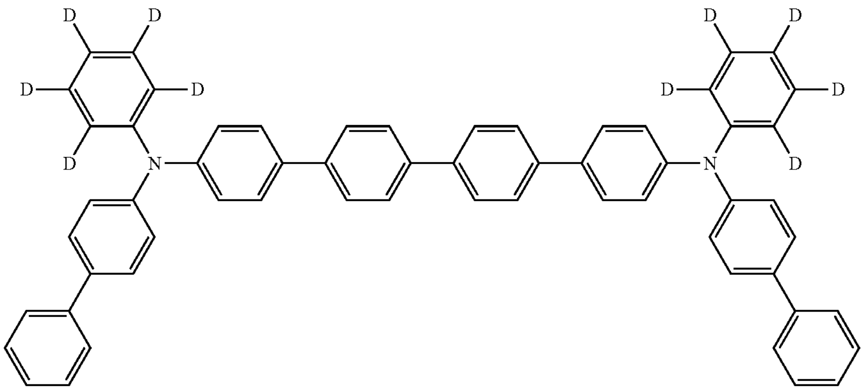
D6
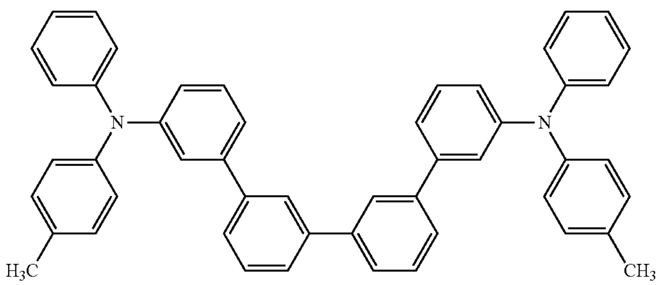
D7
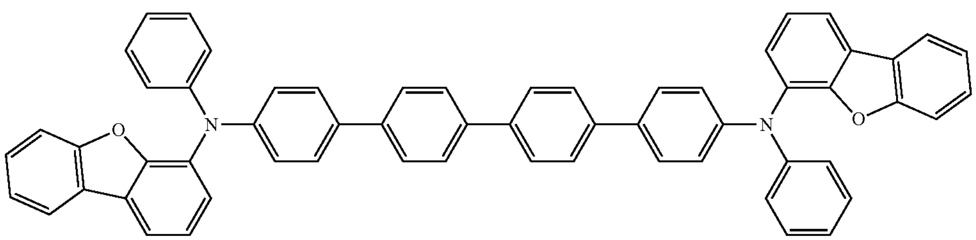
D8
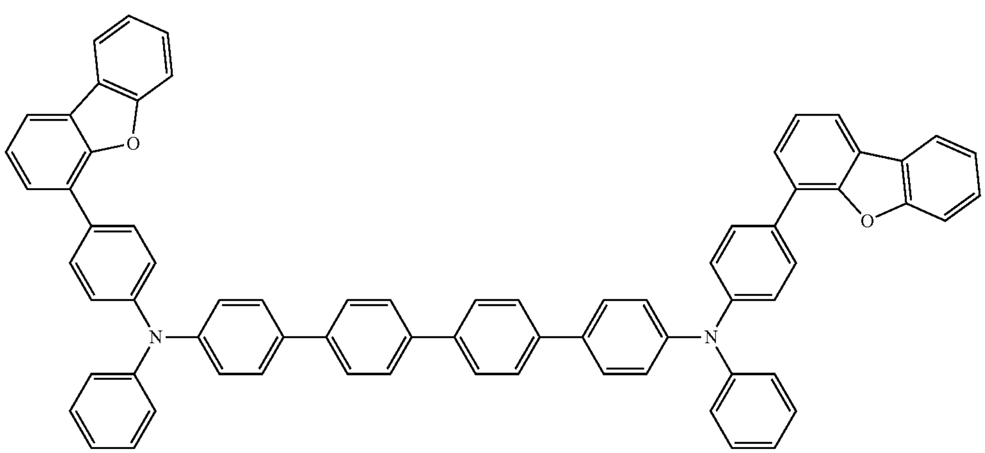

-continued
D9
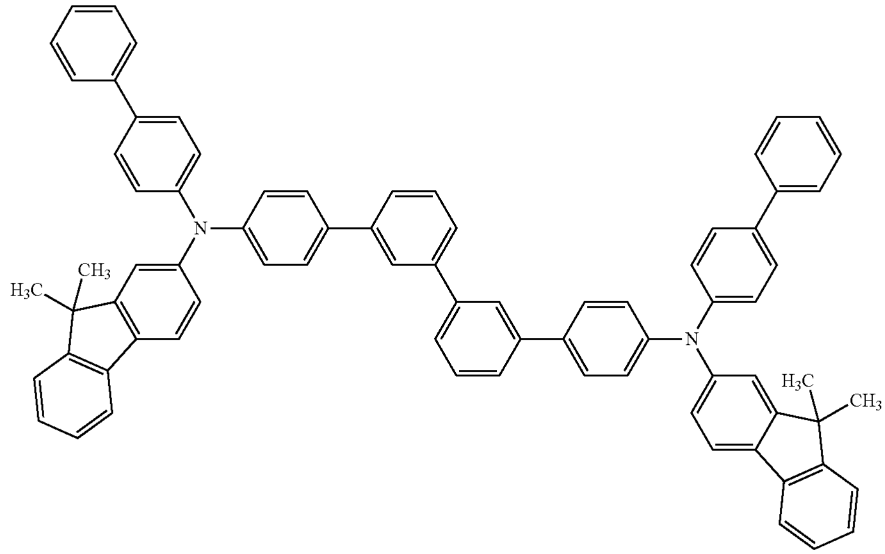
D10
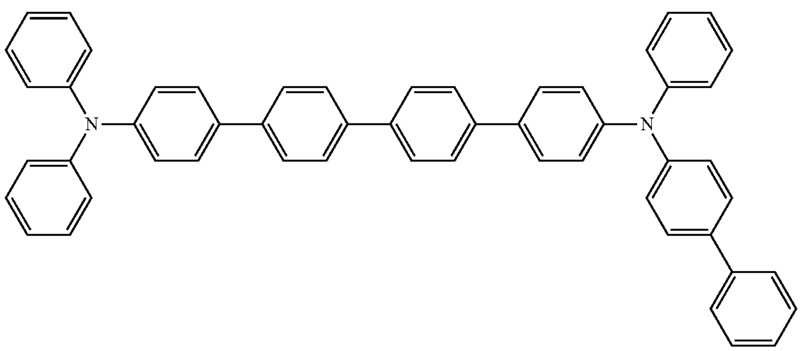
D11
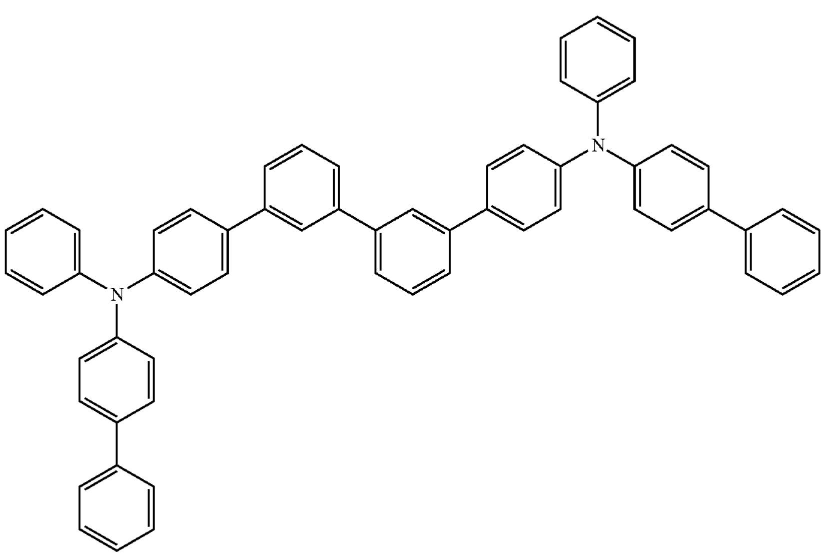

-continued
D12
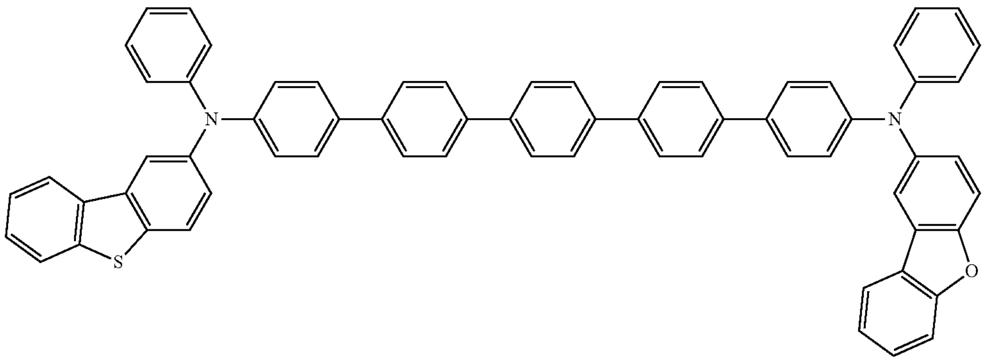
D13
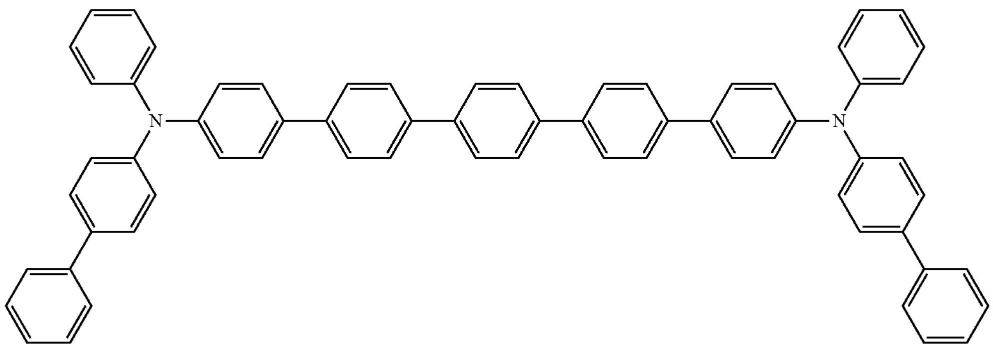
D14
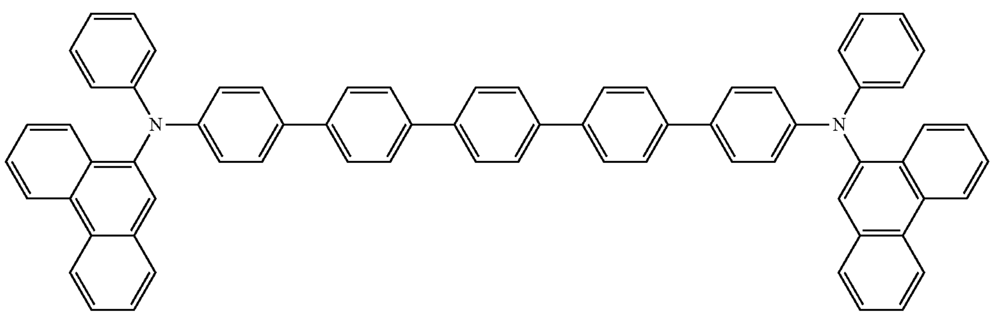
D15
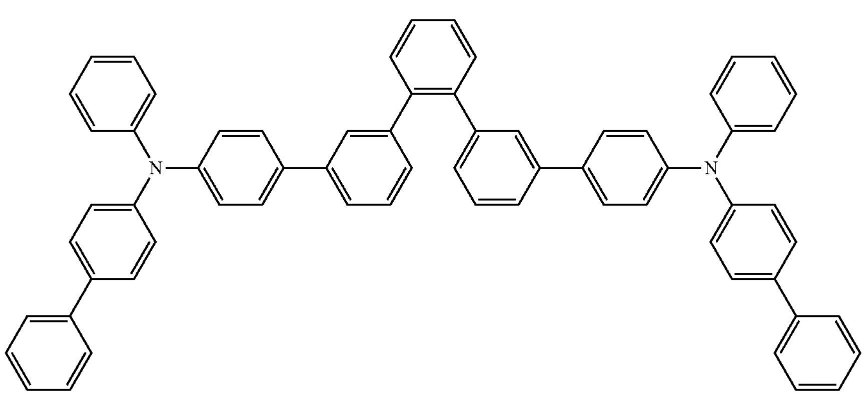

-continued
D16
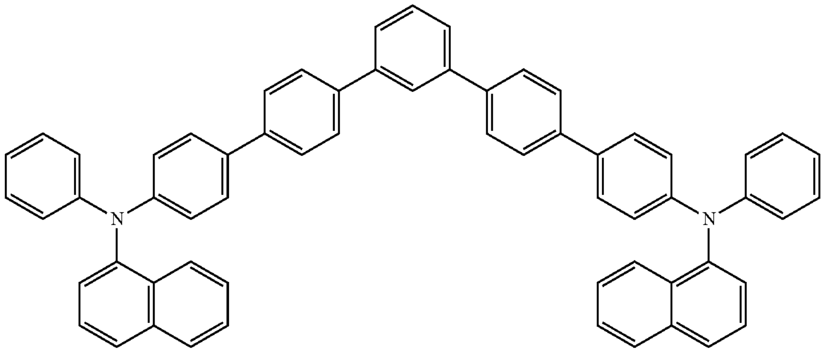
D17
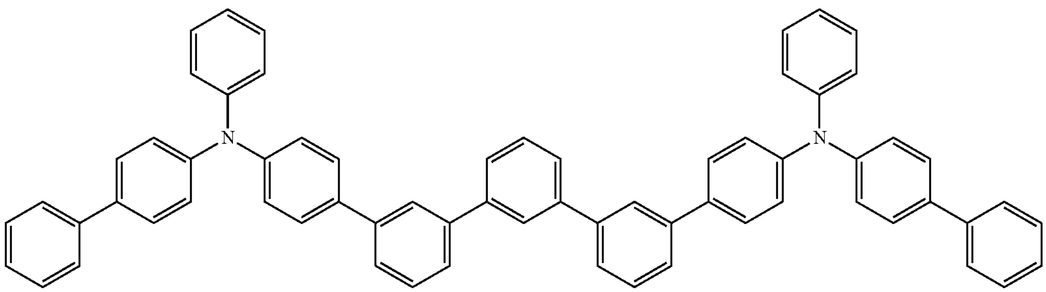
D18
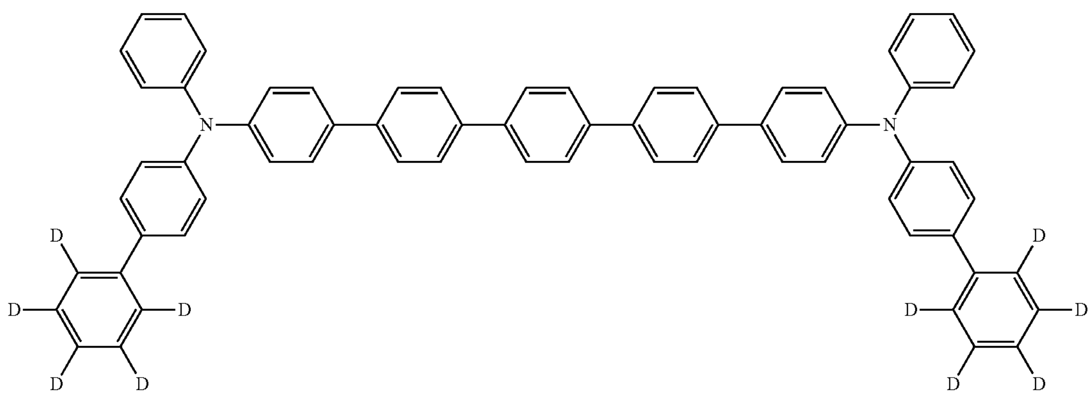
D19
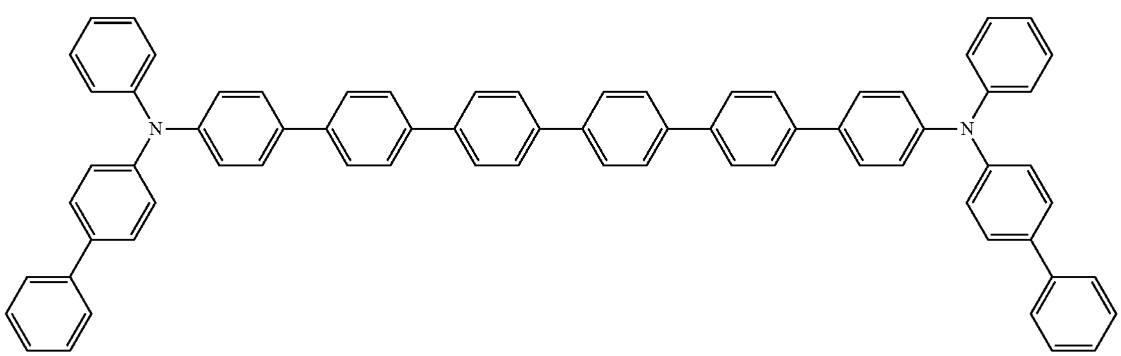

-continued
D20
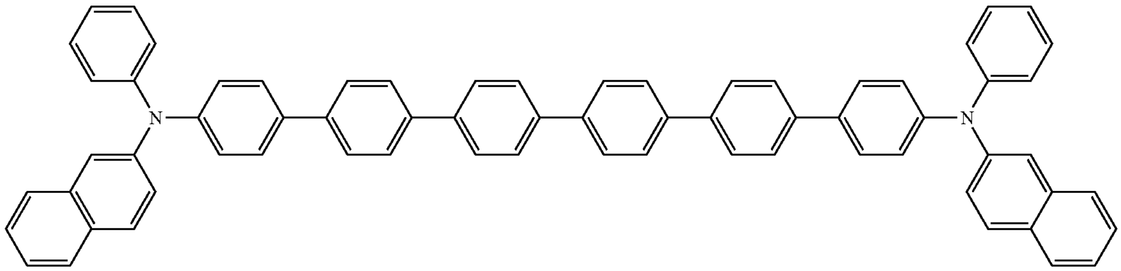
D21
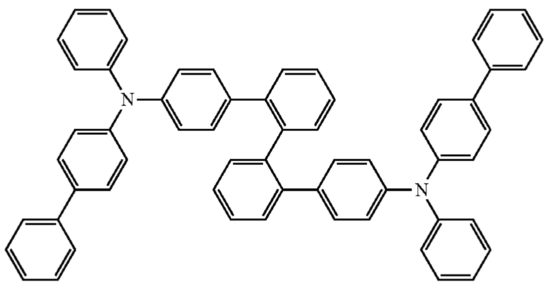
D22
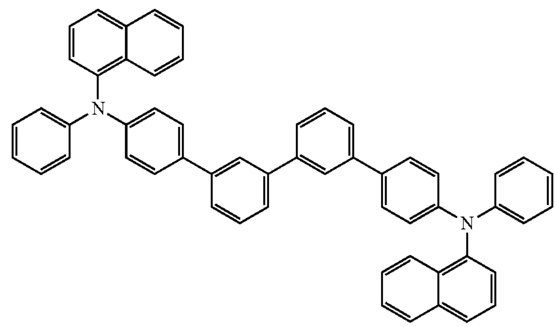
D23
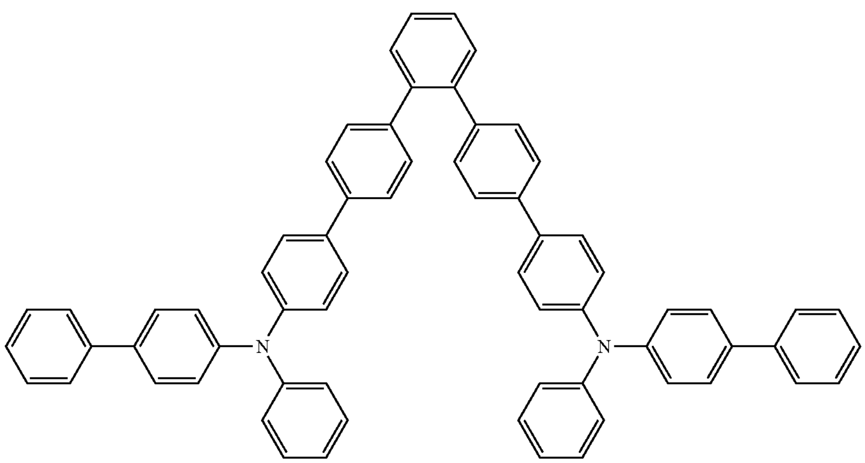
D24
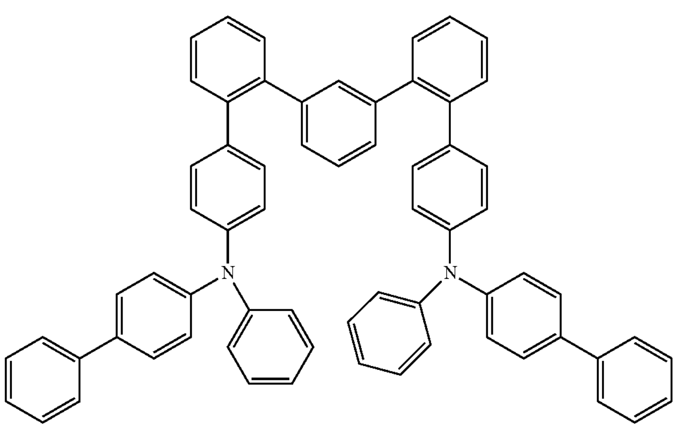

-continued
D25
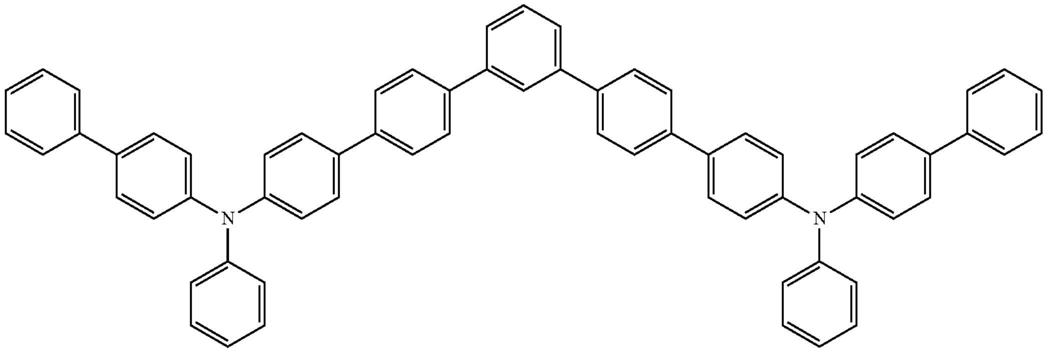
D26
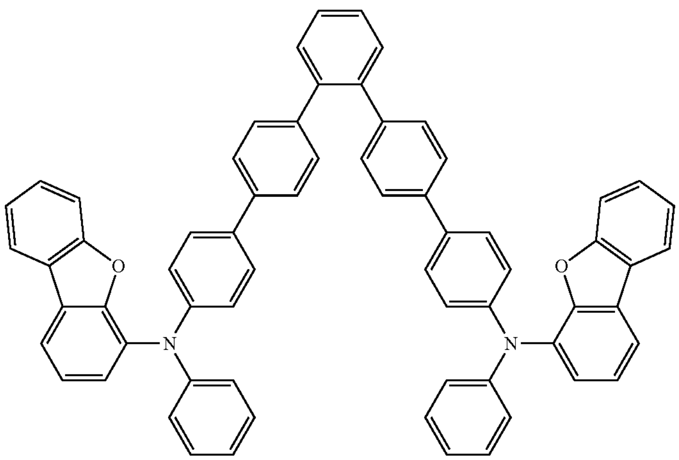
D27
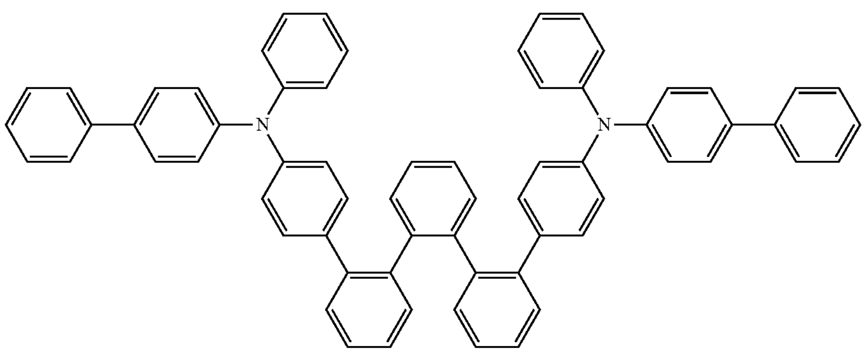
D28
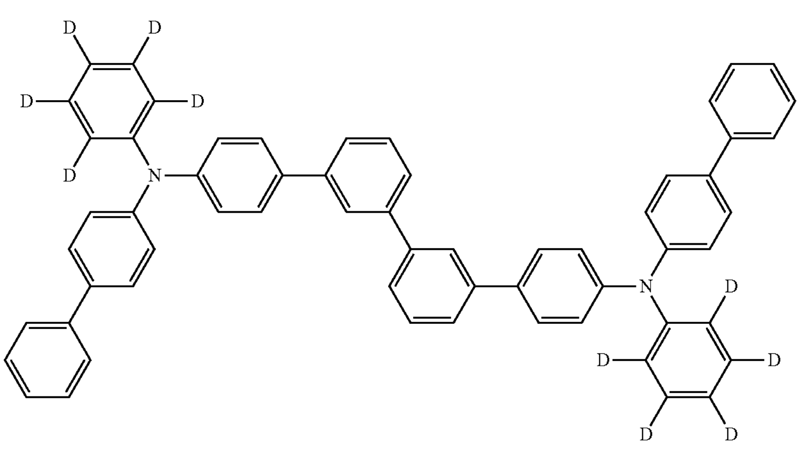

-continued
D29
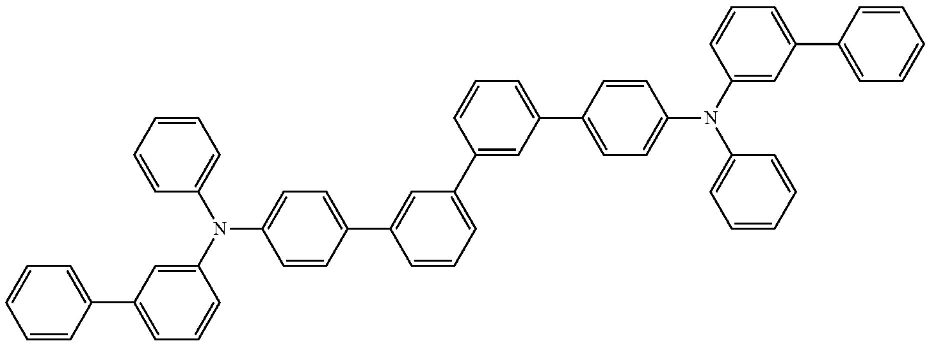
D30
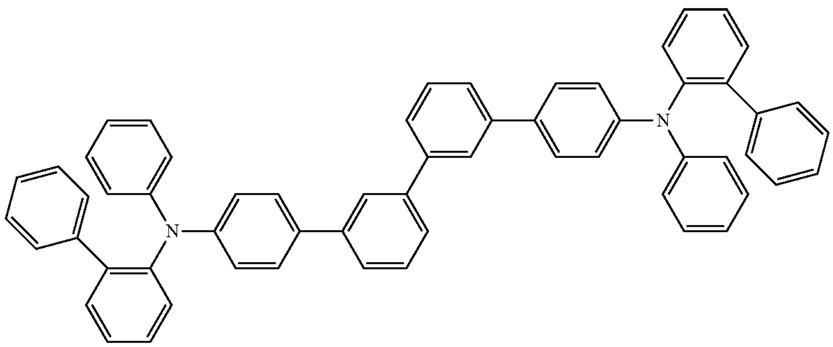
D31
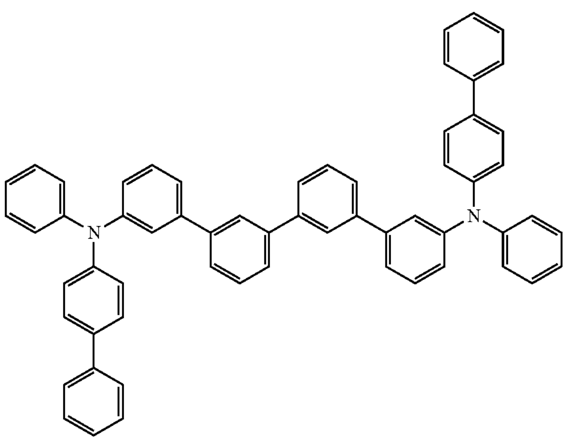
D32
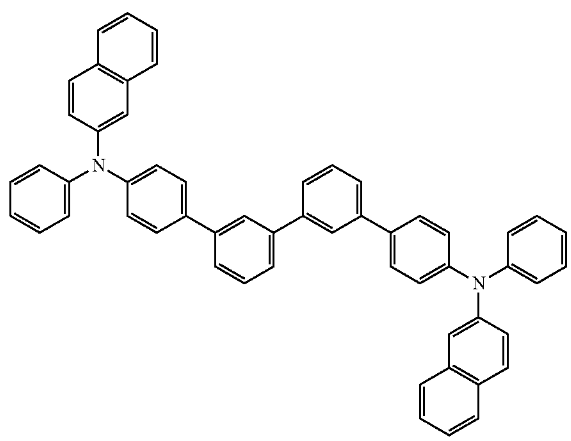
D33
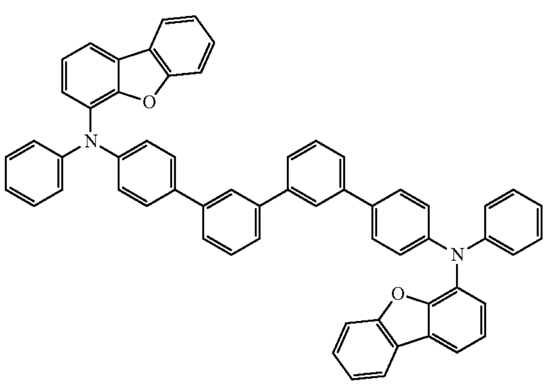
D34
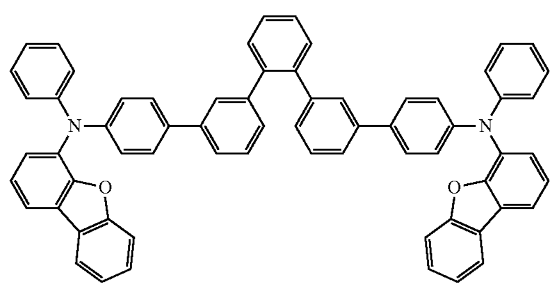

-continued
D35
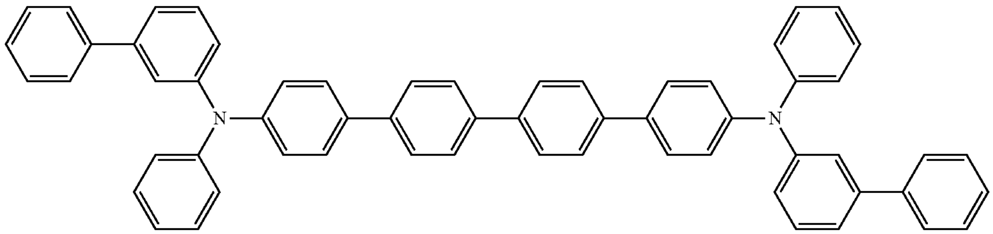
D36
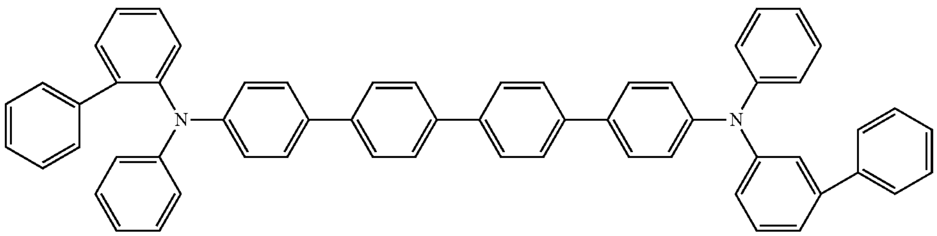
D37
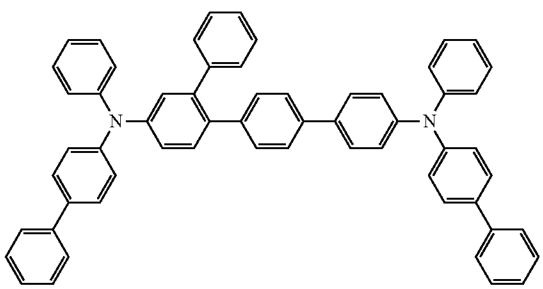
D38
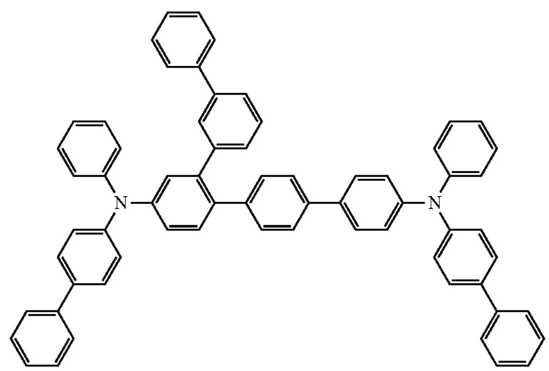
D39
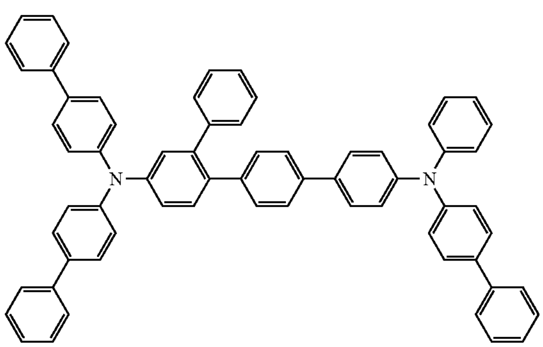
D40
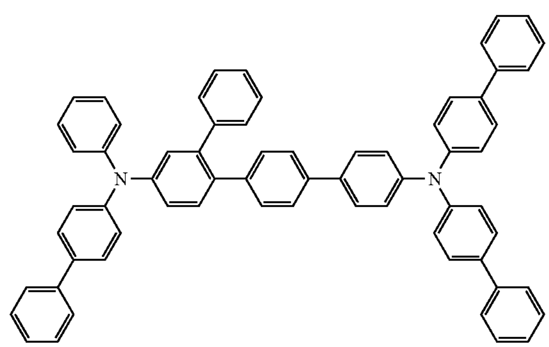
D41
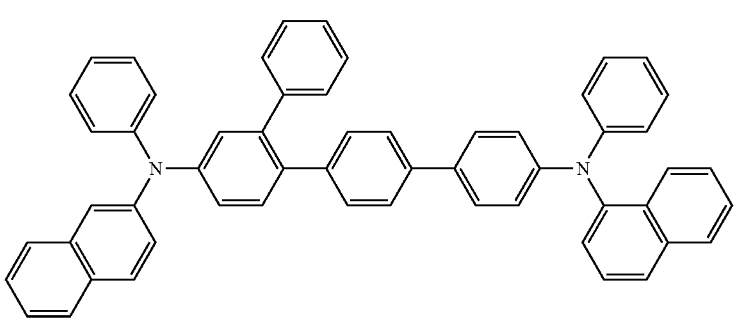

-continued
D42
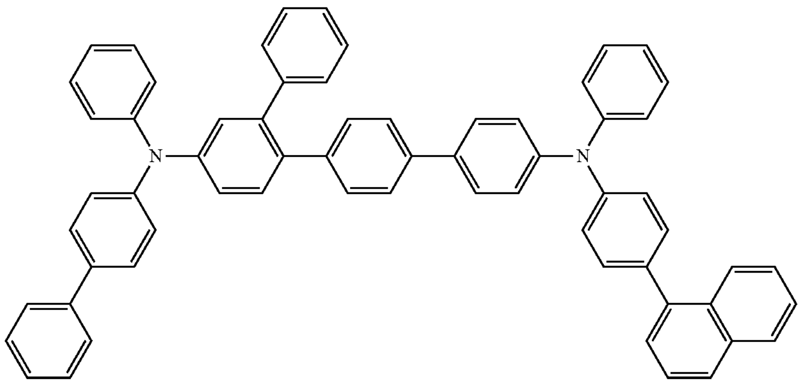
D43
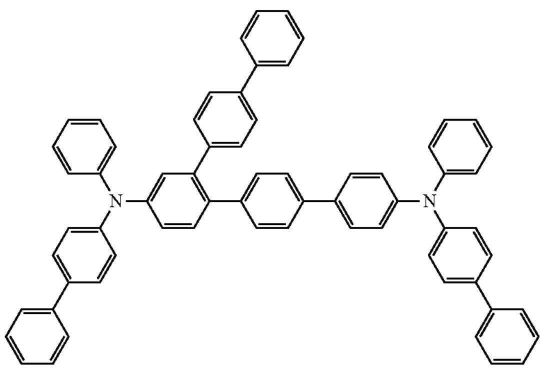
D44
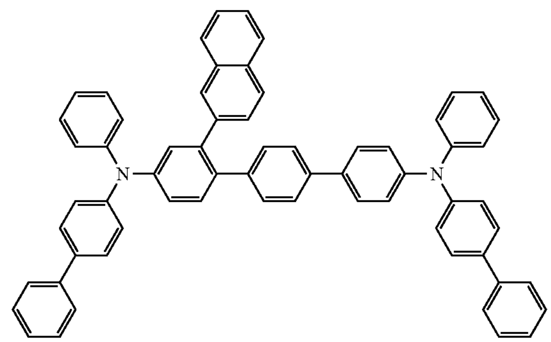
D45
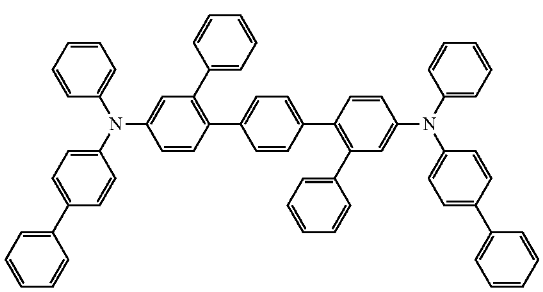
D46
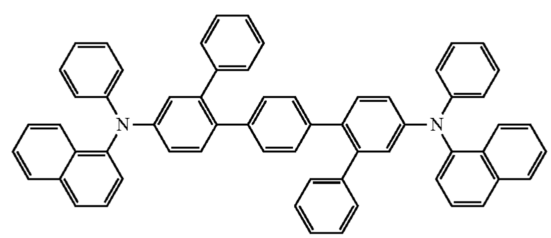
D47
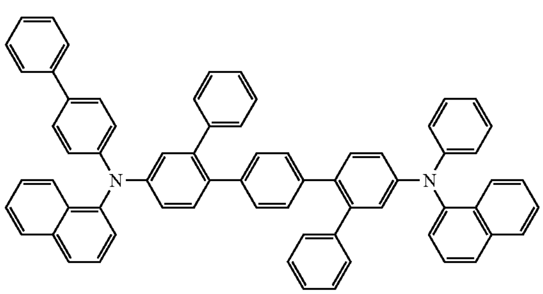
D48
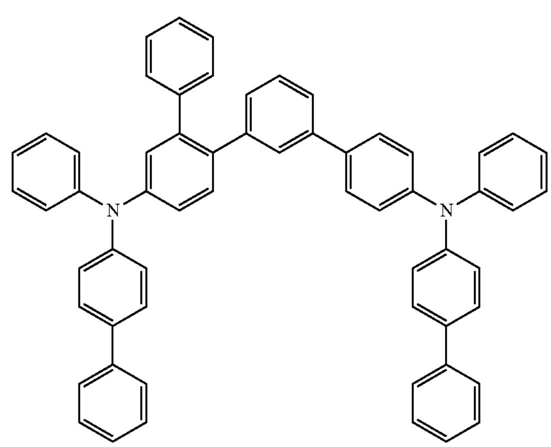

-continued
D49
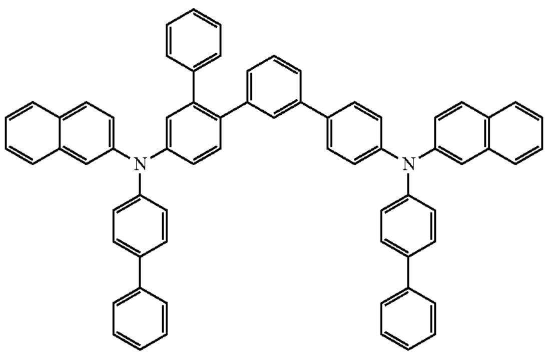
D50
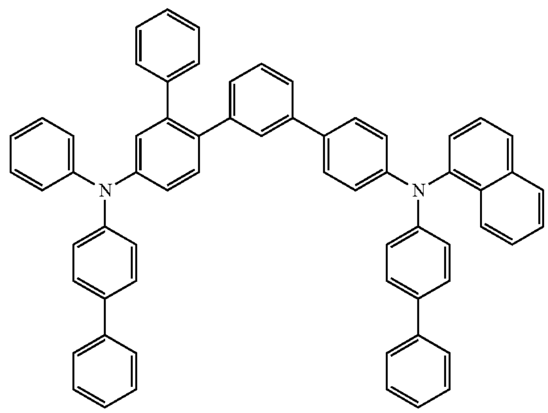
D51
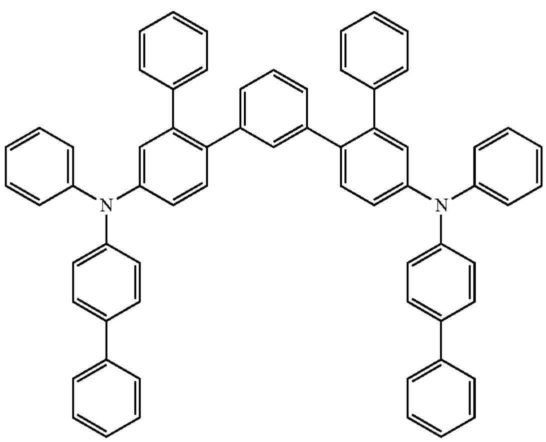
D52
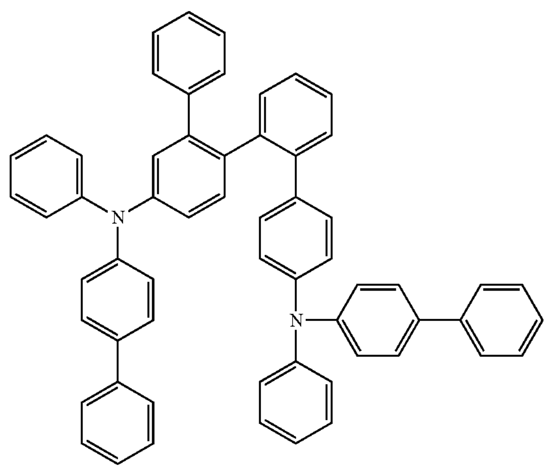
D53
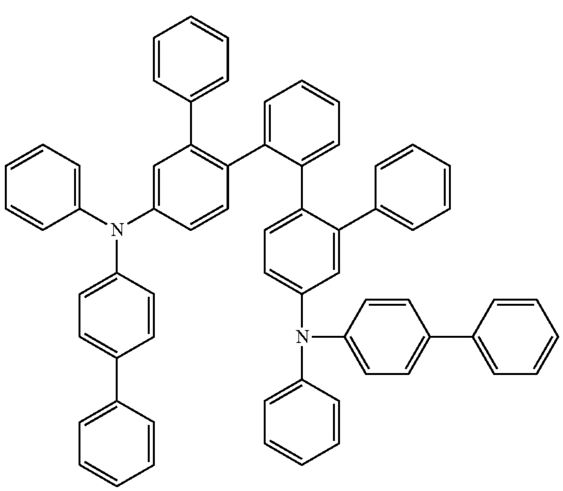

-continued
D54
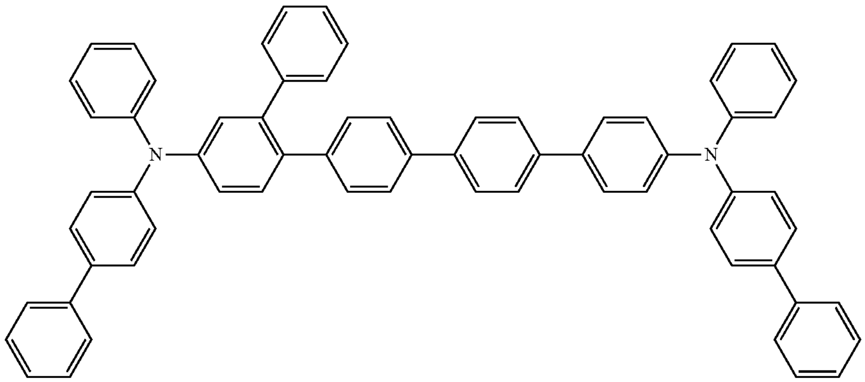
D55
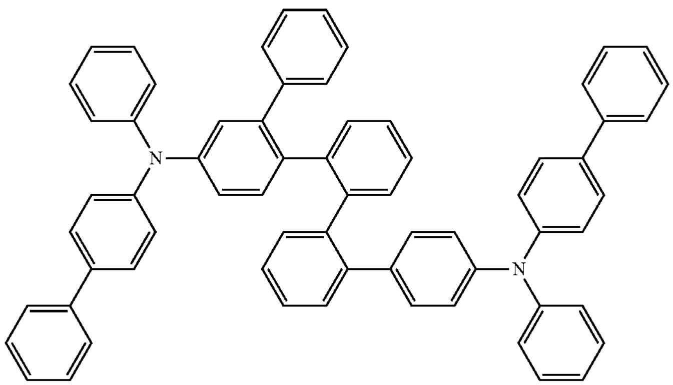
D56
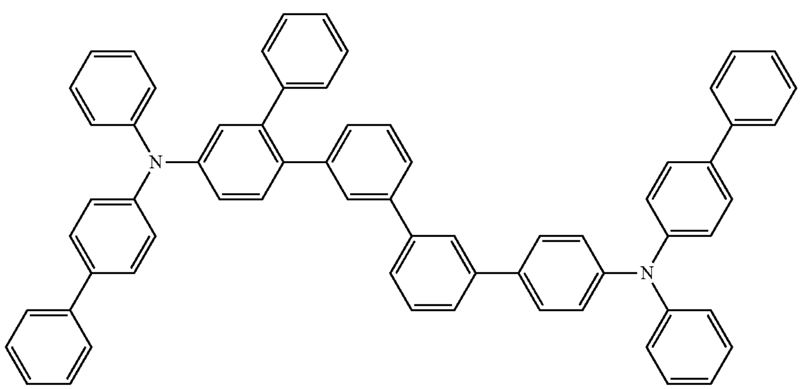
D57
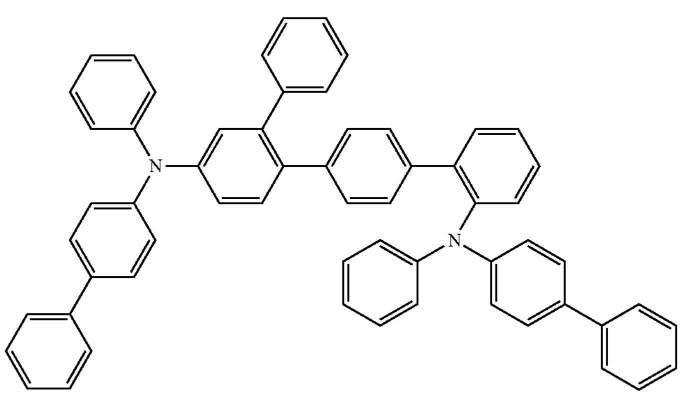

-continued
D58
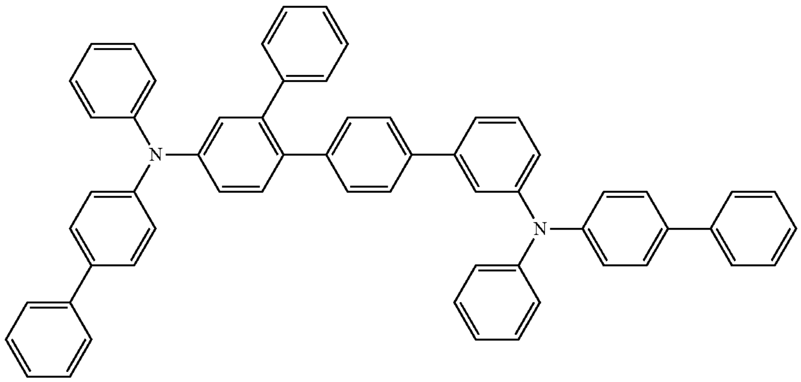
D59
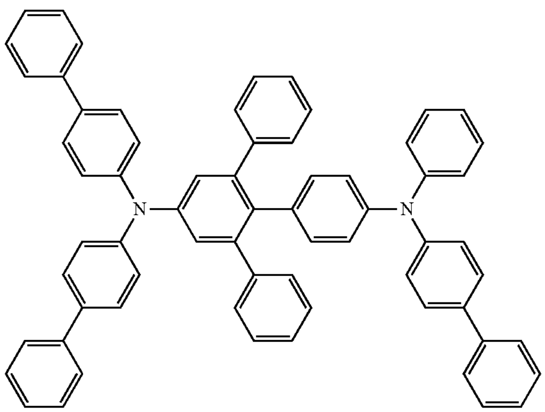
D60
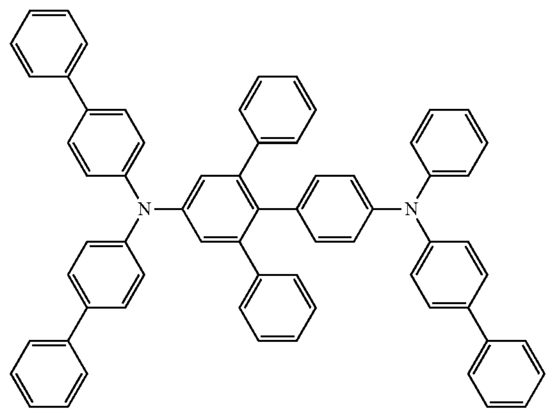
D61
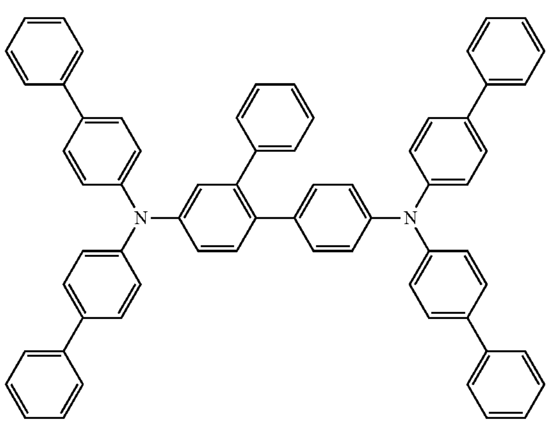
D62
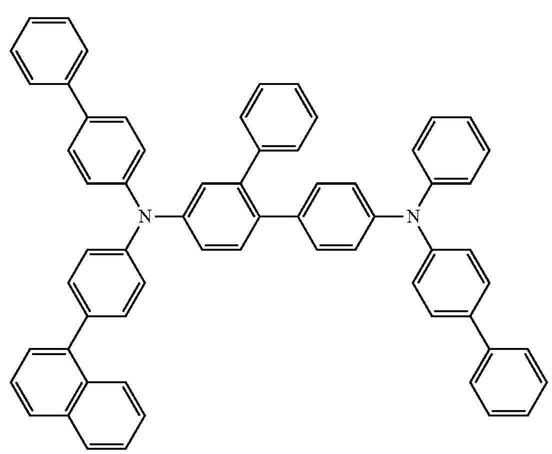

-continued
D63
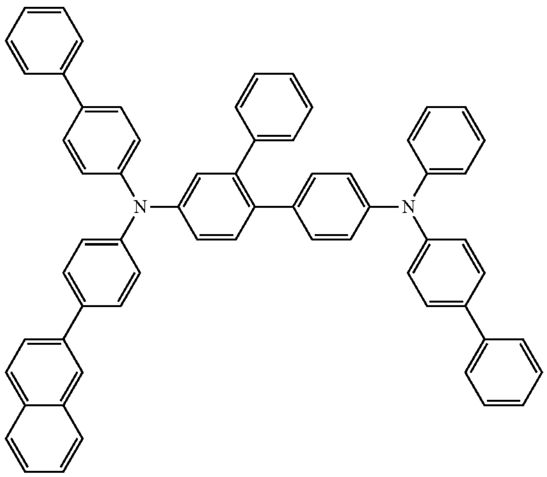
D64
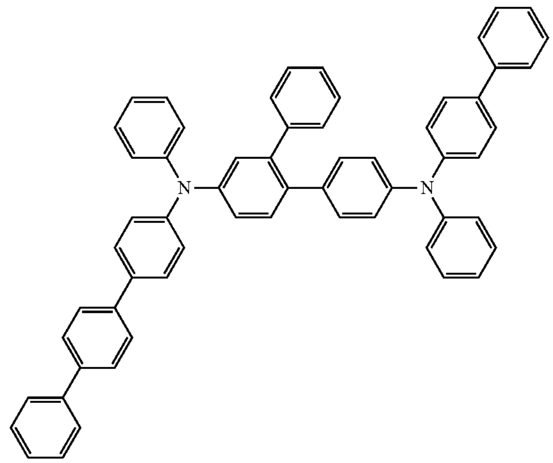
D65
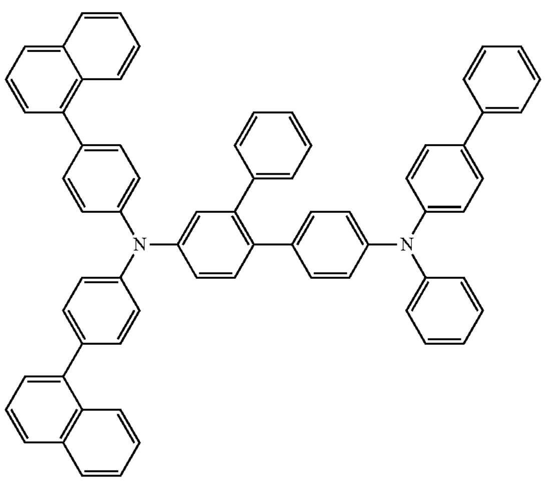
D66
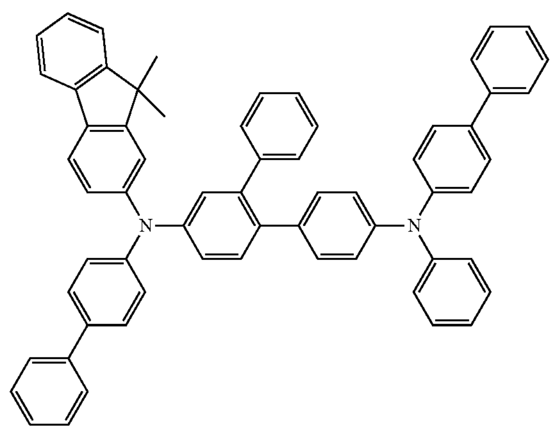
D67
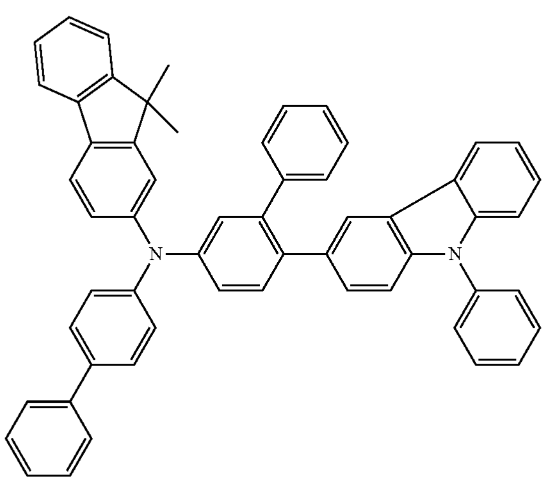
D68
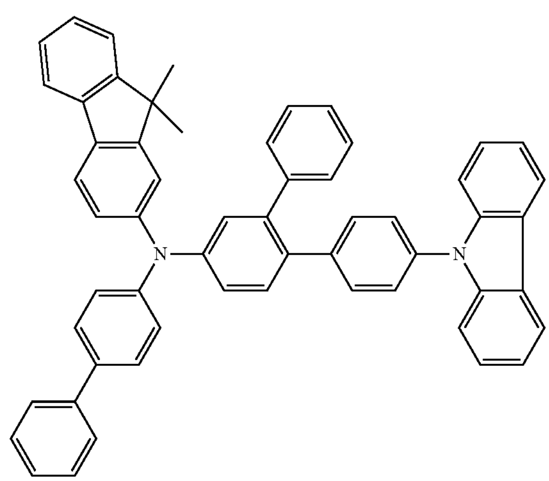

-continued
D69
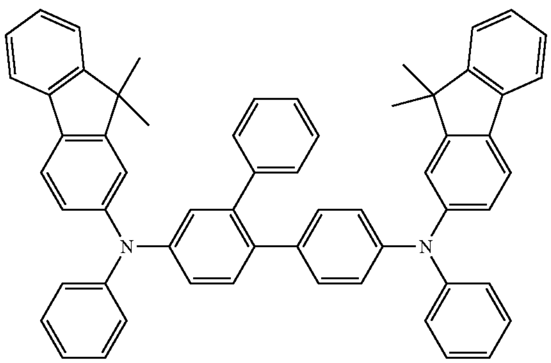
D70
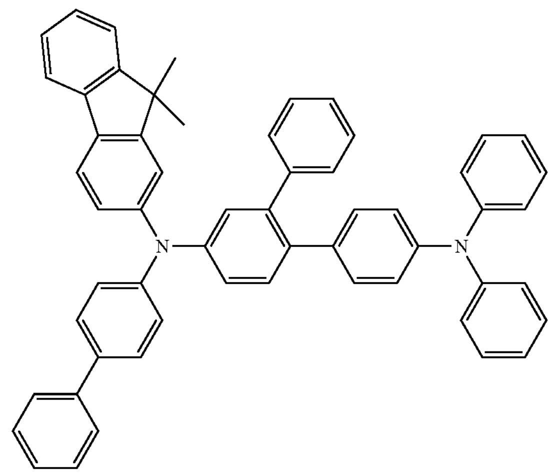
D71
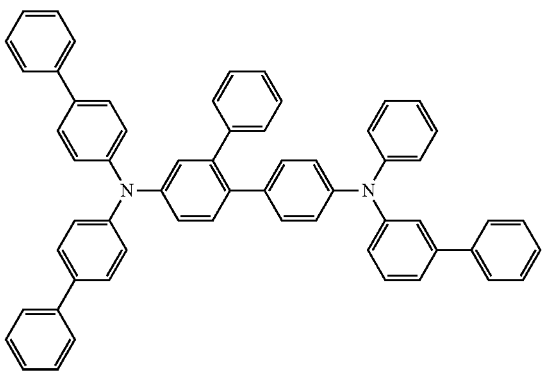
D72
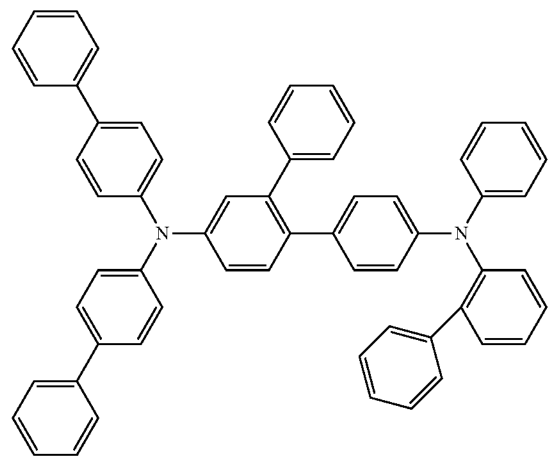
D73
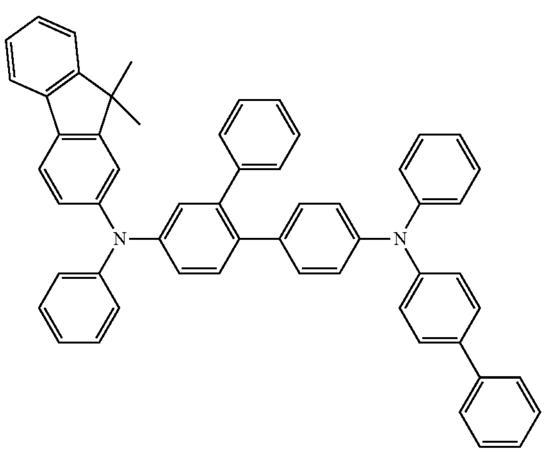
D74
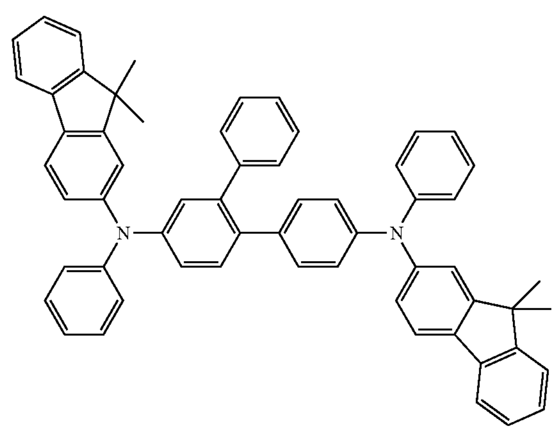

-continued
D75
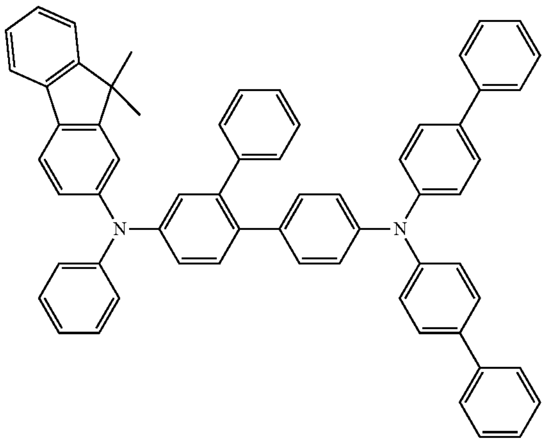
D76
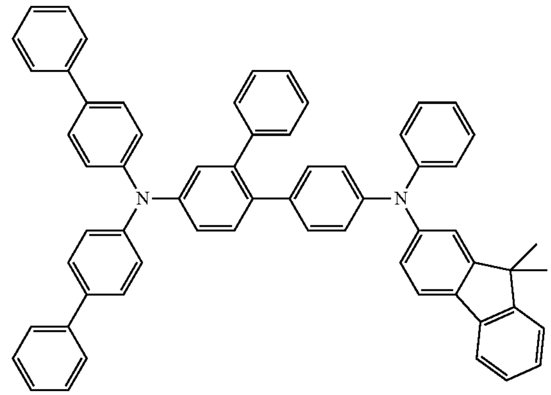
D77
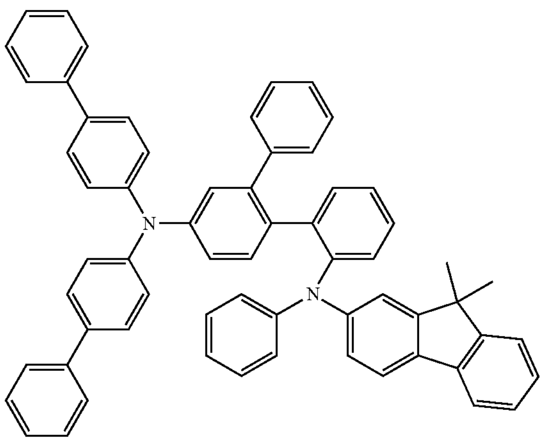
D78
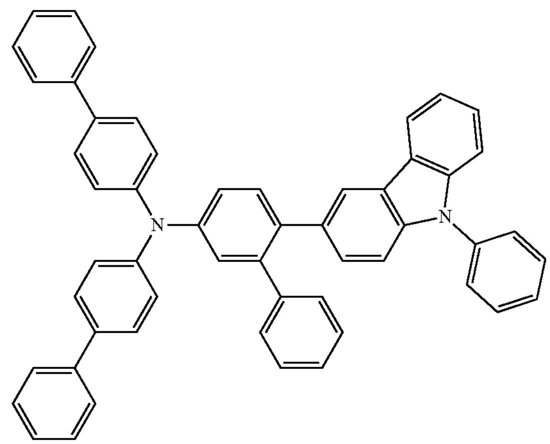
D79
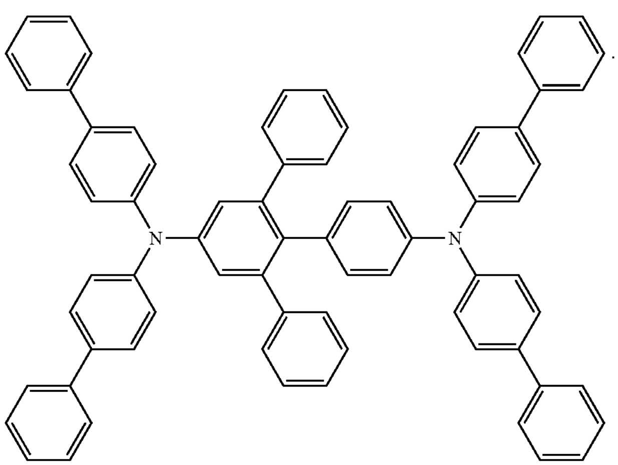

13. The organic electroluminescent according to claim 10, wherein the compound of Formula D is selected from the compounds of Formulae D101 to D145:
D101
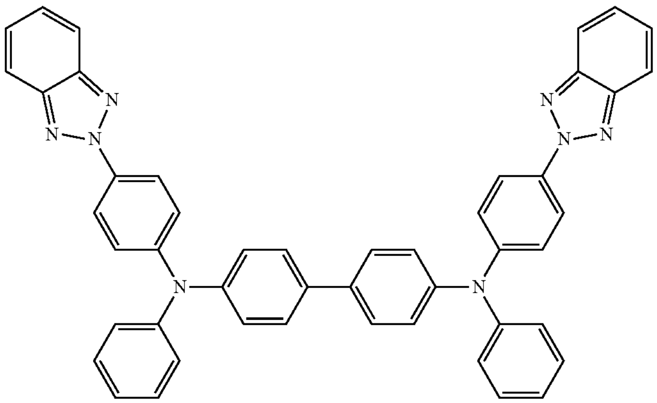
D102
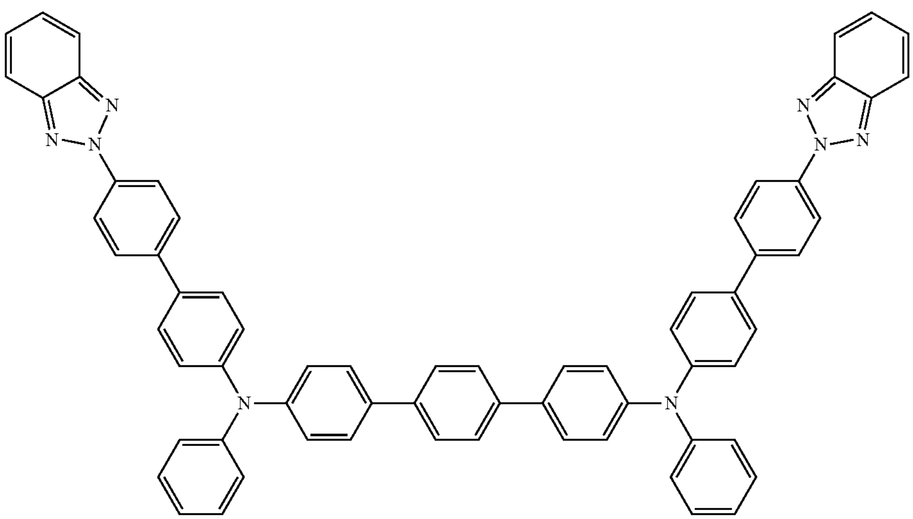
D103
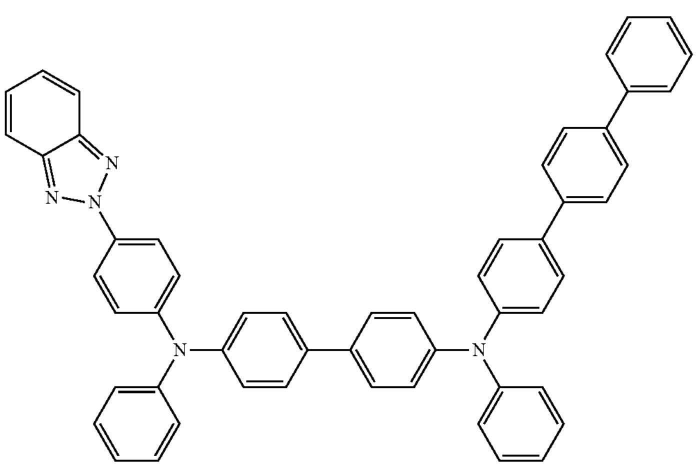

-continued
D104
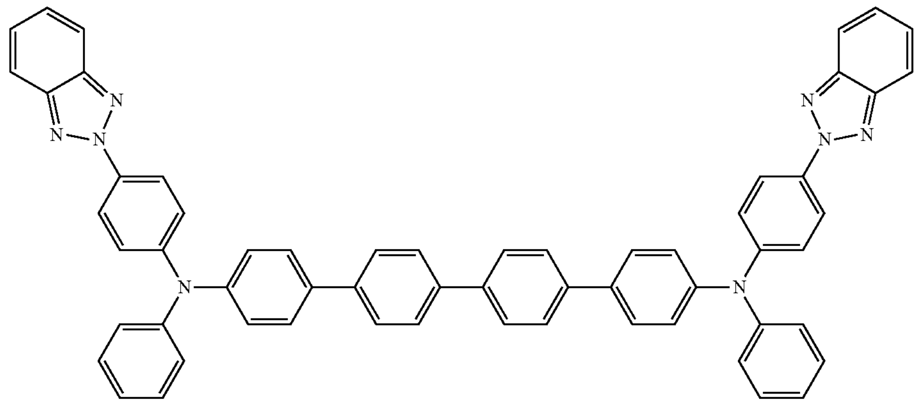
D105
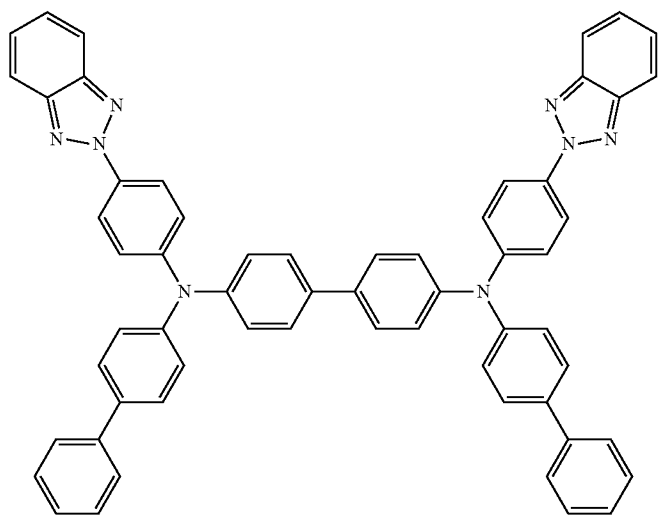
D106
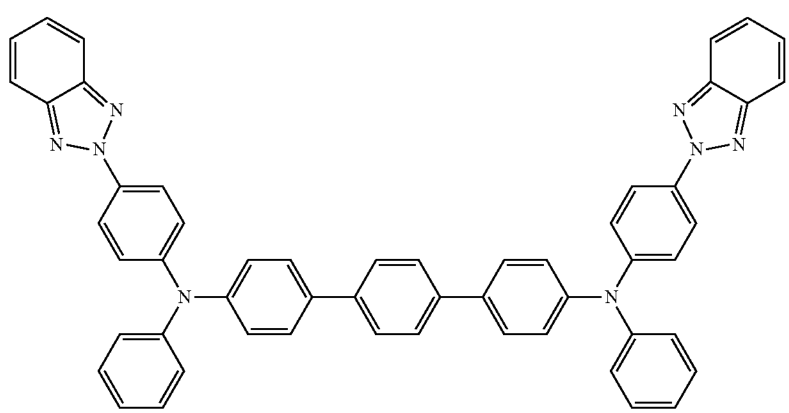

-continued
D107
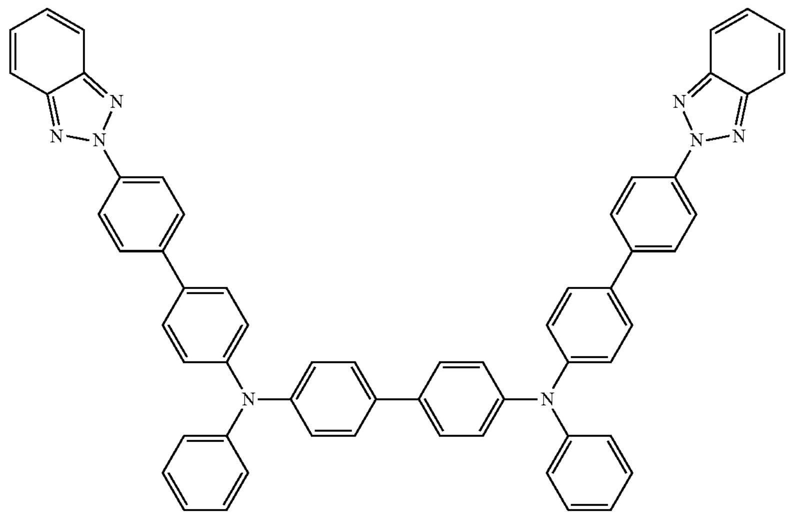
D108
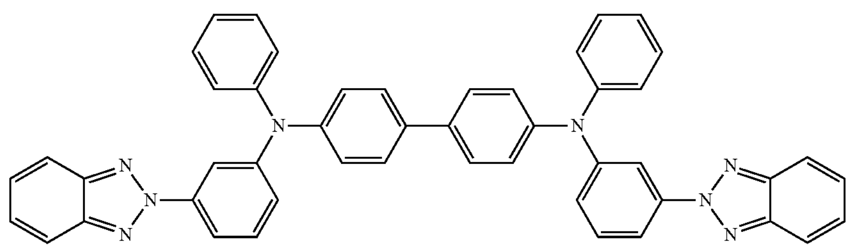
D109
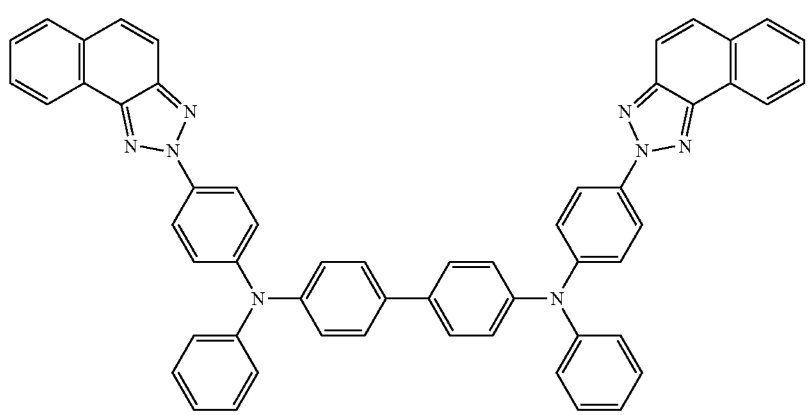
D110
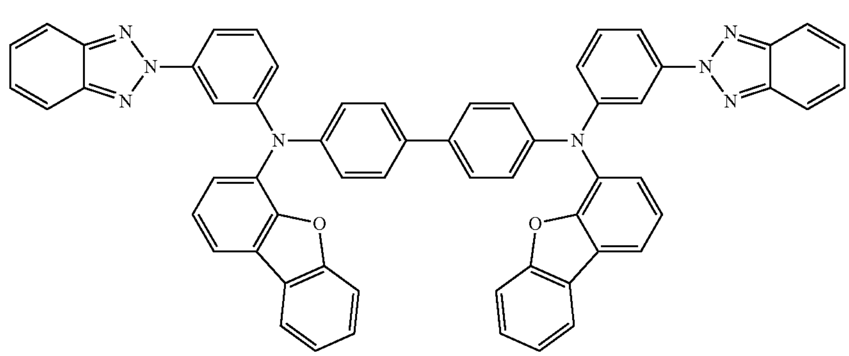

-continued
D111
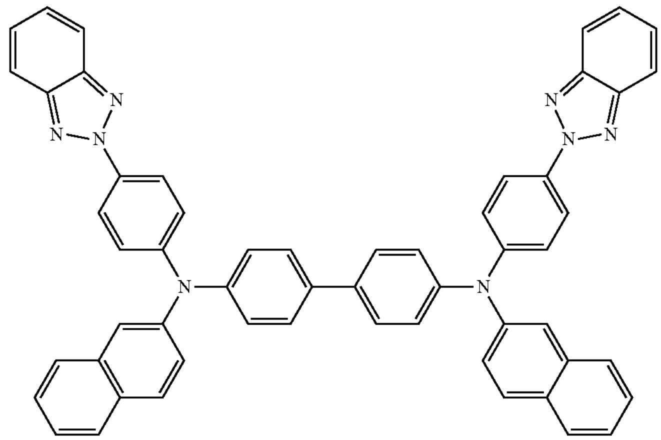
D112
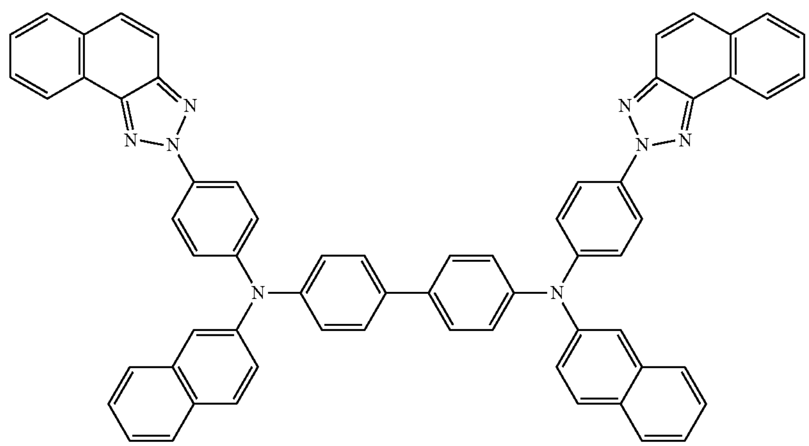
D113
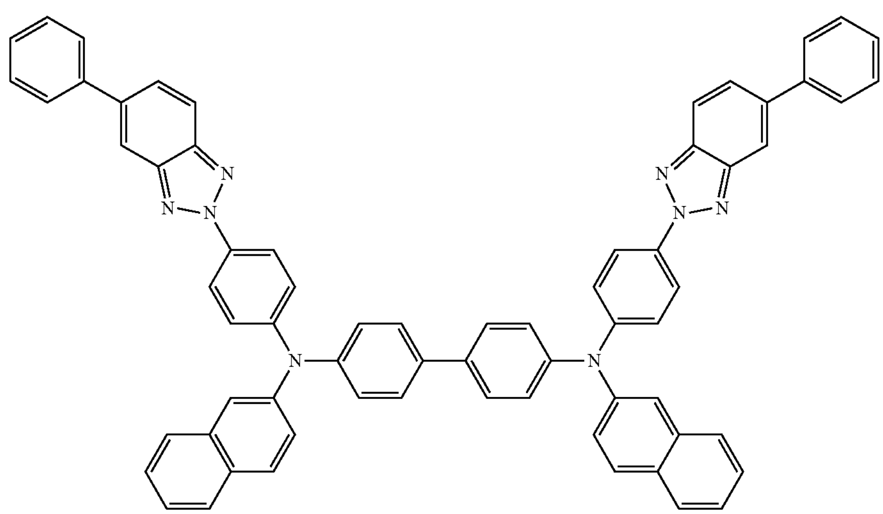

-continued
D114
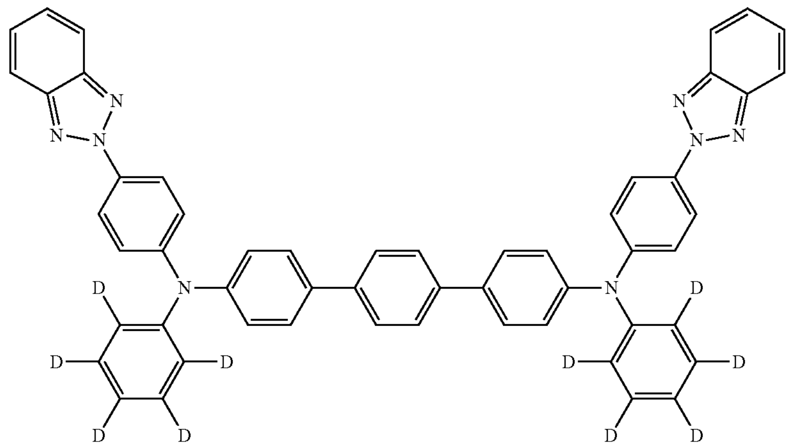
D115
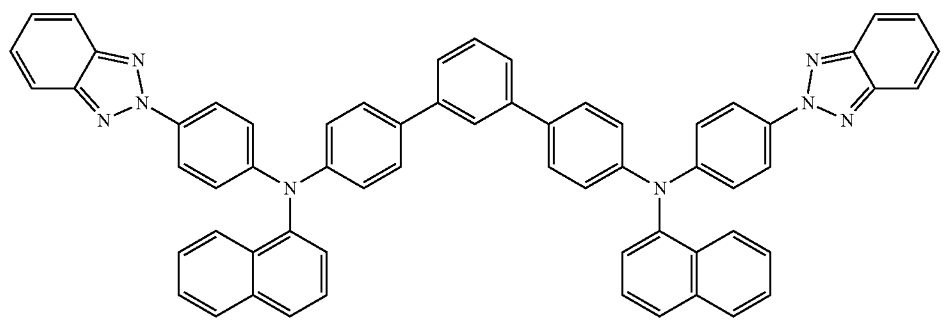
D116
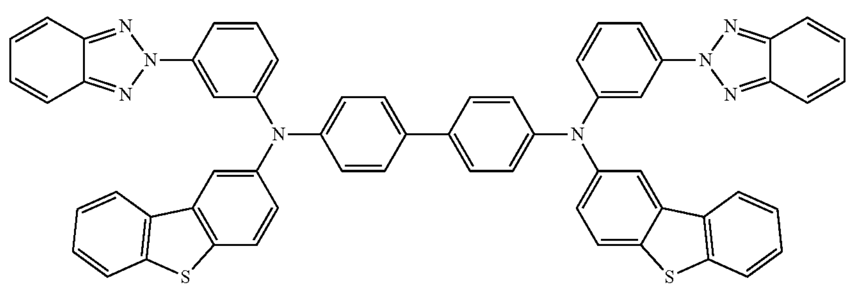
D117
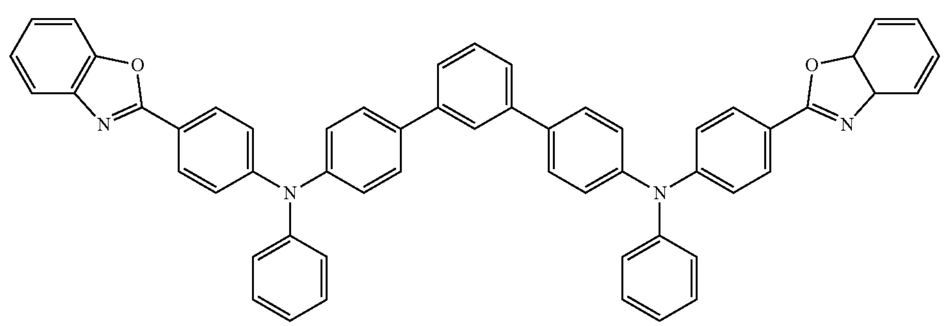

-continued
D118
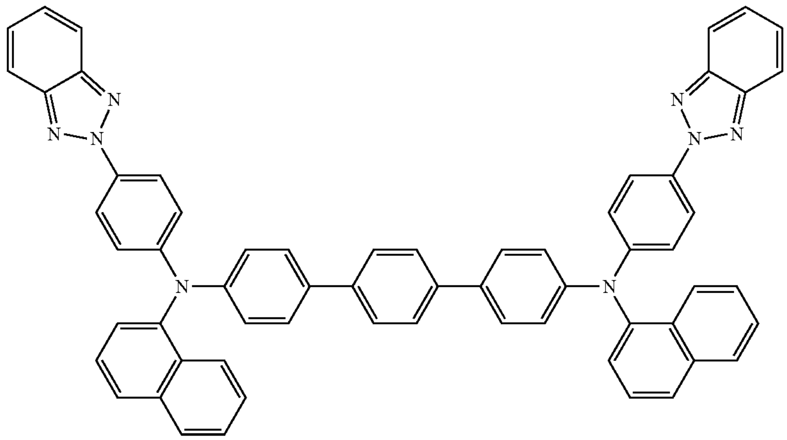
D119
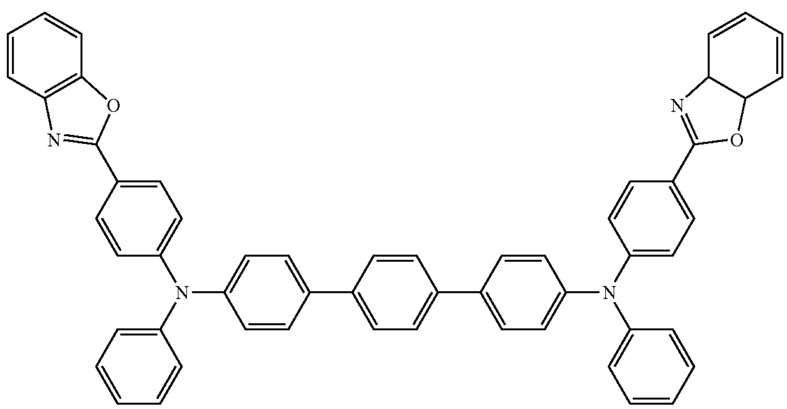
D120
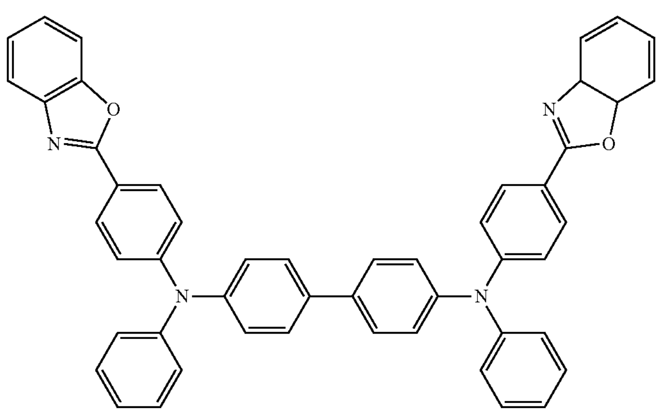

-continued
D121
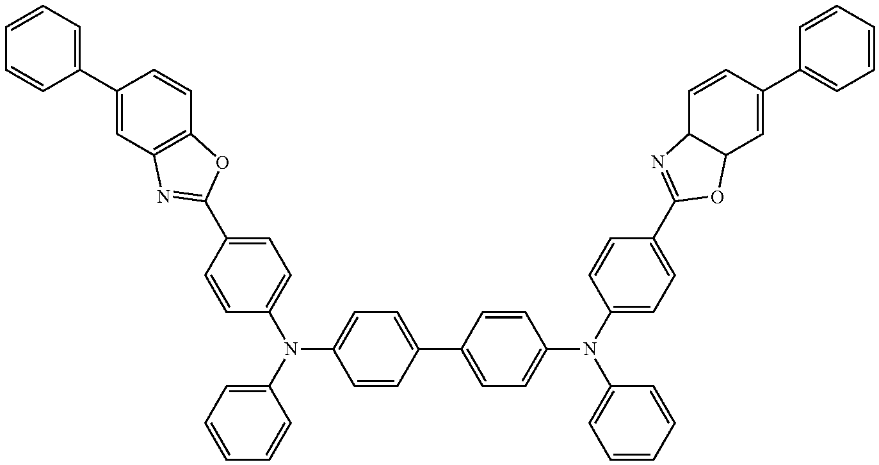
D122
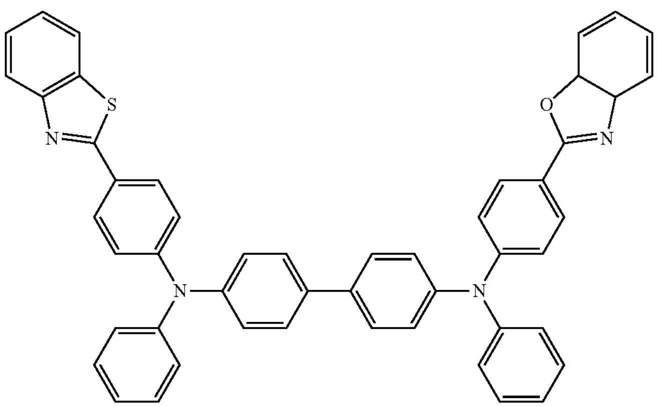
D123
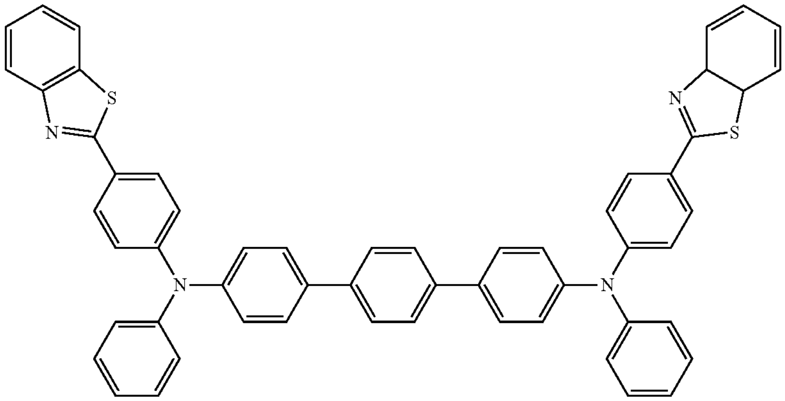

-continued
D124
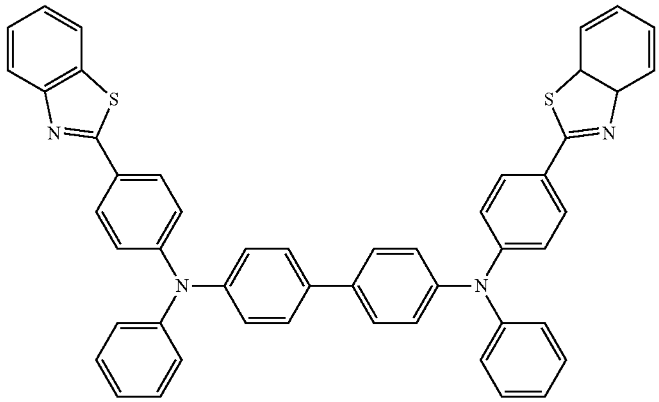
D125
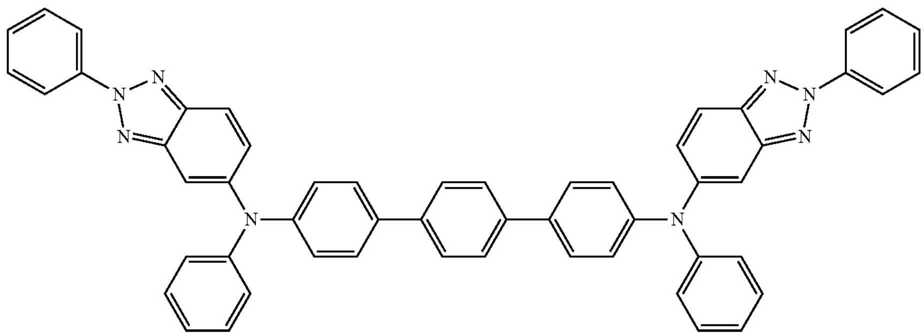
D126
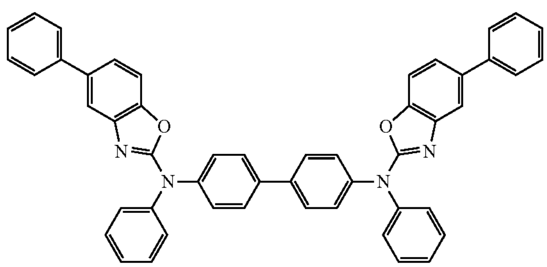
D127
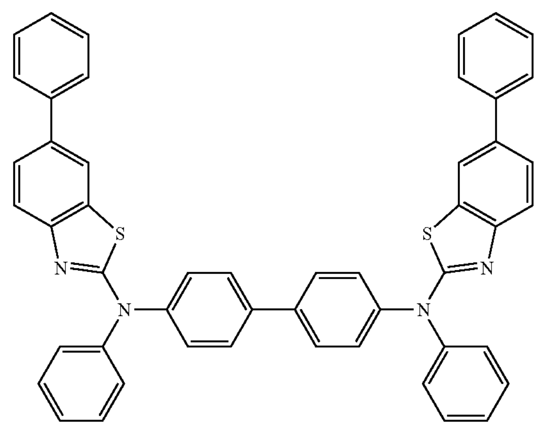
D128
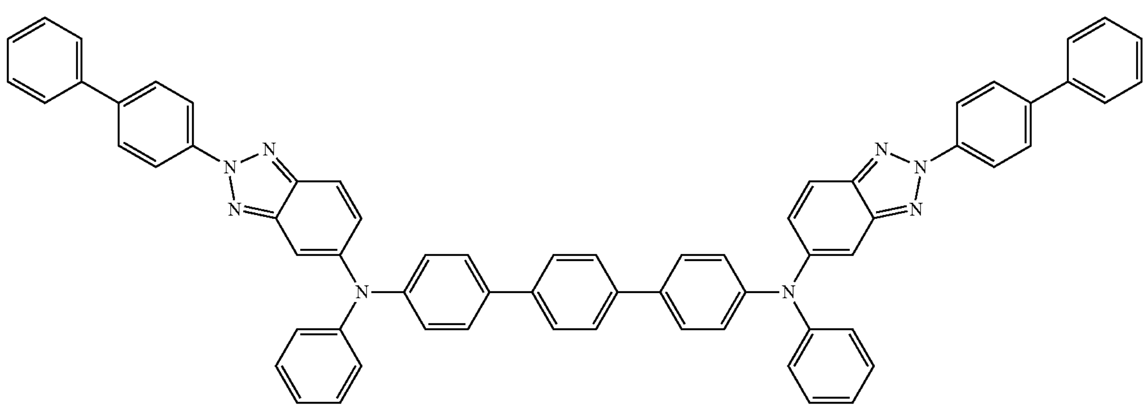

-continued
D129
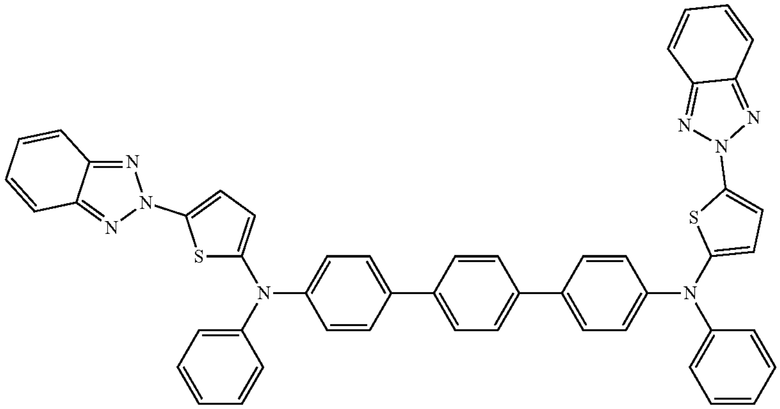
D130
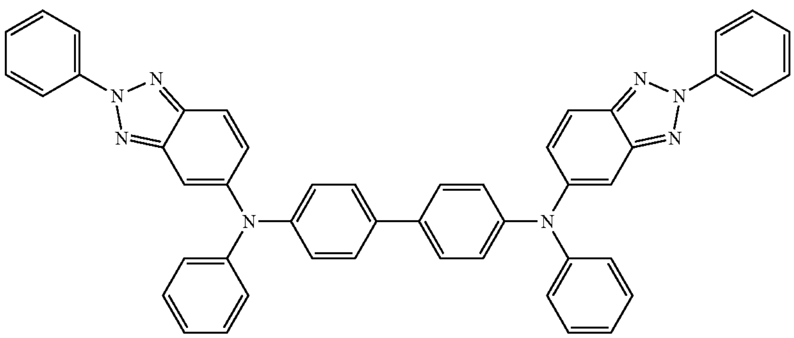
D131
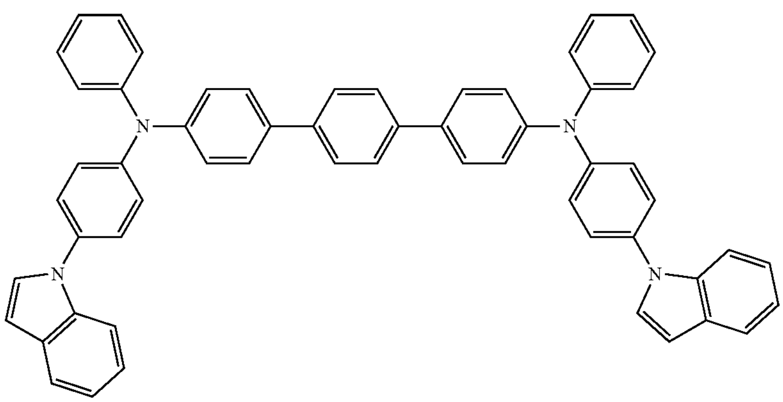
D132
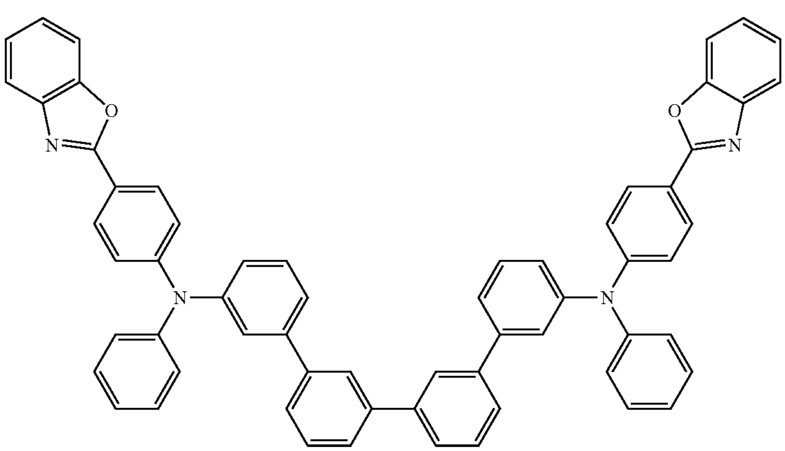

-continued
D133
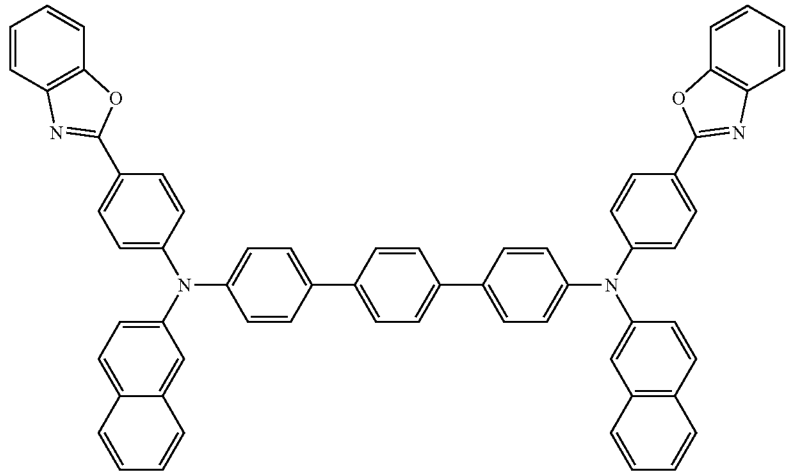
D134
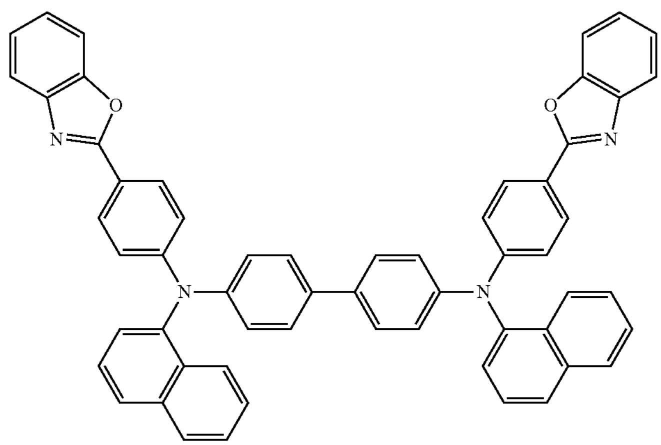
D135
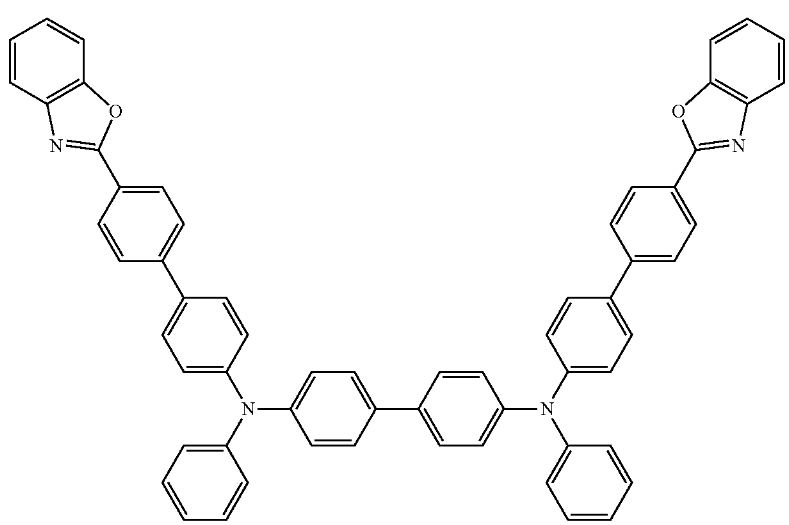

-continued
D136
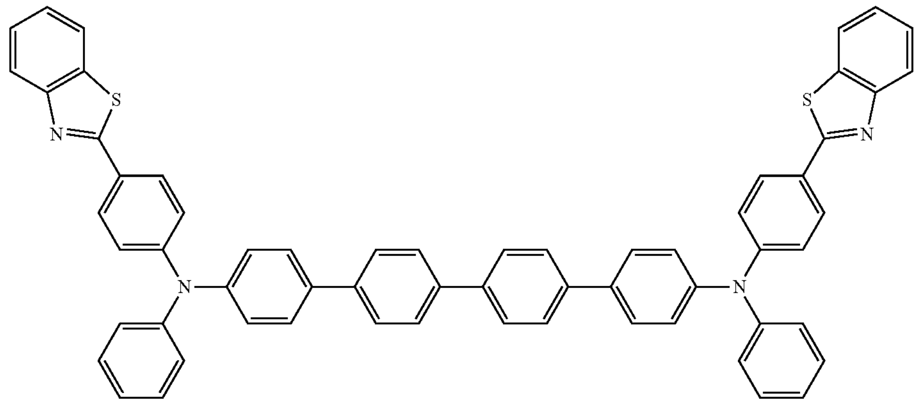
D137
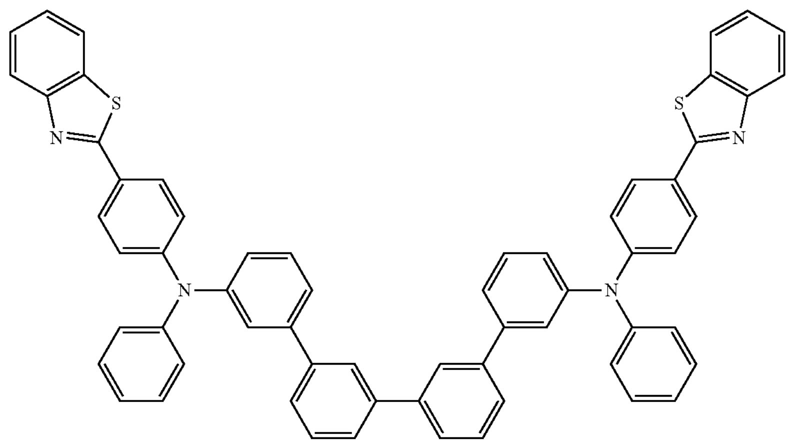
D138
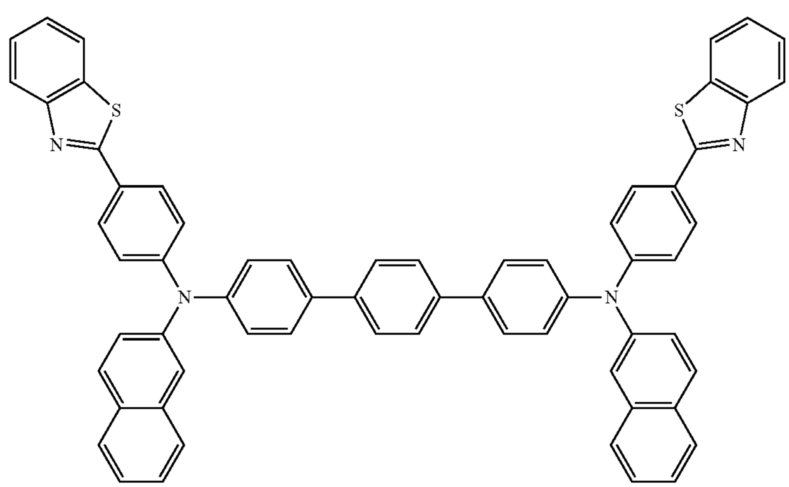

-continued
D139
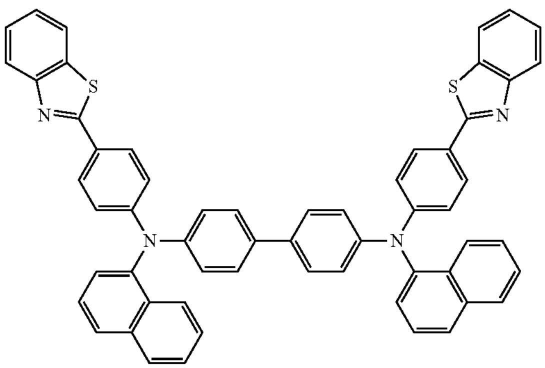
D140
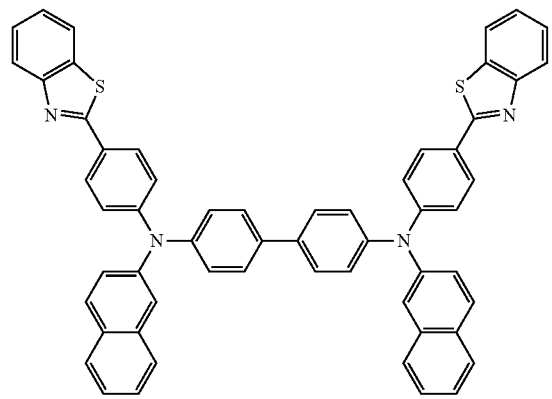
D141
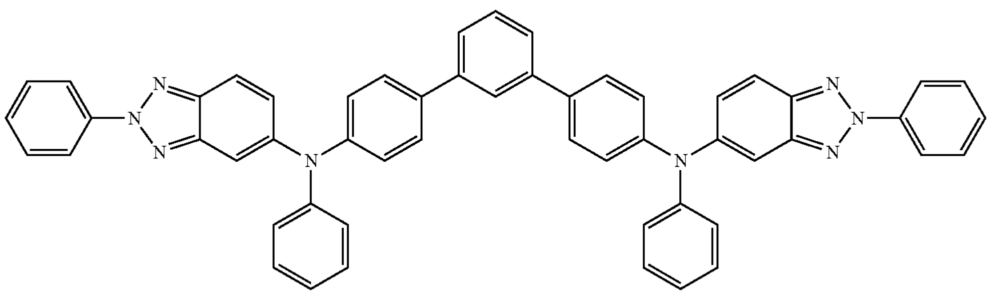
D142
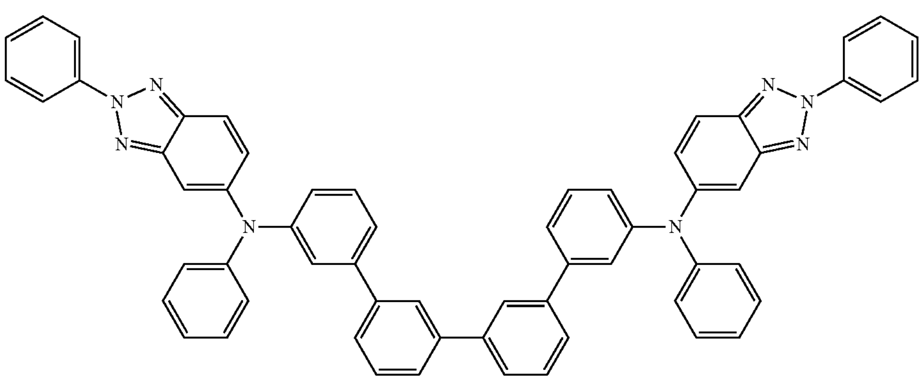
D143
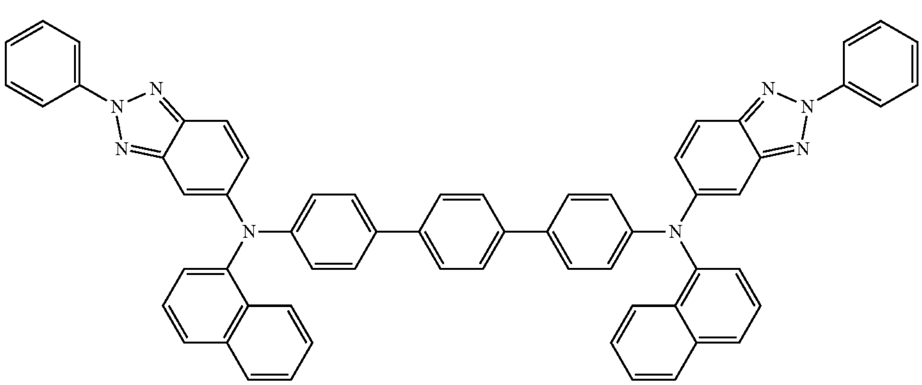

-continued

D144

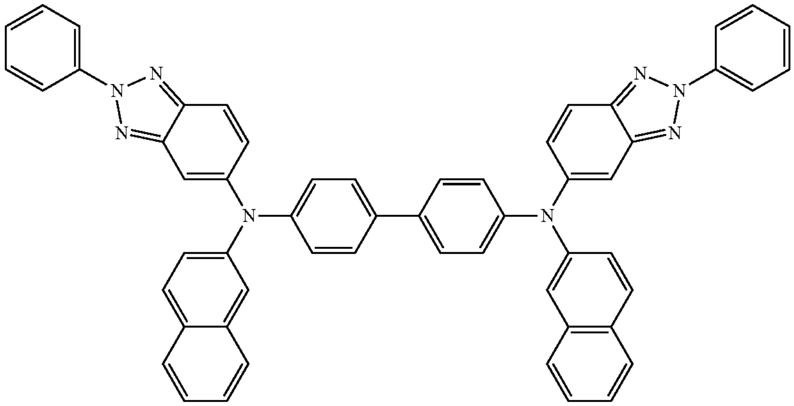

D145

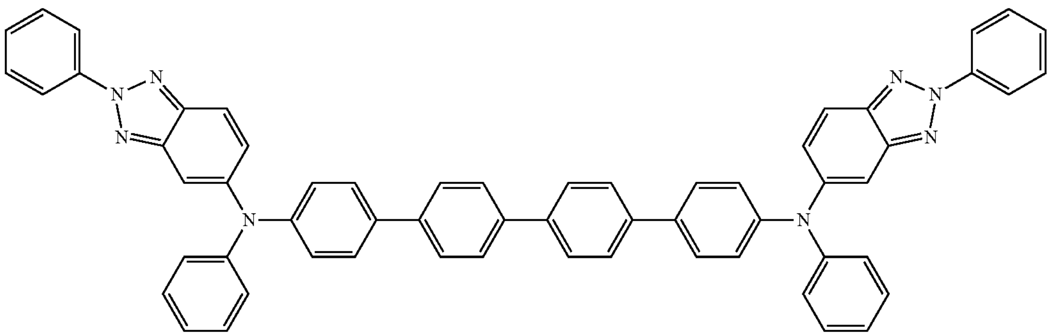

14. The organic electroluminescent according to claim 5, wherein each of the hole transport layer and the electron blocking layer comprises a compound represented by Formula F:

(F)

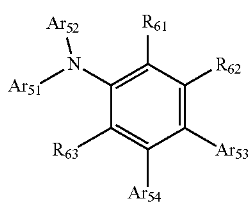

wherein $R_{61}$ to $R_{63}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, substituted or unsubstituted $C_1$-$C_{30}$ alkylgermanium, substituted or unsubstituted $C_1$-$C_{30}$ arylgermanium, cyano, nitro, and halogen, and $Ar_{51}$ to $Ar_{54}$ are identical to or different from each other and are each independently substituted or unsubstituted $C_6$-$C_{40}$ aryl or substituted or unsubstituted $C_2$-$C_{30}$ heteroaryl.

15. The organic electroluminescent according to claim 14, wherein the compound of Formula F is selected from the compounds of Formulae F1 to F33:

F1

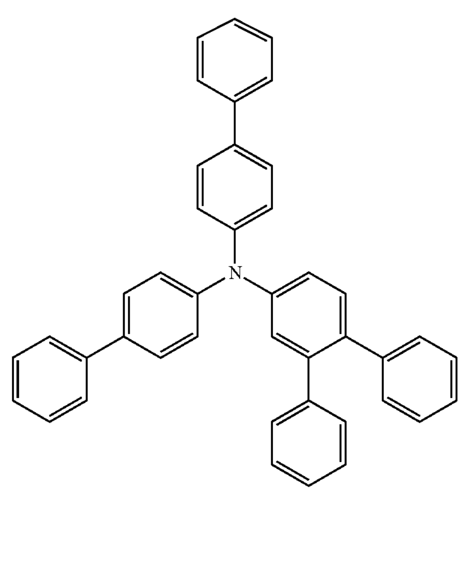

F2
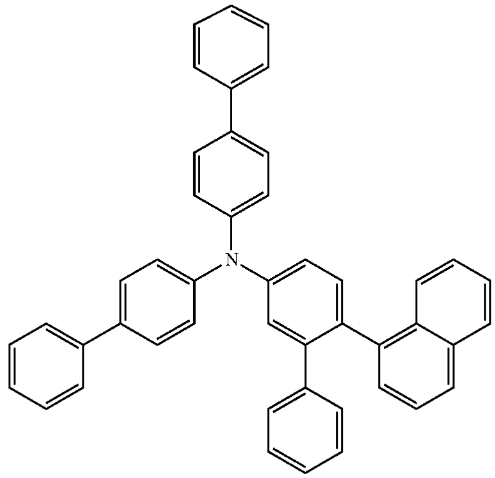
F3
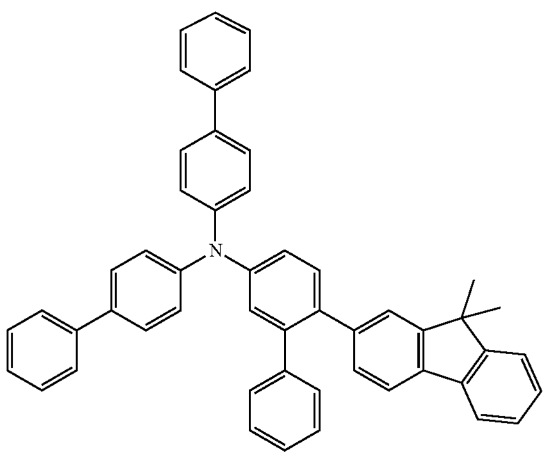
F4
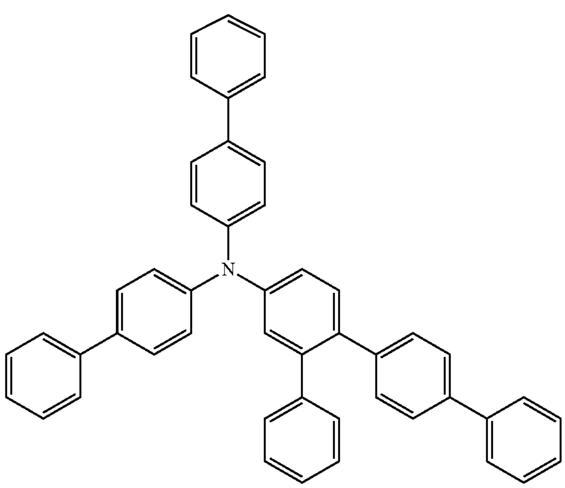
F5
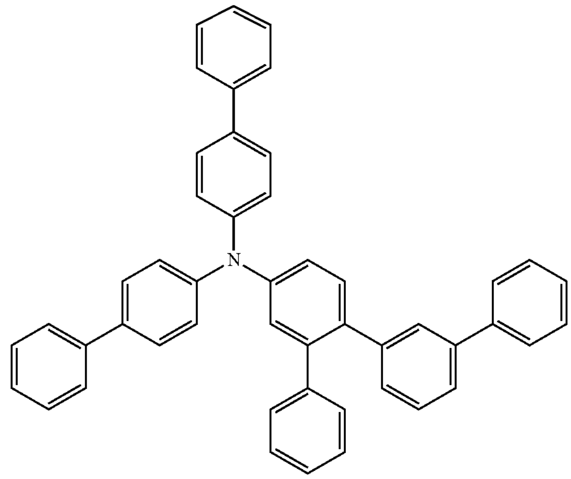
F6
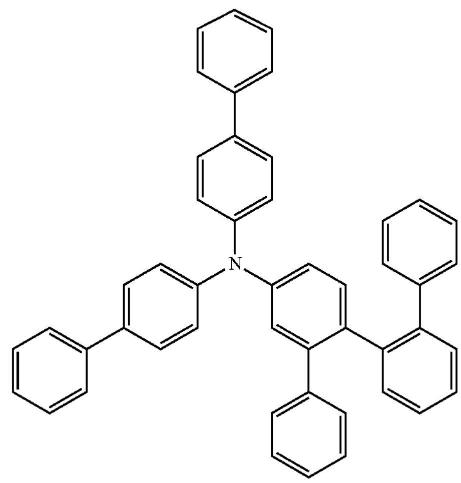
F7
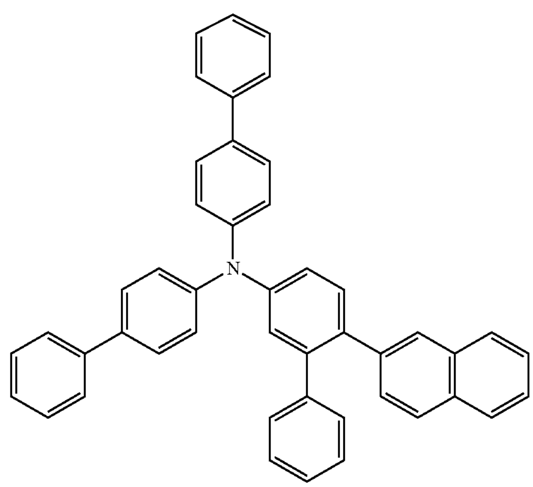

F8
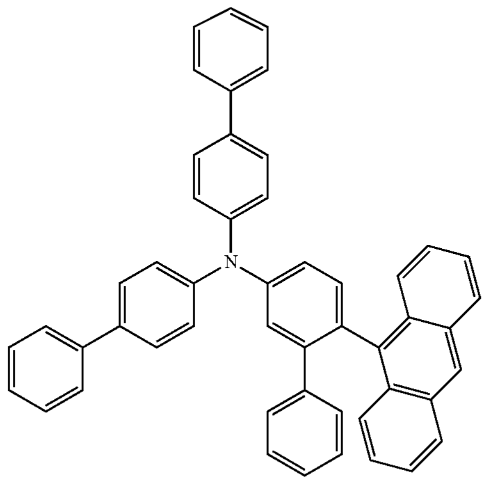
F9
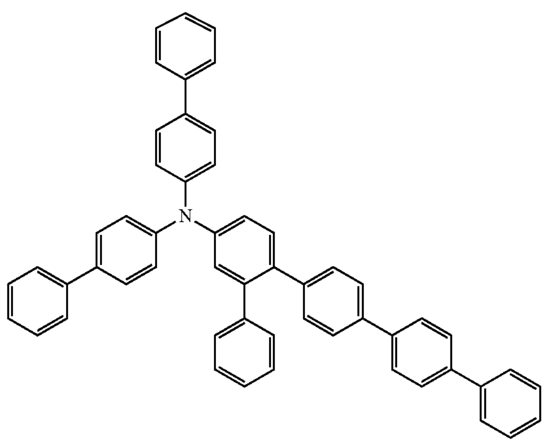
F10
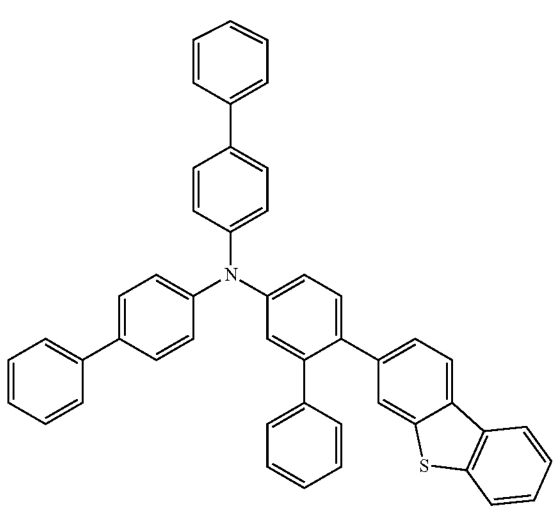
F11
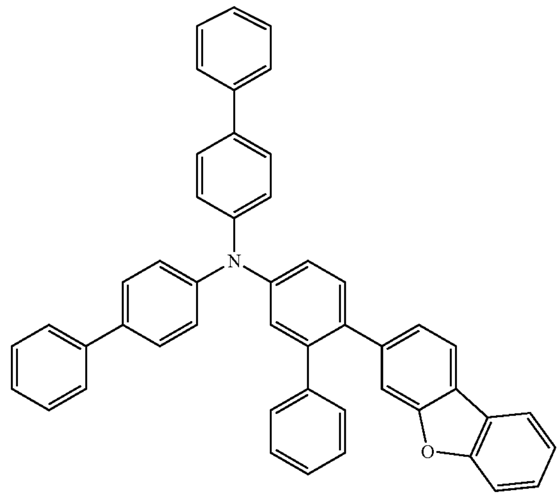
F12
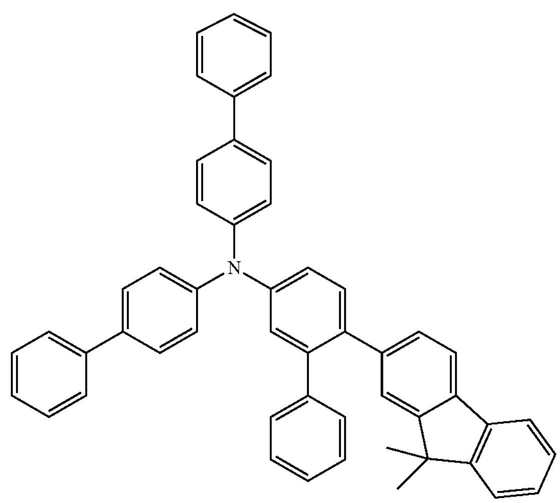
F13
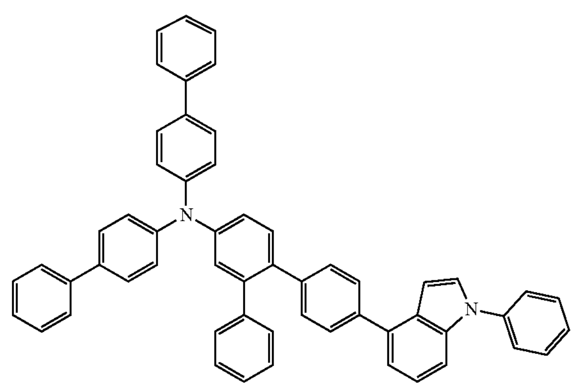

F14
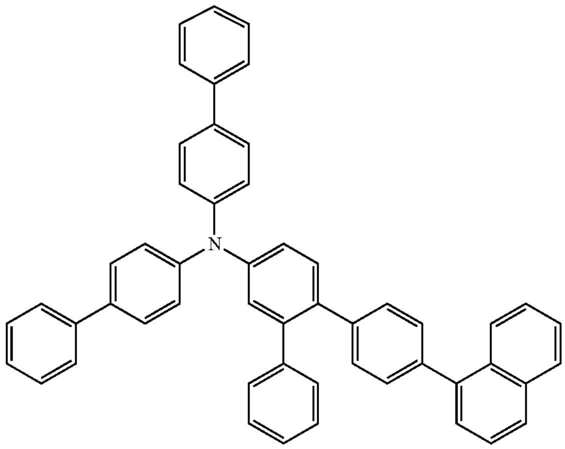
F15
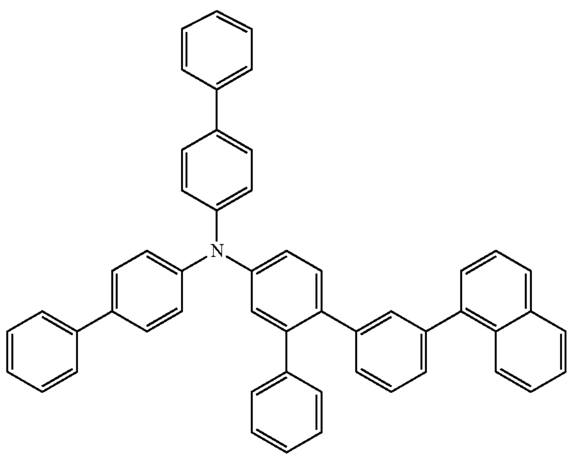
F16
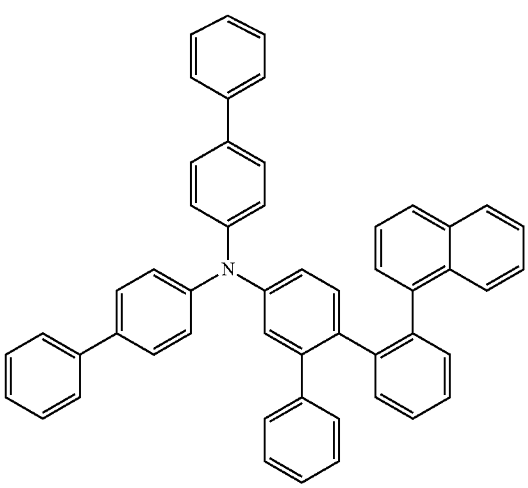
F17
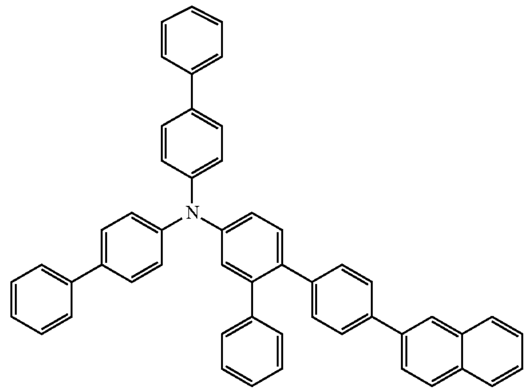
F18
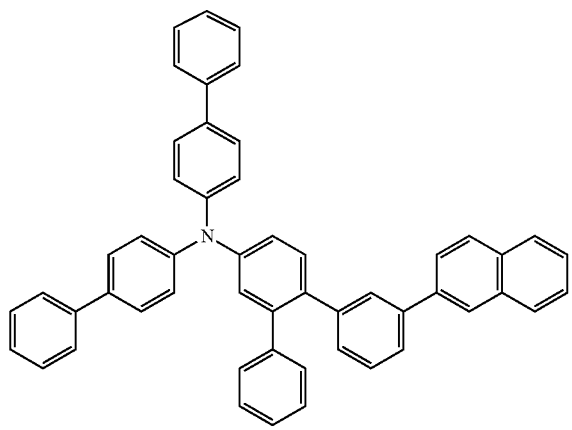
F19
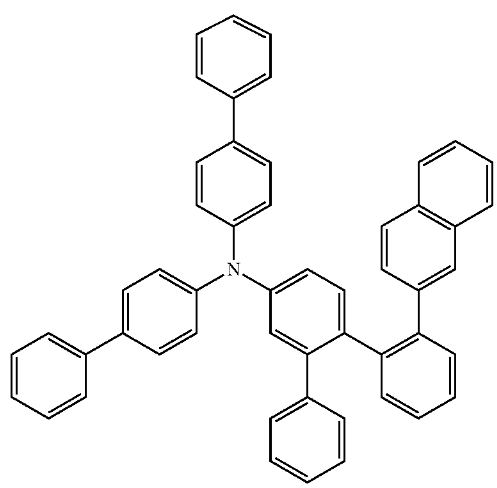

-continued
F20
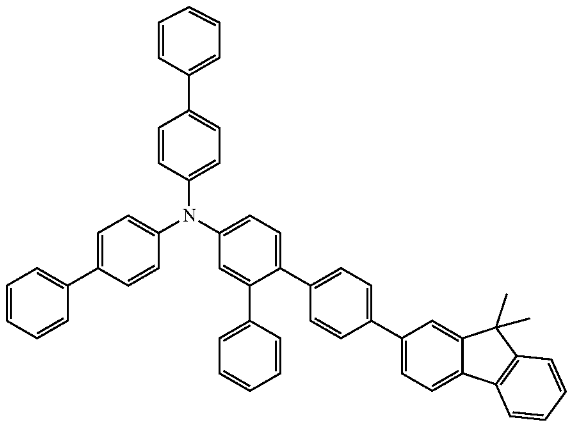
F21
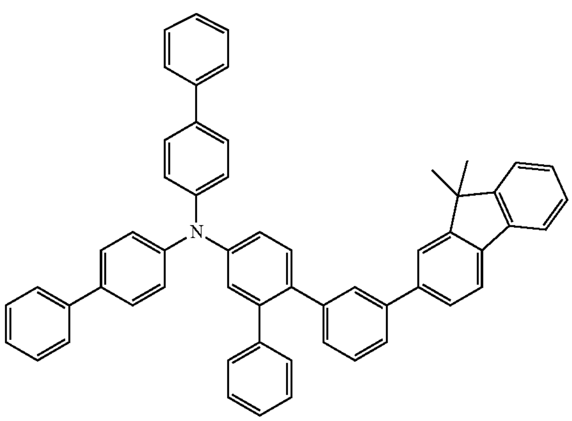
F22
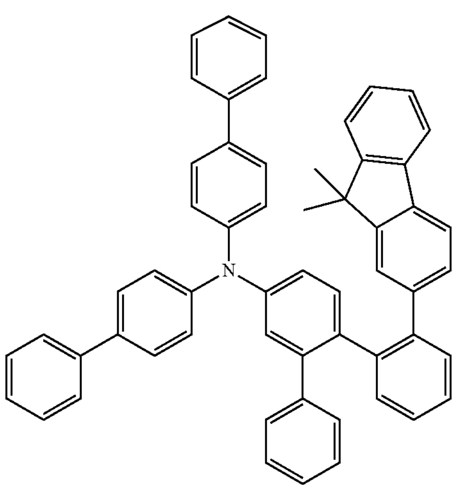
-continued
F23
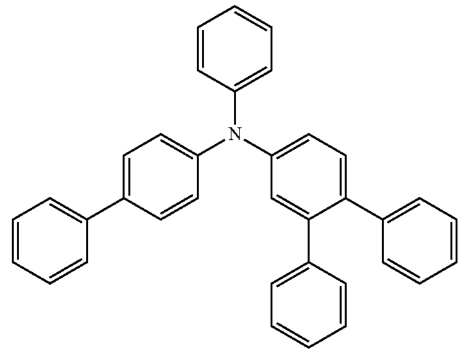
F24
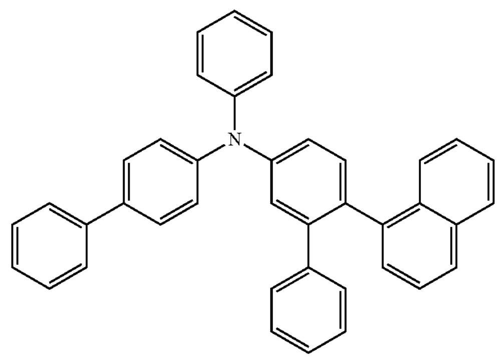
F25
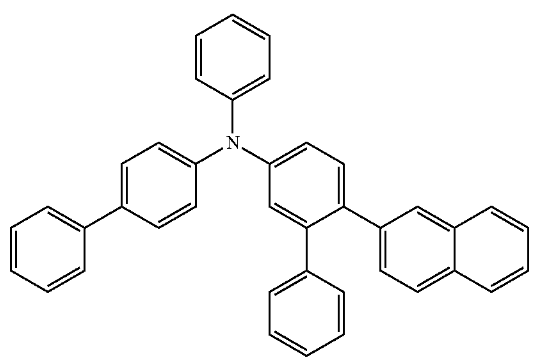
F26
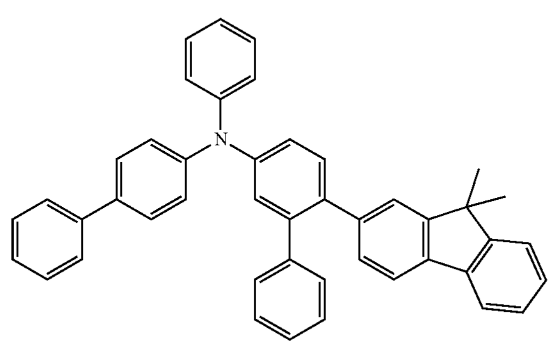

-continued
F27
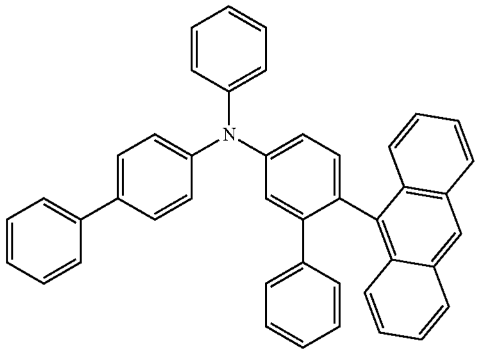
F28
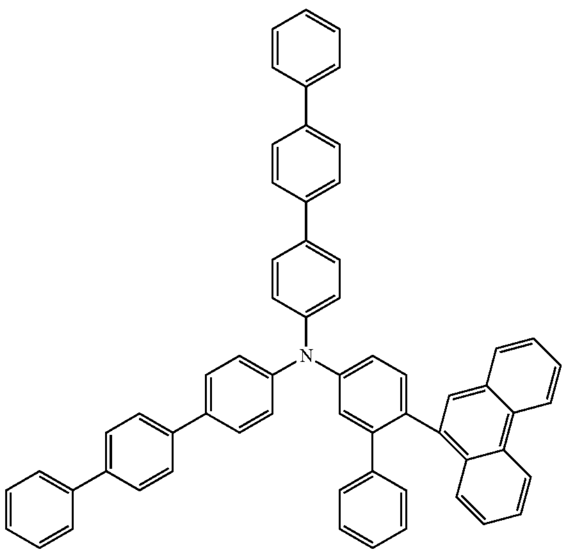
F29
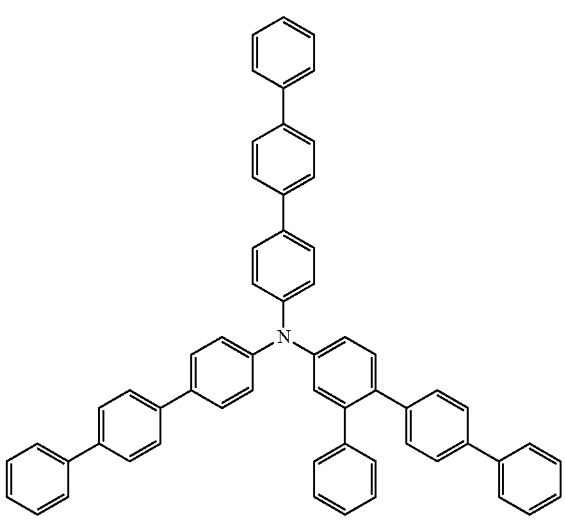
-continued
F30
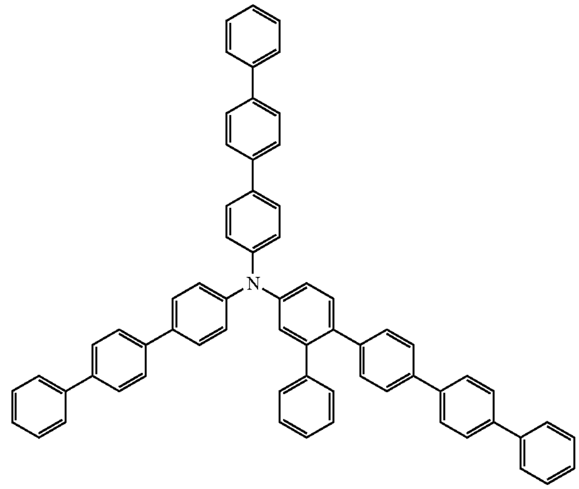
F31
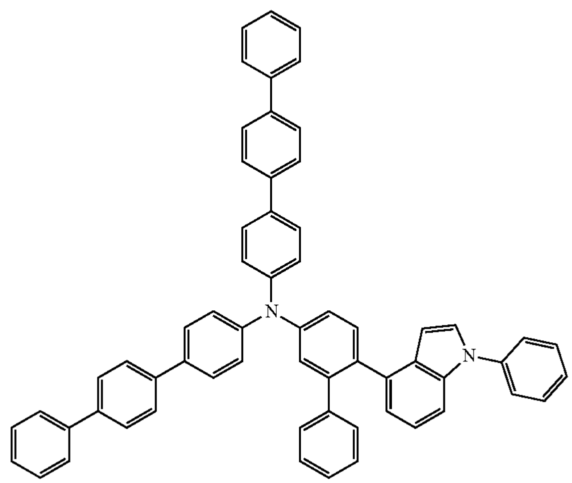
F32
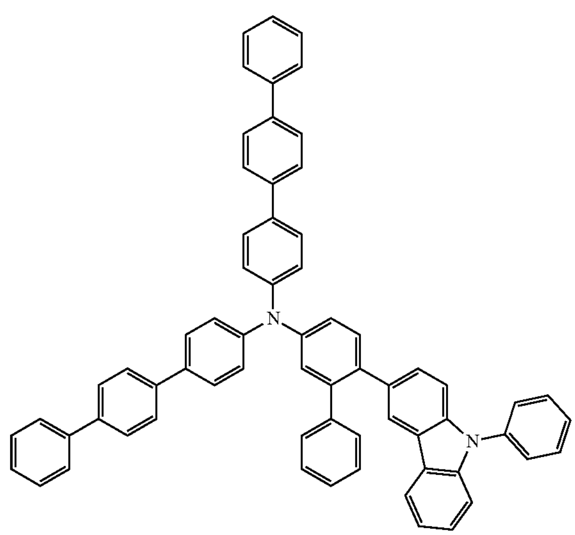

-continued

F33

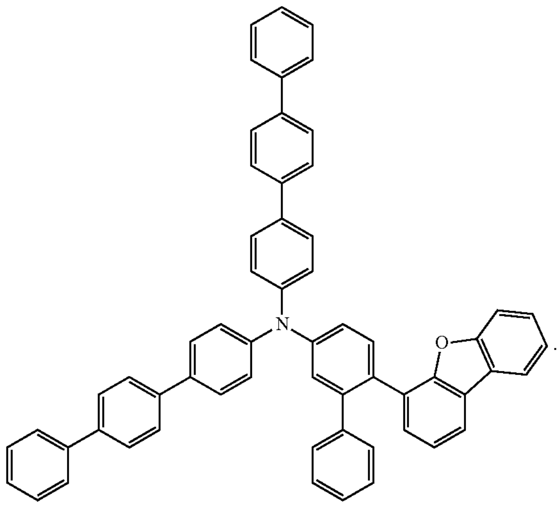

16. The organic electroluminescent according to claim 5, wherein one or more of the layers are formed by a deposition or solution process.

17. The organic electroluminescent according to claim 4, wherein the organic electroluminescence device is used in a display or lighting system selected from flat panel displays, flexible displays, monochromatic flat panel lighting systems, white flat panel lighting systems, flexible monochromatic lighting systems, and flexible white lighting systems.

* * * * *